United States Patent
Iguchi et al.

(10) Patent No.: US 12,249,105 B2
(45) Date of Patent: Mar. 11, 2025

(54) THREE-DIMENSIONAL DATA ENCODING METHOD, THREE-DIMENSIONAL DATA DECODING METHOD, THREE-DIMENSIONAL DATA ENCODING DEVICE, AND THREE-DIMENSIONAL DATA DECODING DEVICE

(71) Applicant: Panasonic Intellectual Property Corporation of America, Torrance, CA (US)

(72) Inventors: Noritaka Iguchi, Osaka (JP); Toshiyasu Sugio, Osaka (JP); Chung Dean Han, Johor Bahru (MY); Pongsak Lasang, Singapore (SG); Pradit Mittrapiyanuruk, Singapore (SG); Keng Liang Loi, Singapore (SG)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 665 days.

(21) Appl. No.: 17/521,309

(22) Filed: Nov. 8, 2021

(65) Prior Publication Data
US 2022/0058834 A1    Feb. 24, 2022

Related U.S. Application Data

(63) Continuation of application No. PCT/JP2020/021018, filed on May 27, 2020.
(Continued)

(51) Int. Cl.
*G06T 9/00* (2006.01)
*H03M 7/24* (2006.01)

(52) U.S. Cl.
CPC .............. *G06T 9/001* (2013.01); *H03M 7/24* (2013.01); *G06T 2207/10028* (2013.01)

(58) Field of Classification Search
CPC ......... G06T 9/001; G06T 2207/10028; H03M 7/24; H03M 7/3082; H04N 19/70; H04N 19/597; H04N 21/854
See application file for complete search history.

(56) References Cited

U.S. PATENT DOCUMENTS

2004/0183451 A1* 9/2004 D'Amora ............. H05B 47/155
                                                                 315/169.1
2014/0375638 A1  12/2014 Tomaru et al.
(Continued)

FOREIGN PATENT DOCUMENTS

JP    2018-101404    6/2018
WO   2014/020663    2/2014

OTHER PUBLICATIONS

International Search Report (ISR) issued on Jul. 14, 2020 in International (PCT) Application No. PCT/JP2020/021018.
(Continued)

*Primary Examiner* — Jon Chang
(74) *Attorney, Agent, or Firm* — Wenderoth, Lind & Ponack, L.L.P.

(57) ABSTRACT

A three-dimensional data encoding method includes: encoding, for each of three-dimensional points included in point cloud data, geometry information and one or more items of attribute information to generate a bitstream. In the encoding, a normal vector of each of the three-dimensional points is encoded as an item of attribute information included in the one or more items of attribute information of the three-dimensional point.

10 Claims, 126 Drawing Sheets

Related U.S. Application Data

(60) Provisional application No. 62/853,441, filed on May 28, 2019.

(56) References Cited

U.S. PATENT DOCUMENTS

| | | |
|---|---|---|
| 2018/0075622 A1 | 3/2018 | Tuffreau et al. |
| 2020/0045343 A1* | 2/2020 | Boyce ........................ G06T 1/20 |

OTHER PUBLICATIONS

Gerdan, G. P. and Deakin, R. E., "Transforming Cartesian Coordinates X, Y, Z to Geographical Coordinates φ, λ, h", The Australian Surveyor, Jun. 1999, vol. 44, No. 1, pp. 55-63.

Yan Huang et al., "A Generic Scheme for Progressive Point Cloud Coding", IEEE Transactions on Visualization and Computer Graphics, Jan. 2008, vol. 14, No. 2, pp. 440-453.

Aaron Bass et al., "Progressive Compression of Normal Vectors", Third International Symposium on 3D Data Processing, Visualization, and Transmission (3DPVT'06), Jun. 2006, pp. 1-8.

Li Cui et al., "Hybrid Color Attribute Compression for Point Cloud Data", 2017 IEEE International Conference on Multimedia and Expo (ICME), IEEE, Jul. 2017, pp. 1273-1278.

Mikio Nagasawa, Daisuke Nishioka, "Highly efficient three-dimensional data communication using ATM network", Multimedia, Distributed, Cooperative and Mobile Workshop, Proceedings of workshop of Information Processing Society of Japan, Jul. 1997, pp. 287-292, with partial English translation.

* cited by examiner

| | GEOMETRY INFORMATION | ATTRIBUTE INFORMATION |
|---|---|---|
| n = 1 | $G(1) = (x_1, y_1, z_1)$ | $A(1) = (R_1, G_1, B_1)$ |
| n = 2 | $G(2) = (x_2, y_2, z_2)$ | $A(2) = (R_2, G_2, B_2)$ |
| ⋮ | ⋮ | ⋮ |
| n = N | $G(N) = (x_N, y_N, z_N)$ | $A(N) = (R_N, G_N, B_N)$ |

FIG. 27

```
EXAMPLES OF SEMANTICS OF pcc_nal_unit_type
(1) if pcc_codec_type == Codec 1
     0:Codec1 Goemetry
     1:Codec1 AttributeX
     2:Codec1 AttributeY
     3:Codec1 Geom. PS
     4:Codec1 AttrX. PS
     5:Codec1 AttrX. PS
     6:Codec1 Geometry Sequence PS
     7:Codec1 AttributeX Sequence PS
     8:Codec1 AttributeY Sequence PS
     9:Codec1 AU Header
    10:Codec1 GOF Header
    11 ~:Codec1 reserved for future use (2) if pcc_codec_type == Codec 2
     0:Codec2 DataA
     1:Codec2 MetaDataA
     2:Codec2 MetaDataB
     3 ~:Codec2 reserved for future use
```

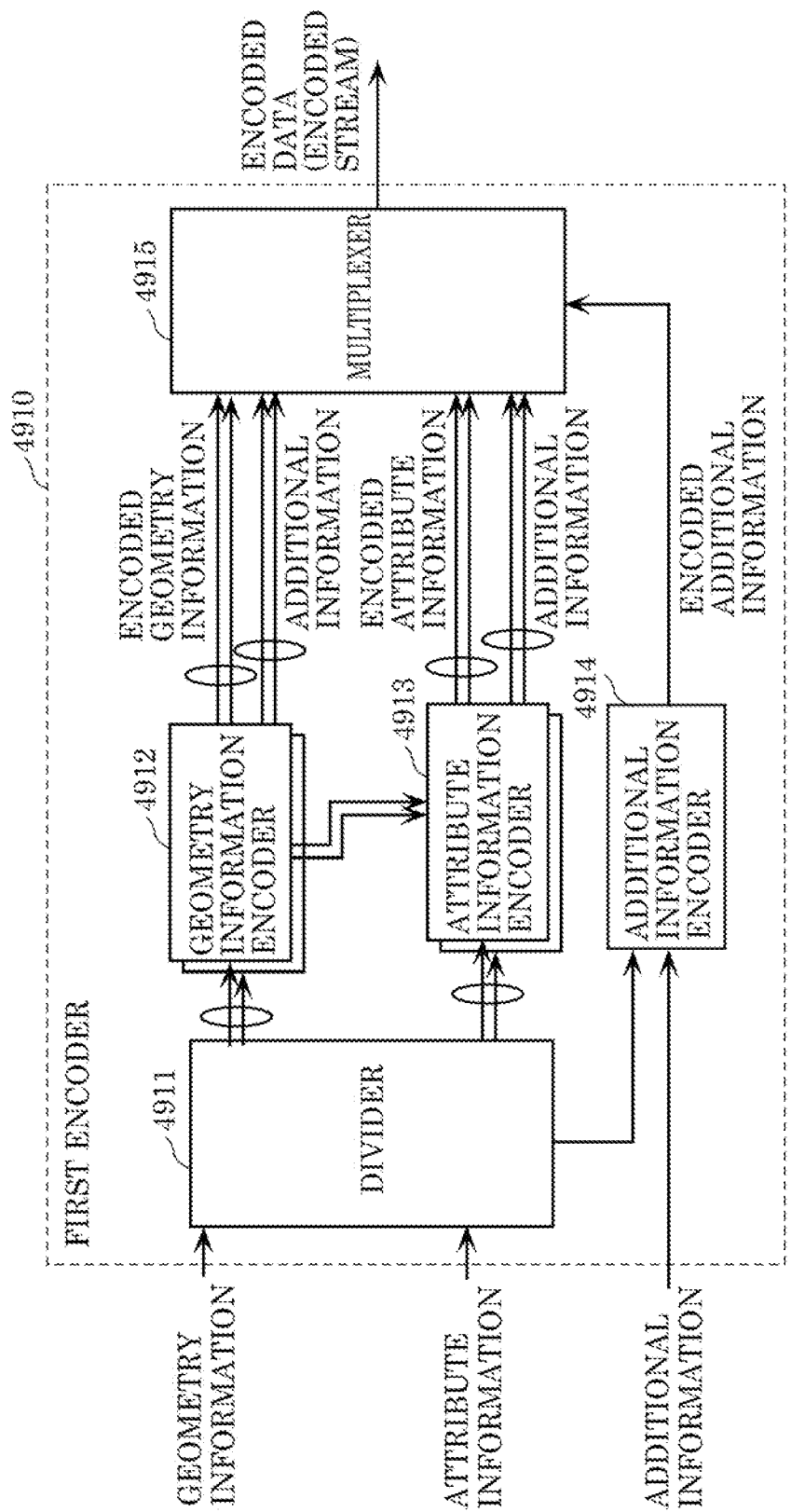

← BEFORE SLICE DIVIDING

← AFTER SLICE DIVIDING

← AFTER TILE DIVIDING

FIG. 40

```
TileMetaData{
   type_of_divide  1:top_view, 2:other
   if(type_of_divide == 1){ //top_view
      topview_shape    //1: square, 2:circle
      tile_overlap_flag   //1:true, 2:false
      if(tile_overlap_flag){
         type_of_overlap
      }
      independent_tile_height_flag
      if(independent_tile_height_flag){
         tile_height //1: road, flyover
      } tile_number for(tile_number){
         global_position or relative_position
         if(independent_tile_height_flag){
            tile_height
         }
      }
   }
}
```

FIG. 42

```
SliceMetaData{
   type_of_divide    1:object, 2:other
   if(type_of_divide == 1) {   //object
      slice_overlap_flag   //1:true, 2:false
      if(slice_overlap_flag){
         type_of_overlap
      } slice_number for(slice_number){
         global_position or relative_position
         slice_bounding_box_size
      }
   }
}
```

FIG. 47

```
TileMetaData{
  type_of_divide
  type_of_divide_null
  if(type_of_divide== A){
    number_of_tiles
    for(number_of_tiles){
      tile_null_flag
      if(tile_null_flag=false){
        origin_x
        origin_y
        origin_z
      }else if (tile_null_flag==true){
        //no data
      }
    }
  }else if (type_of_divide== B){
    //tile_number, origin, null_flag
    divide_information_B();
  }
}
```

FIG. 48

| tile_null_flag | idx |
|---|---|
| false | #1 |
| false | #2 |
| true | #3 |
| false | #4 |
| true | #5 |
| false | #6 |

← BEFORE TILE DIVISION
⇩
← AFTER TILE DIVISION
⇩
← AFTER SLICE DIVISION

```
GPS0{
  gps_idx ..PCC frame number
  sps_idx gps_information0{
    ...
    MergeDuplicatedPointFlag
    QP_value
    ...
  };
  if(tile){
    tile_information0;
  }
}
```

FIG. 72

```
tile_information(){
  type_of_divide
  independent_quantization_flag
  if(type_of_divide == A){
    number_of_tiles
    for(number_of_tiles){
      tile_null_flag
      if(tile_null_flag=false){
        origin_x
        origin_y
        origin_z
        node_size
        if(independent_quantization_flag){
          TileMergeDuplicatedPointFlag
          qp_delta;
        }
      }else if (tile_null_flag==true){
        //no data
      }
    }
  }
}
```

FIG. 73

```
node(depth, index) {
...
isleaf
if (isleaf) { //leaf
 if (MergeDuplicatedPointFlag == 0)
    num_point_per_leaf
}
else {       //node
...
}
...
}
```

FIG. 81

```
GPS0{
gps_idx_PCC frame number
sps_idx gps_information(){
    MergeDuplicatedPointFlag
    QP_value
    ...
};
if(tile){
    UniqueBetweenTilesFlag
    tile_information();
}
...
}
```

TILE A    TILE B

FIG. 91
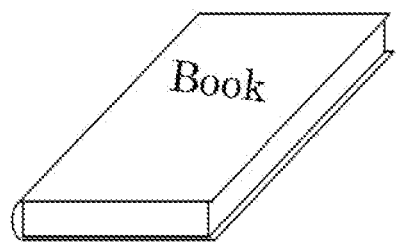
FIG. 92
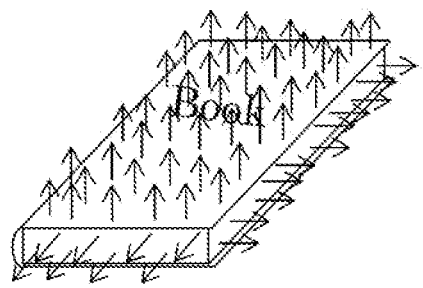
FIG. 93
```
Bitstream syntax() {
    for (i = 0 ; i < NumberofPoints; i++){
        for ( face = 0; face < 3; k++ ){
            NormalVector [ i ][ face ]
        }
    }
}
```

```
element vertex 857966
property float x
property float y
property float z
property uchar red
property uchar green
property uchar blue
property char normalVector x
property char normalVector y
property char normalVector z
end_header
127 163 255 102 94 87 15 -55 120
126 165 255 98 90 86 -65 124 98
127 164 255 101 92 86 123 56 -89
127 165 254 104 96 91 102 22 59
```

FIG. 104
| (-90, 0) | (0, 0) | (90, 0) | (180, 180) | (0, 90) | (0, -90) |
|---|---|---|---|---|---|
| 0 | 1 | 1 | 0 | 0 | 0 |
FIG. 105
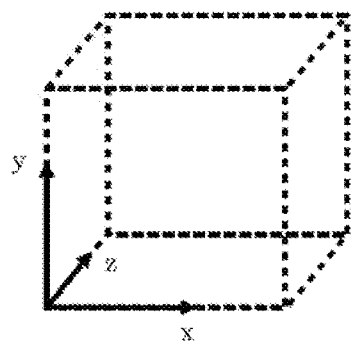
FIG. 106
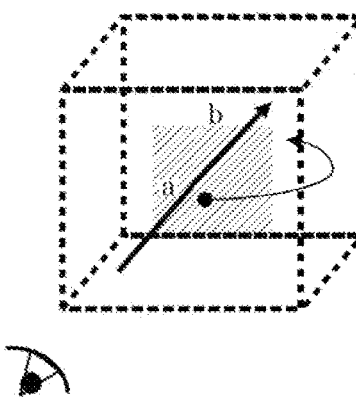
FIG. 107
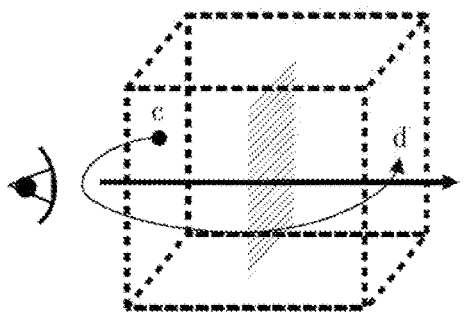

```
Geometry slice header information(){
  gps_id
  slice_id
  normal_vector_number
  for (i=0; i <normal_vector_number;
i++) {
    normal_vector_x
    normal_vector_y
    normal_vector_z
  }
}
```

```
Geometry slice header information(){
  gps_id
  slice_id
  for (i=0; i <6 ; i++) {
    is_normal_vector    ... 1bit
  }
}
```

SLICE 1 (BRICK)   SLICE 2 (BRICK)

```
slice_information{
  number_of_slice
  for(i=0; i<number_of_slices; i++){
    bounding_box_origin_x;
    bounding_box_origin_y;
    bounding_box_origin_z;
    bounding_box_width;
    bounding_box_height;
    bounding_box_depth;
    normalVector_QP;
    number_of_normal_vector
    for(i=0; i<number_of_normal_vector; i++){
      normalVector_x;
      normalVector_y;
      normalVector_z;
    }
  }
}
```

FIG. 118

```
slice_information{
  number_of_slice
  for(i=0; i <number_of_slice; i++){
    bounding_box_origin_x;
    bounding_box_origin_y;
    bounding_box_origin_z;
    bounding_box_width;
    bounding_box_height;
    bounding_box_depth;
    normalVector_QP;
    for(i=0; i<6; i++){
      is_normal_vector ... 1bit
    }
  }
}
```

FIG. 132

```
Geometry slice header information0{
  gps_id
  slice_id
  number_of_angle
  for (i=0; i <number_of_angle; i++) {
    view_angle
    visibility
  }
}
```

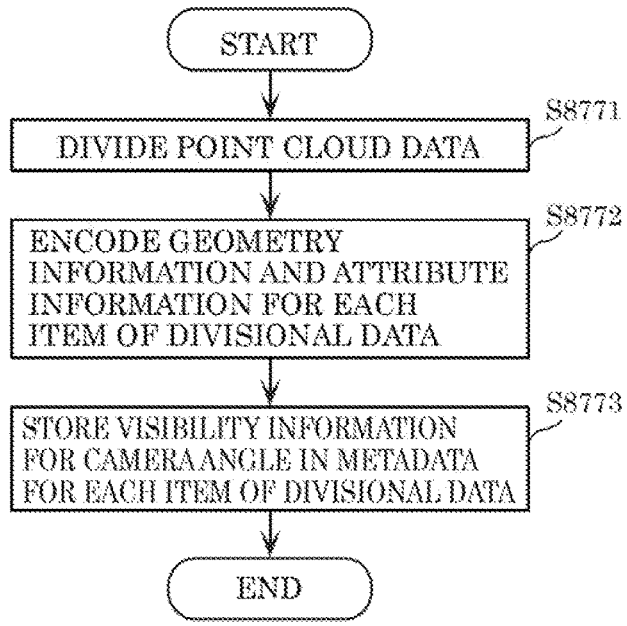

FIG. 133

START
↓
DIVIDE POINT CLOUD DATA — S8771
↓
ENCODE GEOMETRY INFORMATION AND ATTRIBUTE INFORMATION FOR EACH ITEM OF DIVISIONAL DATA — S8772
↓
STORE VISIBILITY INFORMATION FOR CAMERA ANGLE IN METADATA FOR EACH ITEM OF DIVISIONAL DATA — S8773
↓
END

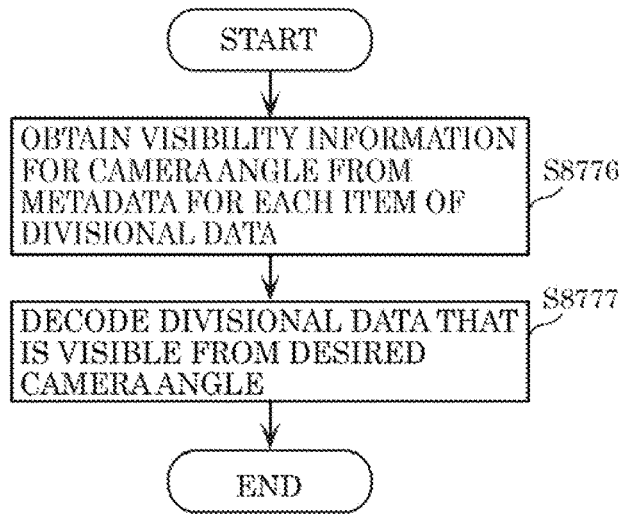

FIG. 134

START
↓
OBTAIN VISIBILITY INFORMATION FOR CAMERA ANGLE FROM METADATA FOR EACH ITEM OF DIVISIONAL DATA — S8776
↓
DECODE DIVISIONAL DATA THAT IS VISIBLE FROM DESIRED CAMERA ANGLE — S8777
↓
END

FIG. 141
| SPS | GPS | APS(0) | APS(1) | SEI | Geom | Attr(0) | Attr(1) | Geom | Attr(0) | Attr(1) |
FIG. 142
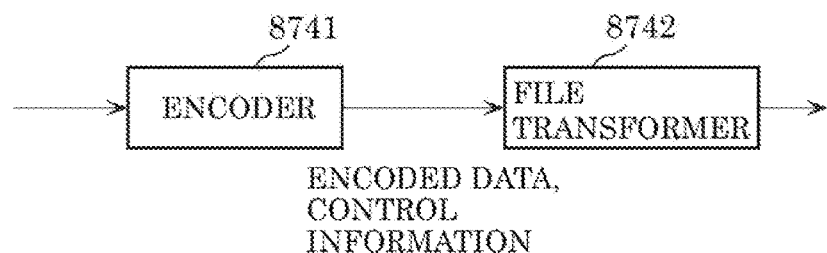
FIG. 143
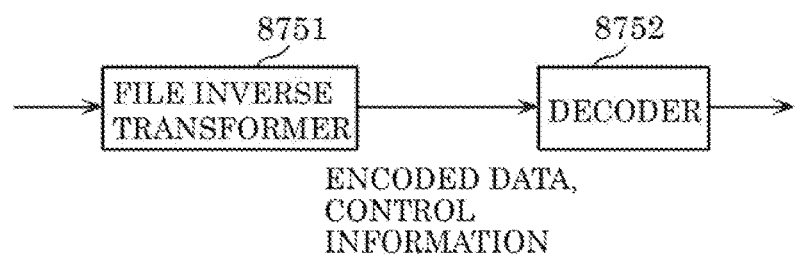

FIG. 144

| 'ftyp' | 'moov' | 'mdat' |
|---|---|---|

FIG. 145

| Codec 1 | Codec 2 |
|---|---|
| Codec 1 NAL unit | Codec 2 NAL unit |
| Carriage of Codec 1 | Carriage of Codec 2 |
| ISOBMFF ||

```
slice_information{
  number_of_slice
  for(i=0; i <number_of_slices; i++){
    bounding_box_origin_x;
    bounding_box_origin_y;
    bounding_box_origin_z;
    bounding_box_width;
    bounding_box_height;
    bounding_box_depth;
    normalVector_QP;
    for(i=0; i<6; i++){
      is_normal_vector ... 1bit
    }
  }
}
```

FIG. 148

```
slice_information{
  number_of_slice
  for(i=0; i <number_of_slice; i++){
    offset;
    bounding_box_info();
    normal_vector_info();
  }
}
```

FIG. 149

```
bounding_box_info(){
    bounding_box_origin_x;
    bounding_box_origin_y;
    bounding_box_origin_z;
    bounding_box_width;
    bounding_box_height;
    bounding_box_depth;
}
```

FIG. 150

```
normal vector info(){
  for(i=0; i<6; i++){
    is_normal_vector ... 1bit
  }
}
```

THREE-DIMENSIONAL DATA ENCODING METHOD, THREE-DIMENSIONAL DATA DECODING METHOD, THREE-DIMENSIONAL DATA ENCODING DEVICE, AND THREE-DIMENSIONAL DATA DECODING DEVICE

CROSS REFERENCE TO RELATED APPLICATIONS

This application is a U.S. continuation application of PCT International Patent Application Number PCT/JP2020/021018 filed on May 27, 2020, claiming the benefit of priority of U.S. Provisional Patent Application No. 62/853,441 filed on May 28, 2019, the entire contents of which are hereby incorporated by reference.

BACKGROUND

1. Technical Field

The present disclosure relates to a three-dimensional data encoding method, a three-dimensional data decoding method, a three-dimensional data encoding device, and a three-dimensional data decoding device.

2. Description of the Related Art

Devices or services utilizing three-dimensional data are expected to find their widespread use in a wide range of fields, such as computer vision that enables autonomous operations of cars or robots, map information, monitoring, infrastructure inspection, and video distribution. Three-dimensional data is obtained through various means including a distance sensor such as a rangefinder, as well as a stereo camera and a combination of a plurality of monocular cameras.

Methods of representing three-dimensional data include a method known as a point cloud scheme that represents the shape of a three-dimensional structure by a point cloud in a three-dimensional space. In the point cloud scheme, the positions and colors of a point cloud are stored. While point cloud is expected to be a mainstream method of representing three-dimensional data, a massive amount of data of a point cloud necessitates compression of the amount of three-dimensional data by encoding for accumulation and transmission, as in the case of a two-dimensional moving picture (examples include Moving Picture Experts Group-4 Advanced Video Coding (MPEG-4 AVC) and High Efficiency Video Coding (HEVC) standardized by MPEG).

Meanwhile, point cloud compression is partially supported by, for example, an open-source library (Point Cloud Library) for point cloud-related processing.

Furthermore, a technique for searching for and displaying a facility located in the surroundings of the vehicle by using three-dimensional map data is known (for example, see Patent Literature (PTL) 1).

CITATION LIST

Patent Literature

PTL 1: International Publication WO 2014/020663

SUMMARY

There has been a demand for reducing the processing amount of three-dimensional data encoding processing and three-dimensional data decoding processing.

The present disclosure has an object to provide a three-dimensional data encoding method, a three-dimensional data decoding method, a three-dimensional data encoding device, or a three-dimensional data decoding device that is capable of reducing a processing amount.

In accordance with an aspect of the present disclosure, a three-dimensional data encoding method includes: encoding, for each of three-dimensional points included in point cloud data, geometry information and one or more items of attribute information to generate a bitstream, wherein in the encoding, a normal vector of each of the three-dimensional points is encoded as an item of attribute information included in the one or more items of attribute information of the three-dimensional point.

In accordance with another aspect of the present disclosure, a three-dimensional data encoding method includes: dividing point cloud data into items of divided data; and encoding the items of divided data to generate a bitstream, wherein the bitstream includes information indicating a normal vector of each of the items of divided data.

In accordance with still another aspect of the present disclosure, a three-dimensional data decoding method includes: obtaining a bitstream, the bitstream being generated by encoding, for each of three-dimensional points included in point cloud data, geometry information and one or more items of attribute information, the bitstream including, for each of the three-dimensional points, a normal vector encoded as an item of attribute information included in the one or more items of attribute information of the three-dimensional point, wherein obtaining the normal vector by decoding the item of attribute information from the bitstream.

In accordance with still another aspect of the present disclosure, a three-dimensional data decoding method includes: obtaining a bitstream generated by encoding items of divided data generated by dividing point cloud data; and obtaining, from the bitstream, information indicating a normal vector of each of the items of divided data.

The present disclosure provides a three-dimensional data encoding method, a three-dimensional data decoding method, a three-dimensional data encoding device, or a three-dimensional data decoding device that is capable of reducing a processing amount.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 27 is a diagram illustrating a semantics example of pcc_nal_unit_type according to Embodiment 2;

FIG. 28 is a block diagram of a first encoder according to Embodiment 3;

FIG. 40 is a diagram illustrating an example of syntax of tile additional information according to Embodiment 4;

FIG. 42 is a diagram illustrating an example of syntax of slice additional information according to Embodiment 4;

FIG. 47 is a diagram illustrating an example of syntax of tile additional information according to Embodiment 5;

FIG. 48 is a diagram illustrating an example of index information according to Embodiment 5;

FIG. 72 is a diagram showing a syntax example of tile information according to Embodiment 6;

FIG. 73 is a diagram showing a syntax example of node information according to Embodiment 6;

FIG. 81 is a diagram showing a syntax example of GPS according to Embodiment 6;

FIG. 91 is a diagram showing an example of point cloud data according to Embodiment 7;

FIG. 92 is a diagram showing an example of a normal vector for each point according to Embodiment 7;

FIG. 93 is a diagram showing a syntax example of a normal vector according to Embodiment 7;

FIG. 104 is a diagram showing an example of normal vector information according to Embodiment 7;

FIG. 105 is a diagram showing an example of a cube according to Embodiment 7;

FIG. 106 is a diagram showing an example of faces of the cube according to Embodiment 7;

FIG. 107 is a diagram showing an example of faces of the cube according to Embodiment 7;

FIG. 118 is a diagram showing a syntax example of slice information according to Embodiment 7;

FIG. 119 is a flowchart of a three-dimensional data decoding process according to Embodiment 7;

FIG. 120 is a diagram showing an example of a partial decoding process according to Embodiment 7;

FIG. 121 is a diagram showing an example configuration of a three-dimensional data decoding device according to Embodiment 7;

FIG. 122 is a diagram showing an example process performed by a random access controller according to Embodiment 7;

FIG. 123 is a diagram showing an example process performed by the random access controller according to Embodiment 7;

FIG. 124 is a diagram showing an example of a relationship between distance and resolution according to Embodiment 7;

FIG. 125 is a diagram showing an example of bricks and normal vectors according to Embodiment 7;

FIG. 126 is a diagram showing an example of levels according to Embodiment 7;

FIG. 127 is a diagram showing an example of an octree structure according to Embodiment 7;

FIG. 128 is a flowchart of a three-dimensional data decoding process according to Embodiment 7;

FIG. 129 is a flowchart of a three-dimensional data decoding process according to Embodiment 7;

FIG. 130 is a diagram showing an example of a brick to be decoded according to Embodiment 7;

Figure 131:
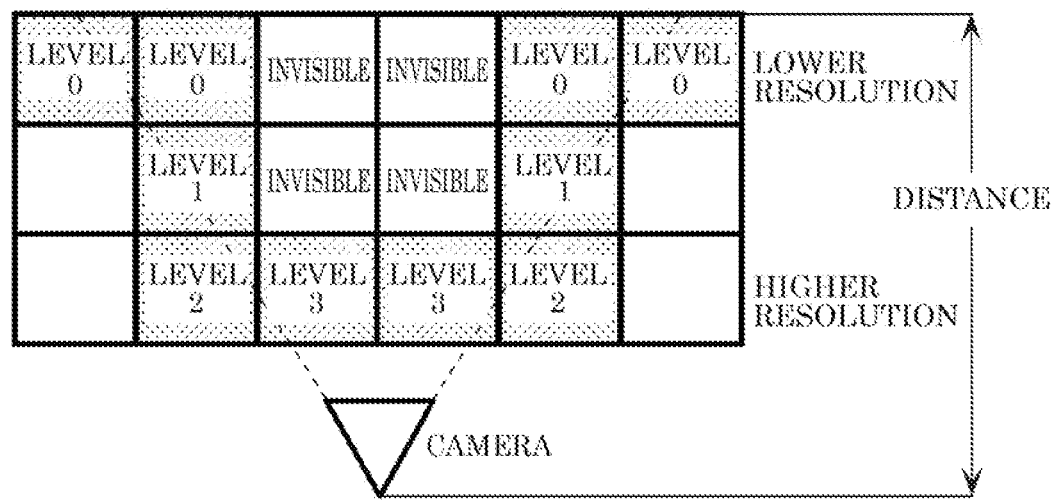
Figure 135:
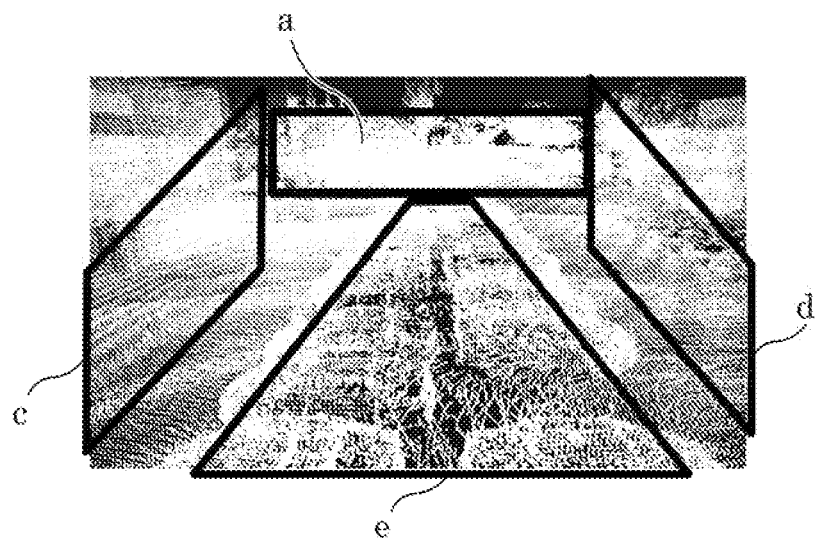
Figure 136:
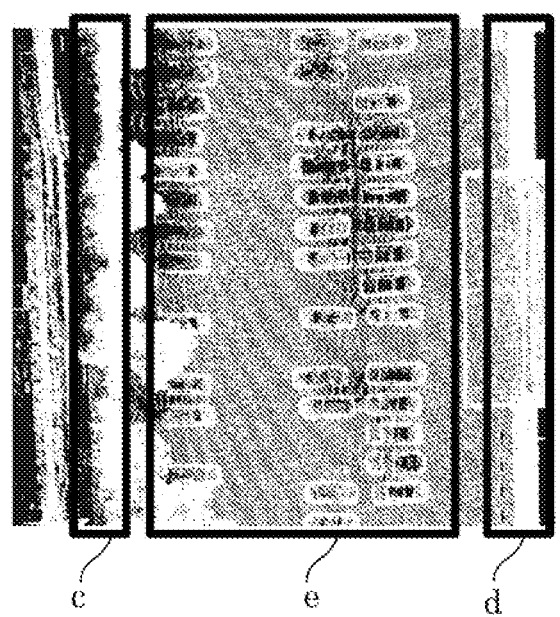
Figure 137:
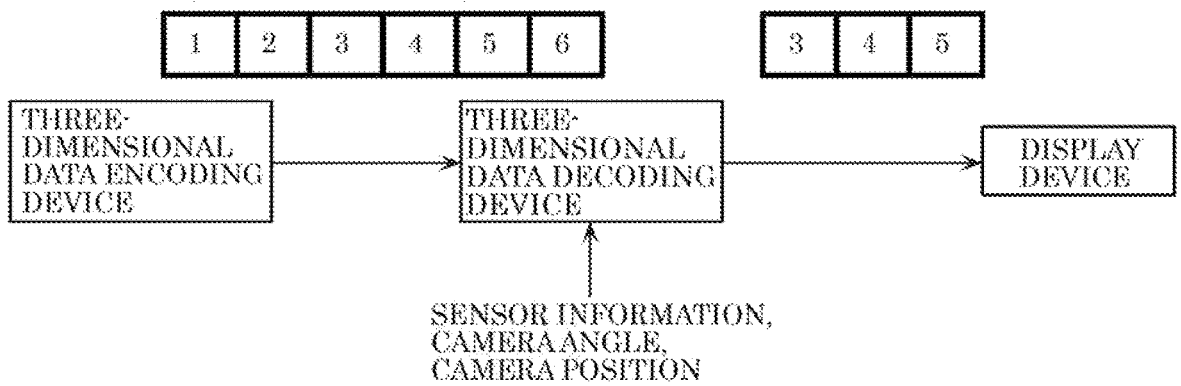
Figure 138:
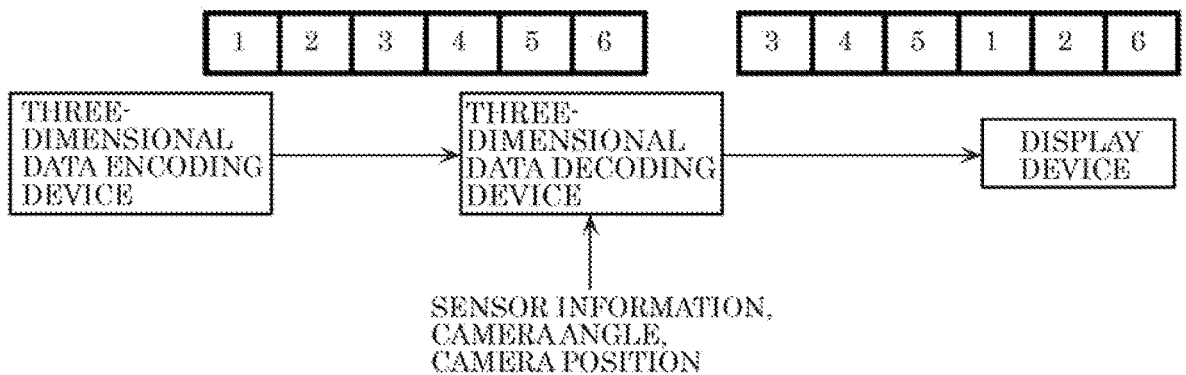
Figure 139:
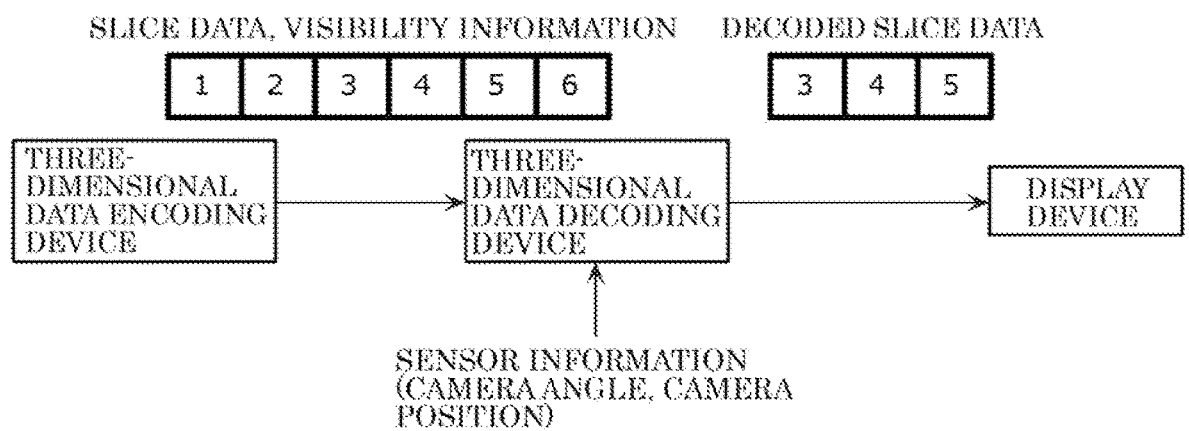
Figure 140:
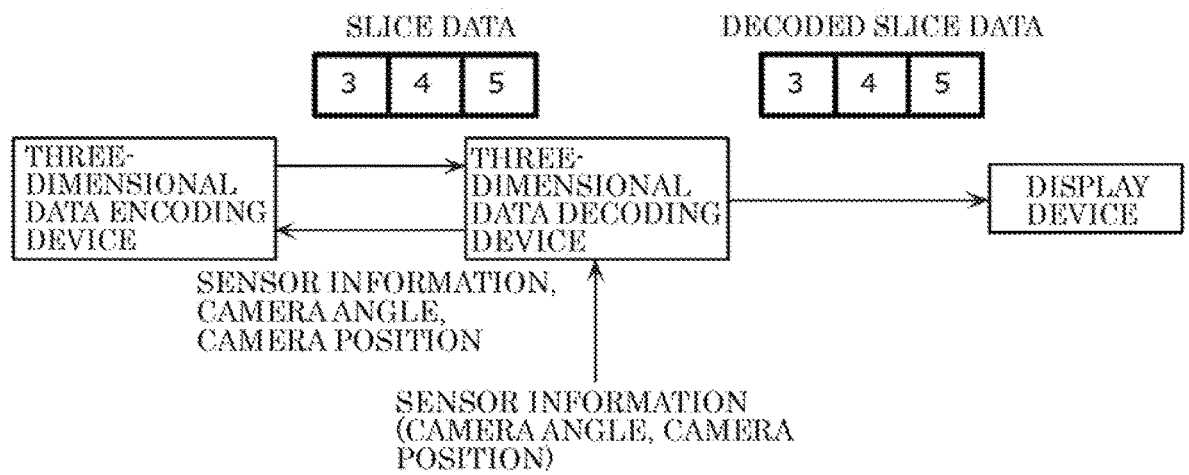
Figures 146, 147:
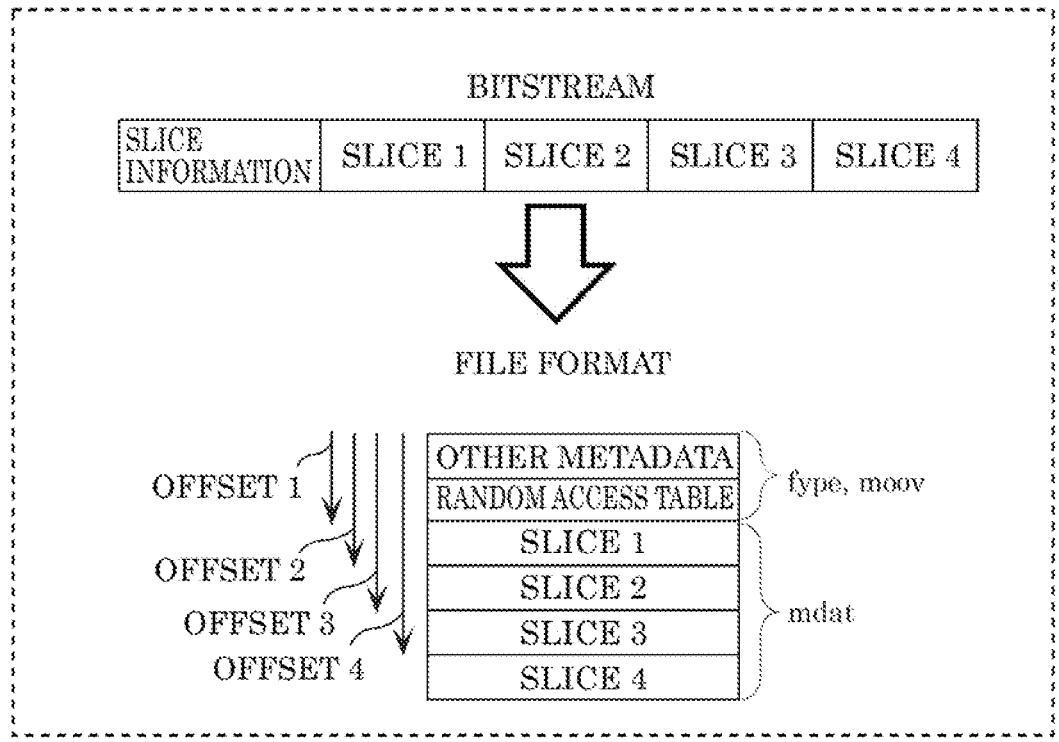
Figure 151:
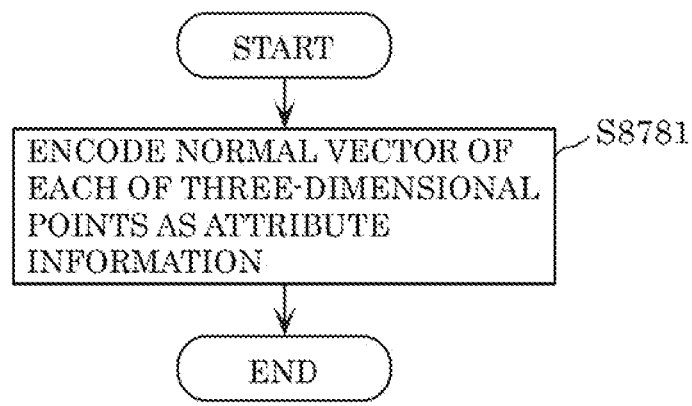
Figure 152:
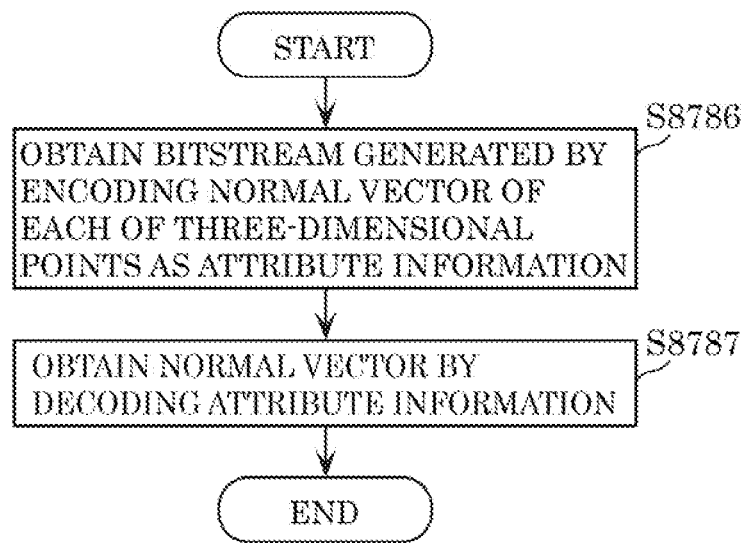
Figure 153:
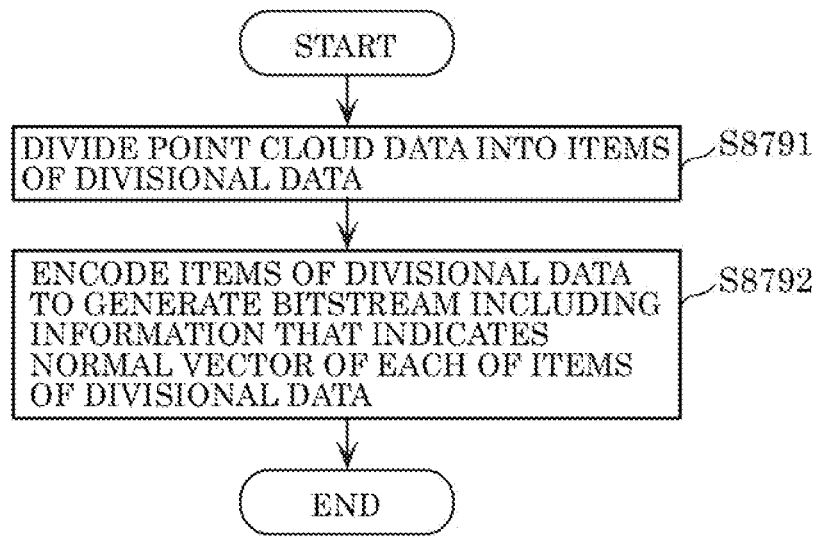
Figure 154:
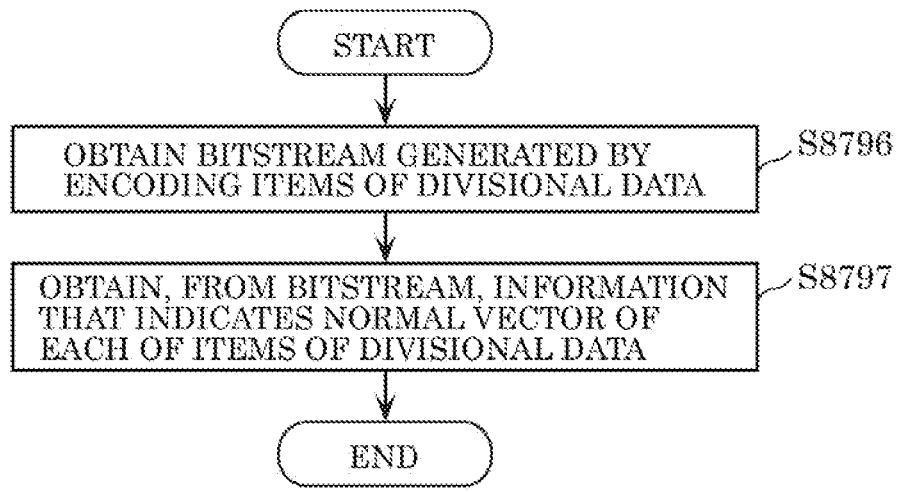
Figure 155:
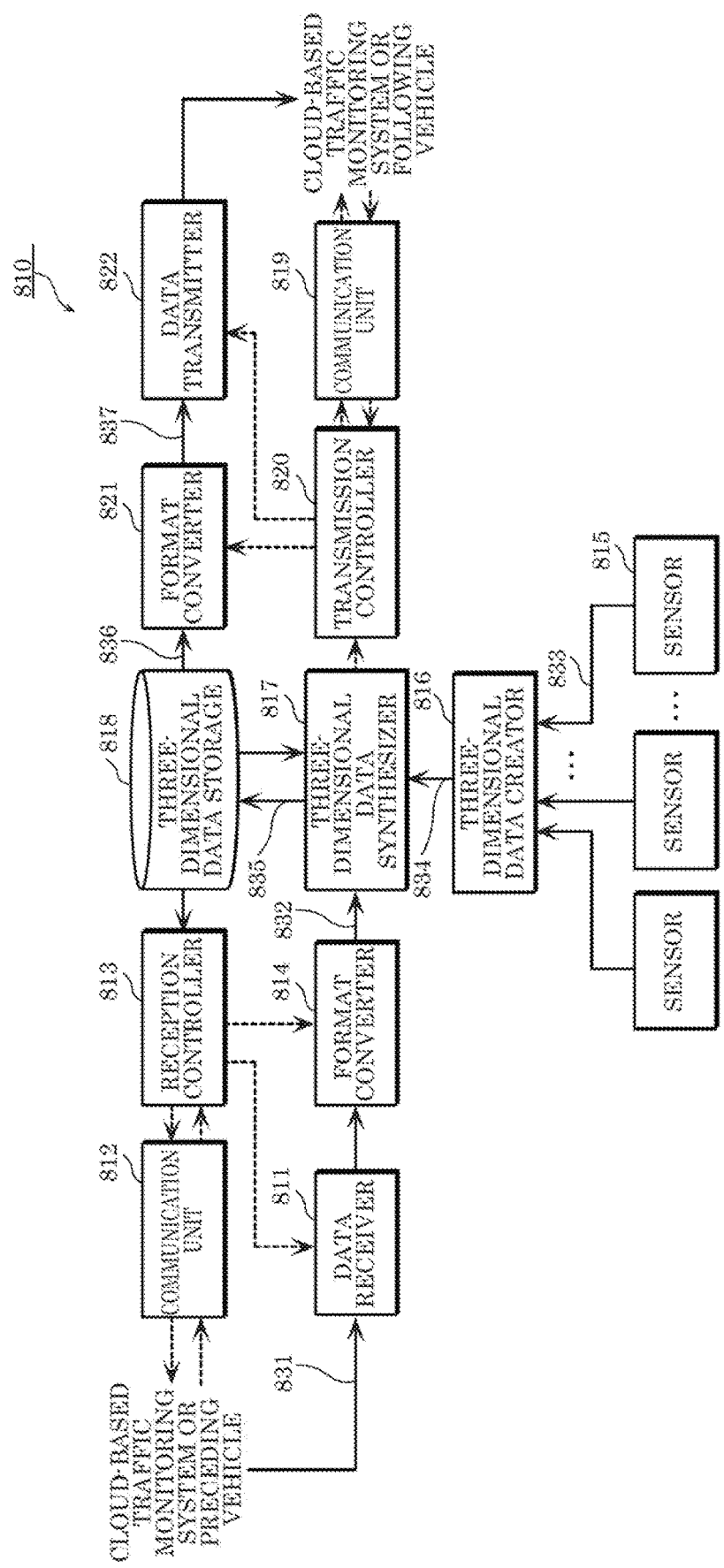
Figure 156:
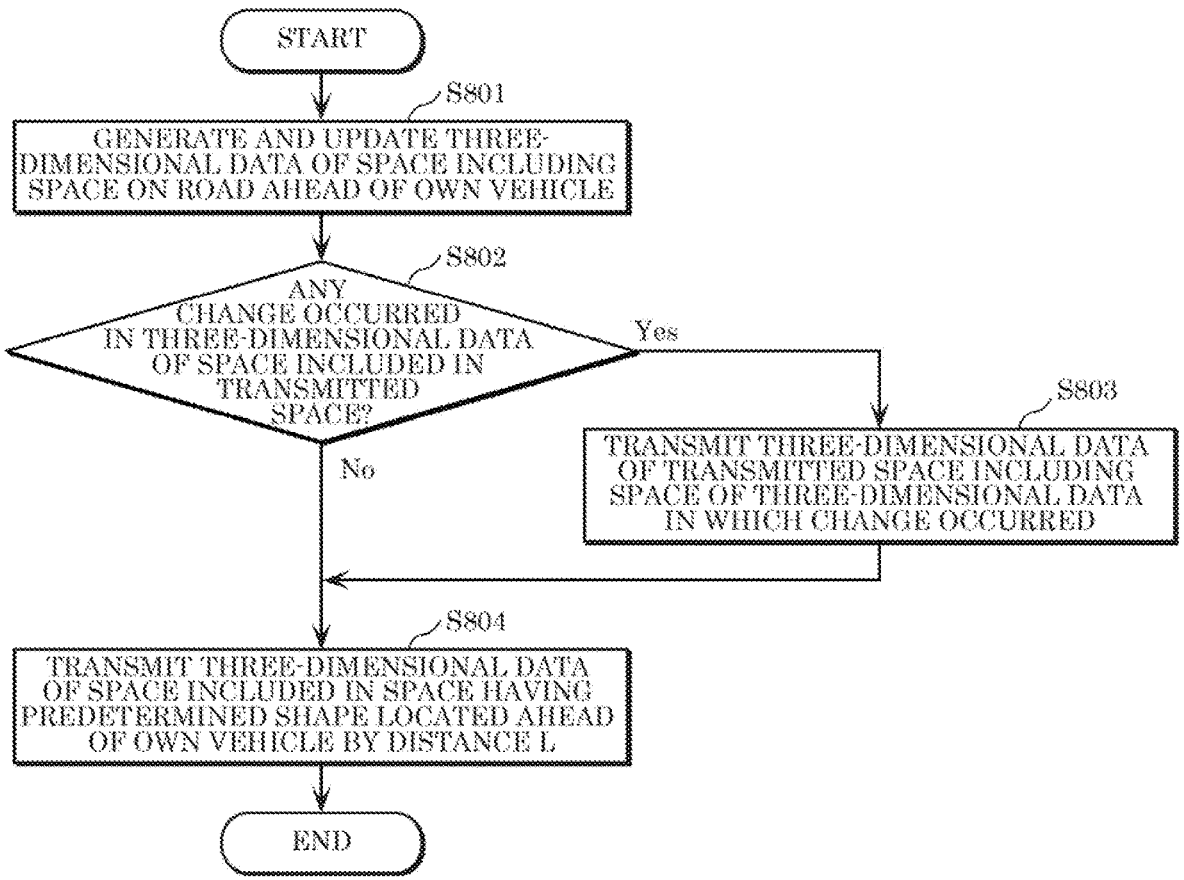
Figure 157:
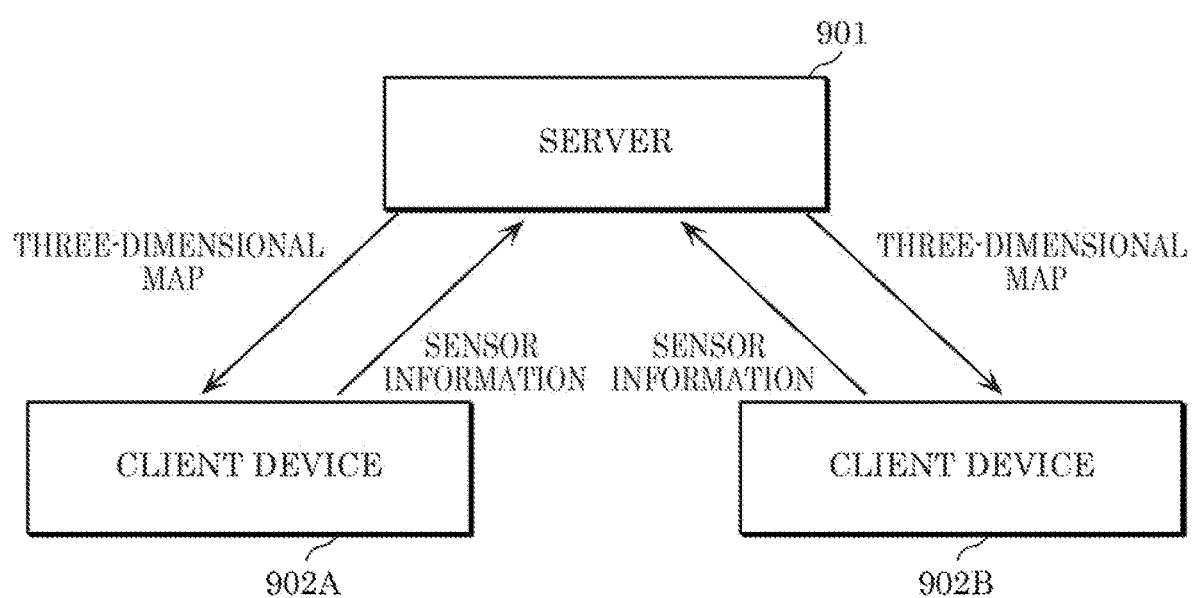
Figure 158:
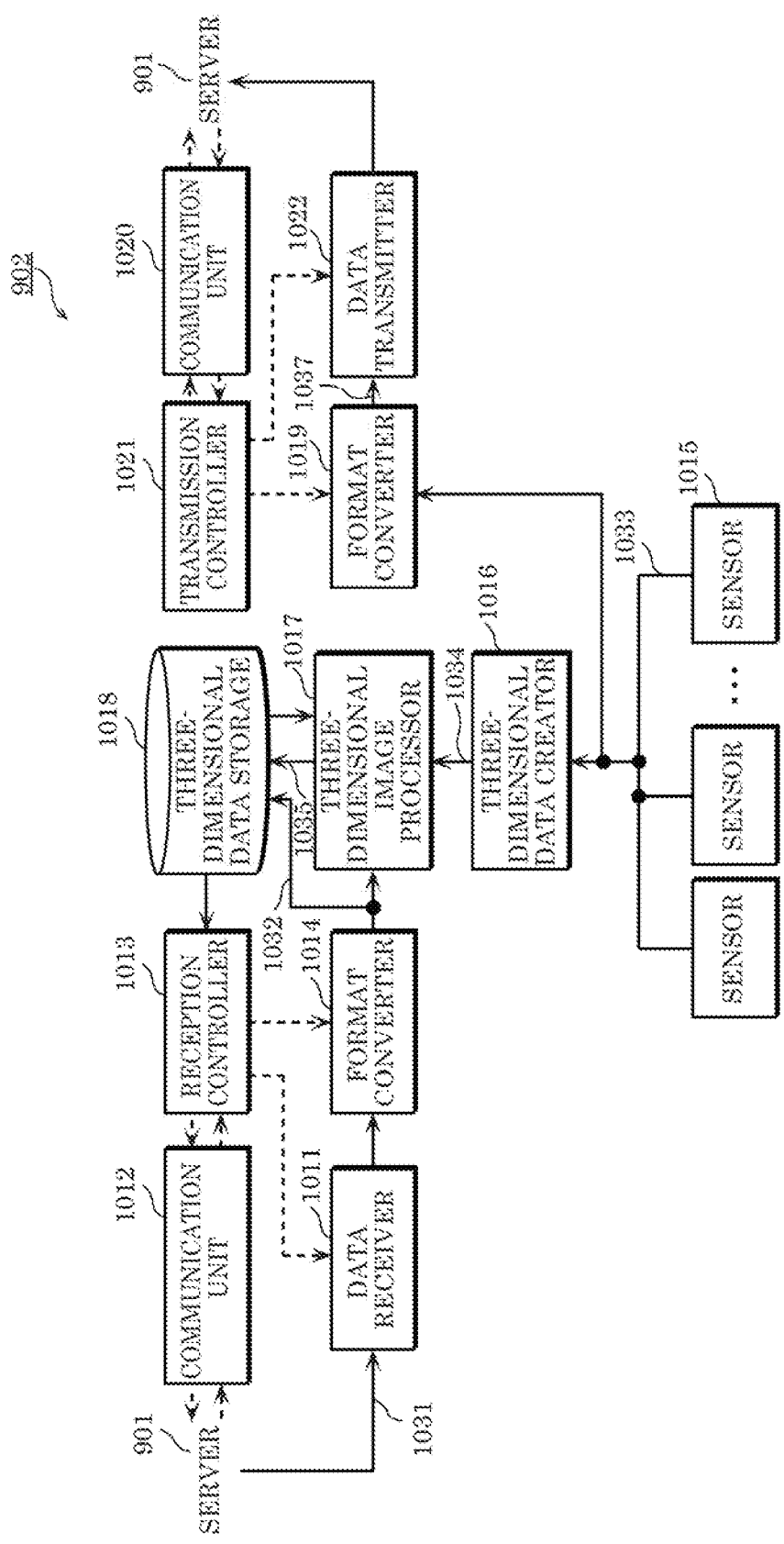
Figure 159:
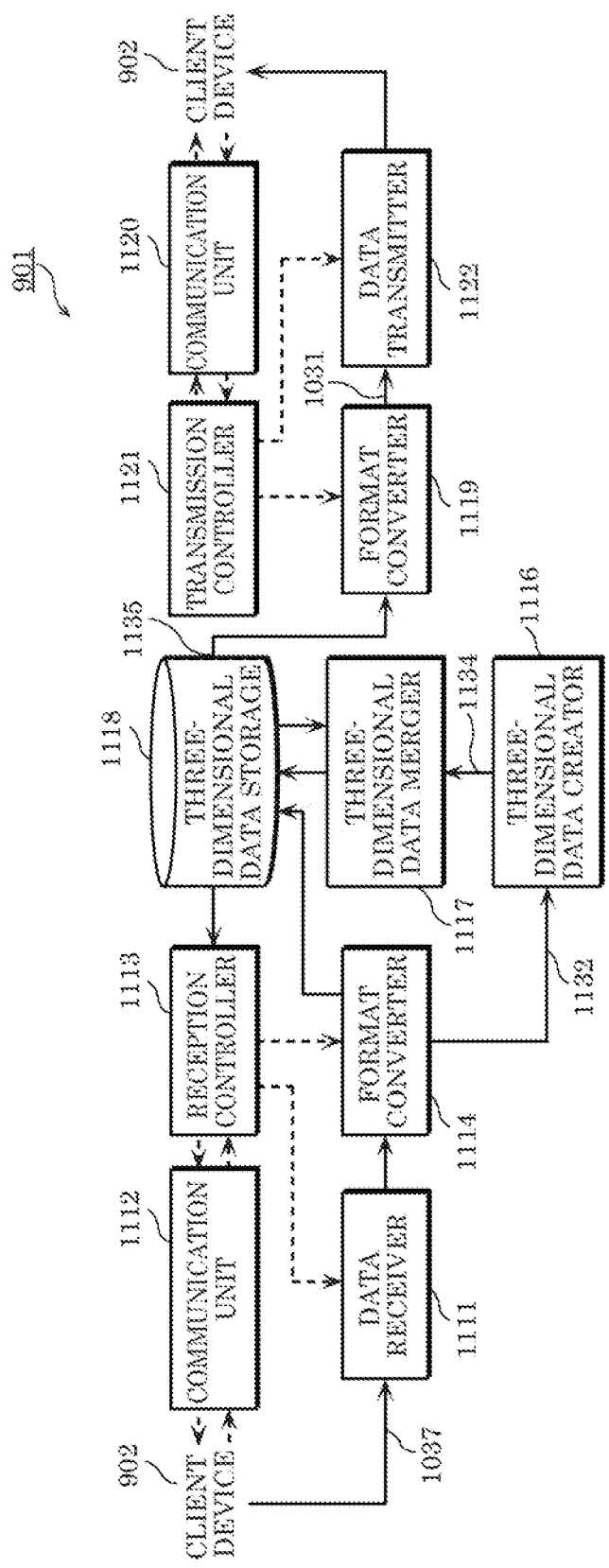
Figure 160:
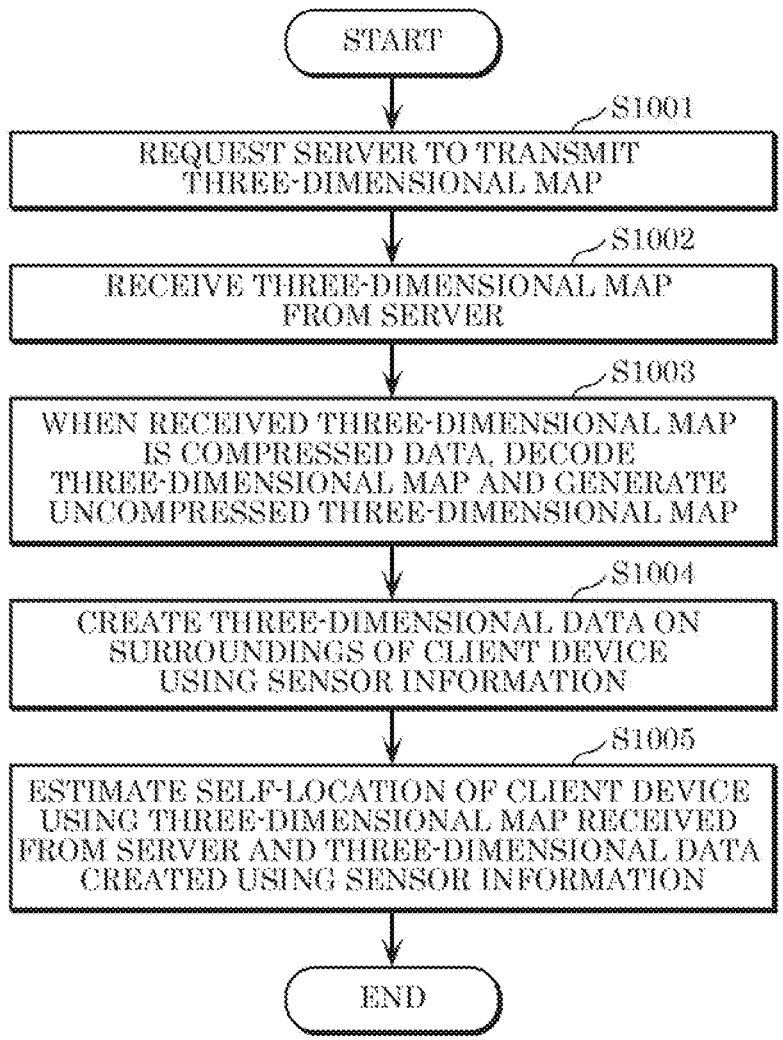
Figure 161:
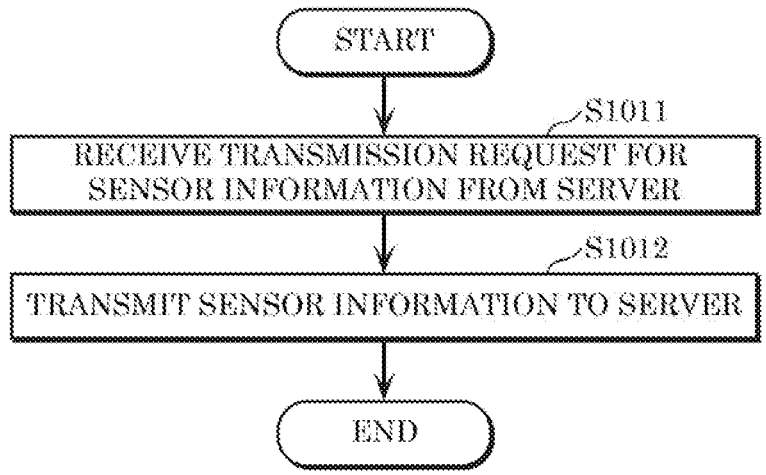
Figure 162:
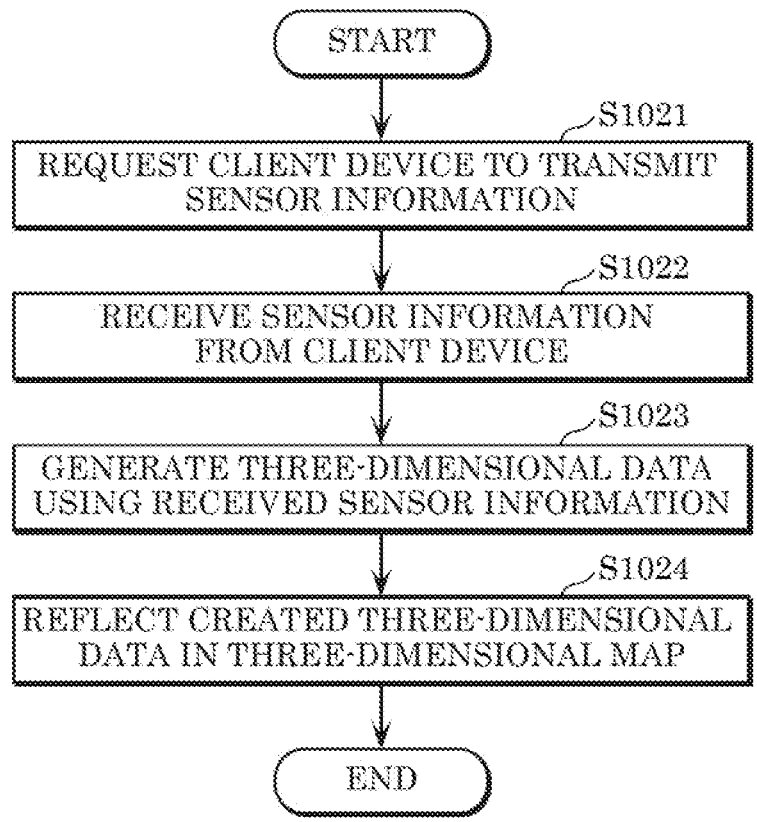
Figure 163:
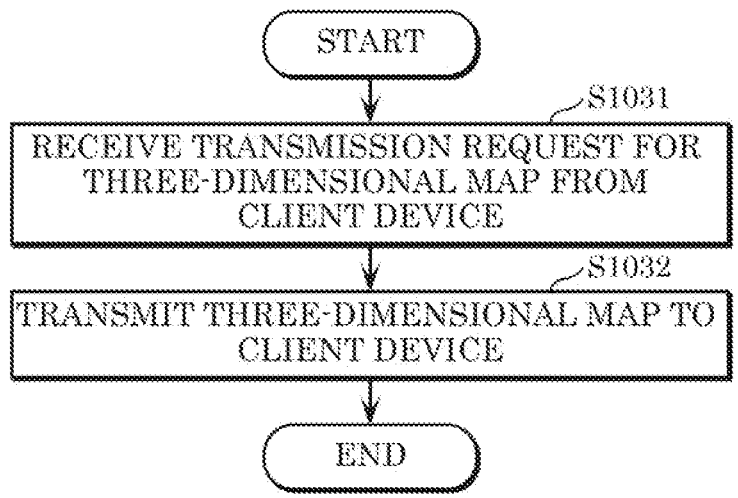
Figure 164:
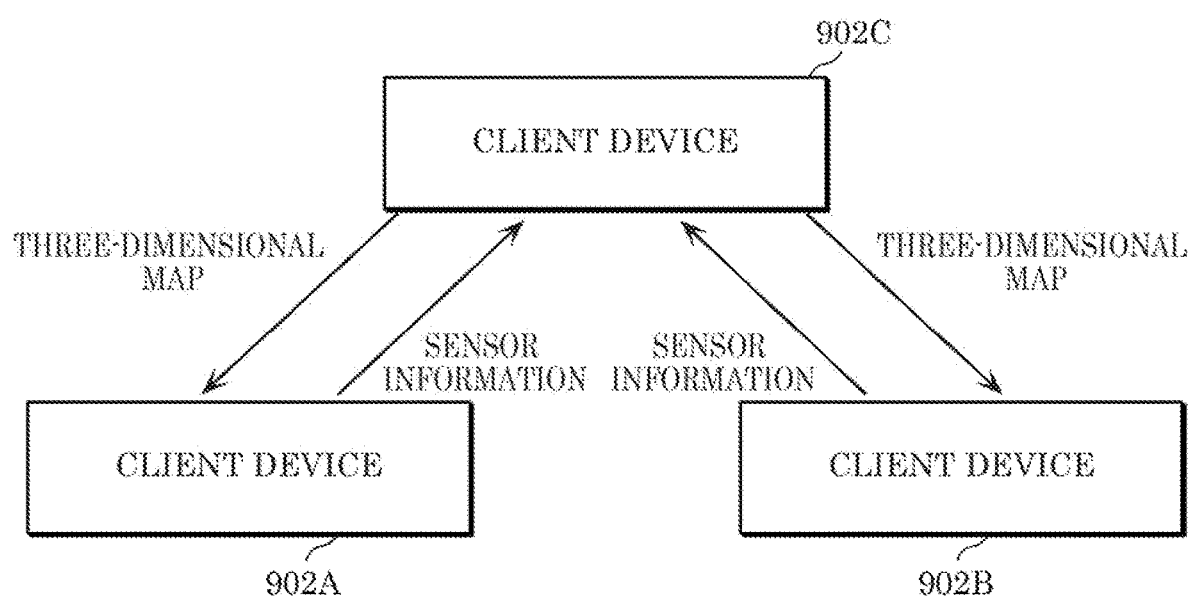
Figure 165:
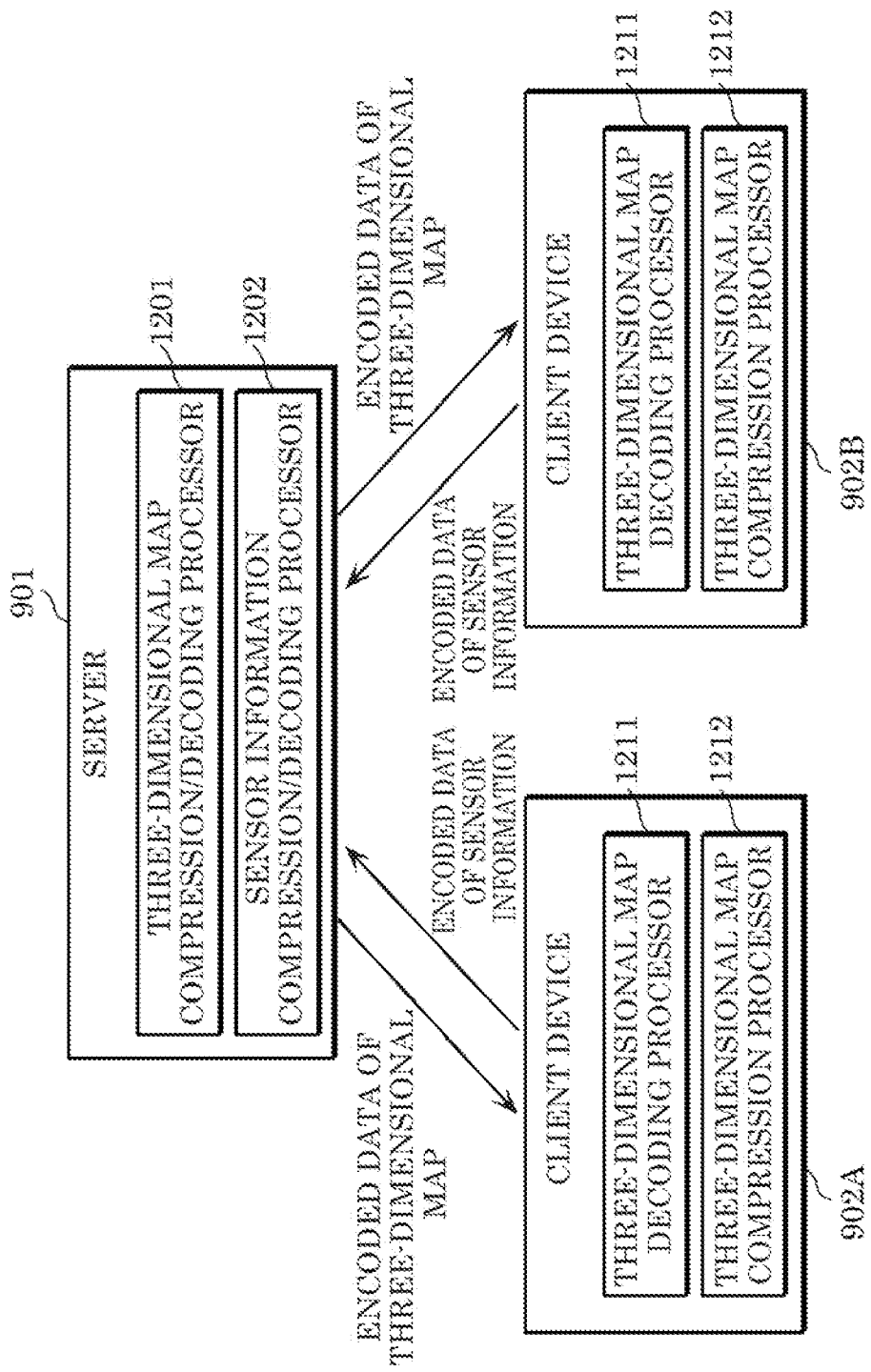
Figure 166:
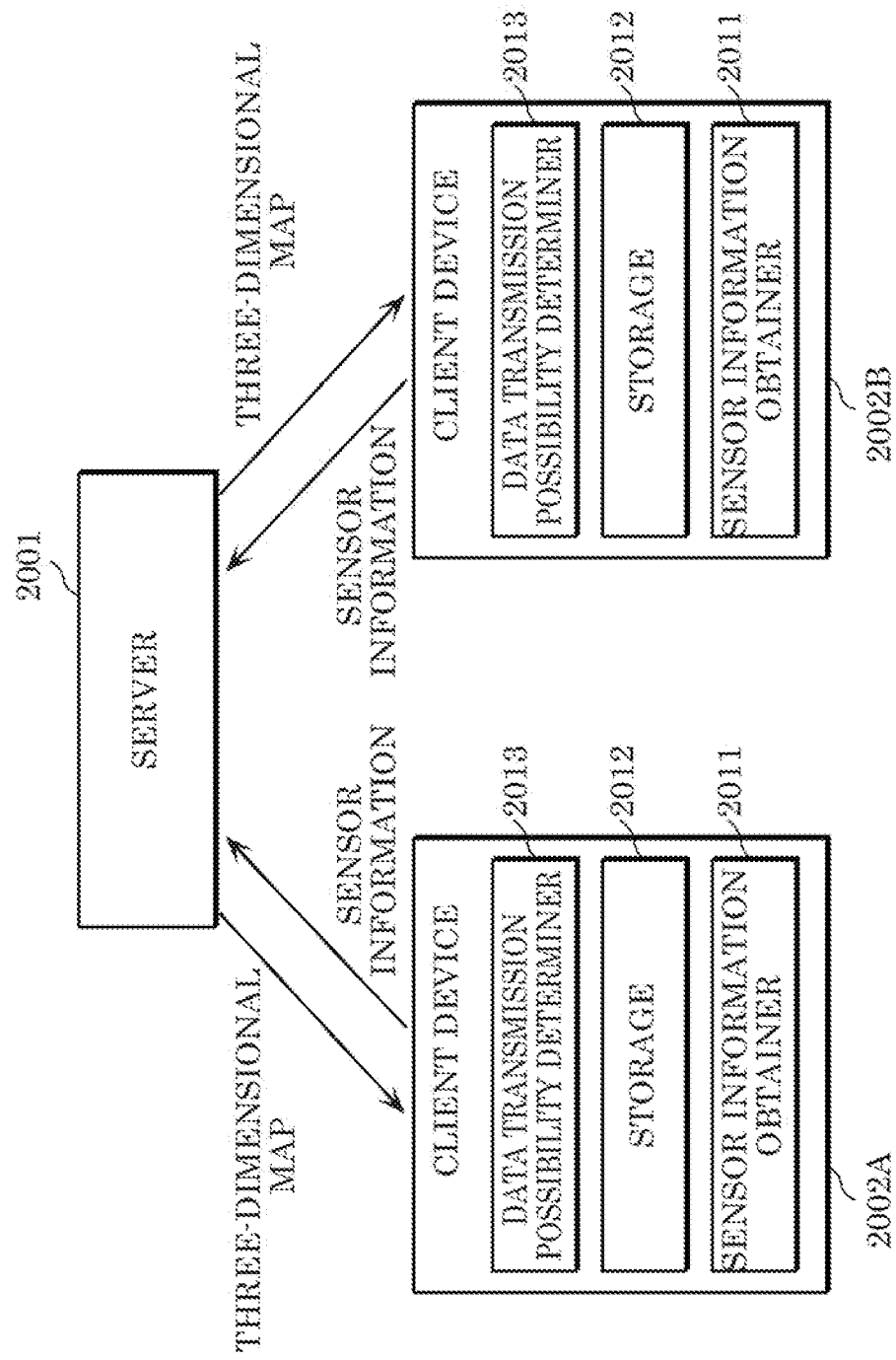
Figure 167:
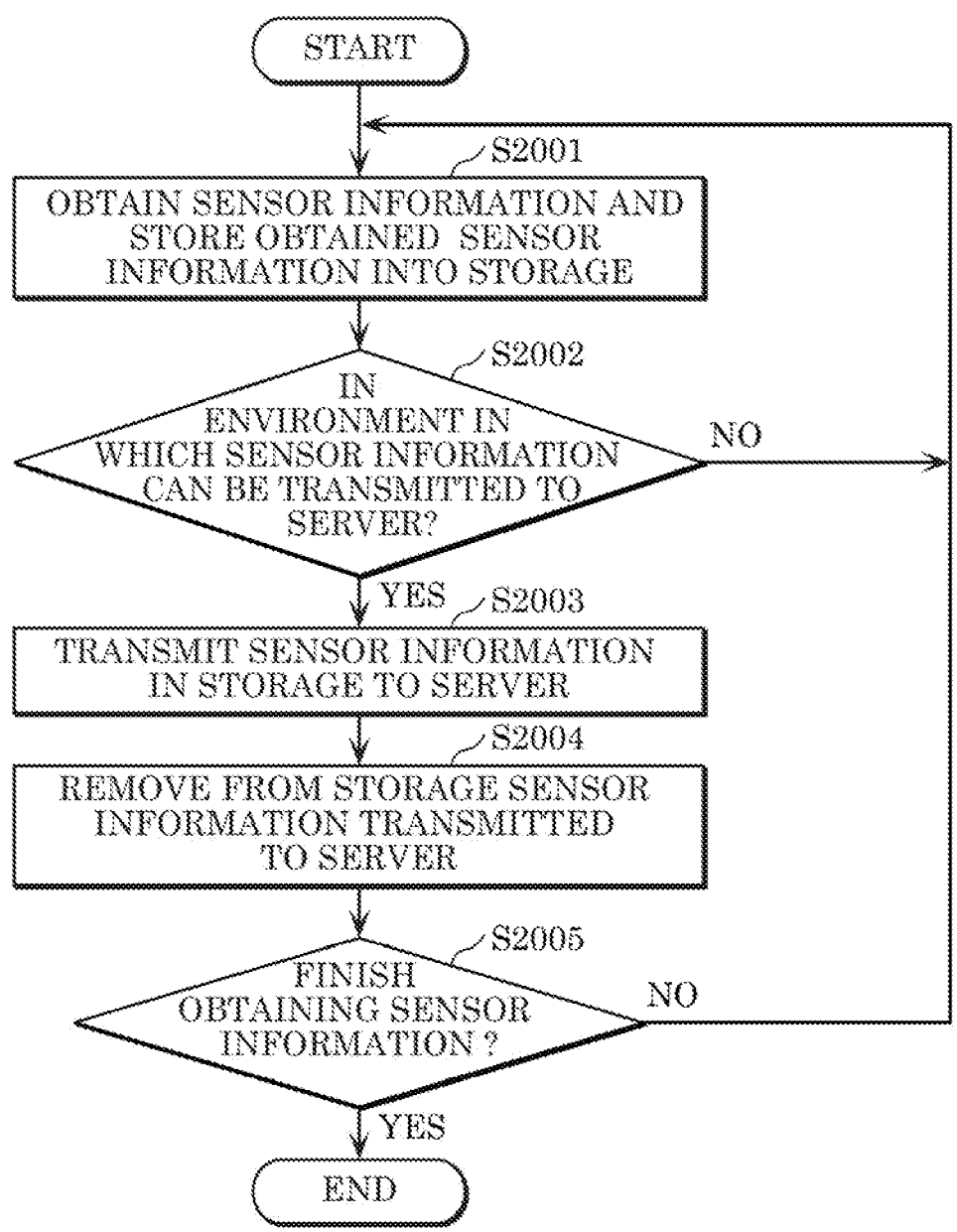
Figure 168:
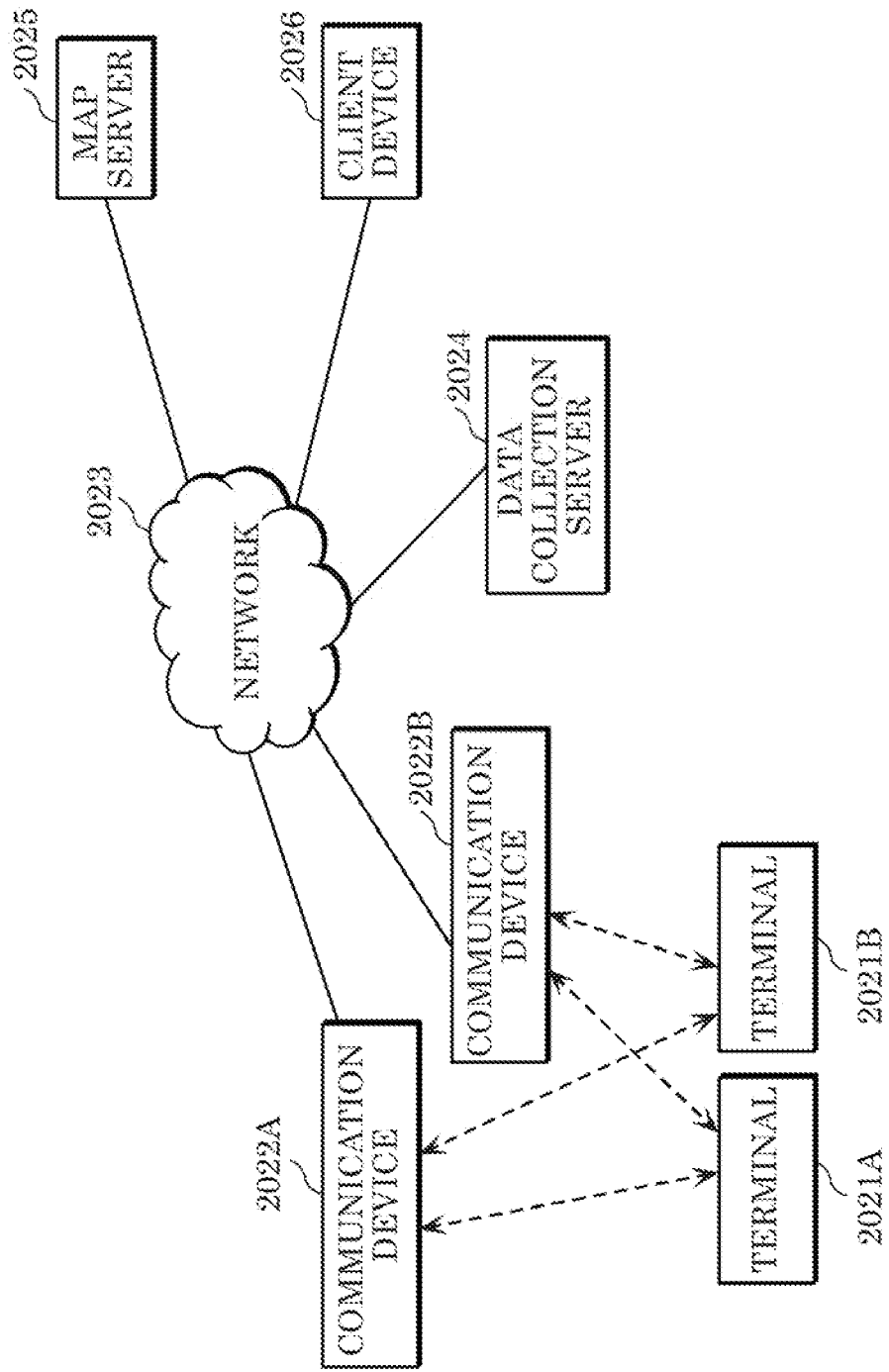
Figure 169:
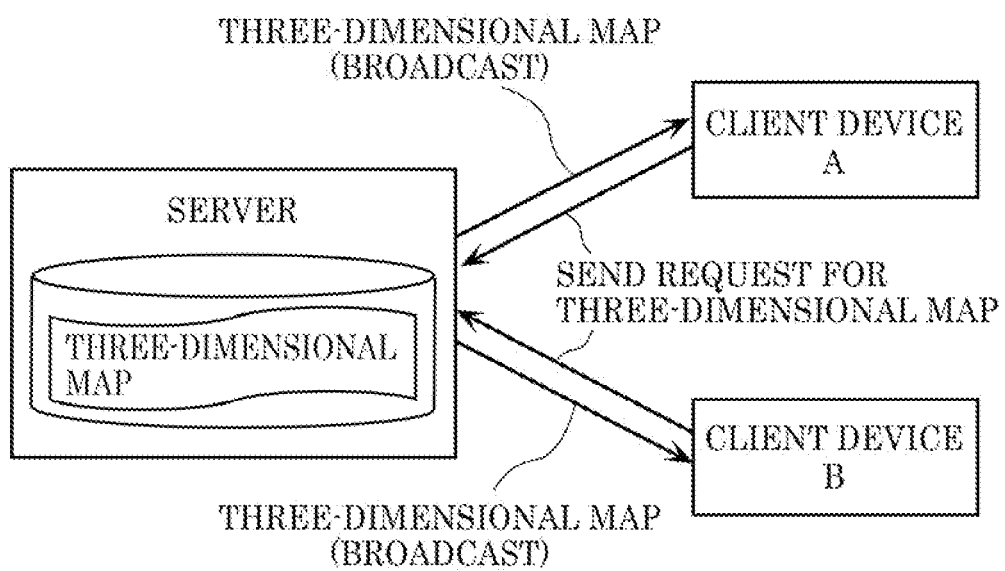
Figure 170:
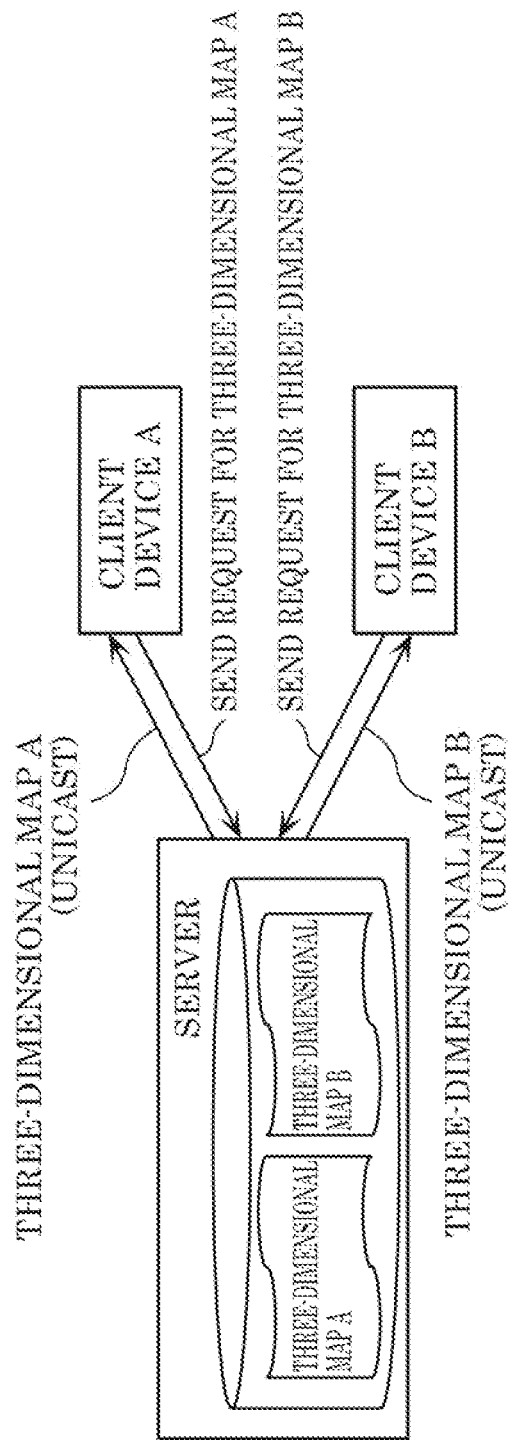
Figure 171:
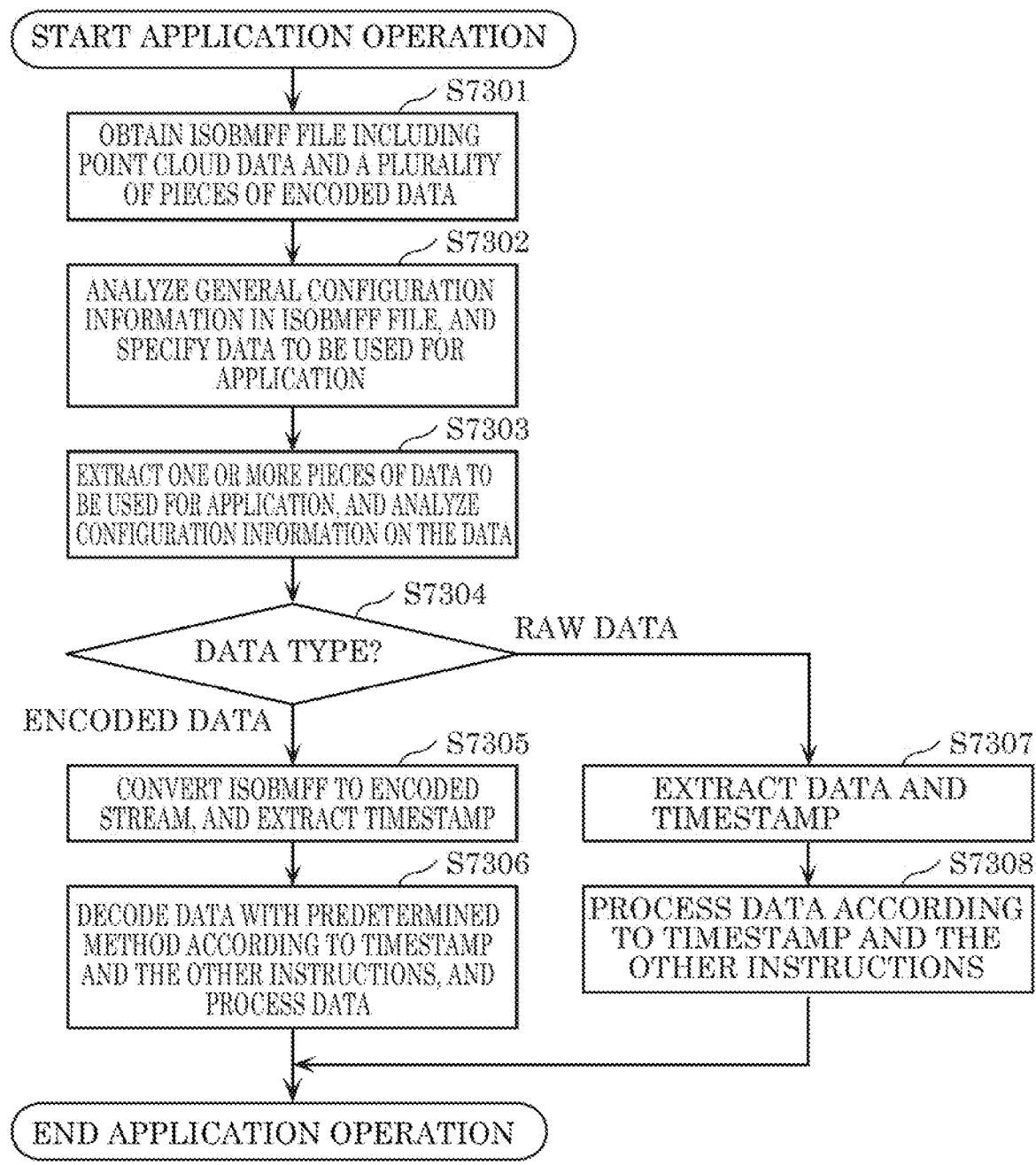
Figure 172:
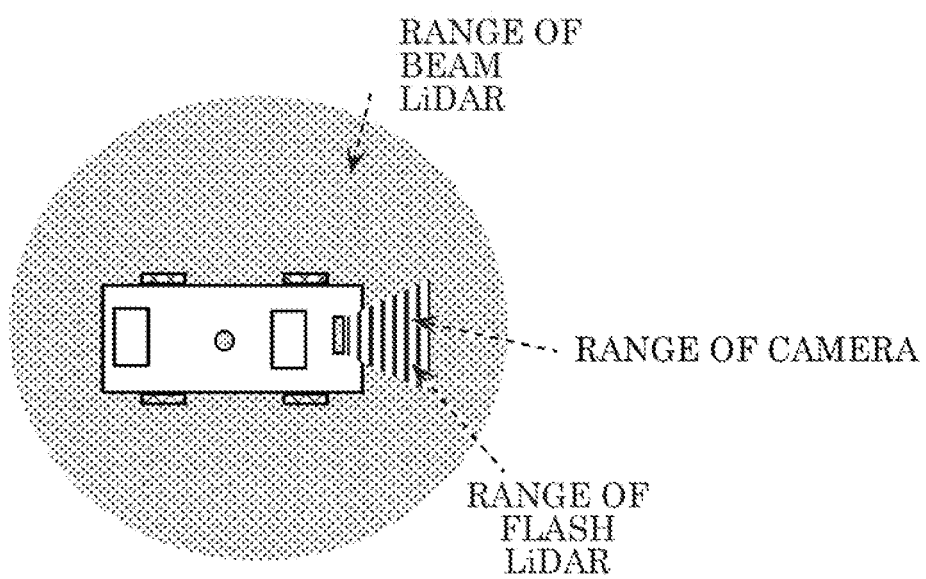
Figure 173:
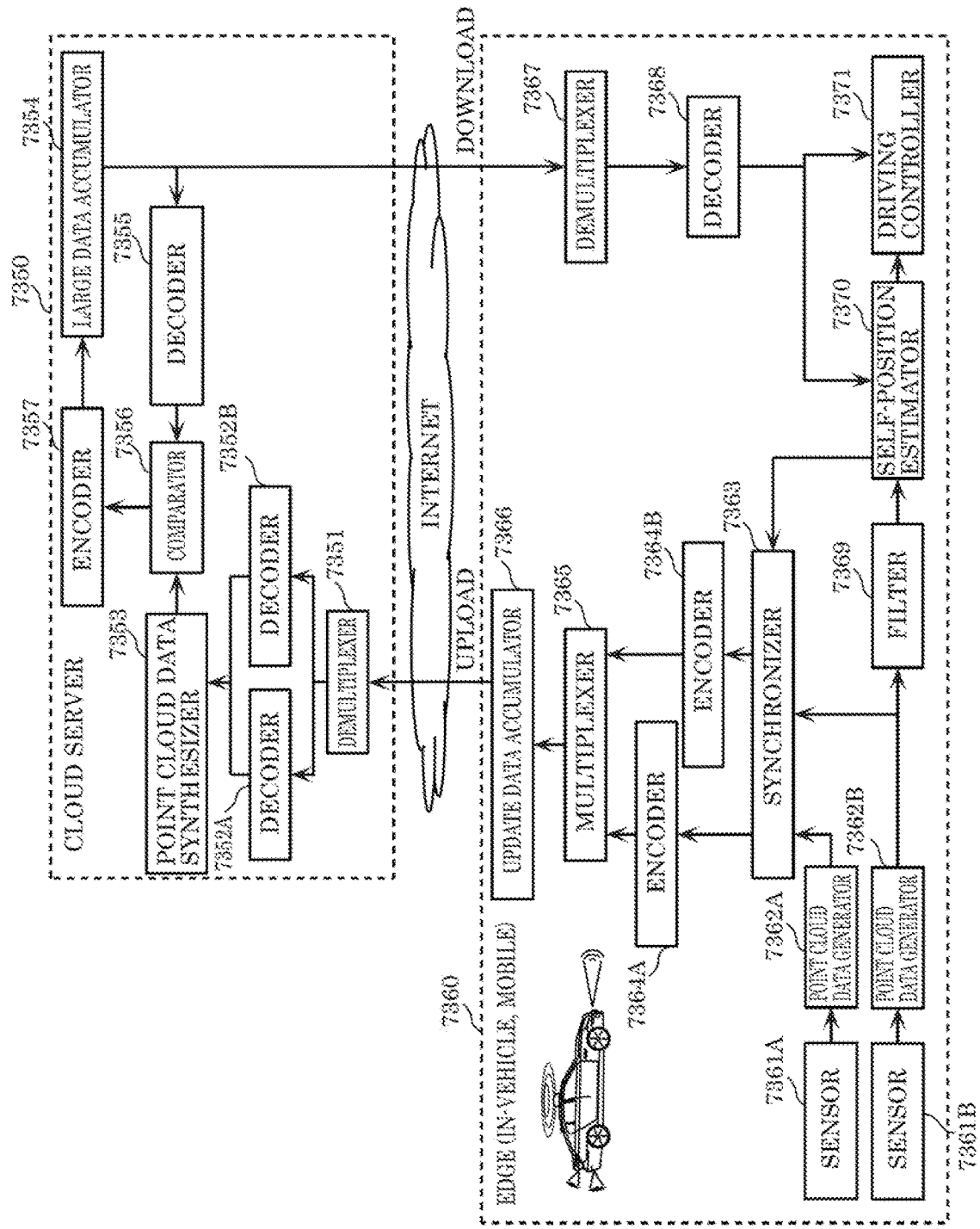
Figure 174:
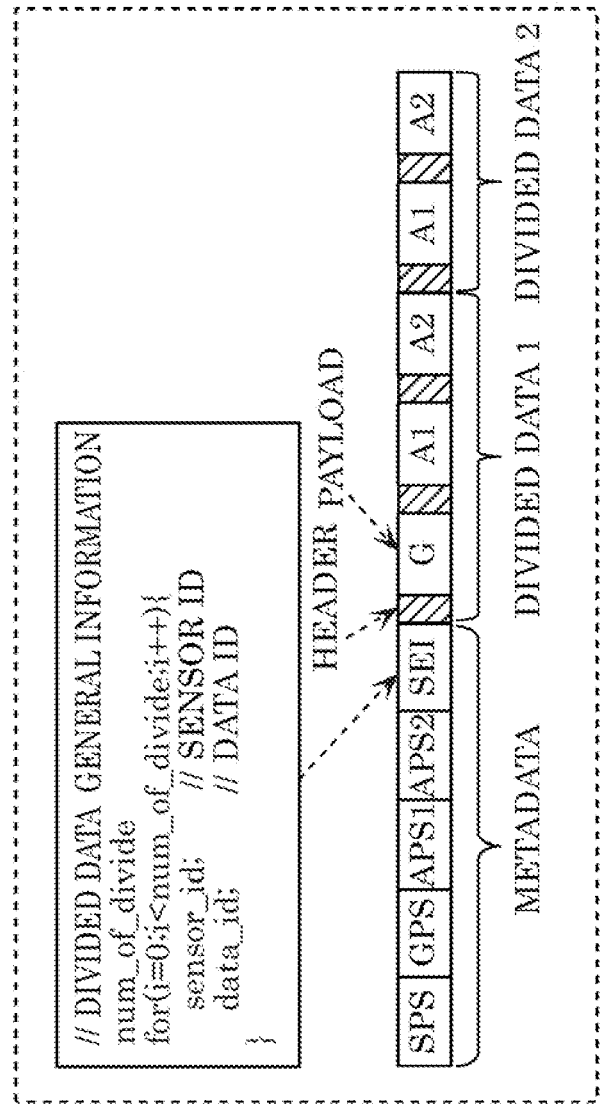
Figure 175:
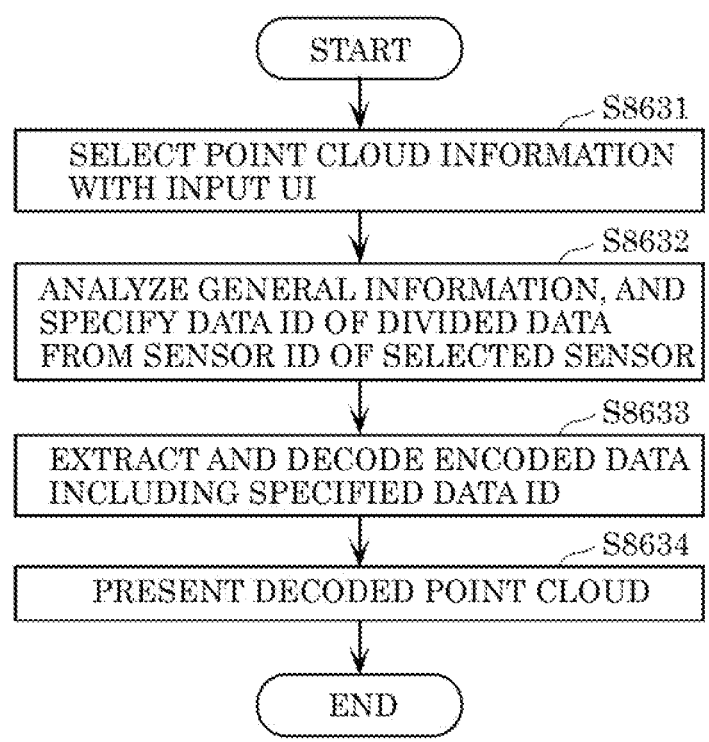
Figure 176:
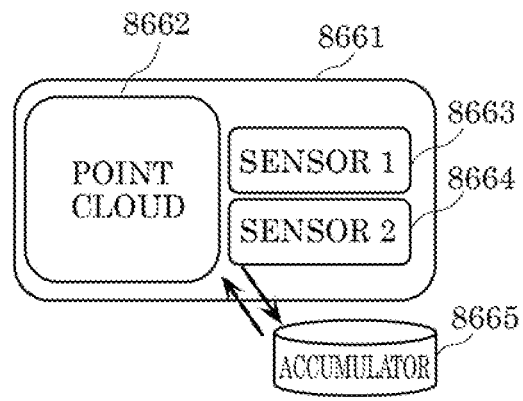
Figure 177:
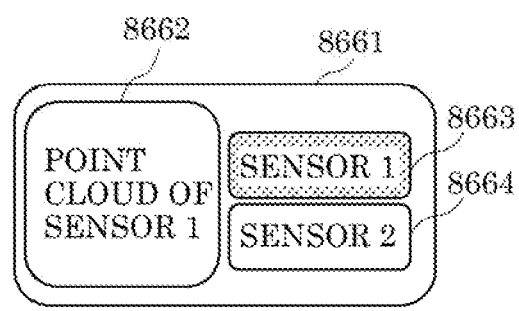
Figure 178:
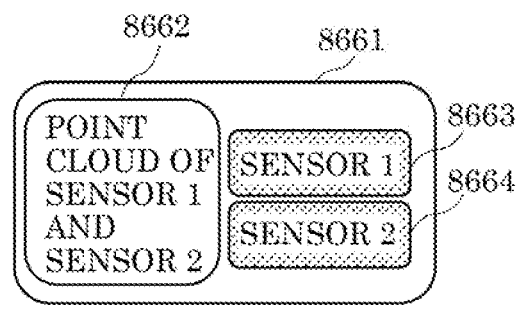

FIG. 131 is a diagram showing an example of levels to be decoded according to Embodiment 7;

FIG. 132 is a diagram showing a syntax example of a slice header of geometry information according to Embodiment 7;

FIG. 133 is a flowchart of a three-dimensional data encoding process according to Embodiment 7;

FIG. 134 is a flowchart of a three-dimensional data decoding process according to Embodiment 7;

FIG. 135 is a diagram showing an example of point cloud data according to Embodiment 7;

FIG. 136 is a diagram showing an example of point cloud data according to Embodiment 7;

FIG. 137 is a diagram showing an example configuration of a system according to Embodiment 7;

FIG. 138 is a diagram showing an example configuration of a system according to Embodiment 7;

FIG. 139 is a diagram showing an example configuration of a system according to Embodiment 7;

FIG. 140 is a diagram showing an example configuration of a system according to Embodiment 7;

FIG. 141 is a diagram showing an example configuration of a bitstream according to Embodiment 7;

FIG. 142 is a diagram showing an example configuration of a three-dimensional data encoding device according to Embodiment 7;

FIG. 143 is a diagram showing an example configuration of a three-dimensional data decoding device according to Embodiment 7;

FIG. 144 is a diagram showing a basic structure of ISOBMFF according to Embodiment 7;

FIG. 145 is a diagram showing a protocol stack in a case where a common PCC codec NAL unit is stored in ISOBMFF according to Embodiment 7;

FIG. 146 is a diagram showing an example of a transform of a bitstream into a file format according to Embodiment 7;

FIG. 147 is a diagram showing a syntax example of slice information according to Embodiment 7;

FIG. 148 is a diagram showing a syntax example of a PCC random access table according to Embodiment 7;

FIG. 149 is a diagram showing a syntax example of the PCC random access table according to Embodiment 7;

FIG. 150 is a diagram showing a syntax example of the PCC random access table according to Embodiment 7;

FIG. 151 is a flowchart of a three-dimensional data encoding process according to embodiment 7;

FIG. 152 is a flowchart of a three-dimensional data decoding process according to embodiment 7;

FIG. 153 is a flowchart of a three-dimensional data encoding process according to embodiment 7;

FIG. 154 is a flowchart of a three-dimensional data decoding process according to embodiment 7;

FIG. 155 is a block diagram of a three-dimensional data creation device according to Embodiment 8;

FIG. 156 is a flowchart of a three-dimensional data creation method according to Embodiment 8;

FIG. 157 is a diagram showing a structure of a system according to Embodiment 8;

FIG. 158 is a block diagram of a client device according to Embodiment 8;

FIG. 159 is a block diagram of a server according to Embodiment 8;

FIG. 160 is a flowchart of a three-dimensional data creation process performed by the client device according to Embodiment 8;

FIG. 161 is a flowchart of a sensor information transmission process performed by the client device according to Embodiment 8;

FIG. 162 is a flowchart of a three-dimensional data creation process performed by the server according to Embodiment 8;

FIG. 163 is a flowchart of a three-dimensional map transmission process performed by the server according to Embodiment 8;

FIG. 164 is a diagram showing a structure of a variation of the system according to Embodiment 8;

FIG. 165 is a diagram showing a structure of the server and client devices according to Embodiment 8;

FIG. 166 is a diagram illustrating a configuration of a server and a client device according to Embodiment 8;

FIG. 167 is a flowchart of a process performed by the client device according to Embodiment 8;

FIG. 168 is a diagram illustrating a configuration of a sensor information collection system according to Embodiment 8;

FIG. 169 is a diagram illustrating an example of a system according to Embodiment 8;

FIG. 170 is a diagram illustrating a variation of the system according to Embodiment 8;

FIG. 171 is a flowchart illustrating an example of an application process according to Embodiment 8;

FIG. 172 is a diagram illustrating the sensor range of various sensors according to Embodiment 8;

FIG. 173 is a diagram illustrating a configuration example of an automated driving system according to Embodiment 8;

FIG. 174 is a diagram illustrating a configuration example of a bitstream according to Embodiment 8;

FIG. 175 is a flowchart of a point cloud selection process according to Embodiment 8;

FIG. 176 is a diagram illustrating a screen example for point cloud selection process according to Embodiment 8;

FIG. 177 is a diagram illustrating a screen example of the point cloud selection process according to Embodiment 8; and FIG. 178 is a diagram illustrating a screen example of the point cloud selection process according to Embodiment 8.

DETAILED DESCRIPTION OF THE EMBODIMENTS

In accordance with an aspect of the present disclosure, a three-dimensional data encoding method includes: encoding, for each of three-dimensional points included in point cloud data, geometry information and one or more items of attribute information to generate a bitstream, wherein in the encoding, a normal vector of each of the three-dimensional points is encoded as an item of attribute information included in the one or more items of attribute information of the three-dimensional point.

According to this three-dimensional data encoding method, a normal vector is encoded as attribute information and therefore can be processed in the same manner as other attribute information. Therefore, according to the three-dimensional data encoding method, the processing amount can be reduced.

For example, it is possible that the encoding includes: transforming the normal vector represented by a floating point to an integer; and encoding the integer.

According to this three-dimensional data encoding method, the normal vector can be processed in the same manner as other attribute information represented by an integer.

For example, it is also possible that the bitstream includes control information shared by the geometry information and the one or more items of attribute information, the control information includes at least one of information indicating that the item of attribute information included in the one or more items of attribute information indicates the normal vector; or information indicating that the normal vector is data including three elements for each of the three-dimensional points.

In accordance with an aspect of the present disclosure, a three-dimensional data encoding method includes: dividing point cloud data into items of divided data; and encoding the items of divided data to generate a bitstream, wherein the bitstream includes information indicating a normal vector of each of the items of divided data.

According to this three-dimensional data encoding method, by encoding a normal vector for each item of divisional data, the processing amount and the code amount can be reduced compared with the case where a normal vector is encoded for each point.

For example, it is possible that each of the items of divided data is a random access unit.

In accordance with still another aspect of the present disclosure, a three-dimensional data decoding method includes: obtaining a bitstream, the bitstream being generated by encoding, for each of three-dimensional points included in point cloud data, geometry information and one or more items of attribute information, the bitstream including, for each of the three-dimensional points, a normal vector encoded as an item of attribute information included in the one or more items of attribute information of the three-dimensional point, wherein obtaining the normal vector by decoding the item of attribute information from the bitstream.

According to this three-dimensional data decoding method, a normal vector is decoded as attribute information and therefore can be processed in the same manner as other attribute information. Therefore, according to this three-dimensional data decoding method, the processing amount can be reduced.

For example, it is possible that in the obtaining of the normal vector, the normal vector which is represented by an integer is obtained.

According to this three-dimensional data decoding method, the normal vector can be processed in the same manner as other attribute information represented by an integer.

For example, it is also possible that the bitstream includes control information shared by the geometry information and the one or more items of attribute information, the control information includes at least one of information indicating that the item of attribute information included in the one or more items of attribute information indicates the normal vector; or information indicating that the normal vector is data including three elements for each of the three-dimensional points.

In accordance with still another aspect of the present disclosure, a three-dimensional data decoding method includes: obtaining a bitstream generated by encoding items of divided data generated by dividing point cloud data; and obtaining, from the bitstream, information indicating a normal vector of each of the items of divided data.

According to this three-dimensional data decoding method, by decoding a normal vector for each item of divisional data, the processing amount can be reduced compared with the case where a normal vector is decoded for each point.

For example, it is possible that each of the items of divided data is a random access unit.

For example, it is also possible that the three-dimensional data decoding method further includes: determining a current item of divided data to be decoded from among the items of divided data in accordance with the normal vector; and decoding the current item of divided data.

For example, it is further possible that the three-dimensional data decoding method further includes: determining a decoding order of the items of divided data in accordance with the normal vector; and decoding the items of divided data in the decoding order determined.

In accordance with still another aspect of the present disclosure, a three-dimensional data encoding device includes: a processor; and memory, wherein using the memory, the processor: encodes, for each of three-dimensional points included in point cloud data, geometry information and one or more items of attribute information to generate a bitstream, wherein in the encoding, a normal vector of each of the three-dimensional points is encoded as an item of attribute information included in the one or more items of attribute information of the three-dimensional point.

With this configuration, the three-dimensional data encoding device encodes a normal vector as attribute information and therefore can process the normal vector in the same manner as other attribute information. Therefore, the three-dimensional data encoding device can reduce the processing amount.

In accordance with still another aspect of the present disclosure, a three-dimensional data encoding device includes: a processor; and memory, wherein using the memory, the processor: divides point cloud data into items of divided data; and encodes the items of divided data to generate a bitstream, wherein the bitstream includes information indicating a normal vector of each of the items of divided data.

With this configuration, by encoding a normal vector for each item of divisional data, the three-dimensional data encoding device can reduce the processing amount and the code amount compared with the case where a normal vector is encoded for each point.

In accordance with still another aspect of the present disclosure, a three-dimensional data decoding device includes: a processor; and memory, wherein using the memory, the processor: obtains a bitstream, the bitstream being generated by encoding, for each of three-dimensional points included in point cloud data, geometry information and one or more items of attribute information, the bitstream including, for each of the three-dimensional points, a normal vector encoded as an item of attribute information included in the one or more items of attribute information of the three-dimensional point, wherein obtains the normal vector by decoding the item of attribute information from the bitstream.

With this configuration, the three-dimensional data decoding device decodes a normal vector as attribute information and therefore can process the normal vector in the same manner as other attribute information. Therefore, the three-dimensional data decoding device can reduce the processing amount.

In accordance with still another aspect of the present disclosure, a three-dimensional data decoding device includes: a processor; and memory, wherein using the memory, the processor: obtains a bitstream generated by encoding items of divided data generated by dividing point cloud data; and obtains, from the bitstream, information indicating a normal vector of each of the items of divided data.

With this configuration, by decoding a normal vector for each item of divisional data, the three-dimensional data decoding device can reduce the processing amount compared with the case where a normal vector is decoded for each point.

Note that these general or specific aspects may be implemented as a system, a method, an integrated circuit, a computer program, or a computer-readable recording medium such as a compact disc read only memory (CD-ROM), or may be implemented as any combination of a system, a method, an integrated circuit, a computer program, and a recording medium.

The following describes embodiments with reference to the drawings. Note that the following embodiments show exemplary embodiments of the present disclosure. The numerical values, shapes, materials, structural components, the arrangement and connection of the structural components, steps, the processing order of the steps, etc. shown in the following embodiments are mere examples, and thus are not intended to limit the present disclosure. Of the structural components described in the following embodiments, structural components not recited in any one of the independent claims that indicate the broadest concepts will be described as optional structural components.

Embodiment 1

When using encoded data of a point cloud in a device or for a service in practice, required information for the application is desirably transmitted and received in order to reduce the network bandwidth. However, conventional encoding structures for three-dimensional data have no such a function, and there is also no encoding method for such a function.

Embodiment 1 described below relates to a three-dimensional data encoding method and a three-dimensional data encoding device for encoded data of a three-dimensional point cloud that provides a function of transmitting and receiving required information for an application, a three-dimensional data decoding method and a three-dimensional data decoding device for decoding the encoded data, a three-dimensional data multiplexing method for multiplexing the encoded data, and a three-dimensional data transmission method for transmitting the encoded data.

In particular, at present, a first encoding method and a second encoding method are under investigation as encoding methods (encoding schemes) for point cloud data. However, there is no method defined for storing the configuration of encoded data and the encoded data in a system format. Thus, there is a problem that an encoder cannot perform an MUX process (multiplexing), transmission, or accumulation of data.

In addition, there is no method for supporting a format that involves two codecs, the first encoding method and the second encoding method, such as point cloud compression (PCC).

With regard to this embodiment, a configuration of PCC-encoded data that involves two codecs, a first encoding method and a second encoding method, and a method of storing the encoded data in a system format will be described.

Figure 1:
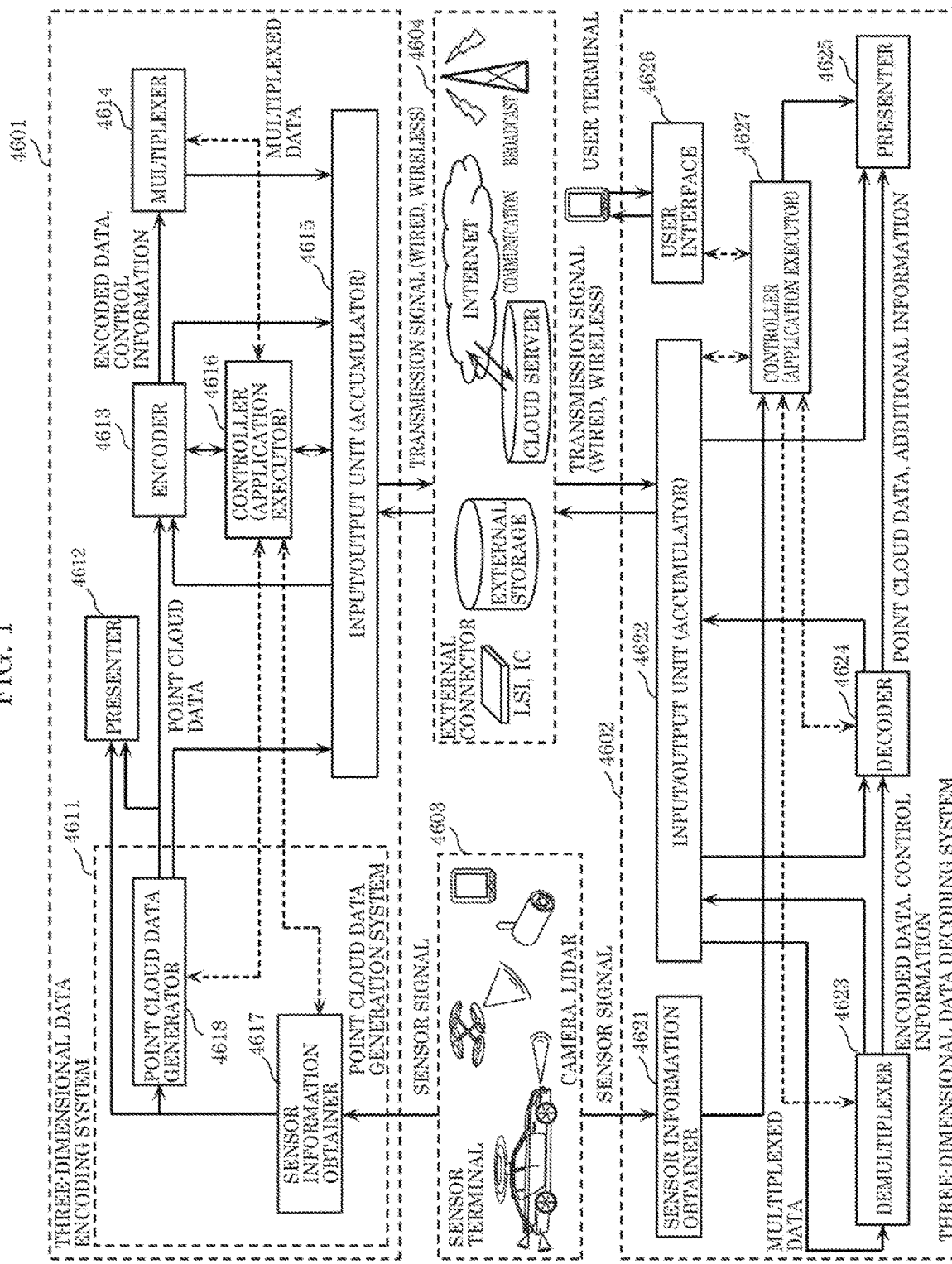
FIG. 1 is a diagram illustrating a configuration of a three-dimensional data encoding and decoding system according to Embodiment 1.

A configuration of a three-dimensional data (point cloud data) encoding and decoding system according to this embodiment will be first described. FIG. 1 is a diagram showing an example of a configuration of the three-dimensional data encoding and decoding system according to this embodiment. As shown in FIG. 1, the three-dimensional data encoding and decoding system includes three-dimensional data encoding system 4601, three-dimensional data decoding system 4602, sensor terminal 4603, and external connector 4604.

Three-dimensional data encoding system 4601 generates encoded data or multiplexed data by encoding point cloud data, which is three-dimensional data. Three-dimensional data encoding system 4601 may be a three-dimensional data encoding device implemented by a single device or a system implemented by a plurality of devices. The three-dimensional data encoding device may include a part of a plurality of processors included in three-dimensional data encoding system 4601.

Three-dimensional data encoding system 4601 includes point cloud data generation system 4611, presenter 4612, encoder 4613, multiplexer 4614, input/output unit 4615, and controller 4616. Point cloud data generation system 4611 includes sensor information obtainer 4617, and point cloud data generator 4618.

Sensor information obtainer 4617 obtains sensor information from sensor terminal 4603, and outputs the sensor information to point cloud data generator 4618. Point cloud data generator 4618 generates point cloud data from the sensor information, and outputs the point cloud data to encoder 4613.

Presenter 4612 presents the sensor information or point cloud data to a user. For example, presenter 4612 displays information or an image based on the sensor information or point cloud data.

Encoder 4613 encodes (compresses) the point cloud data, and outputs the resulting encoded data, control information (signaling information) obtained in the course of the encoding, and other additional information to multiplexer 4614. The additional information includes the sensor information, for example.

Multiplexer 4614 generates multiplexed data by multiplexing the encoded data, the control information, and the additional information input thereto from encoder 4613. A format of the multiplexed data is a file format for accumulation or a packet format for transmission, for example.

Input/output unit 4615 (a communication unit or interface, for example) outputs the multiplexed data to the outside. Alternatively, the multiplexed data may be accumulated in an accumulator, such as an internal memory. Controller 4616 (or an application executor) controls each processor. That is, controller 4616 controls the encoding, the multiplexing, or other processing.

Note that the sensor information may be input to encoder 4613 or multiplexer 4614. Alternatively, input/output unit 4615 may output the point cloud data or encoded data to the outside as it is.

A transmission signal (multiplexed data) output from three-dimensional data encoding system 4601 is input to three-dimensional data decoding system 4602 via external connector 4604.

Three-dimensional data decoding system 4602 generates point cloud data, which is three-dimensional data, by decoding the encoded data or multiplexed data. Note that three-dimensional data decoding system 4602 may be a three-dimensional data decoding device implemented by a single device or a system implemented by a plurality of devices. The three-dimensional data decoding device may include a part of a plurality of processors included in three-dimensional data decoding system 4602.

Three-dimensional data decoding system 4602 includes sensor information obtainer 4621, input/output unit 4622, demultiplexer 4623, decoder 4624, presenter 4625, user interface 4626, and controller 4627.

Sensor information obtainer 4621 obtains sensor information from sensor terminal 4603.

Input/output unit 4622 obtains the transmission signal, decodes the transmission signal into the multiplexed data (file format or packet), and outputs the multiplexed data to demultiplexer 4623.

Demultiplexer 4623 obtains the encoded data, the control information, and the additional information from the multiplexed data, and outputs the encoded data, the control information, and the additional information to decoder 4624.

Decoder 4624 reconstructs the point cloud data by decoding the encoded data.

Presenter 4625 presents the point cloud data to a user. For example, presenter 4625 displays information or an image based on the point cloud data. User interface 4626 obtains an indication based on a manipulation by the user. Controller 4627 (or an application executor) controls each processor. That is, controller 4627 controls the demultiplexing, the decoding, the presentation, or other processing.

Note that input/output unit 4622 may obtain the point cloud data or encoded data as it is from the outside. Presenter 4625 may obtain additional information, such as sensor information, and present information based on the additional information. Presenter 4625 may perform a presentation based on an indication from a user obtained on user interface 4626.

Sensor terminal 4603 generates sensor information, which is information obtained by a sensor. Sensor terminal 4603 is a terminal provided with a sensor or a camera. For example, sensor terminal 4603 is a mobile body, such as an automobile, a flying object, such as an aircraft, a mobile terminal, or a camera.

Sensor information that can be generated by sensor terminal 4603 includes (1) the distance between sensor terminal 4603 and an object or the reflectance of the object obtained by LiDAR, a millimeter wave radar, or an infrared sensor or (2) the distance between a camera and an object or the reflectance of the object obtained by a plurality of monocular camera images or a stereo-camera image, for example. The sensor information may include the posture, orientation, gyro (angular velocity), position (GPS information or altitude), velocity, or acceleration of the sensor, for example. The sensor information may include air temperature, air pressure, air humidity, or magnetism, for example.

External connector 4604 is implemented by an integrated circuit (LSI or IC), an external accumulator, communication with a cloud server via the Internet, or broadcasting, for example.

Figures 2, 3:
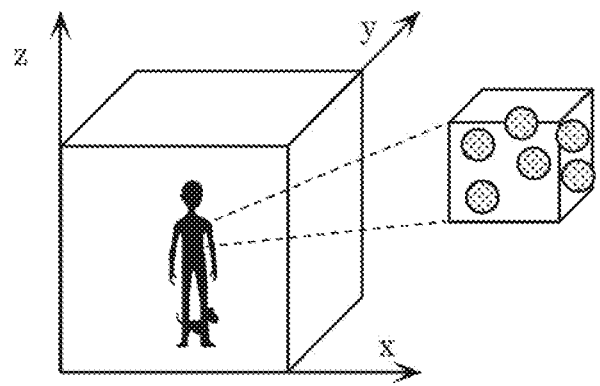
FIG. 2 is a diagram illustrating a structure example of point cloud data according to Embodiment 1.
FIG. 3 is a diagram illustrating a structure example of a data file indicating the point cloud data according to Embodiment 1.

Next, point cloud data will be described. FIG. 2 is a diagram showing a configuration of point cloud data. FIG. 3 is a diagram showing a configuration example of a data file describing information of the point cloud data.

Point cloud data includes data on a plurality of points. Data on each point includes geometry information (three-dimensional coordinates) and attribute information associated with the geometry information. A set of a plurality of such points is referred to as a point cloud. For example, a point cloud indicates a three-dimensional shape of an object.

Geometry information (position), such as three-dimensional coordinates, may be referred to as geometry. Data on each point may include attribute information (attribute) on a plurality of types of attributes. A type of attribute is color or reflectance, for example.

One item of attribute information (in other words, a piece of attribute information or an attribute information item) may be associated with one item of geometry information (in other words, a piece of geometry information or a geometry information item), or attribute information on a plurality of different types of attributes may be associated with one item of geometry information. Alternatively, items of attribute information on the same type of attribute may be associated with one item of geometry information.

The configuration example of a data file shown in FIG. 3 is an example in which geometry information and attribute information are associated with each other in a one-to-one relationship, and geometry information and attribute information on N points forming point cloud data are shown.

The geometry information is information on three axes, specifically, an x-axis, a y-axis, and a z-axis, for example. The attribute information is RGB color information, for example. A representative data file is ply file, for example.

Figure 4:
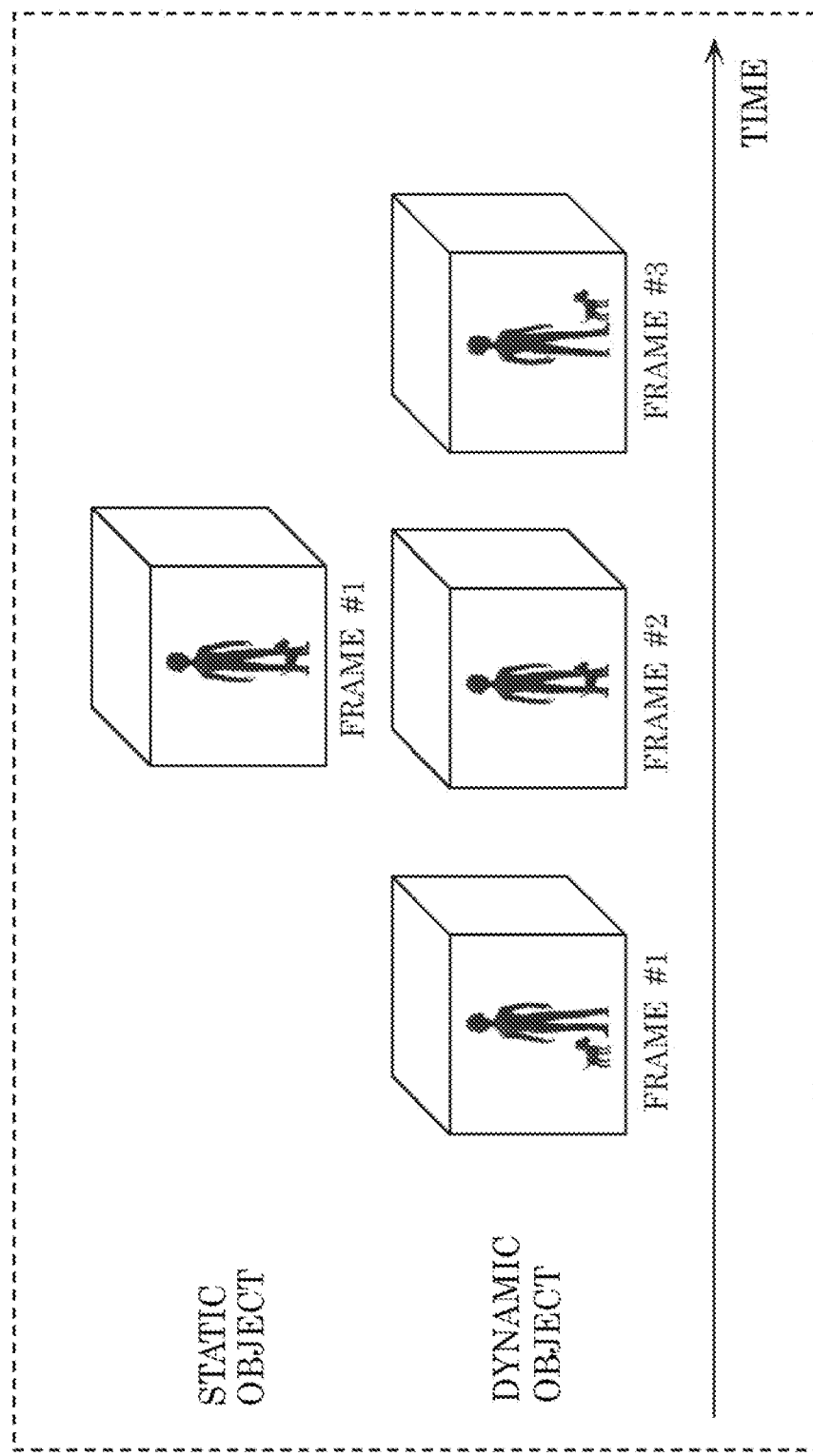
FIG. 4 is a diagram illustrating types of the point cloud data according to Embodiment 1.

Next, types of point cloud data will be described. FIG. 4 is a diagram showing types of point cloud data. As shown in FIG. 4, point cloud data includes a static object and a dynamic object.

The static object is three-dimensional point cloud data at an arbitrary time (a time point). The dynamic object is three-dimensional point cloud data that varies with time. In the following, three-dimensional point cloud data associated with a time point will be referred to as a PCC frame or a frame.

The object may be a point cloud whose range is limited to some extent, such as ordinary video data, or may be a large point cloud whose range is not limited, such as map information.

There are point cloud data having varying densities. There may be sparse point cloud data and dense point cloud data.

In the following, each processor will be described in detail. Sensor information is obtained by various means, including a distance sensor such as LiDAR or a range finder, a stereo camera, or a combination of a plurality of monocular cameras. Point cloud data generator 4618 generates point cloud data based on the sensor information obtained by sensor information obtainer 4617. Point cloud data generator 4618 generates geometry information as point cloud data, and adds attribute information associated with the geometry information to the geometry information.

When generating geometry information or adding attribute information, point cloud data generator 4618 may process the point cloud data. For example, point cloud data generator 4618 may reduce the data amount by omitting a point cloud whose position coincides with the position of another point cloud. Point cloud data generator 4618 may also convert the geometry information (such as shifting, rotating or normalizing the position) or render the attribute information.

Note that, although FIG. 1 shows point cloud data generation system 4611 as being included in three-dimensional data encoding system 4601, point cloud data generation system 4611 may be independently provided outside three-dimensional data encoding system 4601.

Encoder 4613 generates encoded data by encoding point cloud data according to an encoding method previously defined. In general, there are the two types of encoding methods described below. One is an encoding method using geometry information, which will be referred to as a first encoding method, hereinafter. The other is an encoding method using a video codec, which will be referred to as a second encoding method, hereinafter.

Decoder 4624 decodes the encoded data into the point cloud data using the encoding method previously defined.

Multiplexer 4614 generates multiplexed data by multiplexing the encoded data in an existing multiplexing method. The generated multiplexed data is transmitted or accumulated. Multiplexer 4614 multiplexes not only the PCC-encoded data but also another medium, such as a video, an audio, subtitles, an application, or a file, or reference time information. Multiplexer 4614 may further multiplex attribute information associated with sensor information or point cloud data.

Multiplexing schemes or file formats include ISOBMFF, MPEG-DASH, which is a transmission scheme based on ISOBMFF, MMT, MPEG-2 TS Systems, or RMP, for example.

Demultiplexer 4623 extracts PCC-encoded data, other media, time information and the like from the multiplexed data.

Input/output unit 4615 transmits the multiplexed data in a method suitable for the transmission medium or accumulation medium, such as broadcasting or communication. Input/output unit 4615 may communicate with another device over the Internet or communicate with an accumulator, such as a cloud server.

As a communication protocol, http, ftp, TCP, UDP or the like is used. The pull communication scheme or the push communication scheme can be used.

A wired transmission or a wireless transmission can be used. For the wired transmission, Ethernet (registered trademark), USB, RS-232C, HDMI (registered trademark), or a coaxial cable is used, for example. For the wireless transmission, wireless LAN, Wi-Fi (registered trademark), Bluetooth (registered trademark), or a millimeter wave is used, for example.

As a broadcasting scheme, DVB-T2, DVB-S2, DVB-C2, ATSC3.0, or ISDB-S3 is used, for example.

Figure 5:
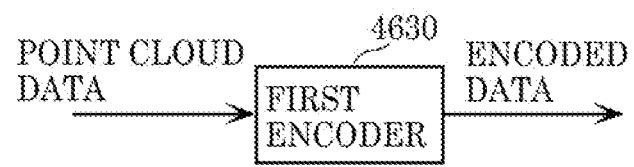
FIG. 5 is a diagram illustrating a structure of a first encoder according to Embodiment 1.
Figure 6:
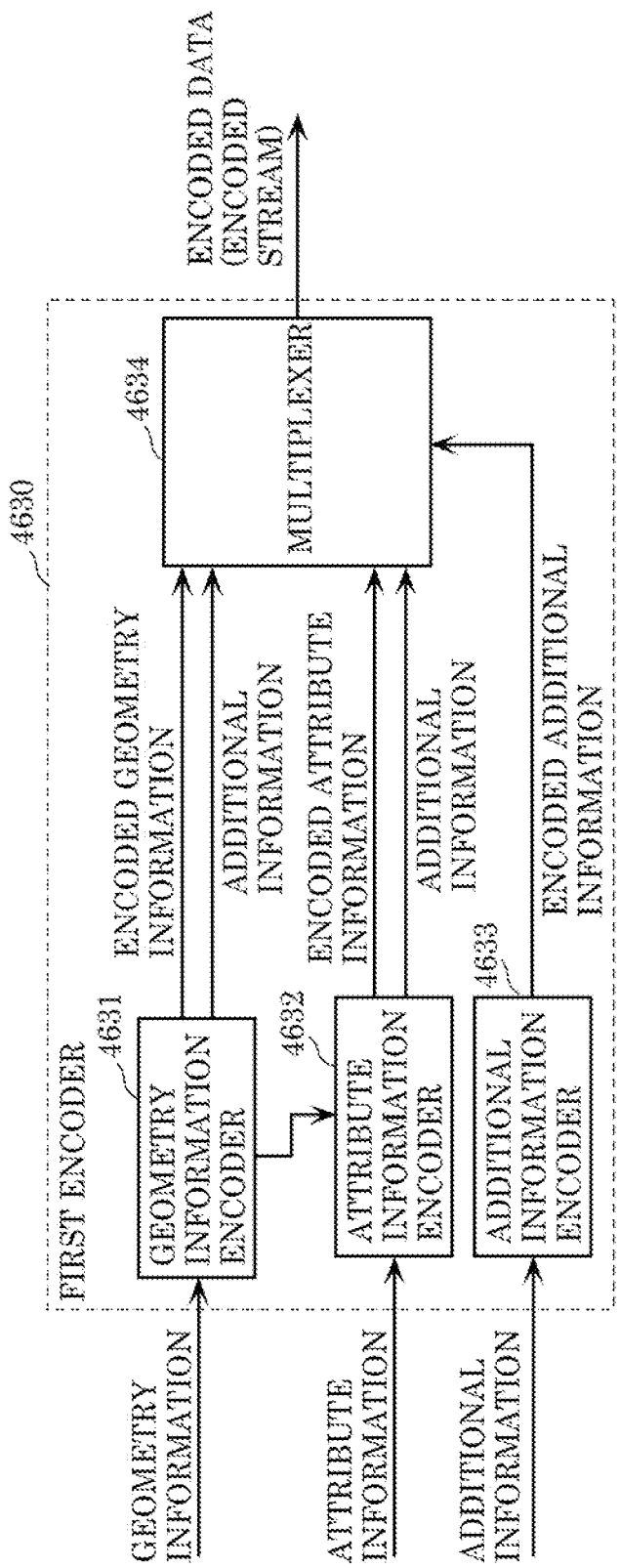
FIG. 6 is a block diagram illustrating the first encoder according to Embodiment 1.

FIG. 5 is a diagram showing a configuration of first encoder 4630, which is an example of encoder 4613 that performs encoding in the first encoding method. FIG. 6 is a block diagram showing first encoder 4630. First encoder 4630 generates encoded data (encoded stream) by encoding point cloud data in the first encoding method. First encoder 4630 includes geometry information encoder 4631, attribute information encoder 4632, additional information encoder 4633, and multiplexer 4634.

First encoder 4630 is characterized by performing encoding by keeping a three-dimensional structure in mind. First encoder 4630 is further characterized in that attribute information encoder 4632 performs encoding using information obtained from geometry information encoder 4631. The first encoding method is referred to also as geometry-based PCC (GPCC).

Point cloud data is PCC point cloud data like a PLY file or PCC point cloud data generated from sensor information, and includes geometry information (position), attribute information (attribute), and other additional information (metadata). The geometry information is input to geometry information encoder 4631, the attribute information is input to attribute information encoder 4632, and the additional information is input to additional information encoder 4633.

Geometry information encoder 4631 generates encoded geometry information (compressed geometry), which is encoded data, by encoding geometry information. For example, geometry information encoder 4631 encodes geometry information using an N-ary tree structure, such as an octree. Specifically, in the case of an octree, a current space (target space) is divided into eight nodes (subspaces), 8-bit information (occupancy code) that indicates whether each node includes a point cloud or not is generated. A node including a point cloud is further divided into eight nodes, and 8-bit information that indicates whether each of the eight nodes includes a point cloud or not is generated. This process is repeated until a predetermined level is reached or the number of the point clouds included in each node becomes equal to or less than a threshold.

Attribute information encoder 4632 generates encoded attribute information (compressed attribute), which is encoded data, by encoding attribute information using configuration information generated by geometry information encoder 4631. For example, attribute information encoder 4632 determines a reference point (reference node) that is to be referred to in encoding a current point (in other words, a current node or a target node) to be processed based on the octree structure generated by geometry information encoder 4631. For example, attribute information encoder 4632 refers to a node whose parent node in the octree is the same as the parent node of the current node, of peripheral nodes or neighboring nodes. Note that the method of determining a reference relationship is not limited to this method.

The process of encoding attribute information may include at least one of a quantization process, a prediction process, and an arithmetic encoding process. In this case, "refer to" means using a reference node for calculating a predicted value of attribute information or using a state of a reference node (occupancy information that indicates whether a reference node includes a point cloud or not, for example) for determining a parameter of encoding. For example, the parameter of encoding is a quantization parameter in the quantization process or a context or the like in the arithmetic encoding.

Additional information encoder 4633 generates encoded additional information (compressed metadata), which is encoded data, by encoding compressible data of additional information.

Multiplexer 4634 generates encoded stream (compressed stream), which is encoded data, by multiplexing encoded geometry information, encoded attribute information, encoded additional information, and other additional information. The generated encoded stream is output to a processor in a system layer (not shown).

Figure 7:
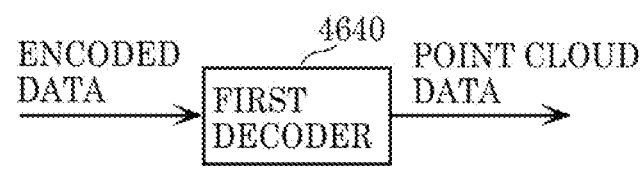
FIG. 7 is a diagram illustrating a structure of a first decoder according to Embodiment 1.
Figure 8:
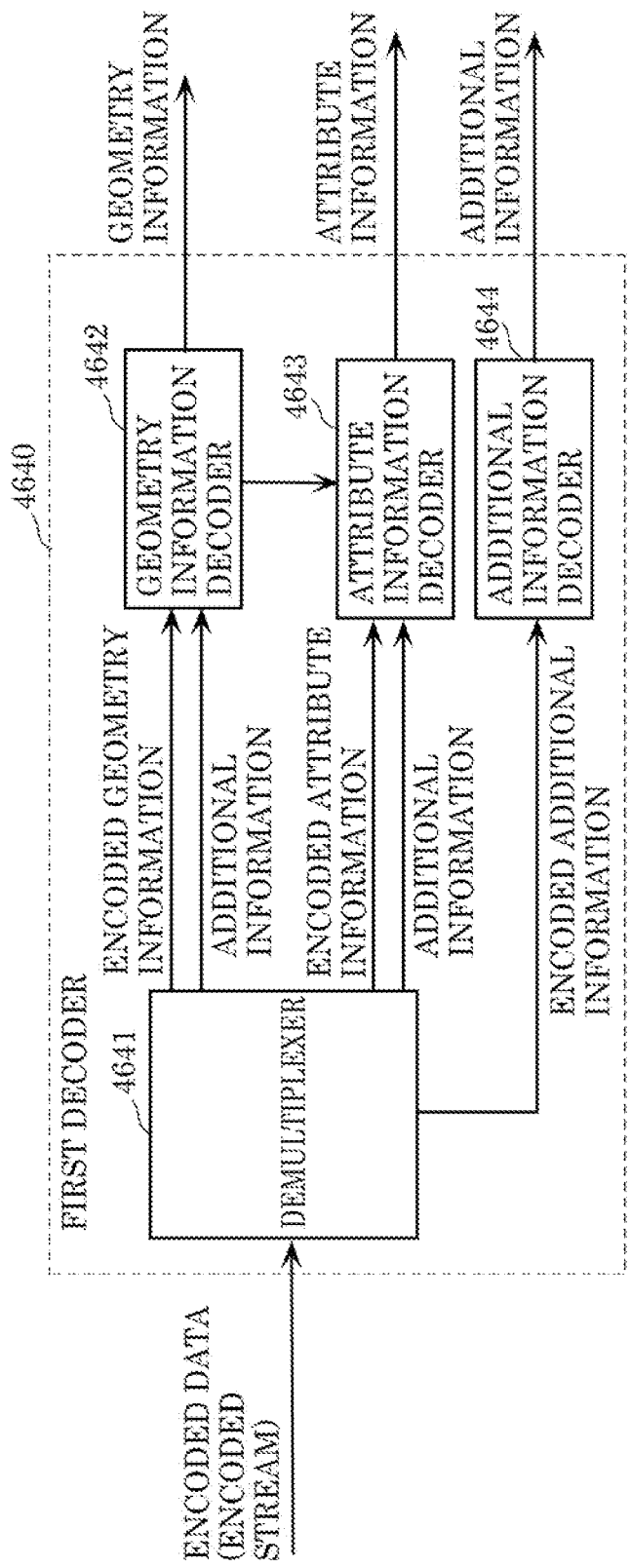
FIG. 8 is a block diagram illustrating the first decoder according to Embodiment 1.

Next, first decoder 4640, which is an example of decoder 4624 that performs decoding in the first encoding method, will be described. FIG. 7 is a diagram showing a configuration of first decoder 4640. FIG. 8 is a block diagram showing first decoder 4640. First decoder 4640 generates point cloud data by decoding encoded data (encoded stream) encoded in the first encoding method in the first encoding method. First decoder 4640 includes demultiplexer 4641, geometry information decoder 4642, attribute information decoder 4643, and additional information decoder 4644.

An encoded stream (compressed stream), which is encoded data, is input to first decoder 4640 from a processor in a system layer (not shown).

Demultiplexer 4641 separates encoded geometry information (compressed geometry), encoded attribute information (compressed attribute), encoded additional information (compressed metadata), and other additional information from the encoded data.

Geometry information decoder 4642 generates geometry information by decoding the encoded geometry information. For example, geometry information decoder 4642 restores the geometry information on a point cloud represented by three-dimensional coordinates from encoded geometry information represented by an N-ary structure, such as an octree.

Attribute information decoder 4643 decodes the encoded attribute information based on configuration information generated by geometry information decoder 4642. For example, attribute information decoder 4643 determines a reference point (reference node) that is to be referred to in decoding a current point (current node) to be processed based on the octree structure generated by geometry information decoder 4642. For example, attribute information decoder 4643 refers to a node whose parent node in the octree is the same as the parent node of the current node, of peripheral nodes or neighboring nodes. Note that the method of determining a reference relationship is not limited to this method.

The process of decoding attribute information may include at least one of an inverse quantization process, a prediction process, and an arithmetic decoding process. In this case, "refer to" means using a reference node for calculating a predicted value of attribute information or using a state of a reference node (occupancy information that indicates whether a reference node includes a point cloud or not, for example) for determining a parameter of decoding. For example, the parameter of decoding is a quantization parameter in the inverse quantization process or a context or the like in the arithmetic decoding.

Additional information decoder 4644 generates additional information by decoding the encoded additional information. First decoder 4640 uses additional information required for the decoding process for the geometry information and the attribute information in the decoding, and outputs additional information required for an application to the outside.

Figure 9:
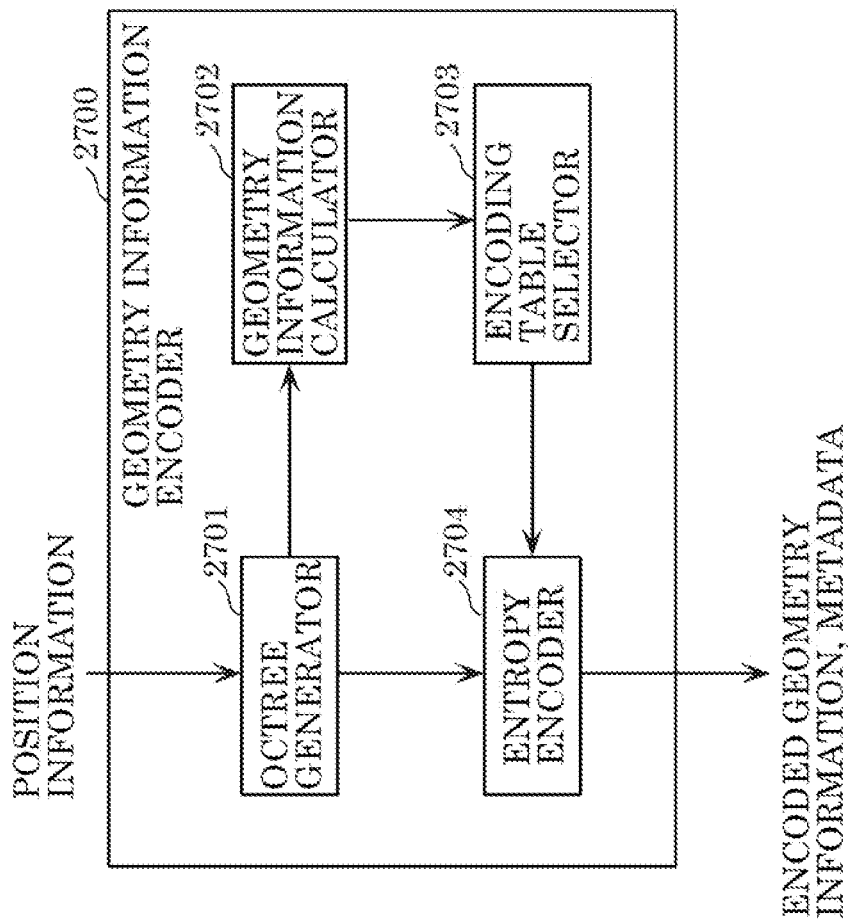
FIG. 9 is a block diagram of a three-dimensional data encoding device according to Embodiment 1.

Next, an example configuration of a geometry information encoder will be described. FIG. 9 is a block diagram of geometry information encoder 2700 according to this embodiment. Geometry information encoder 2700 includes octree generator 2701, geometry information calculator 2702, encoding table selector 2703, and entropy encoder 2704.

Octree generator 2701 generates an octree, for example, from input position information, and generates an occupancy code of each node of the octree. Geometry information calculator 2702 obtains information that indicates whether a neighboring node of a current node (target node) is an occupied node or not. For example, geometry information calculator 2702 calculates occupancy information on a neighboring node from an occupancy code of a parent node to which a current node belongs (information that indicates whether a neighboring node is an occupied node or not). Geometry information calculator 2702 may save an encoded node in a list and search the list for a neighboring node. Note that geometry information calculator 2702 may change neighboring nodes in accordance with the position of the current node in the parent node.

Encoding table selector 2703 selects an encoding table used for entropy encoding of the current node based on the occupancy information on the neighboring node calculated by geometry information calculator 2702. For example, encoding table selector 2703 may generate a bit sequence based on the occupancy information on the neighboring node and select an encoding table of an index number generated from the bit sequence.

Entropy encoder 2704 generates encoded geometry information and metadata by entropy-encoding the occupancy code of the current node using the encoding table of the selected index number. Entropy encoder may add, to the encoded geometry information, information that indicates the selected encoding table.

Figure 10:
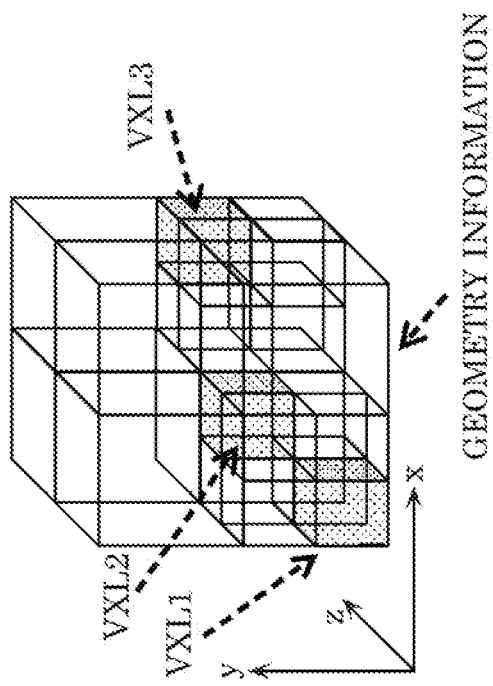
FIG. 10 is a diagram showing an example of geometry information according to Embodiment 1.
Figure 11:
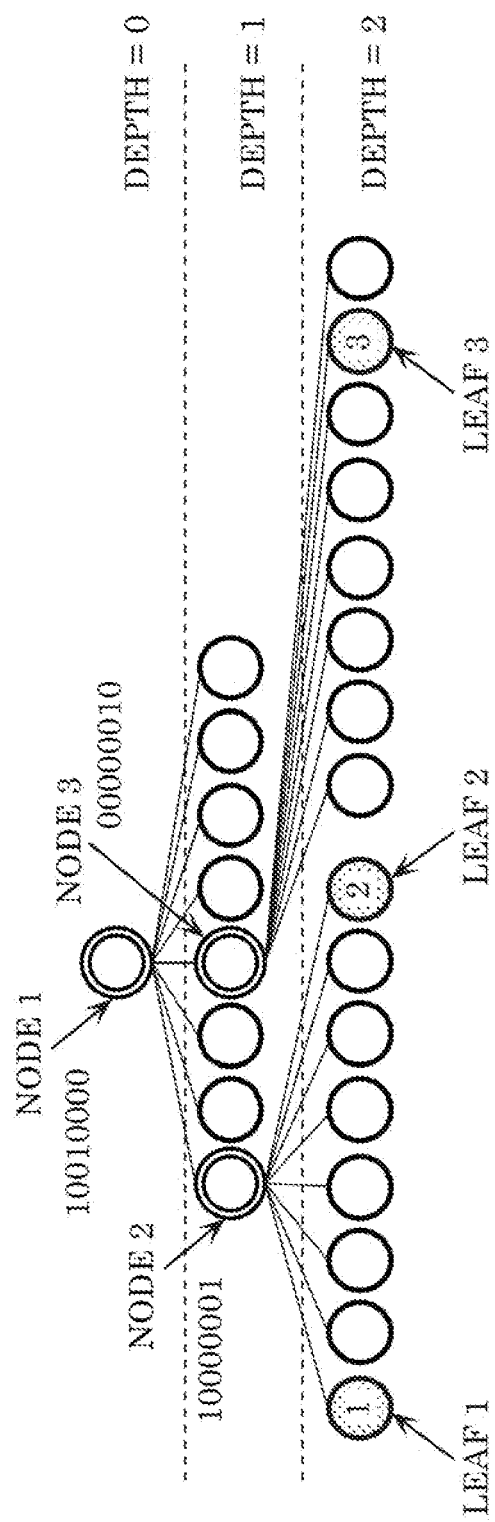
FIG. 11 is a diagram showing an example of an octree representation of geometry information according to Embodiment 1.

In the following, an octree representation and a scan order for geometry information will be described. Geometry information (geometry data) is transformed into an octree structure (octree transform) and then encoded. The octree structure includes nodes and leaves. Each node has eight nodes or leaves, and each leaf has voxel (VXL) information. FIG. 10 is a diagram showing an example structure of geometry information including a plurality of voxels. FIG. 11 is a diagram showing an example in which the geometry information shown in FIG. 10 is transformed into an octree structure. Here, of leaves shown in FIG. 11, leaves 1, 2, and 3 represent voxels VXL1, VXL2, and VXL3 shown in FIG. 10, respectively, and each represent VXL containing a point cloud (referred to as a valid VXL, hereinafter).

Specifically, node 1 corresponds to the entire space comprising the geometry information in FIG. 10. The entire space corresponding to node 1 is divided into eight nodes, and among the eight nodes, a node containing valid VXL is further divided into eight nodes or leaves. This process is repeated for every layer of the tree structure. Here, each node corresponds to a subspace, and has information (occupancy code) that indicates where the next node or leaf is located after division as node information. A block in the bottom layer is designated as a leaf and retains the number of the points contained in the leaf as leaf information.

Figure 12:
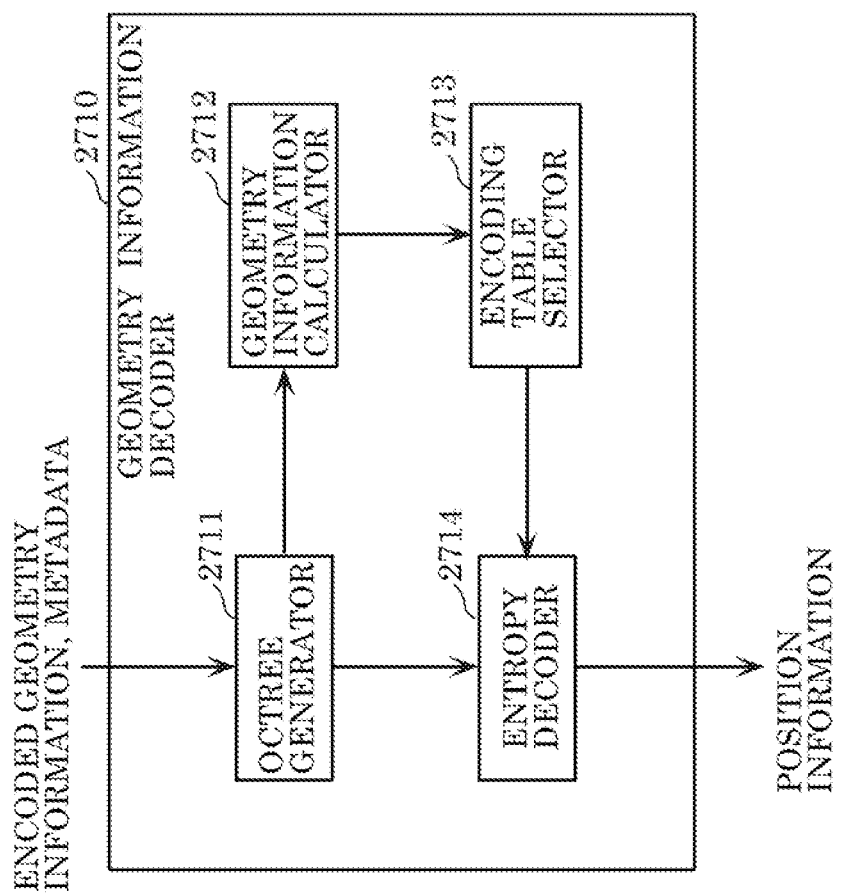
FIG. 12 is a block diagram of a three-dimensional data decoding device according to Embodiment 1.

Next, an example configuration of a geometry information decoder will be described. FIG. 12 is a block diagram of geometry information decoder 2710 according to this embodiment. Geometry information decoder 2710 includes octree generator 2711, geometry information calculator 2712, encoding table selector 2713, and entropy decoder 2714.

Octree generator 2711 generates an octree of a space (node) based on header information, metadata or the like of a bitstream. For example, octree generator 2711 generates an octree by generating a large space (root node) based on the sizes of a space in an x-axis direction, a y-axis direction, and a z-axis direction added to the header information and dividing the space into two parts in the x-axis direction, the y-axis direction, and the z-axis direction to generate eight small spaces A (nodes A0 to A7). Nodes A0 to A7 are sequentially designated as a current node.

Geometry information calculator 2712 obtains occupancy information that indicates whether a neighboring node of a current node is an occupied node or not. For example, geometry information calculator 2712 calculates occupancy information on a neighboring node from an occupancy code of a parent node to which a current node belongs. Geometry information calculator 2712 may save a decoded node in a list and search the list for a neighboring node. Note that geometry information calculator 2712 may change neighboring nodes in accordance with the position of the current node in the parent node.

Encoding table selector 2713 selects an encoding table (decoding table) used for entropy decoding of the current node based on the occupancy information on the neighboring node calculated by geometry information calculator 2712. For example, encoding table selector 2713 may generate a bit sequence based on the occupancy information on the neighboring node and select an encoding table of an index number generated from the bit sequence.

Entropy decoder 2714 generates position information by entropy-decoding the occupancy code of the current node using the selected encoding table. Note that entropy decoder 2714 may obtain information on the selected encoding table by decoding the bitstream, and entropy-decode the occupancy code of the current node using the encoding table indicated by the information.

Figure 13:
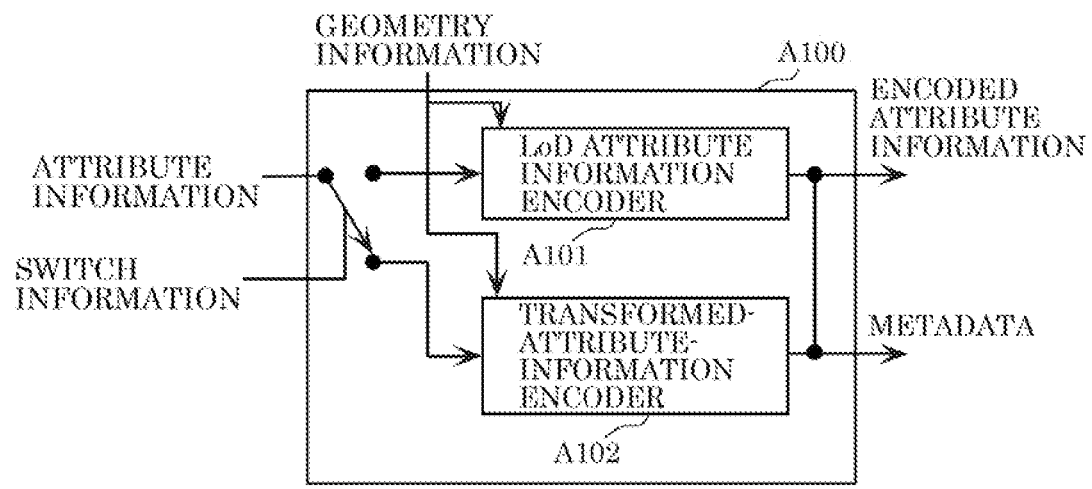
FIG. 13 is a block diagram of an attribute information encoder according to Embodiment 1.

In the following, configurations of an attribute information encoder and an attribute information decoder will be described. FIG. 13 is a block diagram showing an example configuration of attribute information encoder A100. The attribute information encoder may include a plurality of encoders that perform different encoding methods. For example, the attribute information encoder may selectively use any of the two methods described below in accordance with the use case.

Attribute information encoder A100 includes LoD attribute information encoder A101 and transformed-attribute-information encoder A102. LoD attribute information encoder A101 classifies three-dimensional points into a plurality of layers based on geometry information on the three-dimensional points, predicts attribute information on three-dimensional points belonging to each layer, and encodes a prediction residual therefor. Here, each layer into which a three-dimensional point is classified is referred to as a level of detail (LoD).

Transformed-attribute-information encoder A102 encodes attribute information using region adaptive hierarchical transform (RAHT). Specifically, transformed-attribute-information encoder A102 generates a high frequency component and a low frequency component for each layer by applying RAHT or Haar transform to each item of attribute information based on the geometry information on three-dimensional points, and encodes the values by quantization, entropy encoding or the like.

Figure 14:
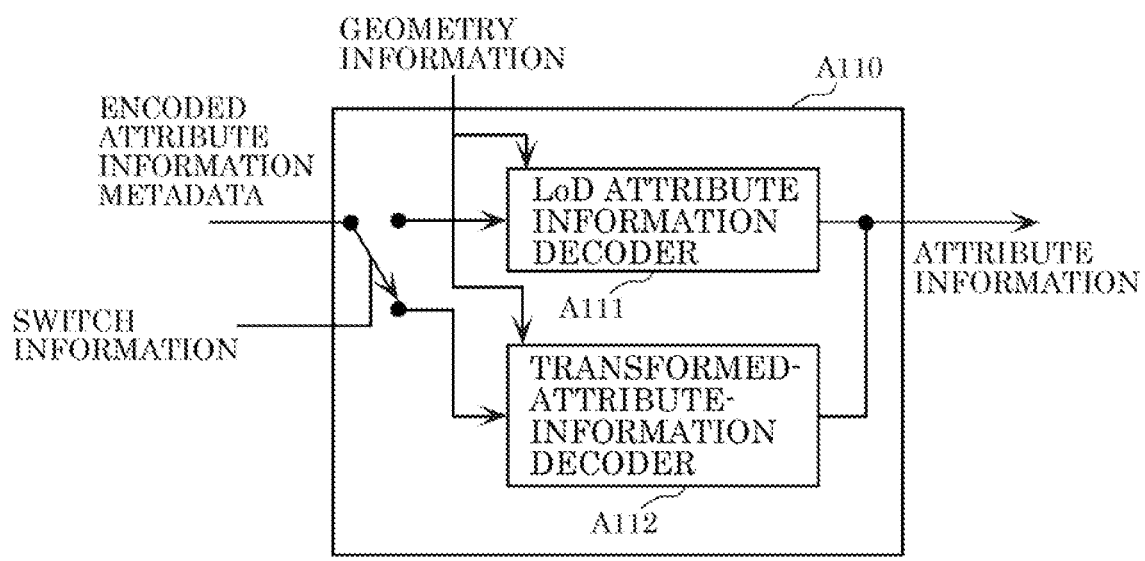
FIG. 14 is a block diagram of an attribute information decoder according to Embodiment 1.

FIG. 14 is a block diagram showing an example configuration of attribute information decoder A110. The attribute information decoder may include a plurality of decoders that perform different decoding methods. For example, the attribute information decoder may selectively use any of the two methods described below for decoding based on the information included in the header or metadata.

Attribute information decoder A110 includes LoD attribute information decoder A111 and transformed-attribute-information decoder A112. LoD attribute information decoder A111 classifies three-dimensional points into a plurality of layers based on the geometry information on the three-dimensional points, predicts attribute information on three-dimensional points belonging to each layer, and decodes attribute values thereof.

Transformed-attribute-information decoder A112 decodes attribute information using region adaptive hierarchical transform (RAHT). Specifically, transformed-attribute-information decoder A112 decodes each attribute value by applying inverse RAHT or inverse Haar transform to the high frequency component and the low frequency component of the attribute value based on the geometry information on the three-dimensional point.

Figure 15:
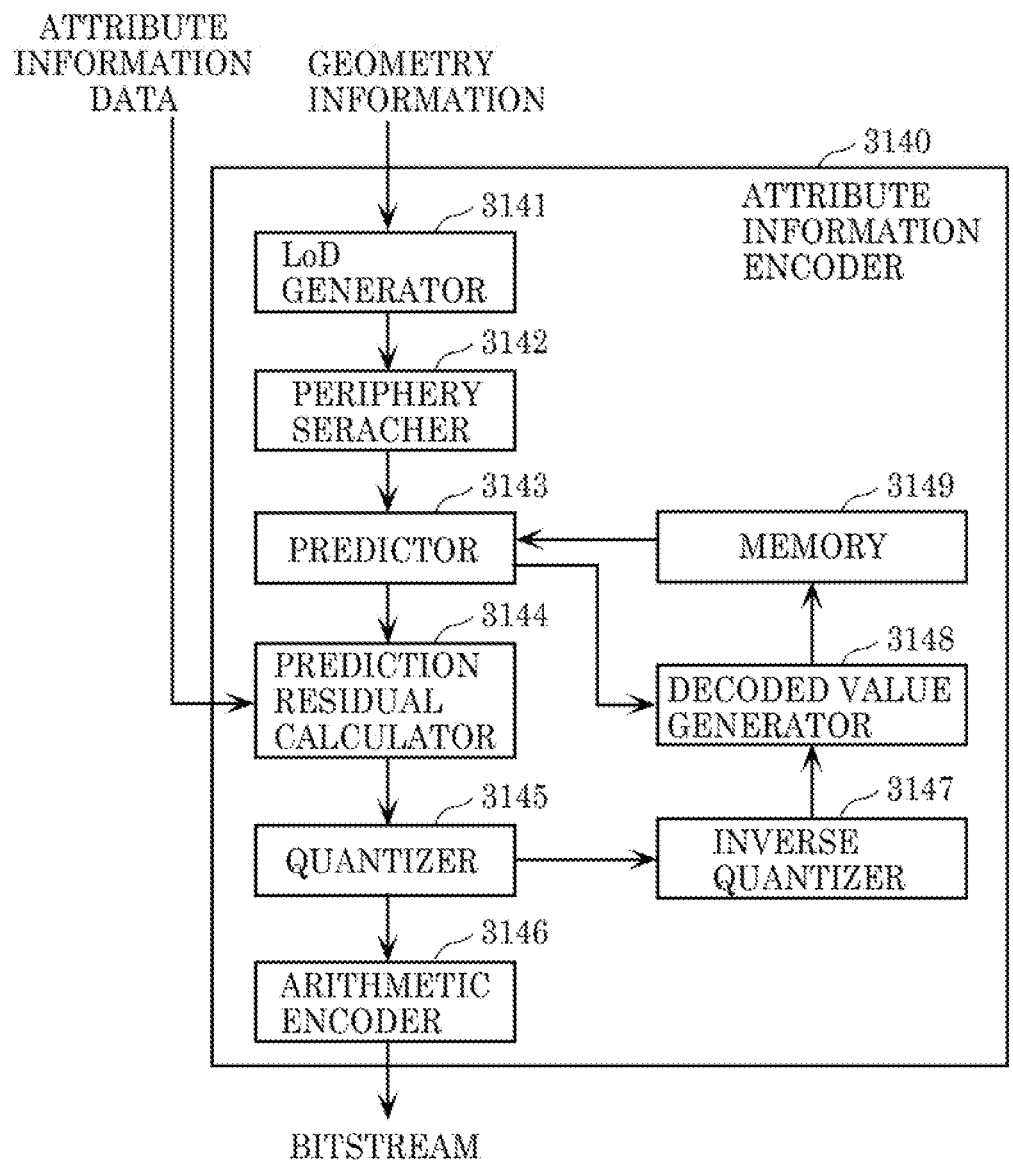
FIG. 15 is a block diagram showing a configuration of the attribute information encoder according to the variation of Embodiment 1.

FIG. 15 is a block diagram showing a configuration of attribute information encoder 3140 that is an example of LoD attribute information encoder A101.

Attribute information encoder 3140 includes LoD generator 3141, periphery searcher 3142, predictor 3143, prediction residual calculator 3144, quantizer 3145, arithmetic encoder 3146, inverse quantizer 3147, decoded value generator 3148, and memory 3149.

LoD generator 3141 generates an LoD using geometry information on a three-dimensional point.

Periphery searcher 3142 searches for a neighboring three-dimensional point neighboring each three-dimensional point using a result of LoD generation by LoD generator 3141 and distance information indicating distances between three-dimensional points.

Predictor 3143 generates a predicted value of an item of attribute information on a current (target) three-dimensional point to be encoded.

Prediction residual calculator 3144 calculates (generates) a prediction residual of the predicted value of the item of the attribute information generated by predictor 3143.

Quantizer 3145 quantizes the prediction residual of the item of attribute information calculated by prediction residual calculator 3144.

Arithmetic encoder 3146 arithmetically encodes the prediction residual quantized by quantizer 3145. Arithmetic encoder 3146 outputs a bitstream including the arithmetically encoded prediction residual to the three-dimensional data decoding device, for example.

The prediction residual may be binarized by quantizer 3145 before being arithmetically encoded by arithmetic encoder 3146.

Arithmetic encoder 3146 may initialize the encoding table used for the arithmetic encoding before performing the arithmetic encoding. Arithmetic encoder 3146 may initialize the encoding table used for the arithmetic encoding for each layer. Arithmetic encoder 3146 may output a bitstream including information that indicates the position of the layer at which the encoding table is initialized.

Inverse quantizer 3147 inverse-quantizes the prediction residual quantized by quantizer 3145.

Decoded value generator 3148 generates a decoded value by adding the predicted value of the item of attribute information generated by predictor 3143 and the prediction residual inverse-quantized by inverse quantizer 3147 together.

Memory 3149 is a memory that stores a decoded value of an item of attribute information on each three-dimensional point decoded by decoded value generator 3148. For example, when generating a predicted value of a three-dimensional point yet to be encoded, predictor 3143 may generate the predicted value using a decoded value of an item of attribute information on each three-dimensional point stored in memory 3149.

Figure 16:
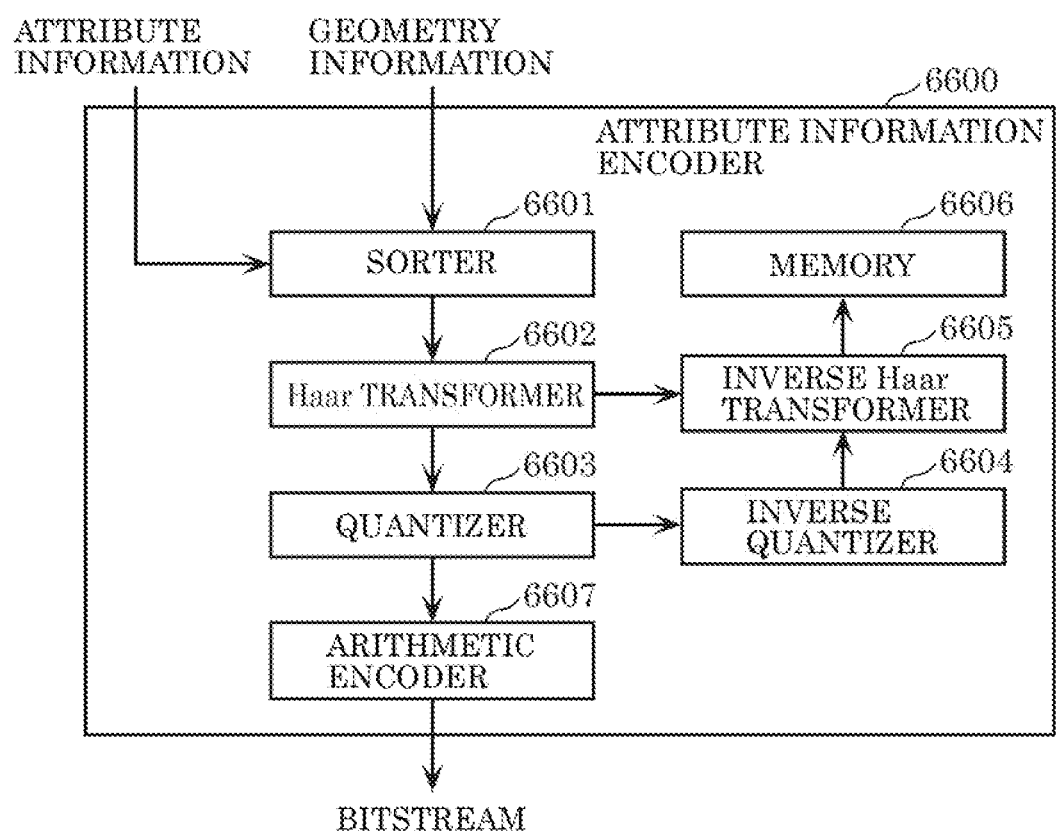
FIG. 16 is a block diagram of the attribute information encoder according to Embodiment 1.

FIG. 16 is a block diagram of attribute information encoder 6600 that is an example of transformation attribute information encoder A102. Attribute information encoder 6600 includes sorter 6601, Haar transformer 6602, quantizer 6603, inverse quantizer 6604, inverse Haar transformer 6605, memory 6606, and arithmetic encoder 6607.

Sorter 6601 generates the Morton codes by using the geometry information of three-dimensional points, and sorts the plurality of three-dimensional points in the order of the Morton codes. Haar transformer 6602 generates the coding coefficient by applying the Haar transform to the attribute information. Quantizer 6603 quantizes the coding coefficient of the attribute information.

Inverse quantizer 6604 inverse quantizes the coding coefficient after the quantization. Inverse Haar transformer 6605 applies the inverse Haar transform to the coding coefficient. Memory 6606 stores the values of items of attribute information of a plurality of decoded three-dimensional points. For example, the attribute information of the decoded three-dimensional points stored in memory 6606 may be utilized for prediction and the like of an unencoded three-dimensional point.

Arithmetic encoder 6607 calculates ZeroCnt from the coding coefficient after the quantization, and arithmetically encodes ZeroCnt. Additionally, arithmetic encoder 6607 arithmetically encodes the non-zero coding coefficient after the quantization. Arithmetic encoder 6607 may binarize the coding coefficient before the arithmetic encoding. In addition, arithmetic encoder 6607 may generate and encode various kinds of header information.

Figure 17:
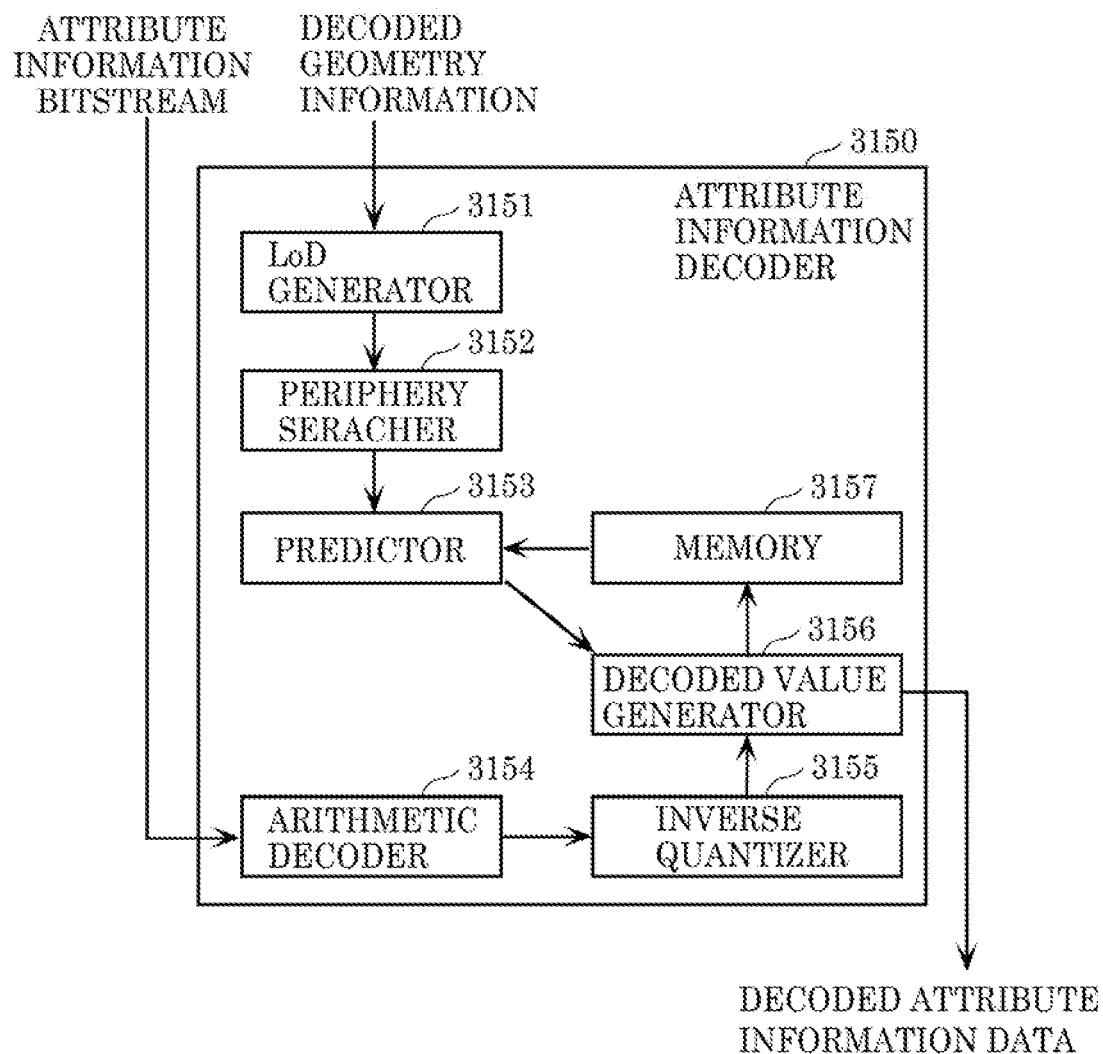
FIG. 17 is a block diagram showing a configuration of the attribute information decoder according to the variation of Embodiment 1.

FIG. 17 is a block diagram showing a configuration of attribute information decoder 3150 that is an example of LoD attribute information decoder A111.

Attribute information decoder 3150 includes LoD generator 3151, periphery searcher 3152, predictor 3153, arithmetic decoder 3154, inverse quantizer 3155, decoded value generator 3156, and memory 3157.

LoD generator 3151 generates an LoD using geometry information on a three-dimensional point decoded by the geometry information decoder (not shown in FIG. 17).

Periphery searcher 3152 searches for a neighboring three-dimensional point neighboring each three-dimensional point using a result of LoD generation by LoD generator 3151 and distance information indicating distances between three-dimensional points.

Predictor 3153 generates a predicted value of attribute information item on a current three-dimensional point to be decoded.

Arithmetic decoder 3154 arithmetically decodes the prediction residual in the bitstream obtained from attribute information encoder 3140 shown in FIG. 15. Note that arithmetic decoder 3154 may initialize the decoding table used for the arithmetic decoding. Arithmetic decoder 3154 initializes the decoding table used for the arithmetic decoding for the layer for which the encoding process has been performed by arithmetic encoder 3146 shown in FIG. 15. Arithmetic decoder 3154 may initialize the decoding table used for the arithmetic decoding for each layer. Arithmetic decoder 3154 may initialize the decoding table based on the information included in the bitstream that indicates the position of the layer for which the encoding table has been initialized.

Inverse quantizer 3155 inverse-quantizes the prediction residual arithmetically decoded by arithmetic decoder 3154.

Decoded value generator 3156 generates a decoded value by adding the predicted value generated by predictor 3153 and the prediction residual inverse-quantized by inverse quantizer 3155 together. Decoded value generator 3156 outputs the decoded attribute information data to another device.

Memory 3157 is a memory that stores a decoded value of an item of attribute information on each three-dimensional point decoded by decoded value generator 3156. For example, when generating a predicted value of a three-dimensional point yet to be decoded, predictor 3153 generates the predicted value using a decoded value of an item of attribute information on each three-dimensional point stored in memory 3157.

Figure 18:
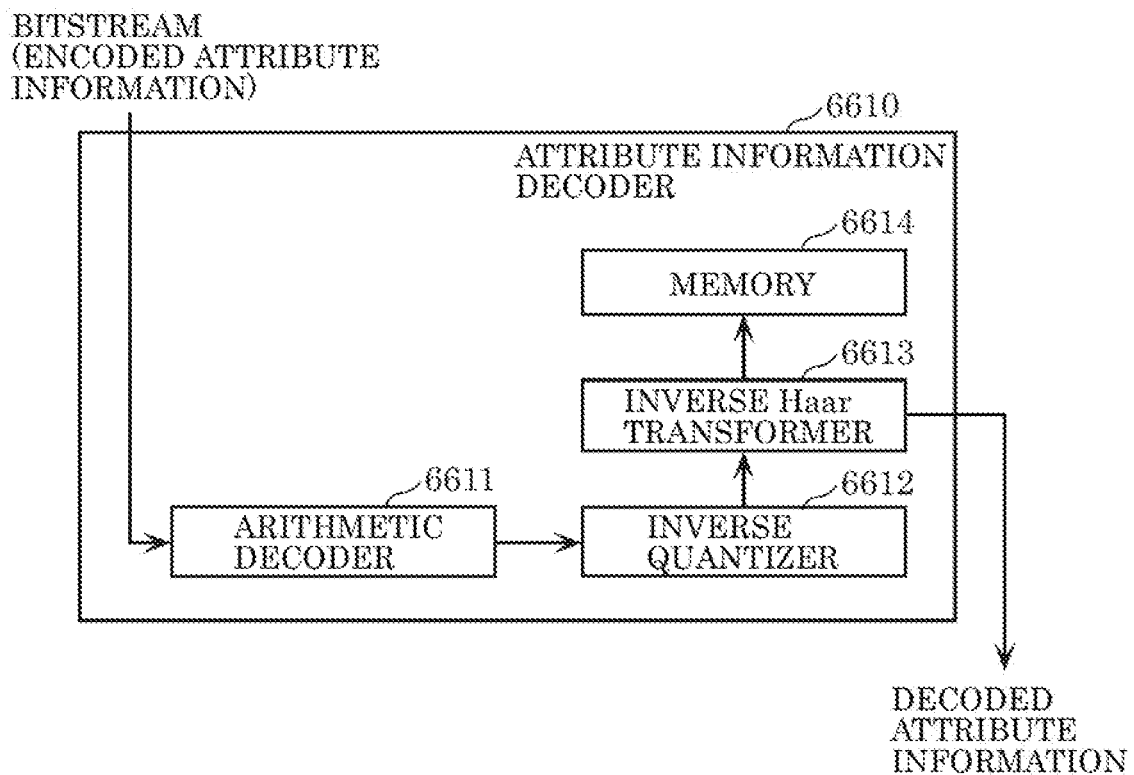
FIG. 18 is a block diagram of the attribute information decoder according to Embodiment 1.

FIG. 18 is a block diagram of attribute information decoder 6610 that is an example of transformation attribute information decoder A112. Attribute information decoder 6610 includes arithmetic decoder 6611, inverse quantizer 6612, inverse Haar transformer 6613, and memory 6614.

Arithmetic decoder 6611 arithmetically decodes ZeroCnt and the coding coefficient included in a bitstream. Note that arithmetic decoder 6611 may decode various kinds of header information.

Inverse quantizer 6612 inverse quantizes the arithmetically decoded coding coefficient. Inverse Haar transformer 6613 applies the inverse Haar transform to the coding coefficient after the inverse quantization. Memory 6614 stores the values of items of attribute information of a plurality of decoded three-dimensional points. For example, the attribute information of the decoded three-dimensional points stored in memory 6614 may be utilized for prediction of an undecoded three-dimensional point.

Figure 19:
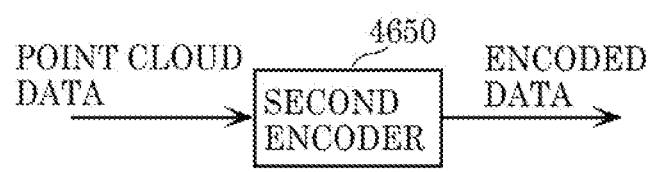
FIG. 19 is a diagram illustrating a structure of a second encoder according to Embodiment 1.
Figure 20:
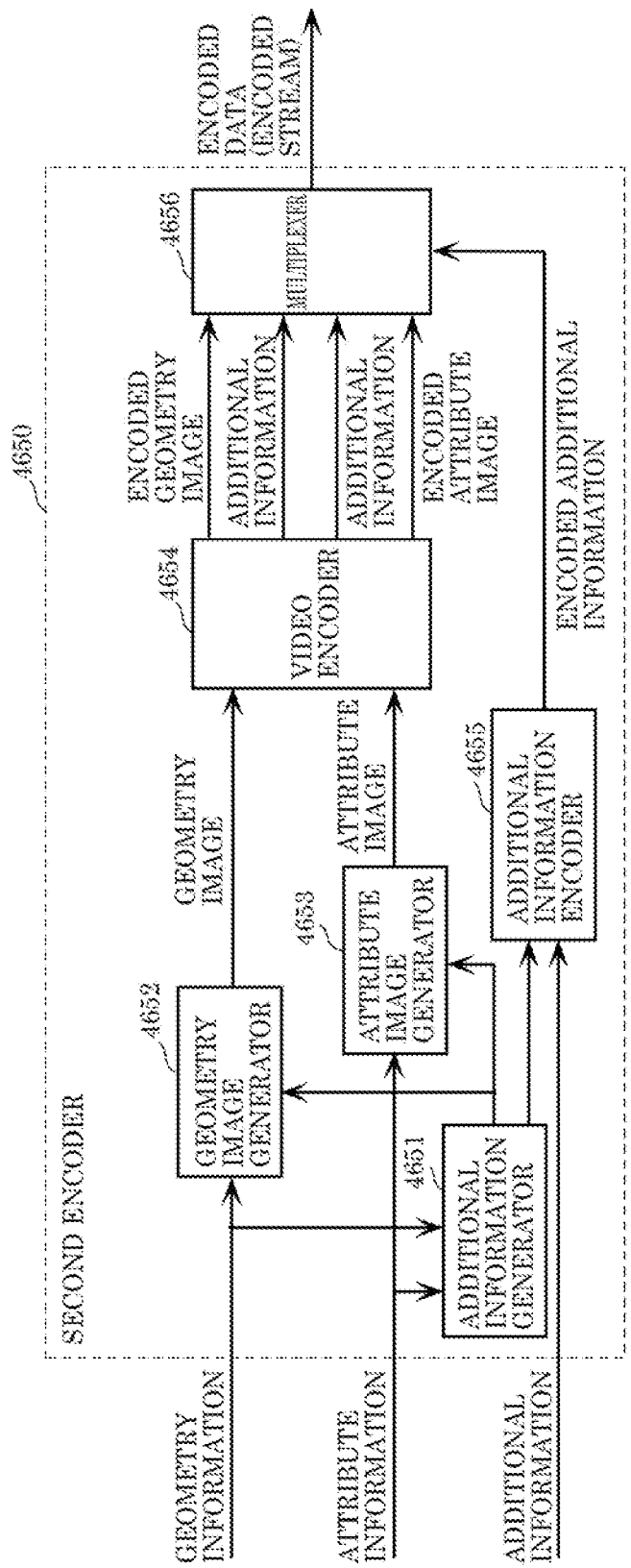
FIG. 20 is a block diagram illustrating the second encoder according to Embodiment 1.

Next, second encoder 4650, which is an example of encoder 4613 that performs encoding in the second encoding method, will be described. FIG. 19 is a diagram showing a configuration of second encoder 4650. FIG. 20 is a block diagram showing second encoder 4650.

Second encoder 4650 generates encoded data (encoded stream) by encoding point cloud data in the second encoding method. Second encoder 4650 includes additional information generator 4651, geometry image generator 4652, attribute image generator 4653, video encoder 4654, additional information encoder 4655, and multiplexer 4656.

Second encoder 4650 is characterized by generating a geometry image and an attribute image by projecting a three-dimensional structure onto a two-dimensional image, and encoding the generated geometry image and attribute image in an existing video encoding scheme. The second encoding method is referred to as video-based PCC (VPCC).

Point cloud data is PCC point cloud data like a PLY file or PCC point cloud data generated from sensor information, and includes geometry information (position), attribute information (attribute), and other additional information (metadata).

Additional information generator 4651 generates map information on a plurality of two-dimensional images by projecting a three-dimensional structure onto a two-dimensional image.

Geometry image generator 4652 generates a geometry image based on the geometry information and the map information generated by additional information generator 4651. The geometry image is a distance image in which distance (depth) is indicated as a pixel value, for example. The distance image may be an image of a plurality of point clouds viewed from one point of view (an image of a plurality of point clouds projected onto one two-dimensional plane), a plurality of images of a plurality of point clouds viewed from a plurality of points of view, or a single image integrating the plurality of images.

Attribute image generator 4653 generates an attribute image based on the attribute information and the map information generated by additional information generator 4651. The attribute image is an image in which attribute information (color (RGB), for example) is indicated as a pixel value, for example. The image may be an image of a plurality of point clouds viewed from one point of view (an image of a plurality of point clouds projected onto one two-dimensional plane), a plurality of images of a plurality of point clouds viewed from a plurality of points of view, or a single image integrating the plurality of images.

Video encoder 4654 generates an encoded geometry image (compressed geometry image) and an encoded attribute image (compressed attribute image), which are encoded data, by encoding the geometry image and the attribute image in a video encoding scheme. Note that, as the video encoding scheme, any well-known encoding method can be used. For example, the video encoding scheme is AVC or HEVC.

Additional information encoder 4655 generates encoded additional information (compressed metadata) by encoding the additional information, the map information and the like included in the point cloud data.

Multiplexer 4656 generates an encoded stream (compressed stream), which is encoded data, by multiplexing the encoded geometry image, the encoded attribute image, the encoded additional information, and other additional information. The generated encoded stream is output to a processor in a system layer (not shown).

Figure 21:
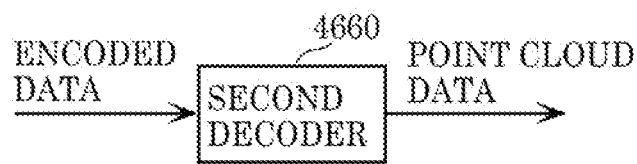
FIG. 21 is a diagram illustrating a structure of a second decoder according to Embodiment 1.
Figure 22:
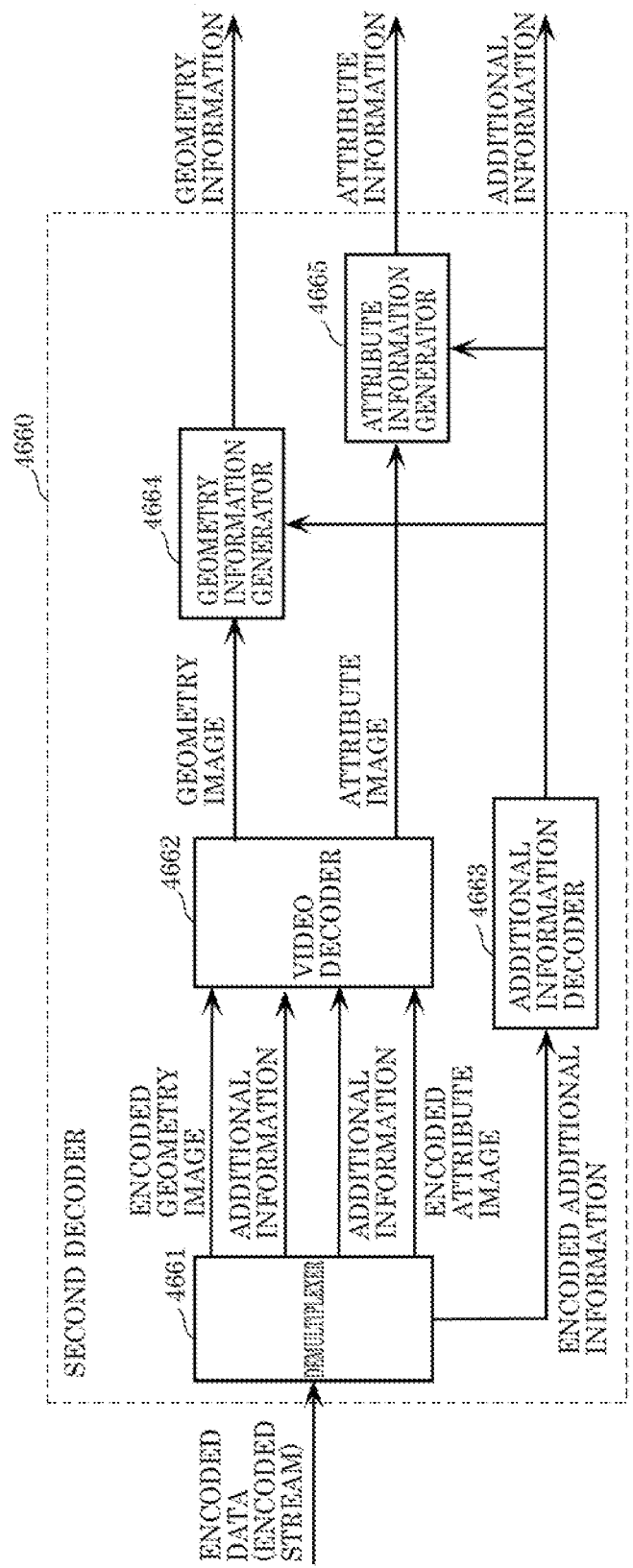
FIG. 22 is a block diagram illustrating the second decoder according to Embodiment 1.

Next, second decoder 4660, which is an example of decoder 4624 that performs decoding in the second encoding method, will be described. FIG. 21 is a diagram showing a configuration of second decoder 4660. FIG. 22 is a block diagram showing second decoder 4660. Second decoder 4660 generates point cloud data by decoding encoded data (encoded stream) encoded in the second encoding method in the second encoding method. Second decoder 4660 includes demultiplexer 4661, video decoder 4662, additional information decoder 4663, geometry information generator 4664, and attribute information generator 4665.

An encoded stream (compressed stream), which is encoded data, is input to second decoder 4660 from a processor in a system layer (not shown).

Demultiplexer 4661 separates an encoded geometry image (compressed geometry image), an encoded attribute image (compressed attribute image), an encoded additional information (compressed metadata), and other additional information from the encoded data.

Video decoder 4662 generates a geometry image and an attribute image by decoding the encoded geometry image and the encoded attribute image in a video encoding scheme. Note that, as the video encoding scheme, any well-known encoding method can be used. For example, the video encoding scheme is AVC or HEVC.

Additional information decoder 4663 generates additional information including map information or the like by decoding the encoded additional information.

Geometry information generator 4664 generates geometry information from the geometry image and the map information. Attribute information generator 4665 generates attribute information from the attribute image and the map information.

Second decoder 4660 uses additional information required for decoding in the decoding, and outputs additional information required for an application to the outside.

Figure 23:
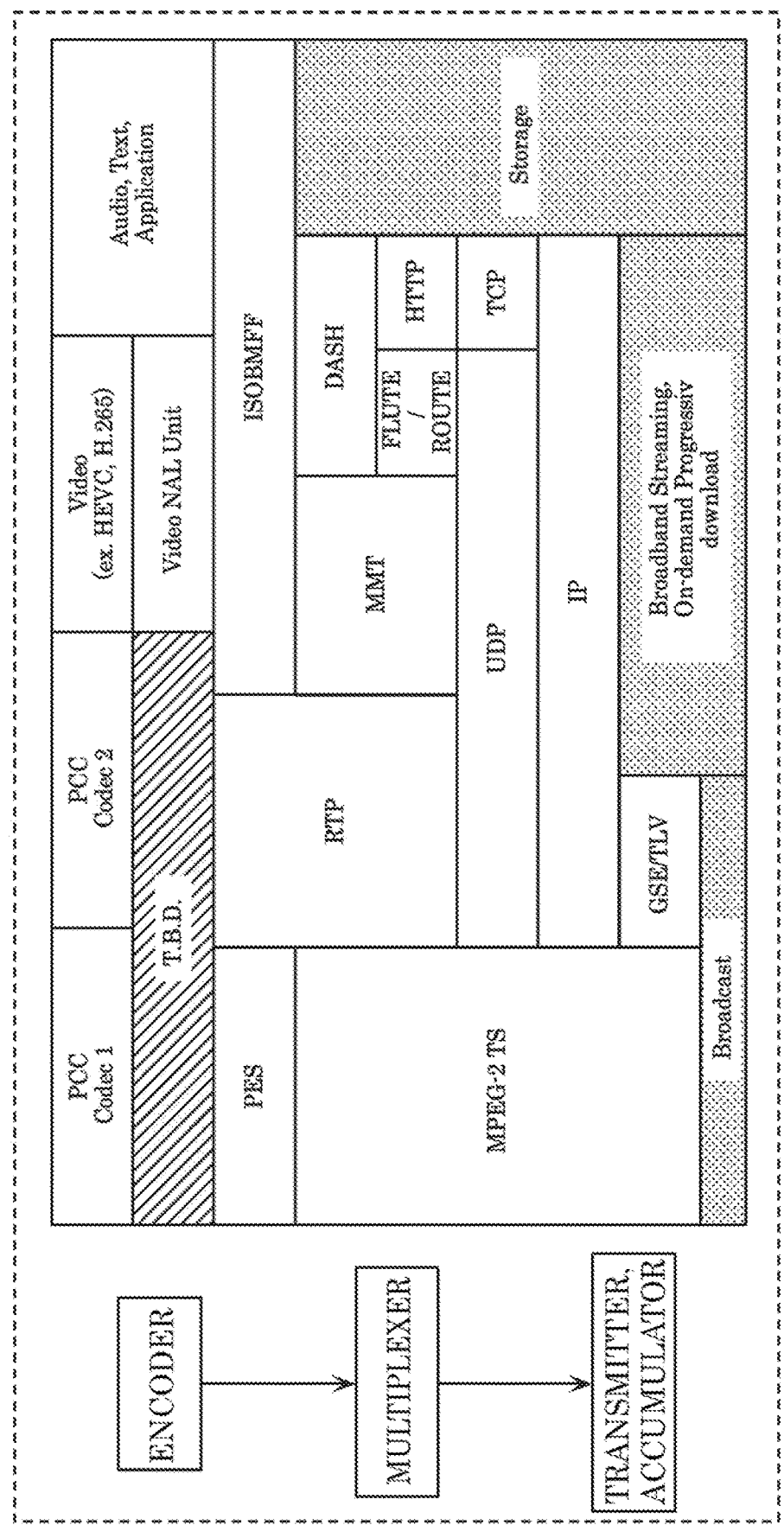
FIG. 23 is a diagram illustrating a protocol stack related to PCC encoded data according to Embodiment 1.

In the following, a problem with the PCC encoding scheme will be described. FIG. 23 is a diagram showing a protocol stack relating to PCC-encoded data. FIG. 23 shows an example in which PCC-encoded data is multiplexed with other medium data, such as a video (HEVC, for example) or an audio, and transmitted or accumulated.

A multiplexing scheme and a file format have a function of multiplexing various encoded data and transmitting or accumulating the data. To transmit or accumulate encoded data, the encoded data has to be converted into a format for the multiplexing scheme. For example, with HEVC, a technique for storing encoded data in a data structure referred to as a NAL unit and storing the NAL unit in ISOBMFF is prescribed.

At present, a first encoding method (Codec1) and a second encoding method (Codec2) are under investigation as encoding methods for point cloud data. However, there is no method defined for storing the configuration of encoded data and the encoded data in a system format. Thus, there is a problem that an encoder cannot perform an MUX process (multiplexing), transmission, or accumulation of data.

Note that, in the following, the term "encoding method" means any of the first encoding method and the second encoding method unless a particular encoding method is specified.

Embodiment 2

In this embodiment, types of the encoded data (geometry information (geometry), attribute information (attribute), and additional information (metadata)) generated by first encoder 4630 or second encoder 4650 described above, a method of generating additional information (metadata), and a multiplexing process in the multiplexer will be described. The additional information (metadata) may be referred to as a parameter set or control information (signaling information).

In this embodiment, the dynamic object (three-dimensional point cloud data that varies with time) described above with reference to FIG. 4 will be described, for example. However, the same method can also be used for the static object (three-dimensional point cloud data associated with an arbitrary time point).

Figure 24:
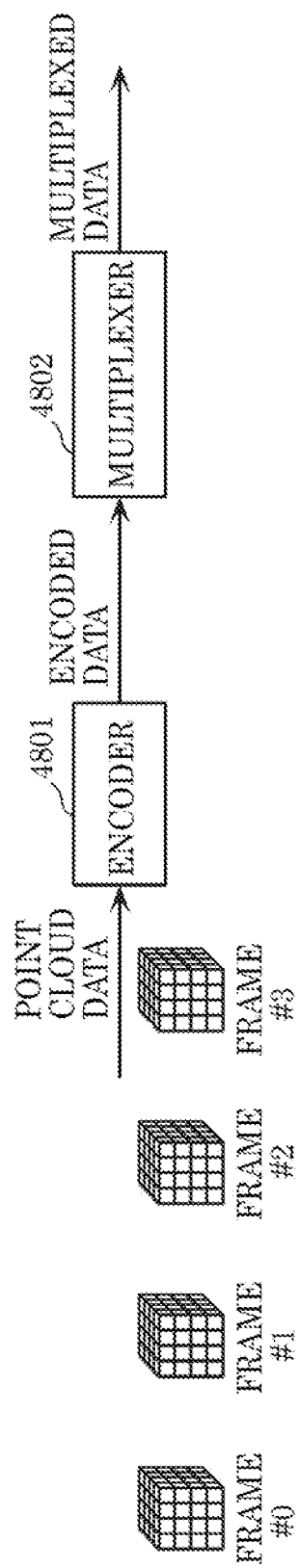
FIG. 24 is a diagram illustrating structures of an encoder and a multiplexer according to Embodiment 2.

FIG. 24 is a diagram showing configurations of encoder 4801 and multiplexer 4802 in a three-dimensional data encoding device according to this embodiment. Encoder 4801 corresponds to first encoder 4630 or second encoder 4650 described above, for example. Multiplexer 4802 corresponds to multiplexer 4634 or 4656 described above.

Encoder 4801 encodes a plurality of PCC (point cloud compression) frames of point cloud data to generate a plurality of pieces of encoded data (multiple compressed data) of geometry information, attribute information, and additional information.

Multiplexer 4802 integrates a plurality of types of data (geometry information, attribute information, and additional information) into a NAL unit, thereby converting the data into a data configuration that takes data access in the decoding device into consideration.

Figure 25:
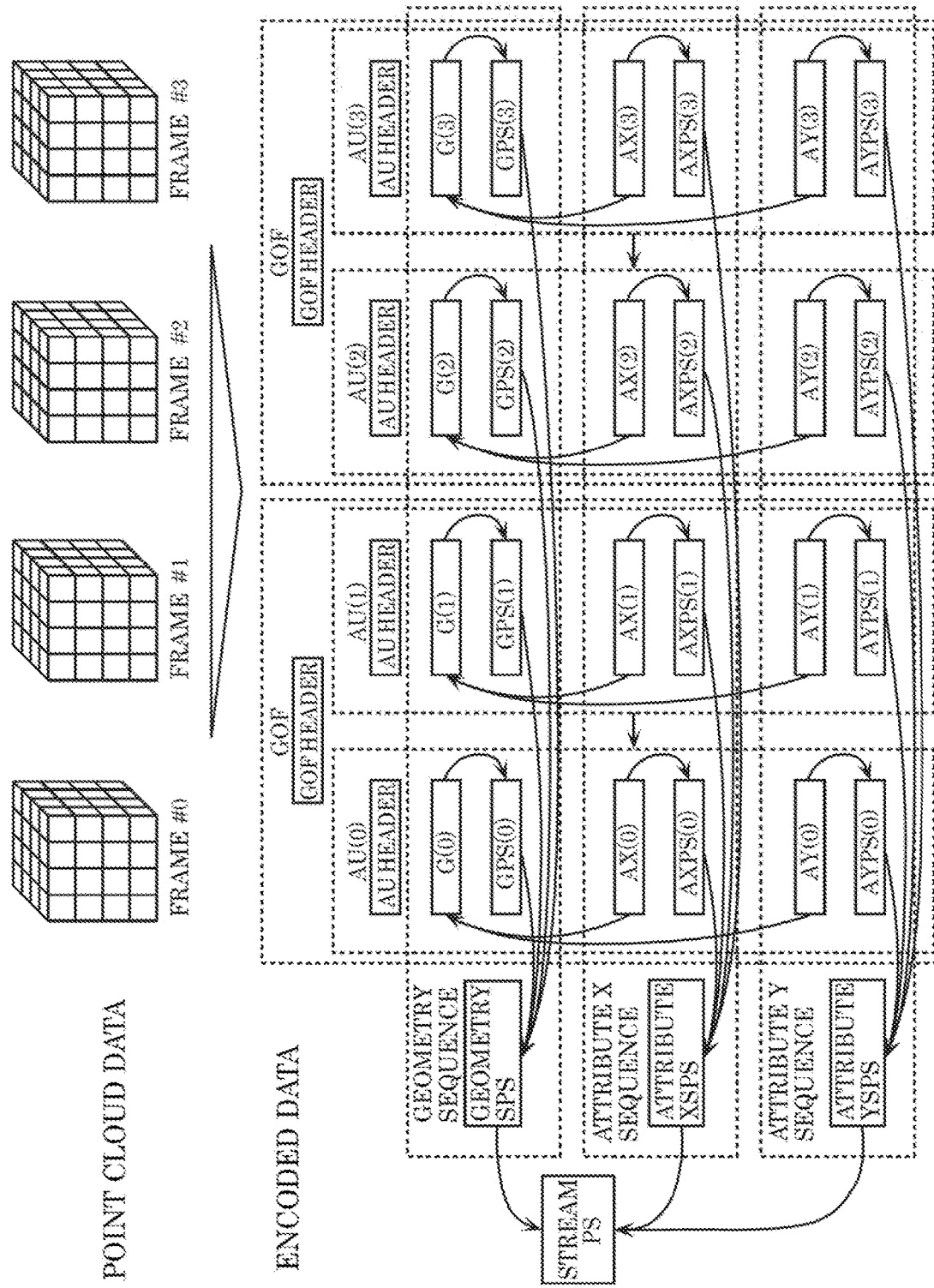
FIG. 25 is a diagram illustrating a structure example of encoded data according to Embodiment 2.

FIG. 25 is a diagram showing a configuration example of the encoded data generated by encoder 4801. Arrows in the drawing indicate a dependence involved in decoding of the encoded data. The source of an arrow depends on data of the destination of the arrow. That is, the decoding device decodes the data of the destination of an arrow, and decodes the data of the source of the arrow using the decoded data. In other words, "a first entity depends on a second entity" means that data of the second entity is referred to (used) in processing (encoding, decoding, or the like) of data of the first entity.

First, a process of generating encoded data of geometry information will be described. Encoder 4801 encodes geometry information of each frame to generate encoded geometry data (compressed geometry data) for each frame. The encoded geometry data is denoted by G(i). i denotes a frame number or a time point of a frame, for example.

Furthermore, encoder 4801 generates a geometry parameter set (GPS(i)) for each frame. The geometry parameter set includes a parameter that can be used for decoding of the encoded geometry data. The encoded geometry data for each frame depends on an associated geometry parameter set.

The encoded geometry data formed by a plurality of frames is defined as a geometry sequence. Encoder 4801 generates a geometry sequence parameter set (referred to also as geometry sequence PS or geometry SPS) that stores a parameter commonly used for a decoding process for the plurality of frames in the geometry sequence. The geometry sequence depends on the geometry SPS.

Next, a process of generating encoded data of attribute information will be described. Encoder 4801 encodes attribute information of each frame to generate encoded attribute data (compressed attribute data) for each frame. The encoded attribute data is denoted by A(i). FIG. 25 shows an example in which there are attribute X and attribute Y, and encoded attribute data for attribute X is denoted by AX(i), and encoded attribute data for attribute Y is denoted by AY(i).

Furthermore, encoder 4801 generates an attribute parameter set (APS(i)) for each frame. The attribute parameter set for attribute X is denoted by AXPS(i), and the attribute parameter set for attribute Y is denoted by AYPS(i). The attribute parameter set includes a parameter that can be used for decoding of the encoded attribute information. The encoded attribute data depends on an associated attribute parameter set.

The encoded attribute data formed by a plurality of frames is defined as an attribute sequence. Encoder 4801 generates an attribute sequence parameter set (referred to also as attribute sequence PS or attribute SPS) that stores a parameter commonly used for a decoding process for the plurality of frames in the attribute sequence. The attribute sequence depends on the attribute SPS.

In the first encoding method, the encoded attribute data depends on the encoded geometry data.

FIG. 25 shows an example in which there are two types of attribute information (attribute X and attribute Y). When there are two types of attribute information, for example, two encoders generate data and metadata for the two types of attribute information. For example, an attribute sequence is defined for each type of attribute information, and an attribute SPS is generated for each type of attribute information.

Note that, although FIG. 25 shows an example in which there is one type of geometry information, and there are two types of attribute information, the present invention is not limited thereto. There may be one type of attribute information or three or more types of attribute information. In such cases, encoded data can be generated in the same manner. If the point cloud data has no attribute information, there may be no attribute information. In such a case, encoder 4801 does not have to generate a parameter set associated with attribute information.

Next, a process of generating encoded data of additional information (metadata) will be described. Encoder 4801 generates a PCC stream PS (referred to also as PCC stream PS or stream PS), which is a parameter set for the entire PCC stream. Encoder 4801 stores a parameter that can be commonly used for a decoding process for one or more geometry sequences and one or more attribute sequences in the stream PS. For example, the stream PS includes identification information indicating the codec for the point cloud data and information indicating an algorithm used for the encoding, for example. The geometry sequence and the attribute sequence depend on the stream PS.

Next, an access unit and a GOF will be described. In this embodiment, concepts of access unit (AU) and group of frames (GOF) are newly introduced.

An access unit is a basic unit for accessing data in decoding, and is formed by one or more pieces of data and one or more pieces of metadata. For example, an access unit is formed by geometry information and one or more pieces of attribute information associated with a same time point. A GOF is a random access unit, and is formed by one or more access units.

Encoder 4801 generates an access unit header (AU header) as identification information indicating the top of an access unit. Encoder 4801 stores a parameter relating to the access unit in the access unit header. For example, the access unit header includes a configuration of or information on the encoded data included in the access unit. The access unit header further includes a parameter commonly used for the data included in the access unit, such as a parameter relating to decoding of the encoded data.

Note that encoder 4801 may generate an access unit delimiter that includes no parameter relating to the access unit, instead of the access unit header. The access unit delimiter is used as identification information indicating the top of the access unit. The decoding device identifies the top of the access unit by detecting the access unit header or the access unit delimiter.

Next, generation of identification information for the top of a GOF will be described. As identification information indicating the top of a GOF, encoder 4801 generates a GOF header. Encoder 4801 stores a parameter relating to the GOF in the GOF header. For example, the GOF header includes a configuration of or information on the encoded data included in the GOF. The GOF header further includes a parameter commonly used for the data included in the GOF, such as a parameter relating to decoding of the encoded data.

Note that encoder 4801 may generate a GOF delimiter that includes no parameter relating to the GOF, instead of the GOF header. The GOF delimiter is used as identification information indicating the top of the GOF. The decoding device identifies the top of the GOF by detecting the GOF header or the GOF delimiter.

In the PCC-encoded data, the access unit is defined as a PCC frame unit, for example. The decoding device accesses a PCC frame based on the identification information for the top of the access unit.

For example, the GOF is defined as one random access unit. The decoding device accesses a random access unit based on the identification information for the top of the GOF. For example, if PCC frames are independent from each other and can be separately decoded, a PCC frame can be defined as a random access unit.

Note that two or more PCC frames may be assigned to one access unit, and a plurality of random access units may be assigned to one GOF.

Encoder 4801 may define and generate a parameter set or metadata other than those described above. For example, encoder 4801 may generate supplemental enhancement information (SEI) that stores a parameter (an optional parameter) that is not always used for decoding.

Next, a configuration of encoded data and a method of storing encoded data in a NAL unit will be described.

Figure 26:
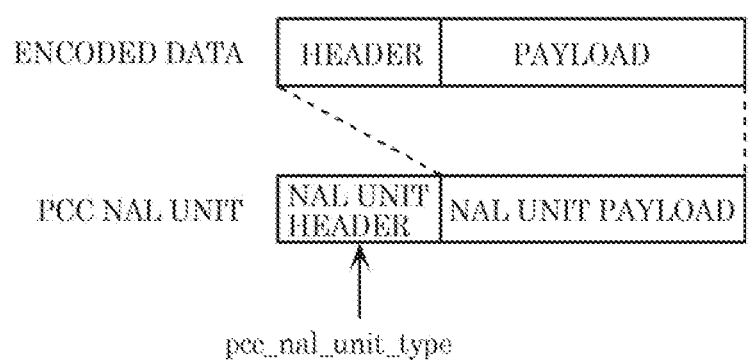
FIG. 26 is a diagram illustrating a structure example of encoded data and a NAL unit according to Embodiment 2.

For example, a data format is defined for each type of encoded data. FIG. 26 is a diagram showing an example of encoded data and a NAL unit.

For example, as shown in FIG. 26, encoded data includes a header and a payload. The encoded data may include length information indicating the length (data amount) of the encoded data, the header, or the payload. The encoded data may include no header.

The header includes identification information for identifying the data, for example. The identification information indicates a data type or a frame number, for example.

The header includes identification information indicating a reference relationship, for example. The identification information is stored in the header when there is a dependence relationship between data, for example, and allows an entity to refer to another entity. For example, the header of the entity to be referred to includes identification information for identifying the data. The header of the referring entity includes identification information indicating the entity to be referred to.

Note that, when the entity to be referred to or the referring entity can be identified or determined from other information, the identification information for identifying the data or identification information indicating the reference relationship can be omitted.

Multiplexer 4802 stores the encoded data in the payload of the NAL unit. The NAL unit header includes pcc_nal_unit_type, which is identification information for the encoded data. FIG. 27 is a diagram showing a semantics example of pcc_nal_unit_type.

As shown in FIG. 27, when pcc_codec_type is codec 1 (Codec1: first encoding method), values 0 to 10 of pcc_nal_unit_type are assigned to encoded geometry data (Geometry), encoded attribute X data (AttributeX), encoded attribute Y data (AttributeY), geometry PS (Geom. PS), attribute XPS (AttrX. S), attribute YPS (AttrY. PS), geometry SPS (Geometry Sequence PS), attribute X SPS (AttributeX Sequence PS), attribute Y SPS (AttributeY Sequence PS), AU header (AU Header), and GOF header (GOF Header) in codec 1. Values of 11 and greater are reserved in codec 1.

When pcc_codec_type is codec 2 (Codec2: second encoding method), values of 0 to 2 of pcc_nal_unit_type are assigned to data A (DataA), metadata A (MetaDataA), and metadata B (MetaDataB) in the codec. Values of 3 and greater are reserved in codec 2.

Embodiment 3

Although there are tools for data dividing, such as the slice or the tile, in HEVC encoding in order to make parallel processing in a decoding device possible, there are no such tools yet in PCC (Point Cloud Compression) encoding.

In PCC, various data dividing methods can be considered according to parallel processing, compression efficiency, and compression algorithms. Here, the definitions of slice and tile, the data structure, and the transmission/reception methods will be described.

FIG. 28 is a block diagram illustrating the configuration of first encoder 4910 included in a three-dimensional data encoding device according to the present embodiment. First encoder 4910 generates encoded data (an encoded stream) by encoding point cloud data with a first encoding method (GPCC (Geometry based PCC)). First encoder 4910 includes divider 4911, a plurality of geometry information encoders 4912, a plurality of attribute information encoders 4913, additional information encoder 4914, and multiplexer 4915.

Divider 4911 generates a plurality of divided data by dividing point cloud data. Specifically, divider 4911 generates a plurality of divided data by dividing the space of point cloud data into a plurality of subspaces. Here, the subspaces are one of tiles and slices, or a combination of tiles and slices. More specifically, point cloud data includes geometry information, attribute information, and additional information. Divider 4911 divides geometry information into a plurality of divided geometry information, and divides attribute information into a plurality of divided attribute information. Also, divider 4911 generates additional information about division.

A plurality of geometry information encoders 4912 generate a plurality of encoded geometry information by encoding the plurality of divided geometry information. For example, the plurality of geometry information encoders 4912 process the plurality of divided geometry information in parallel.

The plurality of attribute information encoders 4913 generate a plurality of encoded attribute information by encoding the plurality of divided attribute information. For example, the plurality of attribute information encoders 4913 process the plurality of divided attribute information in parallel.

Additional information encoder 4914 generates encoded additional information by encoding the additional information included in point cloud data, and the additional information about data dividing generated by divider 4911 at the time of division.

Multiplexer 4915 generates encoded data (an encoded stream) by multiplexing the plurality of encoded geometry information, the plurality of encoded attribute information, and the encoded additional information, and transmits the generated encoded data. Furthermore, the encoded additional information is used at the time of decoding.

Note that, although FIG. 28 illustrates the example in which the respective numbers of geometry information encoders 4912 and attribute information encoders 4913 are two, the respective numbers of geometry information encoders 4912 and attribute information encoders 4913 may be one, or may be three or more. Furthermore, the plurality of divided data may be processed in parallel in the same chip, such as a plurality of cores in a CPU, may be processed in parallel by the respective cores of a plurality of chips, or may be processed in parallel by the plurality of cores of a plurality of chips.

Figure 29:
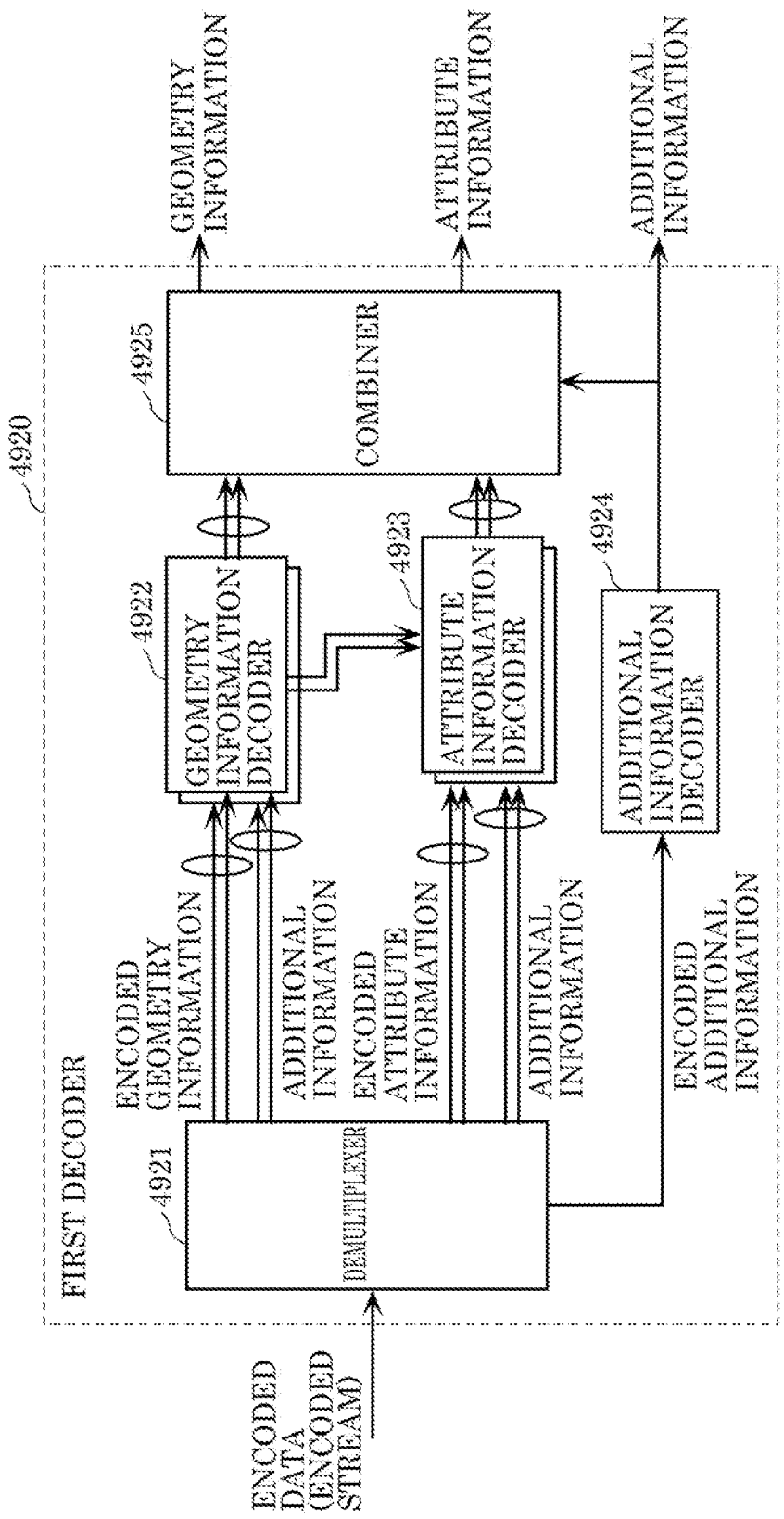
FIG. 29 is a block diagram of a first decoder according to Embodiment 3.

FIG. 29 is a block diagram illustrating the configuration of first decoder 4920. First decoder 4920 restores point cloud data by decoding the encoded data (encoded stream) generated by encoding the point cloud data with the first encoding method (GPCC). First decoder 4920 includes demultiplexer 4921, a plurality of geometry information decoders 4922, a plurality of attribute information decoders 4923, additional information decoder 4924, and combiner 4925.

Demultiplexer 4921 generates a plurality of encoded geometry information, a plurality of encoded attribute information, and encoded additional information by demultiplexing the encoded data (encoded stream).

The plurality of geometry information decoders 4922 generate a plurality of divided geometry information by decoding the plurality of encoded geometry information. For example, the plurality of geometry information decoders 4922 process the plurality of encoded geometry information in parallel.

The plurality of attribute information decoders 4923 generate a plurality of divided attribute information by decoding the plurality of encoded attribute information. For example, the plurality of attribute information decoders 4923 process the plurality of encoded attribute information in parallel.

Additional information decoder 4924 generates additional information by decoding the encoded additional information.

Combiner 4925 generates geometry information by combining the plurality of divided geometry information by using the additional information. Combiner 4925 generates attribute information by combining the plurality of divided attribute information by using the additional information.

Note that, although FIG. 29 illustrates the example in which the respective numbers of geometry information decoders 4922 and attribute information decoders 4923 are two, the respective numbers of geometry information decoders 4922 and attribute information decoders 4923 may be one, or may be three or more. Furthermore, the plurality of divided data may be processed in parallel in the same chip, such as a plurality of cores in a CPU, may be processed in parallel by the respective cores of a plurality of chips, or may be processed in parallel by the plurality of cores of a plurality of chips.

Figure 30:
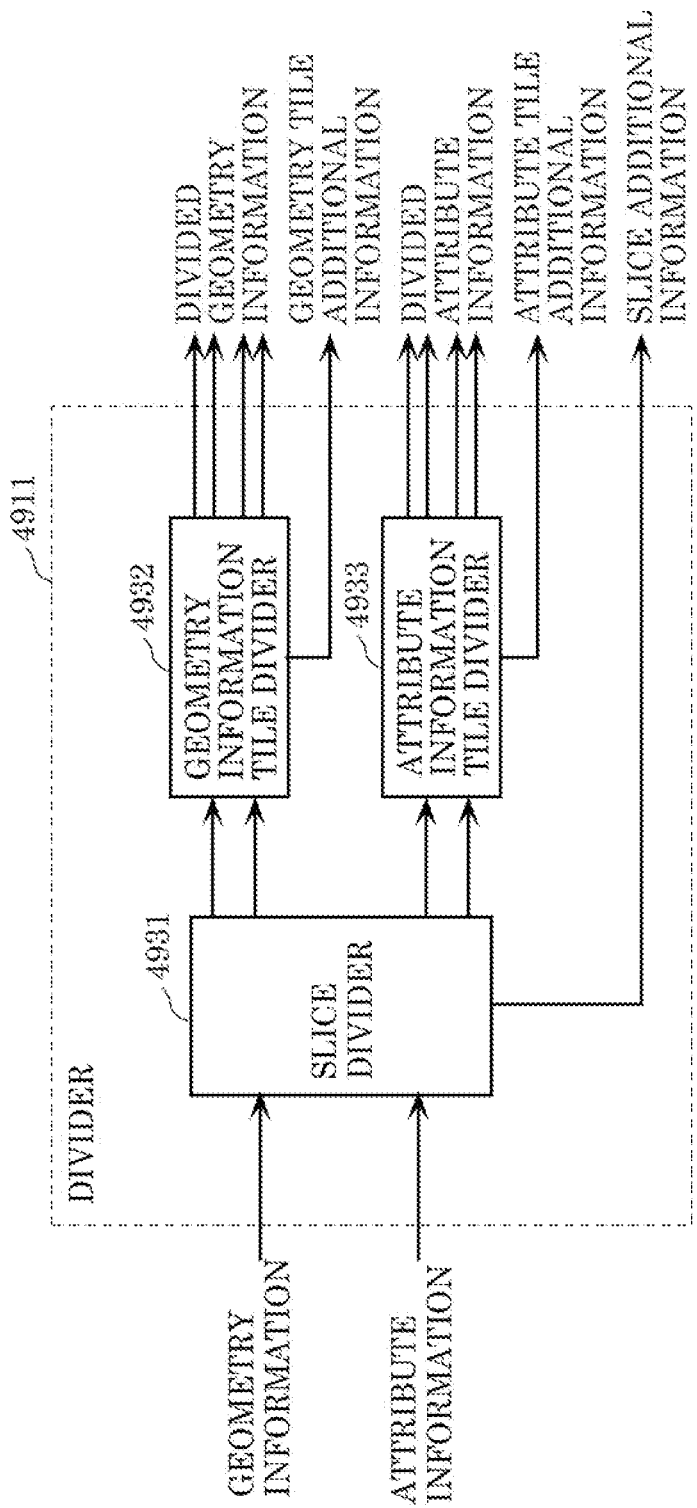
FIG. 30 is a block diagram of a divider according to Embodiment 3.

Next, the configuration of divider 4911 will be described. FIG. 30 is a block diagram of divider 4911. Divider 4911 includes slice divider 4931, geometry information tile divider (geometry tile divider) 4932, and attribute information tile divider (attribute tile divider) 4933.

Slice divider 4931 generates a plurality of slice geometry information by dividing geometry information (position or geometry) into slices. Also, slice divider 4931 generates a plurality of slice attribute information by dividing attribute information (attribute) into slices. Furthermore, slice divider 4931 outputs slice additional information (SliceMetaData) including the information related to slice dividing and the information generated in the slice dividing.

Geometry information tile divider 4932 generates a plurality of divided geometry information (a plurality of tile geometry information) by dividing the plurality of slice geometry information into tiles. Also, geometry information tile divider 4932 outputs geometry tile additional information (geometry tile metadata) including the information related to tile dividing of geometry information, and the information generated in the tile dividing of the geometry information.

Attribute information tile divider 4933 generates a plurality of divided attribute information (a plurality of tile attribute information) by dividing the plurality of slice attribute information into tiles. Also, attribute information tile divider 4933 outputs attribute tile additional information (attribute tile metadata) including the information related to tile dividing of attribute information, and the information generated in the tile dividing of the attribute information.

Note that the number of slices or tiles to be divided is one or more. That is, slice or tile dividing may not be performed.

Note that, although the example in which tile dividing is performed after slice dividing has been illustrated here, slice dividing may be performed after tile dividing. Furthermore, a new division type may be defined in addition to the slice and the tile, and dividing may be performed with three or more division types.

Figure 31:
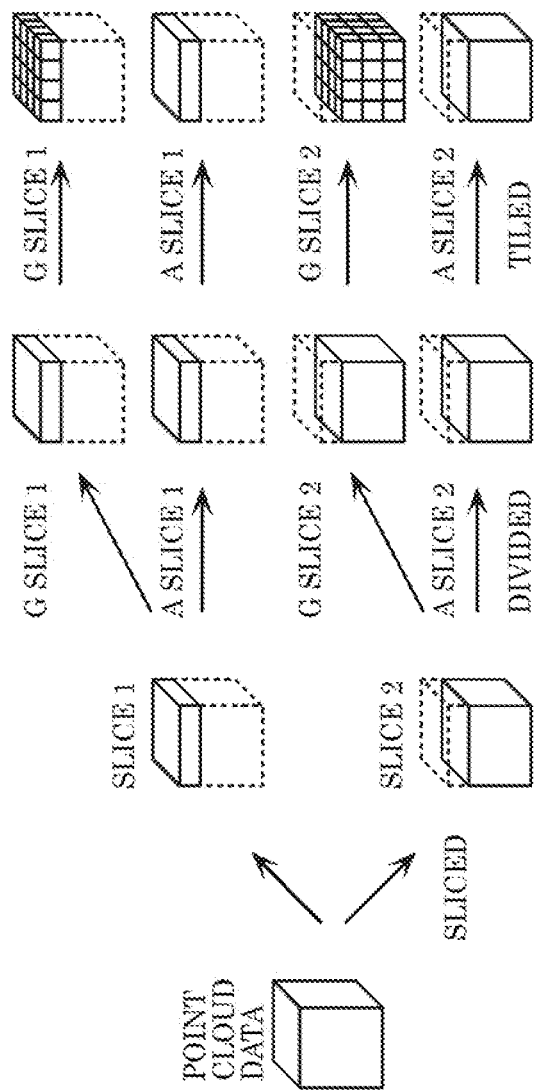
FIG. 31 is a diagram illustrating an example of dividing slices and tiles according to Embodiment 3.

Hereinafter, the dividing method for point cloud data will be described. FIG. 31 is a diagram illustrating an example of slice and tile dividing.

First, the method for slice dividing will be described. Divider 4911 divides three-dimensional point cloud data into arbitrary point clouds on a slice-by-slice basis. In slice dividing, divider 4911 does not divide the geometry information and the attribute information constituting points, but collectively divides the geometry information and the attribute information. That is, divider 4911 performs slice dividing so that the geometry information and the attribute information of an arbitrary point belong to the same slice. Note that, as long as these are followed, the number of divisions and the dividing method may be any number and any method. Furthermore, the minimum unit of division is a point. For example, the numbers of divisions of geometry information and attribute information are the same. For example, a three-dimensional point corresponding to geometry information after slice dividing, and a three-dimensional point corresponding to attribute information are included in the same slice.

Also, divider 4911 generates slice additional information, which is additional information related to the number of divisions and the dividing method at the time of slice dividing. The slice additional information is the same for geometry information and attribute information. For example, the slice additional information includes the information indicating the reference coordinate position, size, or side length of a bounding box after division. Also, the slice additional information includes the information indicating the number of divisions, the division type, etc.

Next, the method for tile dividing will be described. Divider 4911 divides the data divided into slices into slice geometry information (G slice) and slice attribute information (A slice), and divides each of the slice geometry information and the slice attribute information on a tile-by-tile basis.

Note that, although FIG. 31 illustrates the example in which division is performed with an octree structure, the number of divisions and the dividing method may be any number and any method.

Also, divider 4911 may divide geometry information and attribute information with different dividing methods, or may divide geometry information and attribute information with the same dividing method. Additionally, divider 4911 may divide a plurality of slices into tiles with different dividing methods, or may divide a plurality of slices into tiles with the same dividing method.

Furthermore, divider 4911 generates tile additional information related to the number of divisions and the dividing method at the time of tile dividing. The tile additional information (geometry tile additional information and attribute tile additional information) is separate for geometry information and attribute information. For example, the tile additional information includes the information indicating the reference coordinate position, size, or side length of a bounding box after division. Additionally, the tile additional information includes the information indicating the number of divisions, the division type, etc.

Next, an example of the method of dividing point cloud data into slices or tiles will be described. As the method for slice or tile dividing, divider 4911 may use a predetermined method, or may adaptively switch methods to be used according to point cloud data.

At the time of slice dividing, divider 4911 divides a three-dimensional space by collectively handling geometry information and attribute information. For example, divider 4911 determines the shape of an object, and divides a three-dimensional space into slices according to the shape of the object. For example, divider 4911 extracts objects such as trees or buildings, and performs division on an object-by-object basis. For example, divider 4911 performs slice dividing so that the entirety of one or a plurality of objects are included in one slice. Alternatively, divider 4911 divides one object into a plurality of slices.

In this case, the encoding device may change the encoding method for each slice, for example. For example, the encoding device may use a high-quality compression method for a specific object or a specific part of the object. In this case, the encoding device may store the information indicating the encoding method for each slice in additional information (metadata).

Also, divider 4911 may perform slice dividing so that each slice corresponds to a predetermined coordinate space based on map information or geometry information.

At the time of tile dividing, divider 4911 separately divides geometry information and attribute information. For example, divider 4911 divides slices into tiles according to the data amount or the processing amount. For example, divider 4911 determines whether the data amount of a slice (for example, the number of three-dimensional points included in a slice) is greater than a predetermined threshold value. When the data amount of the slice is greater than the threshold value, divider 4911 divides slices into tiles. When the data amount of the slice is less than the threshold value, divider 4911 does not divide slices into tiles.

For example, divider 4911 divides slices into tiles so that the processing amount or processing time in the decoding device is within a certain range (equal to or less than a predetermined value). Accordingly, the processing amount per tile in the decoding device becomes constant, and distributed processing in the decoding device becomes easy.

Additionally, when the processing amount is different between geometry information and attribute information, for example, when the processing amount of geometry information is greater than the processing amount of attribute information, divider 4911 makes the number of divisions of geometry information larger than the number of divisions of attribute information.

Furthermore, for example, when geometry information may be decoded and displayed earlier, and attribute information may be slowly decoded and displayed later in the decoding device according to contents, divider 4911 may make the number of divisions of geometry information larger than the number of divisions of attribute information. Accordingly, since the decoding device can increase the parallel number of geometry information, it is possible to make the processing of geometry information faster than the processing of attribute information.

Note that the decoding device does not necessarily have to process sliced or tiled data in parallel, and may determine whether or not to process them in parallel according to the number or capability of decoding processors.

By performing division with the method as described above, it is possible to achieve adaptive encoding according to contents or objects. Also, parallel processing in decoding processing can be achieved. Accordingly, the flexibility of a point cloud encoding system or a point cloud decoding system is improved.

Figure 32:
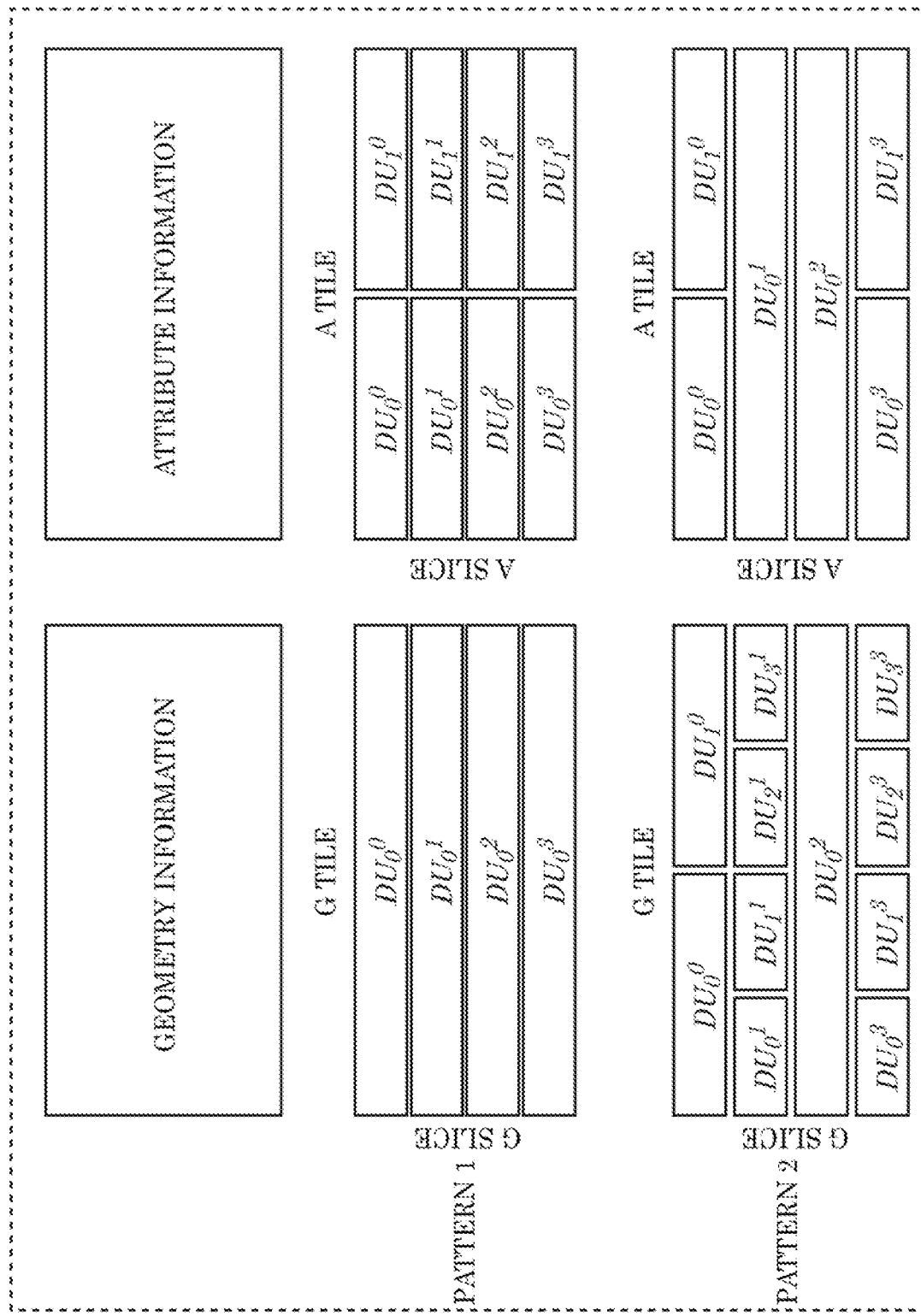
FIG. 32 is a diagram illustrating dividing pattern examples of slices and tiles according to Embodiment 3.

FIG. 32 is a diagram illustrating dividing pattern examples of slices and tiles. DU in the diagram is a data unit (DataUnit), and indicates the data of a tile or a slice. Additionally, each DU includes a slice index (SliceIndex) and a tile index (TileIndex). The top right numerical value of a DU in the diagram indicates the slice index, and the bottom left numerical value of the DU indicates the tile index.

In Pattern 1, in slice dividing, the number of divisions and the dividing method are the same for G slice and A slice. In tile dividing, the number of divisions and the dividing method for G slice are different from the number of divisions and the dividing method for A slice. Additionally, the same number of divisions and dividing method are used among a plurality of G slices. The same number of divisions and dividing method are used among a plurality of A slices.

In Pattern 2, in slice dividing, the number of divisions and the dividing method are the same for G slice and A slice. In tile dividing, the number of divisions and the dividing method for G slice are different from the number of divisions and the dividing method for A slice. Additionally, the number of divisions and the dividing method are different among a plurality of G slices. The number of divisions and the dividing method are different among a plurality of A slices.

Next, the encoding method for divided data will be described. The three-dimensional data encoding device (first encoder 4910) encodes each of divided data. When encoding attribute information, the three-dimensional data encoding device generates, as additional information, dependency information indicating based on which configuration information (geometry information, additional information, or other attribute information) encoding has been performed. That is, the dependency information indicates, for example, the configuration information of a reference destination (dependence destination). In this case, the three-dimensional data encoding device generates the dependency information based on the configuration information corresponding to the divided shape of attribute information. Note that the three-dimensional data encoding device may generate the dependency information based on the configuration information corresponding to a plurality of divided shapes.

Dependency information may be generated by the three-dimensional data encoding device, and the generated dependency information may be transmitted to the three-dimensional data decoding device. Alternatively, the three-dimensional data decoding device may generate dependency information, and the three-dimensional data encoding device may not transmit the dependency information. Furthermore, the dependency used by the three-dimensional data encoding device may be defined in advance, and the three-dimensional data encoding device may not transmit the dependency information.

Figure 33:
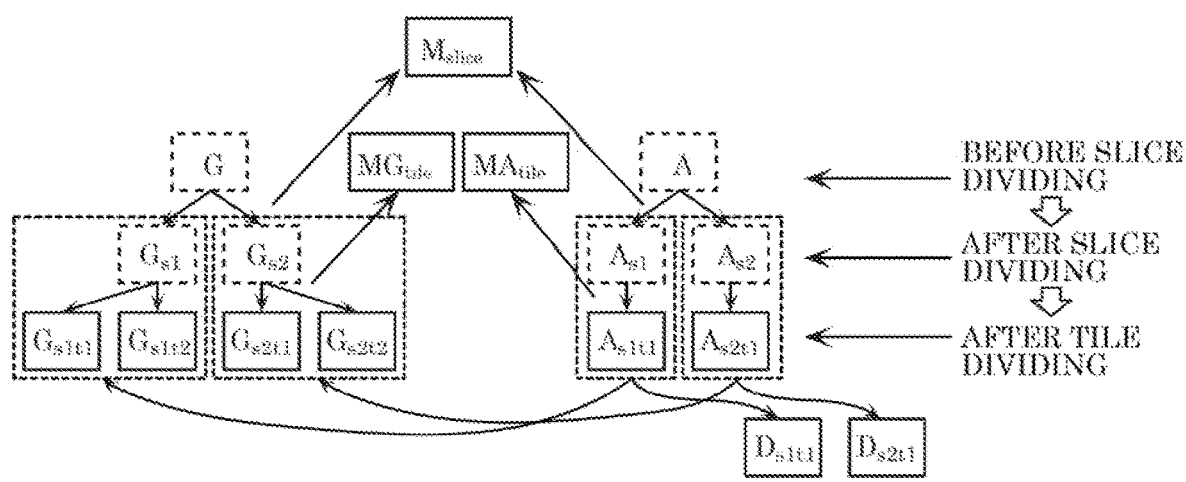
FIG. 33 is a diagram illustrating an example of dependency according to Embodiment 3.

FIG. 33 is a diagram illustrating an example of dependency of each data. The heads of arrows in the diagram indicate dependence destinations, and the origins of the arrows indicate dependence sources. The three-dimensional data decoding device decodes data in the order of a dependence destination to a dependence source. Additionally, the data indicated by solid lines in the diagram is data that is actually transmitted, and the data indicated by dotted lines is data that is not transmitted.

Furthermore, in the diagram, G indicates geometry information, and A indicates attribute information. $G_{s1}$ indicates the geometry information of slice number 1, and $G_{s2}$ indicates the geometry information of slice number 2. $G_{s1t1}$ indicates the geometry information of slice number 1 and tile number 1, $G_{s1t2}$ indicates the geometry information of slice number 1 and tile number 2, $G_{s2t1}$ indicates the geometry information of slice number 2 and tile number 1, and $G_{s2t2}$ indicates the geometry information of slice number 2 and tile number 2. Similarly, $A_{s1}$ indicates the attribute information of slice number 1, and $A_{s2}$ indicates the attribute information of slice number 2. $A_{s1t1}$ indicates the attribute information of slice number 1 and tile number 1, $A_{s1t2}$ indicates the attribute information of slice number 1 and tile number 2, $A_{s2t1}$ indicates the attribute information of slice number 2 and tile number 1, and $A_{s2t2}$ indicates the attribute information of slice number 2 and tile number 2.

Mslice indicates slice additional information, MGtile indicates geometry tile additional information, and MAtile indicates attribute tile additional information. $D_{s1t1}$ indicates the dependency information of attribute information $A_{s1t1}$, and $D_{s2t1}$ indicates the dependency information of attribute information $A_{s2t1}$.

Additionally, the three-dimensional data encoding device may rearrange data in a decoding order, so that it is unnecessary to rearrange data in the three-dimensional data decoding device. Note that data may be rearranged in the three-dimensional data decoding device, or data may be rearranged in both the three-dimensional data encoding device and the three-dimensional data decoding device.

Figure 34:
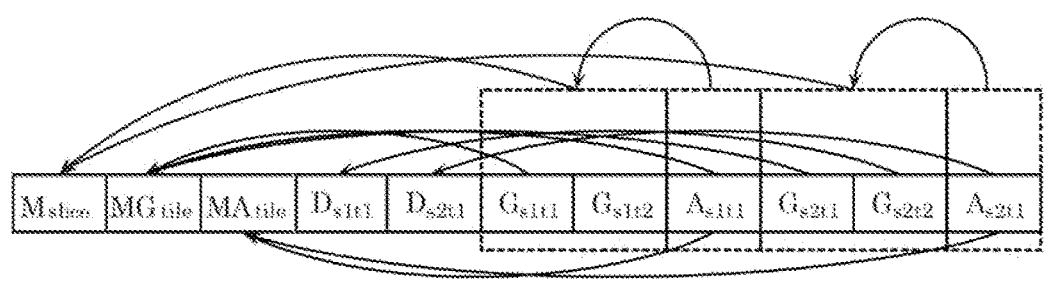
FIG. 34 is a diagram illustrating a data decoding order according to Embodiment 3.

FIG. 34 is a diagram illustrating an example of the data decoding order. In the example of FIG. 34, decoding is sequentially performed from the data on the left. For those data in dependency, the three-dimensional data decoding device decodes the data of a dependence destination first. For example, the three-dimensional data encoding device rearranges data in advance to be in this order, and transmits the data. Note that, as long as it is the order in which the data of dependence destinations become first, it may be any kind of order. Additionally, the three-dimensional data encoding device may transmit additional information and dependency information before data.

Figure 35:
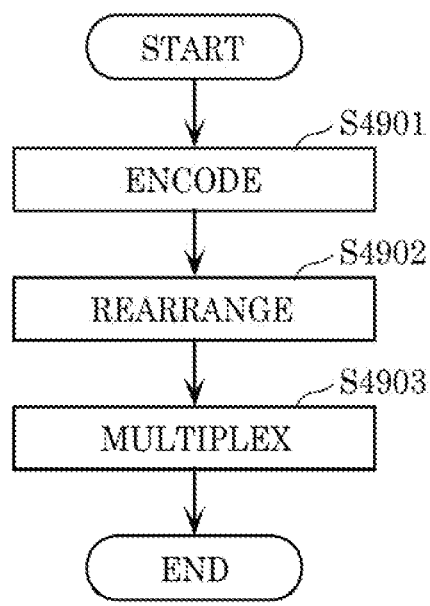
FIG. 35 is a flowchart of encoding processing according to Embodiment 3.

FIG. 35 is a flowchart illustrating the flow of processing by the three-dimensional data encoding device. First, the three-dimensional data encoding device encodes the data of a plurality of slices or tiles as described above (S4901). Next, as illustrated in FIG. 34, the three-dimensional data encoding device rearranges the data so that the data of dependence destinations become first (S4902). Next, the three-dimensional data encoding device multiplexes the rearranged data (forms the rearranged data into a NAL unit) (S4903).

Figure 36:
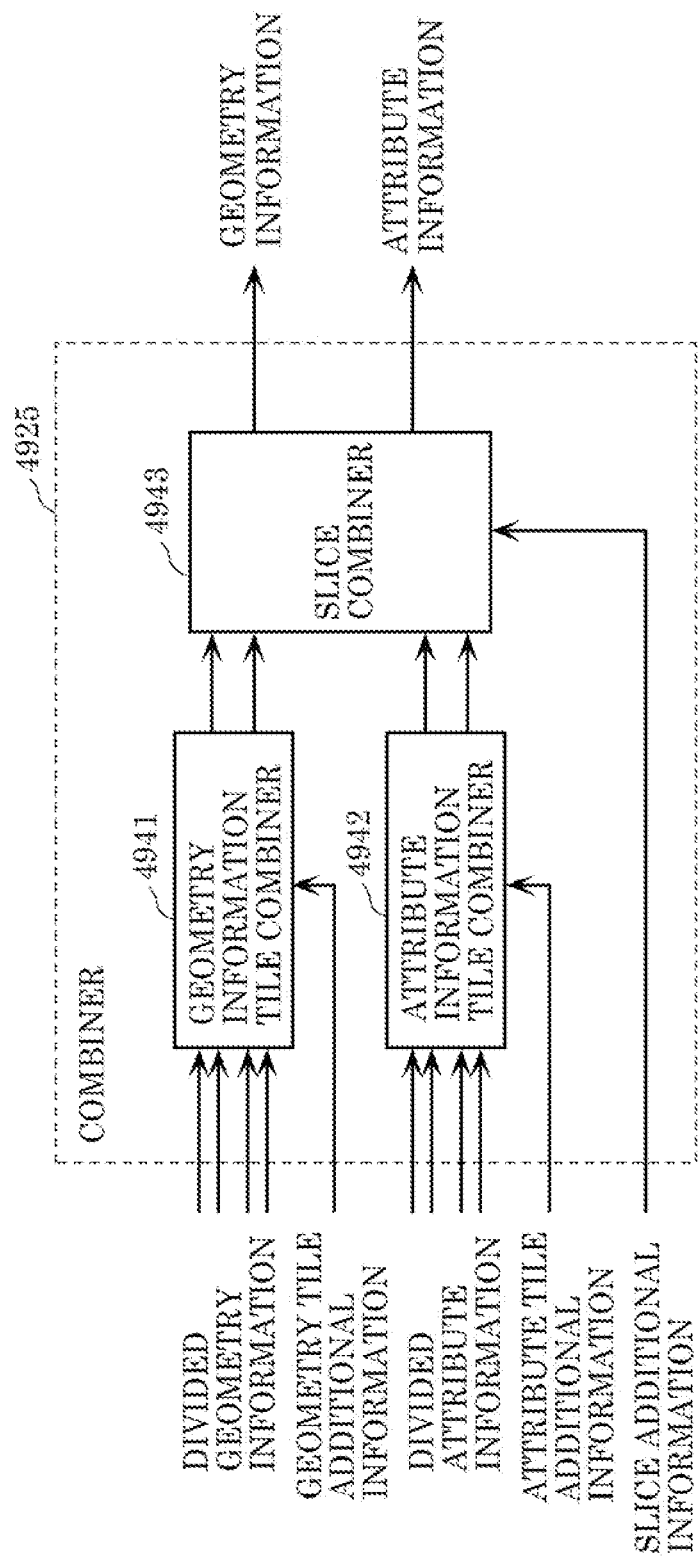
FIG. 36 is a block diagram of a combiner according to Embodiment 3.

Next, the configuration of combiner 4925 included in first decoder 4920 will be described. FIG. 36 is a block diagram illustrating the configuration of combiner 4925. Combiner 4925 includes geometry information tile combiner (geometry tile combiner) 4941, attribute information tile combiner (attribute tile combiner) 4942, and a slice combiner.

Geometry information tile combiner 4941 generates a plurality of slice geometry information by combining a plurality of divided geometry information by using geometry tile additional information. Attribute information tile combiner 4942 generates a plurality of slice attribute information by combining a plurality of divided attribute information by using attribute tile additional information.

Slice combiner 4943 generates geometry information by combining the plurality of slice geometry information by using slice additional information. Additionally, slice combiner 4943 generates attribute information by combining the plurality of slice attribute information by using slice additional information.

Note that the number of slices or tiles to be divided is one or more. That is, slice or tile dividing may not be performed.

Furthermore, although the example in which tile dividing is performed after slice dividing has been illustrated here, slice dividing may be performed after tile dividing. Furthermore, a new division type may be defined in addition to the slice and the tile, and dividing may be performed with three or more division types.

Figure 37:
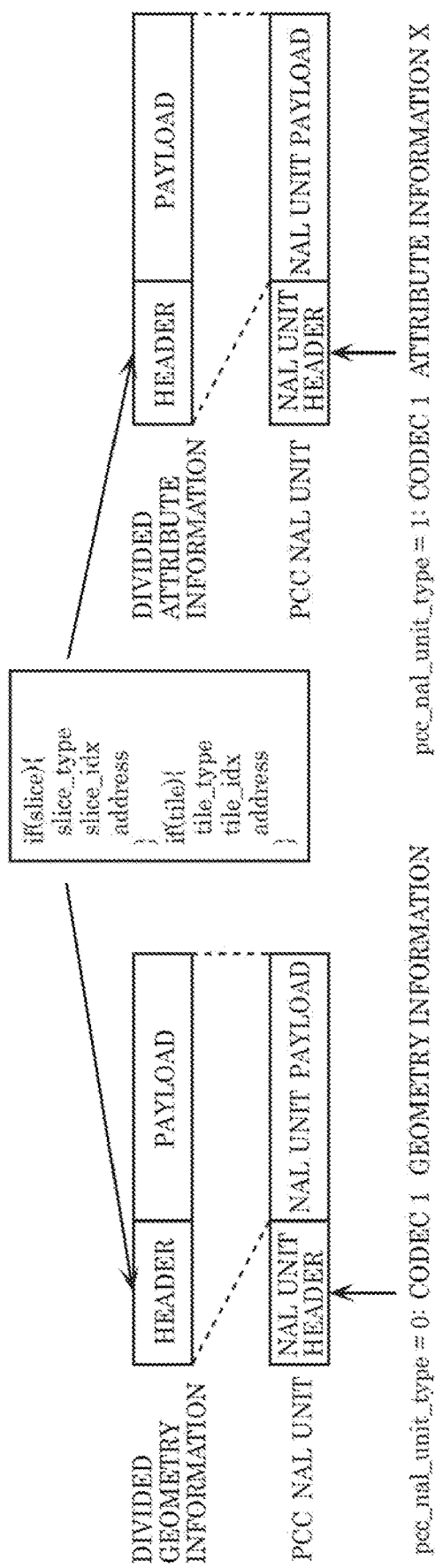
FIG. 37 is a diagram illustrating a structure example of encoded data and a NAL unit according to Embodiment 3.

Next, the configuration of encoded data divided into slices or divided into tiles, and the storing method (multiplexing method) of the encoded data into a NAL unit will be described. FIG. 37 is a diagram illustrating the configuration of encoded data, and the storing method of the encoded data into a NAL unit.

Encoded data (divided geometry information and divided attribute information) is stored in the payload of a NAL unit.

Encoded data includes a header and a payload. The header includes identification information for specifying the data included in the payload. This identification information includes, for example, the type of slice dividing or tile dividing (slice_type, tile_type), the index information for specifying slices or tiles (slice_idx, tile_idx), the geometry information of data (slices or tiles), or the address of data, etc. The index information for specifying slices is also written as the slice index (SliceIndex). The index information for specifying tiles is also written as the tile index (TileIndex). Additionally, the type of division is, for example, the technique based on an object shape as described above, the technique based on map information or geometry information, or the technique based on the data amount or processing amount, etc.

Note that all or a part of the above-described information may be stored in one of the header of divided geometry information and the header of divided attribute information, and may not be stored in the other. For example, when the same dividing method is used for geometry information and attribute information, the type of division (slice_type, tile_type) and the index information (slice_idx, tile_idx) for the geometry information and the attribute information are the same. Therefore, these information may be included in the header of one of the geometry information and the attribute information. For example, when attribute information depends on geometry information, the geometry information is processed first. Therefore, these information may be included in the header of the geometry information, and these information may not be included in the header of the attribute information. In this case, the three-dimensional data decoding device determines that, for example, the attribute information of a dependence source belongs to the same slice or tile as a slice or tile of the geometry information of a dependence destination.

Furthermore, additional information (slice additional information, geometry tile additional information, or attribute tile additional information) related to slice dividing or tile dividing, and dependency information indicating dependency, etc. may be stored and transmitted in an existing parameter set (GPS, APS, geometry SPS, or attribute SPS). When the dividing method is changed for each frame, the information indicating the dividing method may be stored in the parameter set (GPS or APS) for each frame. When the dividing method is not changed within a sequence, the information indicating the dividing method may be stored in the parameter set (geometry SPS or attribute SPS) for each sequence. Furthermore, when the same dividing method is used for geometry information and attribute information, the information indicating the dividing method may be stored in the parameter set of a PCC stream (stream PS).

Also, the above-described information may be stored in any of the above-described parameter sets, or may be stored in a plurality of the parameter sets. Additionally, a parameter set for tile dividing or slice dividing may be defined, and the above-described information may be stored in the parameter set. Furthermore, these information may be stored in the header of encoded data.

Also, the header of encoded data includes the identification information indicating dependency. That is, when there is dependency between data, the header includes the identification information for referring to a dependence destination from a dependence source. For example, the header of data of a dependence destination includes the identification information for specifying the data. The identification information indicating the dependence destination is included in the header of the data of a dependence source. Note that, when the identification information for specifying data, the additional information related to slice dividing or tile dividing, and the identification information indicating dependency can be identified or derived from other information, these information may be omitted.

Figure 38:
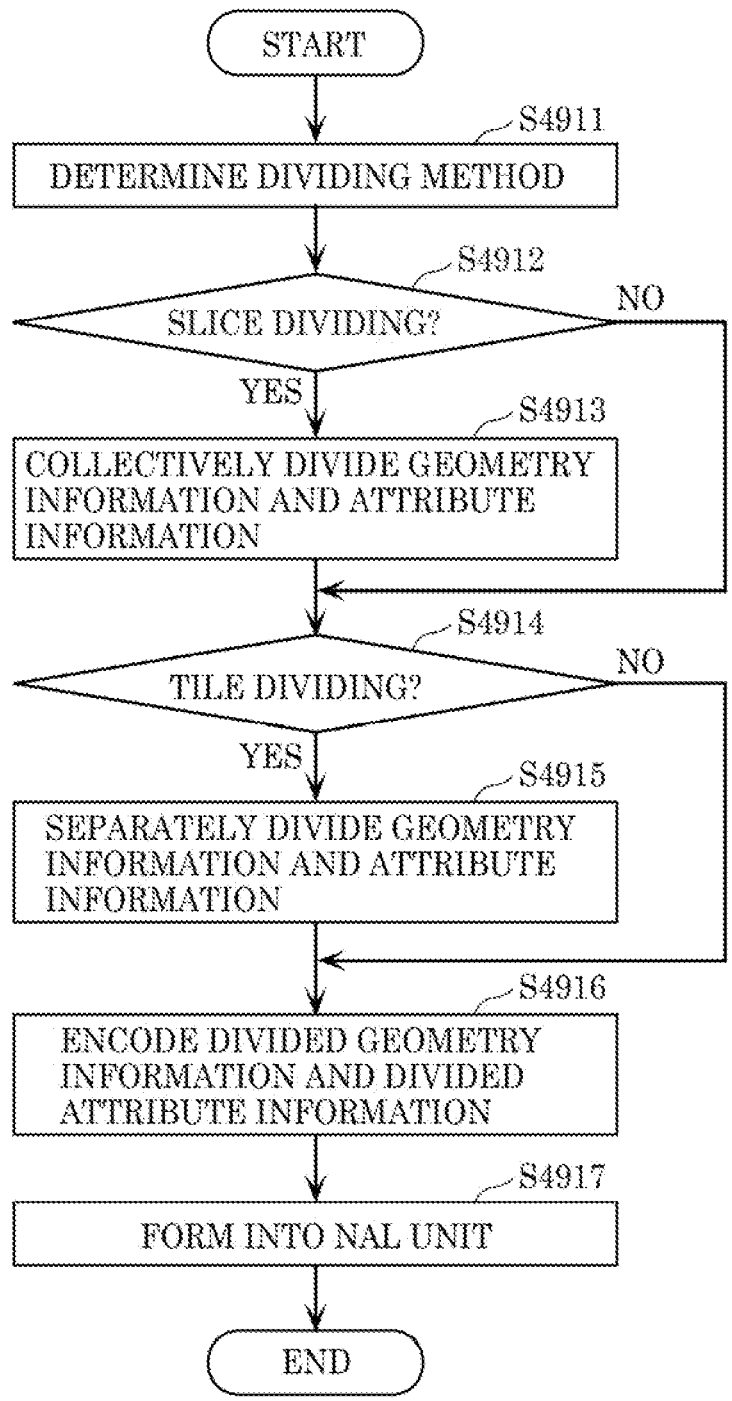
FIG. 38 is a flowchart of encoding processing according to Embodiment 3.

Next, the flows of encoding processing and decoding processing of point cloud data according to the present embodiment will be described. FIG. 38 is a flowchart of the encoding processing of point cloud data according to the present embodiment.

First, the three-dimensional data encoding device determines the dividing method to be used (S4911). This dividing method includes whether or not to perform slice dividing, and whether or not to perform tile dividing. Also, the dividing method may include the number of divisions and the type of division, etc. in the case of performing slice dividing or tile dividing. The type of division is the technique based on an object shape as described above, the technique based on map information or geometry information, or the technique based on the data amount or processing amount, etc. Note that the dividing method may be defined in advance.

When slice dividing is performed (Yes in S4912), the three-dimensional data encoding device generates a plurality of slice geometry information and a plurality of slice attribute information by collectively dividing geometry information and attribute information (S4913). Also, the three-dimensional data encoding device generates slice additional information related to slice dividing. Note that the three-dimensional data encoding device may separately divide geometry information and attribute information.

When tile dividing is performed (Yes in S4914), the three-dimensional data encoding device generates a plurality of divided geometry information and a plurality of divided attribute information by separately dividing the plurality of slice geometry information and the plurality of slice attribute information (or geometry information and attribute information) (S4915). Additionally, the three-dimensional data encoding device generates geometry tile additional information and attribute tile additional information related to tile dividing. Note that the three-dimensional data encoding device may collectively divide slice geometry information and slice attribute information.

Next, the three-dimensional data encoding device generates a plurality of encoded geometry information and a plurality of encoded attribute information by encoding each of the plurality of divided geometry information and the plurality of divided attribute information (S4916). Also, the three-dimensional data encoding device generates dependency information.

Next, the three-dimensional data encoding device generates encoded data (an encoded stream) by forming (multiplexing) the plurality of encoded geometry information, the plurality of encoded attribute information, and additional information into a NAL unit (S4917). Also, the three-dimensional data encoding device transmits the generated encoded data.

Figure 39:
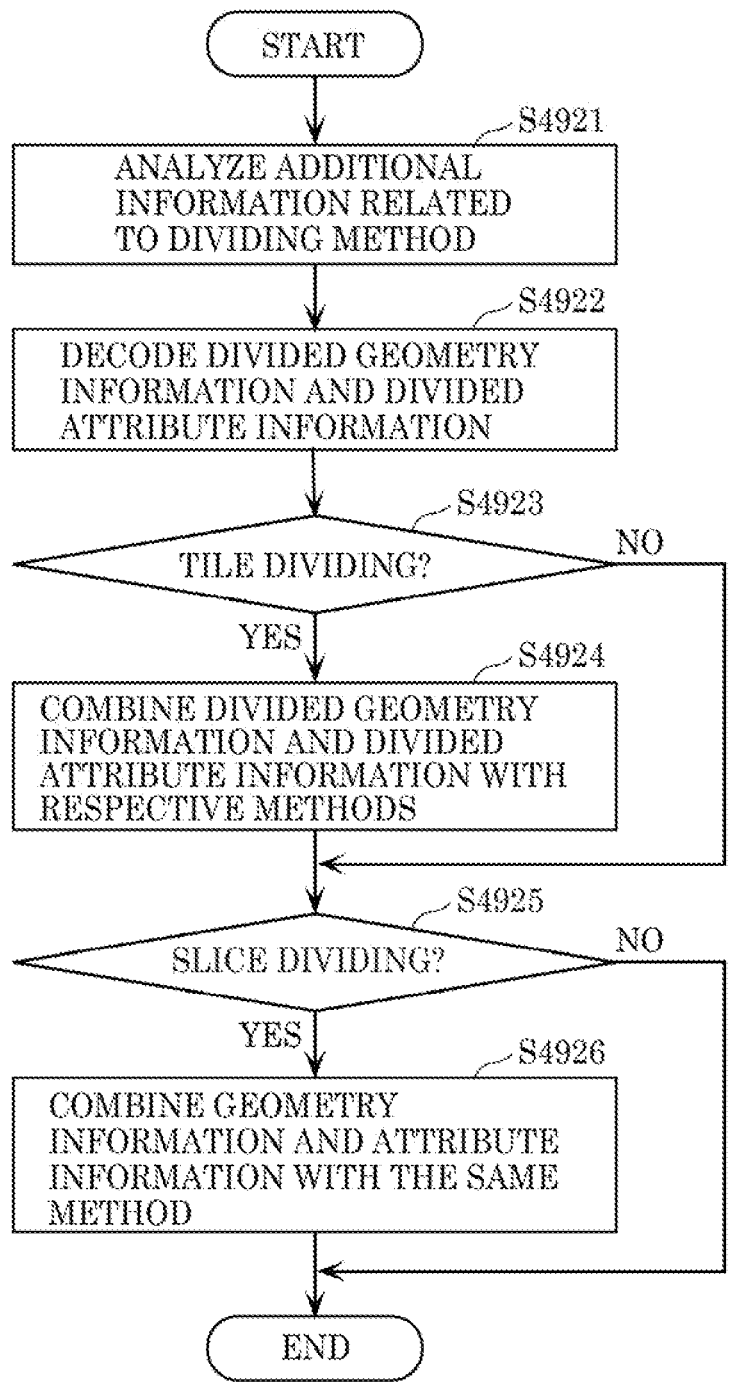
FIG. 39 is a flowchart of decoding processing according to Embodiment 3.

FIG. 39 is a flowchart of the decoding processing of point cloud data according to the present embodiment. First, the three-dimensional data decoding device determines the dividing method by analyzing additional information (slice additional information, geometry tile additional information, and attribute tile additional information) related to the dividing method included in the encoded data (encoded stream) (S4921). This dividing method includes whether or not to perform slice dividing, and whether or not to perform tile dividing. Additionally, the dividing method may include the number of divisions and the type of division, etc. in the case of performing slice dividing or tile dividing.

Next, the three-dimensional data decoding device generates divided geometry information and divided attribute information by decoding a plurality of encoded geometry information and a plurality of encoded attribute information included in the encoded data by using dependency information included in the encoded data (S4922).

When it is indicated by the additional information that tile dividing has been performed (Yes in S4923), the three-dimensional data decoding device generates a plurality of slice geometry information and a plurality of slice attribute information by combining a plurality of divided geometry information and a plurality of divided attribute information with respective methods based on geometry tile additional information and attribute tile additional information (S4924). Note that the three-dimensional data decoding device may combine the plurality of divided geometry information and the plurality of divided attribute information with the same method.

When it is indicated by the additional information that slice dividing has been performed (Yes in S4925), the three-dimensional data decoding device generates geometry information and attribute information by combining the plurality of slice geometry information and the plurality of slice attribute information (the plurality of divided geometry information and the plurality of divided attribute information) with the same method based on slice additional information (S4926). Note that the three-dimensional data decoding device may combine the plurality of slice geometry information and the plurality of slice attribute information with respective different methods.

It is to be noted that attribute information (an identifier, area information, address information, position information, etc.) of a tile or a slice may be stored in other control information instead of SEI. For example, the attribute information may be stored in control information indicating the overall structure of PCC data, or may be stored in control information for each tile or each slice.

In addition, when the three-dimensional data encoding device (three-dimensional data transmitting device) transmits the PCC data to another device, the three-dimensional data encoding device may convert control information such as SEI into control information unique to a protocol supported by the system and present the converted control information.

For example, when the three-dimensional data encoding device converts PCC data including attribute information into an ISO Base Media File Format (ISOBM), the three-dimensional data encoding device may store SEI in an "mdat box" together with the PCC data, or may store SEI in a "track box" in which control information related to a stream is described. In other words, the three-dimensional data encoding device may store the control information in a table for random access. In addition, when the three-dimensional data encoding device packetizes PCC data and transmits packets of PCC data, the three-dimensional data encoding device may store SEI in packet headers. In this way, attribute information can be obtained in a layer of the system, which makes it easier to access the attribute information, and the tile data or the slice data, and thus makes it possible to accelerate the access.

It is to be noted that, in the configuration of the three-dimensional data decoding device, memory manager may determine, in advance, whether information which is necessary for a decoding process is present in memory, and if the information necessary for the decoding process is absent, memory manager may obtain the information necessary for the decoding process from storage or via a network.

When the three-dimensional data decoding device obtains PCC data from storage or via a network using Pull in a protocol such as the MPEG-DASH, memory manager may identify attribute information of data necessary for a decoding process based on information obtained from localizer or the like, request the tile or the slice including the identified attribute information, and obtain the necessary data (PCC stream). A tile or a slice including attribute information may be identified by a storage or network side, or may be identified by memory manager. For example, memory manager may obtain SEI from all PCC data in advance, and identify a tile or a slice based on the information.

When all PCC data have been transmitted from the storage or via the network using Push in the UDP protocol, or the like, memory manager may obtain desired data by identifying the attribute information of data necessary for a decoding process and a tile or a slice, based on information obtained from localizer, or the like, and by filtering a plurality of tiles or slices to obtain a desired tile or a slice from the PCC data transmitted.

In addition, when obtaining data, the three-dimensional data encoding device may determine whether desired data is present, whether real-time processing is possible based on a data size, etc., or a communication state, etc. When the three-dimensional data encoding device determines that it is difficult to obtain the data based on the determination result, the three-dimensional data encoding device may select and obtain another slice or tile whose priority or data amount is different from that of the data.

In addition, the three-dimensional data decoding device may transmit information from localizer, or the like to a cloud server, and the cloud server may determine necessary information based on the information.

Embodiment 4

The following describes tile additional information. The three-dimensional data encoding device generates tile additional information that is metadata regarding a tile division method, and transmits the generated tile additional information to the three-dimensional data decoding device.

FIG. 40 is a diagram illustrating an example of syntax of tile additional information (TileMetaData). As shown in FIG. 40, for example, tile additional information includes division method information (type_of_divide), shape information (topview_shape), an overlap flag (tile_overlap_flag), overlap information (type_of_overlap), height information (tile_height), a tile number (tile_number), and tile position information (global_position, relative_position).

Division method information (type_of_divide) indicates a tile division method. For example, division method information indicates whether a tile division method is division based on map information, that is, division based on top view (top_view) or another division (other).

Shape information (topview_shape) is included in tile additional information when a tile division method is, for example, division based on top view. Shape information indicates a shape in top view of a tile. Examples of the shape include a square and a circle. Moreover, the examples of the shape may include an ellipse, a rectangle, or a polygon other than a quadrangle, or may include a shape other than these. It should be noted that shape information may indicate not only a shape in top view of a tile but also a three-dimensional shape (e.g., a cube, a round column) of a tile.

An overlap flag (tile_overlap_flag) indicates whether tiles overlap each other. For example, an overlap flag is included in tile additional information when a tile division method is division based on top view. In this case, the overlap flag indicates whether tiles overlap each other in top view. It should be noted that an overlap flag may indicate whether tiles overlap each other in a three-dimensional space.

Overlap information (type_of_overlap) is included in tile additional information when, for example, tiles overlap each other. Overlap information indicates, for example, how tiles overlap each other. For example, overlap information indicates the size of an overlapping region.

Height information (tile_height) indicates the height of a tile. It should be noted that height information may include information indicating a tile shape. For example, when the shape of a tile in top view is a rectangle, the information may indicate the length of a side (a vertical length, a horizontal length) of the rectangle. When the shape of a tile in top view is a circle, the information may indicate the diameter or radius of the circle.

Moreover, height information may indicate the height of each tile or a height common to tiles. In addition, height types such as roads and overpasses may be set in advance, and height information may indicate the height of each of the height types and a height type of each tile. Alternatively, a height of each height type may be specified in advance, and height information may indicate a height type of each tile. In other words, height information need not indicate a height of each height type.

A tile number (tile_number) indicates the number of tiles. It should be noted that tile additional information may include information indicating an interval between tiles.

Tile position information (global_position, relative_position) is information for identifying the position of each tile. For example, tile position information indicates the absolute coordinates or relative coordinates of each tile.

It should be noted that part or all of the above-mentioned information may be provided for each tile or each group of tiles (e.g., for each frame or group of frames).

The three-dimensional data encoding device may include tile additional information in supplemental enhancement information (SEI) and transmit the SEI. Alternatively, the three-dimensional data encoding device may store tile additional information in an existing parameter set (PPS. GPS, or APS, etc.) and transmit the parameter set.

For example, when tile additional information changes for each frame, the tile additional information may be stored in a parameter set for each frame (GPS or APS etc.). When tile additional information does not change in a sequence, the tile additional information may be stored in a parameter set for sequence (geometry SPS or attribute SPS). Further, when the same tile division information is used for geometry information and attribute information, tile additional information may be stored in a parameter set for a PCC stream (a stream PS).

Moreover, tile additional information may be stored in any one of the above-mentioned parameter sets or in parameter sets. In addition, tile additional information may be stored in the header of encoded data. Additionally, tile additional information may be stored in the header of a NAL unit.

Furthermore, part or all of tile additional information may be stored in one of the header of divided geometry information and the header of divided attribute information, and need not be stored in the other. For example, when the same tile additional information is used for geometry information and attribute information, the tile additional information may be included in the header of one of the geometry information and the attribute information. For example, when attribute information depends on geometry information, the geometry information is processed first. For this reason, the tile additional information may be included in the header of the geometry information, and need not be included in the header of the attribute information. In this case, for example, the three-dimensional data decoding device determines that the attribute information of the depender belongs to the same tile as a tile having the geometry information of the dependee.

The three-dimensional data decoding device reconstructs point cloud data subjected to tile division, based on tile additional information. When there are pieces of overlapping point cloud data, the three-dimensional data decoding device specifies the pieces of overlapping point cloud data and selects one of the pieces of overlapping point cloud data or merges pieces of point cloud data.

Moreover, the three-dimensional data decoding device may perform decoding using tile additional information. For example, when tiles overlap each other, the three-dimensional data decoding device may perform decoding for each tile, perform processing (e.g., smoothing or filtering) using the pieces of decoded data, and generate point cloud data. This makes it possible to perform highly accurate decoding.

Figure 41:
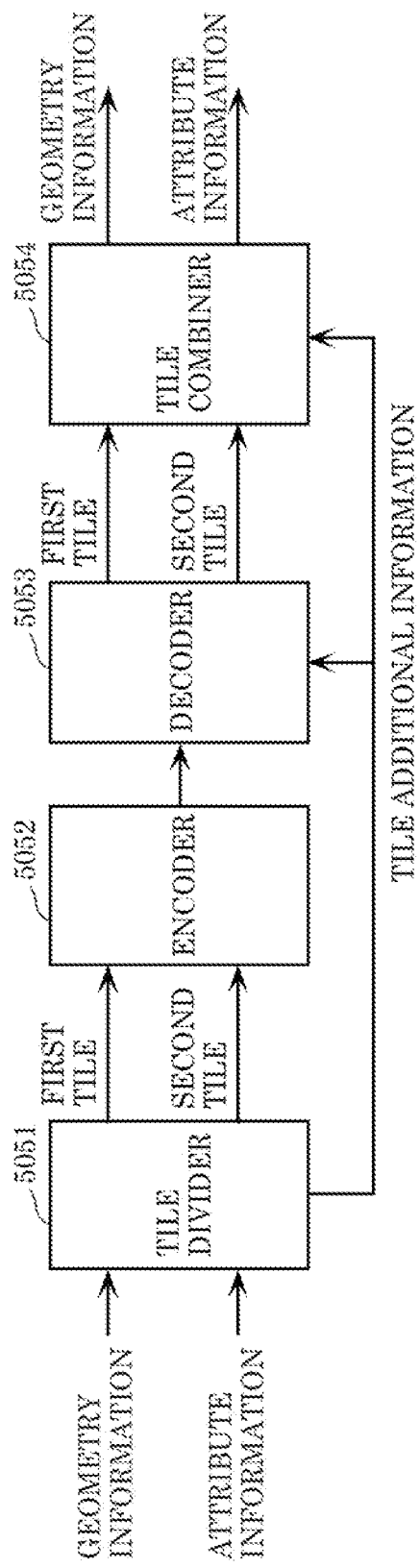
FIG. 41 is a block diagram of an encoding and decoding system according to Embodiment 4.

FIG. 41 is a diagram illustrating a configuration example of a system including the three-dimensional data encoding device and the three-dimensional data decoding device. Tile divider 5051 divides point cloud data including geometry information and attribute information into a first tile and a second tile. In addition, tile divider 5051 transmits tile additional information regarding tile division to decoder 5053 and tile combiner 5054.

Encoder 5052 generates encoded data by encoding the first tile and the second tile.

Decoder 5053 restores the first tile and the second tile by decoding the encoded data generated by encoder 5052. Tile combiner 5054 restores the point cloud data (the geometry information and the attribute information) by combining the first tile and the second tile using the tile additional information.

The following describes slice additional information. The three-dimensional data encoding device generates slice additional information that is metadata regarding a slice division method, and transmits the generated slice additional information to the three-dimensional data decoding device.

FIG. 42 is a diagram illustrating an example of syntax of slice additional information (SliceMetaData). As shown in FIG. 42, for example, slice additional information includes division method information (type_of_divide), an overlap flag (slice_overlap_flag), overlap information (type_of_overlap), a slice number (slice_number), slice position information (global_position, relative_position), and slice size information (slice_bounding_box_size).

Division method information (type_of_divide) indicates a slice division method. For example, division method information indicates whether a slice division method is division based on information about an object (object). It should be noted that slice additional information may include information indicating an object division method. For example, this information indicates whether one object is to be divided into slices or assigned to one slice. In addition, the information may indicate, for example, a division number when one object is divided into slices.

An overlap flag (slice_overlap_flag) indicates whether slices overlap each other. Overlap information (type_of_overlap) is included in slice additional information when, for example, slices overlap each other. Overlap information indicates, for example, how slices overlap each other. For example, overlap information indicates the size of an overlapping region.

A slice number (slice_number) indicates the number of slices.

Slice position information (global_position, relative_position) and slice size information (slice_bounding_box_size) are information about a region of a slice. Slice position information is information for identifying the position of each slice. For example, slice position information indicates the absolute coordinates or relative coordinates of each slice. Slice size information (slice_bounding_box_size) indicates the size of each slice. For example, slice size information indicates the size of a bounding box of each slice.

The three-dimensional data encoding device may include slice additional information in SEI and transmit the SEI. Alternatively, the three-dimensional data encoding device may store slice additional information in an existing parameter set (PPS, GPS, or APS, etc.) and transmit the parameter set.

For example, when slice additional information changes for each frame, the slice additional information may be stored in a parameter set for each frame (GPS or APS etc.). When slice additional information does not change in a sequence, the slice additional information may be stored in a parameter set for sequence (geometry SPS or attribute SPS). Further, when the same slice division information is used for geometry information and attribute information, slice additional information may be stored in a parameter set for a PCC stream (a stream PS).

Moreover, slice additional information may be stored in any one of the above-mentioned parameter sets or in parameter sets. In addition, slice additional information may be stored in the header of encoded data. Additionally, slice additional information may be stored in the header of a NAL unit.

Furthermore, part or all of slice additional information may be stored in one of the header of divided geometry information and the header of divided attribute information, and need not be stored in the other. For example, when the same slice additional information is used for geometry information and attribute information, the slice additional information may be included in the header of one of the geometry information and the attribute information. For example, when attribute information depends on geometry information, the geometry information is processed first. For this reason, the slice additional information may be included in the header of the geometry information, and need not be included in the header of the attribute information. In this case, for example, the three-dimensional data decoding device determines that the attribute information of the depender belongs to the same slice as a slice having the geometry information of the dependee.

The three-dimensional data decoding device reconstructs point cloud data subjected to slice division, based on slice additional information. When there are pieces of overlapping point cloud data, the three-dimensional data decoding device specifies the pieces of overlapping point cloud data and selects one of the pieces of overlapping point cloud data or merges pieces of point cloud data.

Moreover, the three-dimensional data decoding device may perform decoding using slice additional information. For example, when slices overlap each other, the three-dimensional data decoding device may perform decoding for each slice, perform processing (e.g., smoothing or filtering) using the pieces of decoded data, and generate point cloud data. This makes it possible to perform highly accurate decoding.

Figure 43:
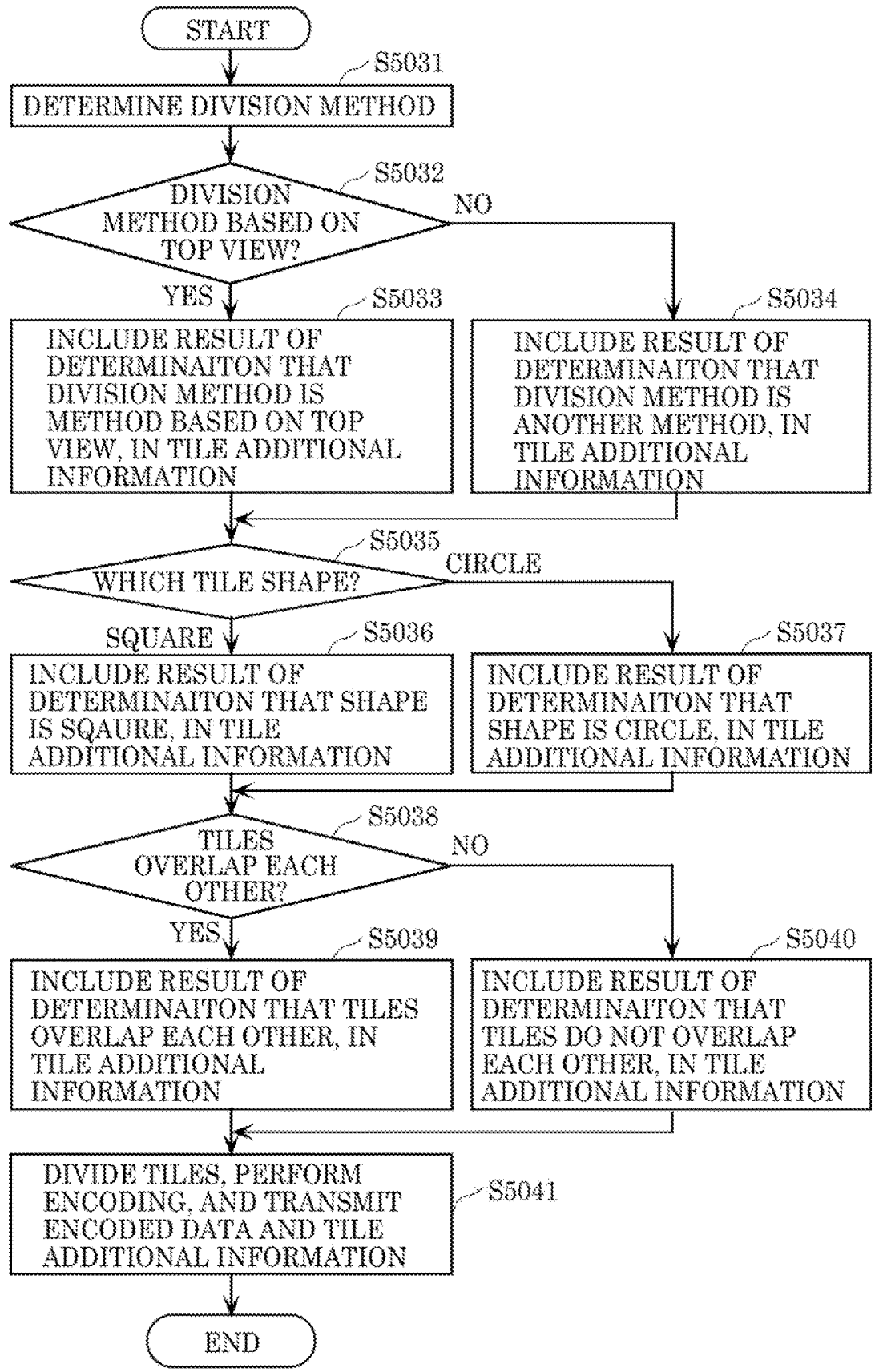
FIG. 43 is a flowchart of an encoding process according to Embodiment 4.

FIG. 43 is a flowchart of a three-dimensional data encoding process including a tile additional information generation process performed by the three-dimensional data encoding device according to the present embodiment.

First, the three-dimensional data encoding device determines a division method to be used (S5031). Specifically, the three-dimensional data encoding device determines whether a division method based on top view (top_view) or another method (other) is to be used as a tile division method. In addition, the three-dimensional data encoding device determines a tile shape when the division method based on top view is used. Additionally, the three-dimensional data encoding device determines whether tiles overlap with other tiles.

When the tile division method determined in step S5031 is the division method based on top view (YES in S5032), the three-dimensional data encoding device includes a result of the determination that the tile division method is the division method based on top view (top_view), in tile additional information (S5033).

On the other hand, when the tile division method determined in step S5031 is a method other than the division method based on top view (NO in S5032), the three-dimensional data encoding device includes a result of the determination that the tile division method is the method other than the division method based on top view (top_view), in tile additional information (S5034).

Moreover, when a shape in top view of a tile determined in step S5031 is a square (SQUARE in S5035), the three-dimensional data encoding device includes a result of the determination that the shape in top view of the tile is the square, in the tile additional information (S5036). In contrast, when a shape in top view of a tile determined in step S5031 is a circle (CIRCLE in S5035), the three-dimensional data encoding device includes a result of the determination that the shape in top view of the tile is the circle, in the tile additional information (S5037).

Next, the three-dimensional data encoding device determines whether tiles overlap with other tiles (S5038). When the tiles overlap with the other tiles (YES in S5038), the three-dimensional data encoding device includes a result of the determination that the tiles overlap with the other tiles, in the tile additional information (S5039). On the other hand, when the tiles do not overlap with other tiles (NO in S5038), the three-dimensional data encoding device includes a result of the determination that the tiles do not overlap with the other tiles, in the tile additional information (S5040).

Finally, the three-dimensional data encoding device divides the tiles based on the tile division method determined in step S5031, encodes each of the tiles, and transmits the generated encoded data and the tile additional information (S5041).

Figure 44:
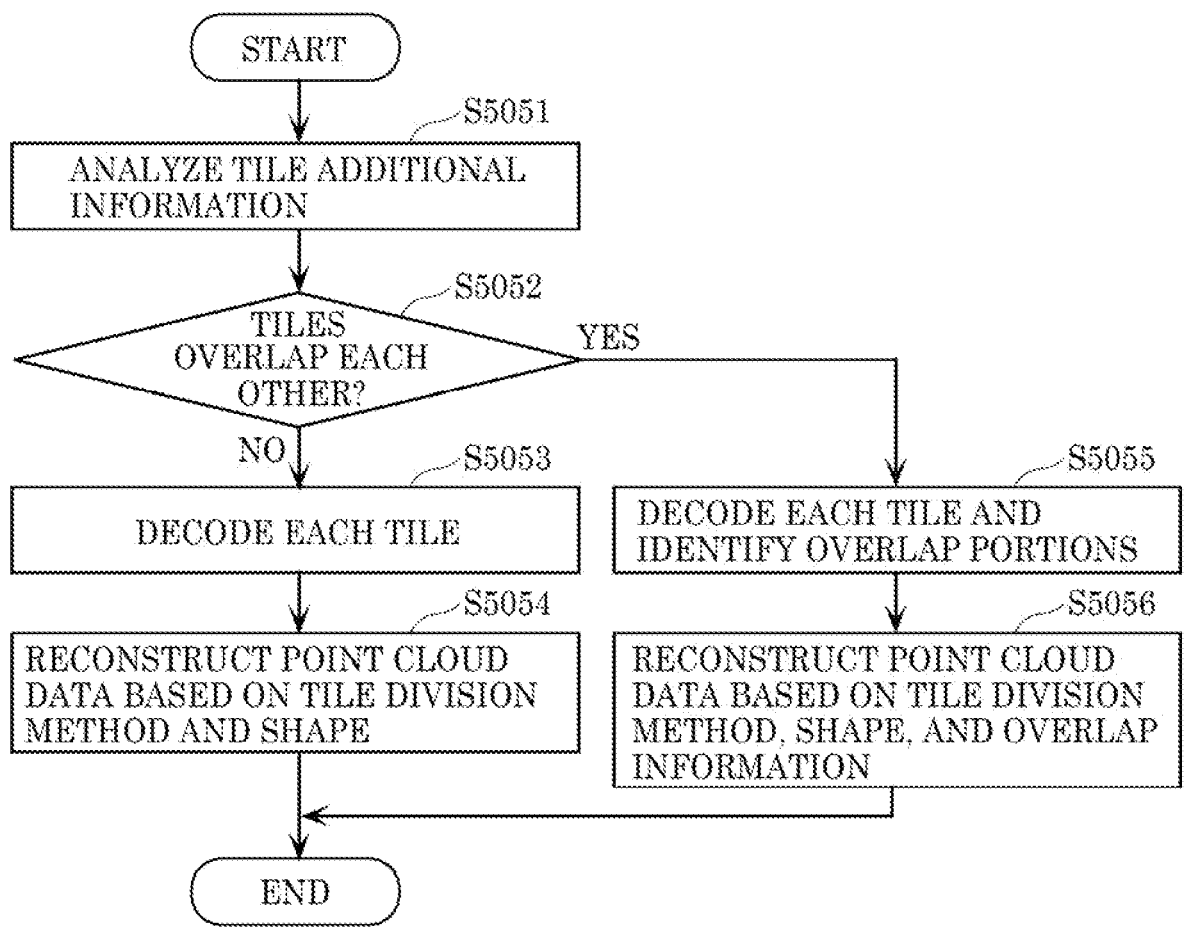
FIG. 44 is a flowchart of a decoding process according to Embodiment 4.

FIG. 44 is a flowchart of a three-dimensional data decoding process performed by the three-dimensional data decoding device according to the present embodiment using tile additional information.

First, the three-dimensional data decoding device analyzes tile additional information included in a bitstream (S5051).

When the tile additional information indicates that tiles do not overlap with other tiles (NO in S5052), the three-dimensional data decoding device generates point cloud data of each tile by decoding the tile (S5053). Finally, the three-dimensional data decoding device reconstructs point cloud data from the point cloud data of each tile, based on a tile division method and a tile shape indicated by the tile additional information (S5054).

In contrast, when the tile additional information indicates that tiles overlap with other tiles (YES in S5052), the three-dimensional data decoding device generates point cloud data of each tile by decoding the tile. In addition, the three-dimensional data decoding device identifies overlap portions of the tiles based on the tile additional information (S5055). It should be noted that, regarding the overlap portions, the three-dimensional data decoding device may perform decoding using pieces of overlapping information. Finally, the three-dimensional data decoding device reconstructs point cloud data from the point cloud data of each tile, based on a tile division method, a tile shape, and overlap information indicated by the tile additional information (S5056).

The following describes, for example, variations regarding slice. The three-dimensional data encoding device may transmit, as additional information, information indicating a type (a road, a building, a tree, etc.) or attribute (dynamic information, static information, etc.) of an object. Alternatively, a coding parameter may be predetermined according to an object, and the three-dimensional data encoding device may notify the coding parameter to the three-dimensional data decoding device by transmitting a type or attribute of the object.

The following methods may be used regarding slice data encoding order and transmitting order. For example, the three-dimensional data encoding device may encode slice data in decreasing order of ease of object recognition or clustering. Alternatively, the three-dimensional data encoding device may encode slice data in the order in which clustering is completed. Moreover, the three-dimensional data encoding device may transmit slice data in the order in which the slice data is encoded. Alternatively, the three-dimensional data encoding device may transmit slice data in decreasing order of priority for decoding in an application. For example, when dynamic information has high priority for decoding, the three-dimensional data encoding device may transmit slice data in the order in which slices are grouped using the dynamic information.

Furthermore, when encoded data order is different from the order of priority for decoding, the three-dimensional data encoding device may transmit encoded data after rearranging the encoded data. In addition, when storing encoded data, the three-dimensional data encoding device may store encoded data after rearranging the encoded data.

An application (the three-dimensional data decoding device) requests a server (the three-dimensional data encoding device) to transmit slices including desired data. The server may transmit slice data required by the application, and need not transmit slice data unnecessary for the application.

An application requests a server to transmit a tile including desired data. The server may transmit tile data required by the application, and need not transmit tile data unnecessary for the application.

Embodiment 5

The present embodiment describes processing of a division unit (e.g., a tile or a slice) including no points. First, a method of dividing point cloud data will be described.

In a video coding standard such as HEVC, since there are data for all the pixels of a two-dimensional image, even when a two-dimensional space is divided into data areas, all the data areas include data. On the other hand, in encoding of three-dimensional point cloud data, points themselves that are elements of point cloud data are data, and there is a possibility that data are not included in some of areas.

There are various methods of spatially dividing point cloud data, and such methods can be classified according to whether a division unit (e.g., a tile or a slice) that is a divided data unit always includes one or more point data.

A division method in which all division units each include one or more point data is referred to as a first division method. Examples of the first division method include a method of dividing point cloud data in consideration of processing time for encoding or the size of encoded data. In this case, each division unit has a substantially even number of points.

Figure 45:
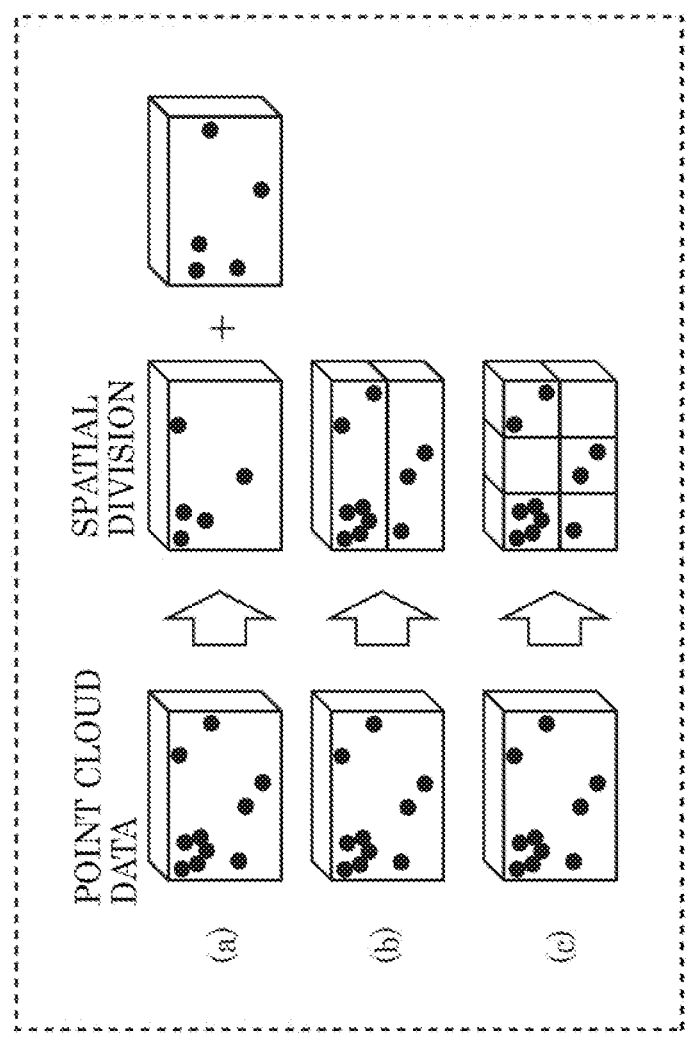
FIG. 45 is a diagram illustrating examples of a division method according to Embodiment 5.

FIG. 45 is a diagram illustrating examples of a division method. For example, as shown in (a) in FIG. 45, a method of separating points belonging to an identical space into two identical spaces may be used as the first division method. In addition, as shown in (b) in FIG. 45, a space may be divided into subspaces (division units) so that each of the division units includes points.

Since these methods are division in consideration of points, all division units always include one or more points.

A division method in which division units are likely to include one or more division units including no point data is referred to as a second division method. For example, as shown in (c) in FIG. 45, a method of dividing a space equally may be used as the second division method. In this case, a division unit does not always include points. In short, a division unit may include no points.

When the three-dimensional data encoding device divides point cloud data, the three-dimensional data encoding device may include, in divided additional information (e.g., tile additional information or slice additional information), (i) whether a division method in which all division units include one or more point data has been used, (ii) whether a division method in which division units include one or more division units including no point data has been used, or (iii) whether a division method in which division units are likely to include one or more division units including no point data. Subsequently, the three-dimensional data encoding device may transmit the divided additional information.

It should be noted that the three-dimensional data encoding device may indicate the above information as a type of a division method. Additionally, the three-dimensional data encoding device may perform division using a predetermined division method, and need not transmit divided additional information. In this case, the three-dimensional data encoding device dearly specifies whether the division method is the first division method or the second division method in advance.

The following describes the second division method and an example of generating and transmitting encoded data. It should be noted that although tile division will be exemplified as a method of dividing a three-dimensional space below, the present embodiment is not limited to tile division, and the following procedure is applicable to a division method using division units other than tiles. For example, slice division may be used instead of tile division.

Figure 46:
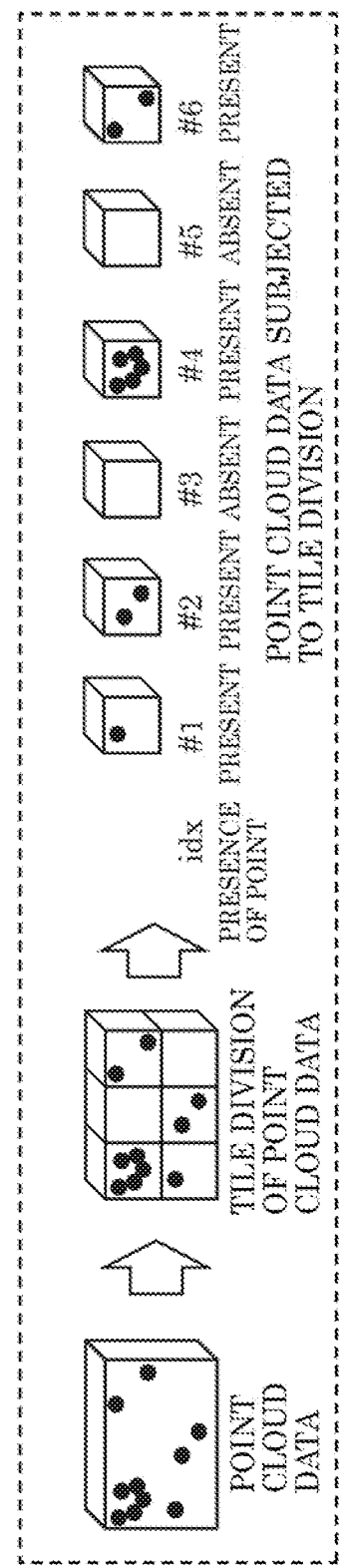
FIG. 46 is a diagram illustrating an example of dividing point cloud data according to Embodiment 5.

FIG. 46 is a diagram illustrating an example of dividing point cloud data into six tiles. FIG. 46 shows an example in which the smallest unit is a point and geometry information (geometry) and attribute information (attribute) are divided together. It should be noted that the same applies to a case in which geometry information and attribute information are divided using separate division methods or by separate division numbers, a case in which there is no attribute information, and a case in which there are pieces of attribute information.

In the example shown in FIG. 46, tile division results in tiles (#1, #2, #4, #6) including points and tiles (#3, #5) including no points. A tile including no points is referred to as a null tile.

It should be noted that the present disclosure is not limited to the division into six tiles, and any division method may be used. For example, a division unit may be a cube or have a non-cubic shape such as a cuboid or round column. Division units may be identical or different in shape. Moreover, a predetermined method may be used as a division method, or a different method may be used for each predetermined unit (e.g., PCC frame).

In the present division method, when point cloud data is divided into tiles and one or more of the tiles include no data, a bitstream including information indicating that the one or more tiles are null tiles is generated.

The following describes a method of transmitting a null tile and a method of signaling a null tile. The three-dimensional data encoding device may generate, as addition information (metadata) regarding data division, for example, the following information and transmit the generated information. FIG. 47 is a diagram illustrating an example of syntax of tile additional information (TileMetaData). Tile additional information includes division method information (type_of_divide), division method null information (type_of_divide_null), a tile division number (number_of_tiles), and a tile null flag (tile_null_flag).

Division method information (type_of_divide) is information regarding a division method or a division type. For example, division method information indicates one or more division methods or division types. Examples of a division method include top view (top_view) division and equal division. It should be noted that when the number of definitions of a division method is one, tile additional information need not include division method information.

Division method null information (type_of_divide_null) is information indicating whether a division method to be used is the following first division method or second division method. Here, the first division method is a division method in which each of all division units always includes one or more point data. The second division method is a division method in which division units include one or more division units including no point data or a division method in which division units are likely to include one or more division units including no point data.

Tile additional information may also include, as division information about tiles as a whole, at least one of (i) information (a tile division number (number_of_tiles)) indicating a tile division number or information for specifying a tile division number, (ii) information indicating the number of null tiles or information for specifying the number of null tiles, or (iii) information indicating the number of tiles other than null tiles or information for specifying the number of tiles other than null tiles. In addition, the tile additional information may include, as division information about tiles as a whole, information indicating shapes of tiles or whether tiles overlap each other.

Moreover, the tile additional information indicates division information of each tile in sequence. For example, the order of tiles is predetermined for each division method, and is already known to the three-dimensional data encoding device and the three-dimensional data decoding device. It should be noted that when the order of tiles is not predetermined, the three-dimensional data encoding device may transmit information indicating the order to the three-dimensional data decoding device.

Division information of each tile includes a tile null flag (tile_null_flag) indicating whether the tile includes data (a point). It should be noted that when a tile includes no data, a tile null flag may be included as tile division information.

Moreover, when a tile is not a null tile, tile additional information includes division information (position information (e.g., the coordinates of the origin (origin_x, origin_y, origin_z), tile height information, etc.) of each tile. Furthermore, when a tile is a null tile, tile additional information does not include division information of each tile.

For example, when slice division information of each tile is stored into division information of each tile, the three-dimensional data encoding device need not store slice division information of a null tile into additional information.

It should be noted that in this example, a tile division number (number_of_tiles) indicates the number of tiles including null tiles. FIG. 48 is a diagram illustrating an example of index information (idx) of a tile. In the example shown in FIG. 48, index information is also assigned to a null tile.

Figure 49:
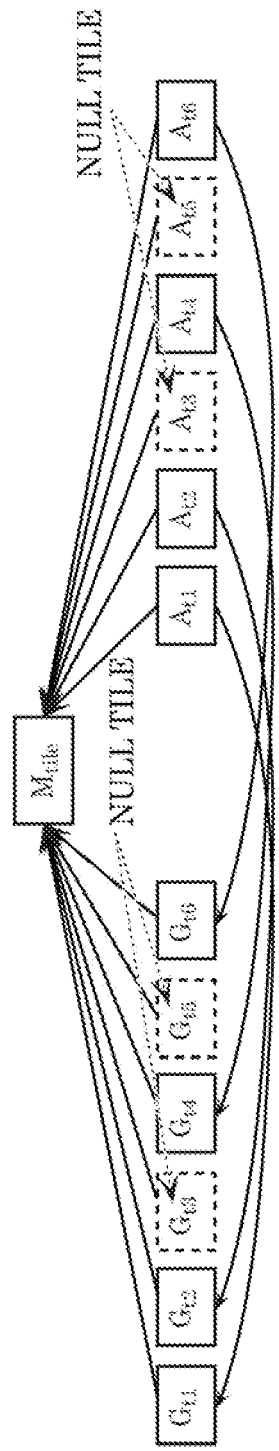
FIG. 49 is a diagram illustrating an example of dependency relationships according to Embodiment 5.
Figure 50:
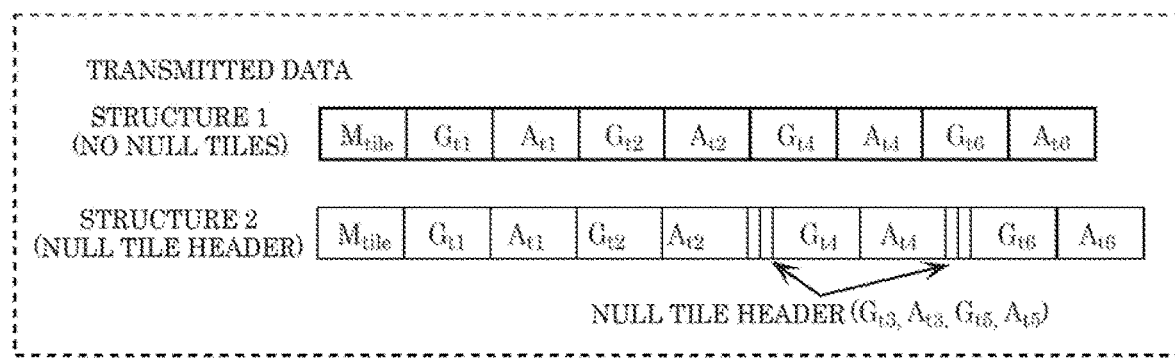
FIG. 50 is a diagram illustrating an example of transmitted data according to Embodiment 5.
Figure 51:
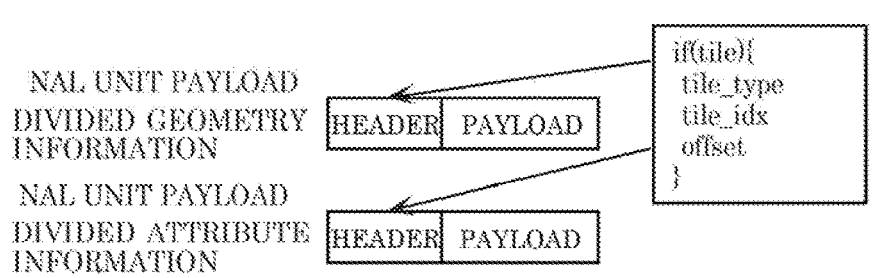
FIG. 51 is a diagram illustrating a structural example of NAL units according to Embodiment 5.

The following describes a data structure of encoded data including null tiles and a transmission method. FIG. 49 to FIG. 51 each are a diagram illustrating a data structure when the third and fifth tiles include no data after geometry information and attribute information are divided into six tiles.

FIG. 49 is a diagram illustrating an example of a dependency relationship of each data. The pointed end of an arrow in the figure indicates a dependee, and the other end of the arrow indicates a depender. Moreover, in the figure, $G_{tn}$ denotes geometry information for tile number n, and $A_{tn}$ denotes attribute information for tile number n, n being an integer from 1 to 6. $M_{tile}$ denotes tile additional information.

FIG. 50 is a diagram illustrating a structural example of transmitted data that is encoded data transmitted by the three-dimensional data encoding device. FIG. 51 is a diagram illustrating a structure of encoded data and a method of storing encoded data in a NAL unit.

As shown in FIG. 51, each of the headers of data of geometry information (divided geometry information) and attribute information (divided attribute information) includes index information (tile_idx) of a tile.

Moreover, as shown in structure 1 in FIG. 50, the three-dimensional data encoding device need not transmit geometry information or attribute information constituting a null tile. Alternatively, as shown in structure 2 in FIG. 50, the three-dimensional data encoding device may transmit, as data of a null tile, information indicating that a tile is a null tile. For example, the three-dimensional data encoding device may include, in tile_type stored in the header of a NAL unit or the header in a payload (nal_unit_payload) of a NAL unit, that a type of the data is a null tile, and transmit the header. It should be noted that the following description will be premised on structure 1.

In structure 1, when there are null tiles, some of values of index information (tile_idx) of tiles included in the header of geometry information data or attribute information data are missing and the values are not continuous in transmitted data.

Moreover, when data have a dependency relationship with each other, the three-dimensional data encoding device transmits the data so that data referred to can be decoded before data referring to the data. It should be noted that a tile of attribute information depends on a tile of geometry information. The same index number of a tile is assigned to attribute information and geometry information having a dependency relationship with each other.

It should be noted that tile additional information regarding tile division may be stored in both or one of a parameter set for geometry information (GPS) and a parameter set for attribute information (APS). When the tile additional information is stored in one of the GPS or the APS, reference information indicating a GPS or an APS to be referred to may be stored in the other of the GPS or the APS. Moreover, when a tile division method is different between geometry information and attribute information, different tile additional information is stored in each of a GPS and an APS.

Furthermore, when an identical tile division method is used for sequences (PCC frames), tile additional information may be stored in a GPS, an APS, or a sequence parameter set (SPS).

For example, when tile additional information is stored in both a GPS and an APS, tile additional information for geometry information is stored in the GPS, and tile additional information for attribute information is stored in the APS. Moreover, when tile additional information is stored in common information such as an SPS, tile additional information to be commonly used for geometry information and attribute information may be stored, or tile additional information for the geometry information and tile additional information for the attribute information may be stored separately.

Hereinafter, a combination of tile division and slice division will be described. First, the following describe a data structure and data transmission when tile division is performed after slice division.

Figure 52:
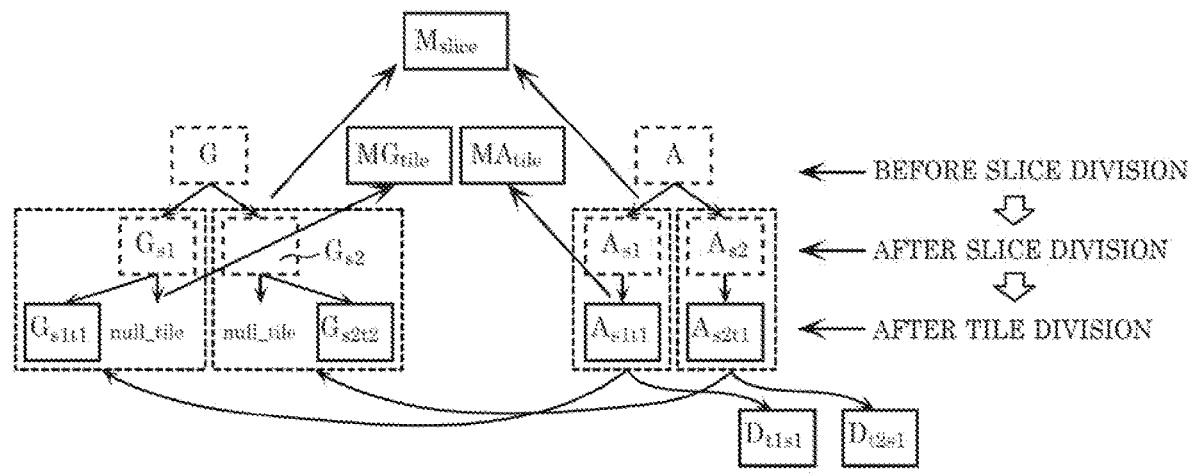
FIG. 52 is a diagram illustrating an example of dependency relationships according to Embodiment 5.

FIG. 52 is a diagram illustrating an example of a dependency relationship of each data when tile division is performed after slice division. The pointed end of an arrow in the figure indicates a dependee, and the other end of the arrow indicates a depender. Data indicated by a solid line in the figure is data actually transmitted, and data indicated by a broken line is data not transmitted.

In the figure, G denotes geometry information, and A denotes attribute information. $G_{s1}$ denotes geometry information for slice number 1, and $G_{s2}$ denotes geometry information for slice number 2. $G_{s1t1}$ denotes geometry information for slice number 1 and tile number 1, and $G_{s2t2}$ denotes geometry information for slice number 2 and tile number 2. Likewise, $A_{s1}$ denotes attribute information for slice number 1, and $A_{s2}$ denotes attribute information for slice number 2. $A_{s1t1}$ denotes attribute information for slice number 1 and tile number 1, and $A_{s2t1}$ denotes attribute information for slice number 2 and tile number 1.

$M_{slice}$ denotes slice additional information, $MG_{tile}$ denotes geometry tile additional information, and $MA_{tile}$ denotes attribute tile additional information. $D_{s1t1}$ denotes dependency relationship information of attribute information $A_{s1t1}$, and $D_{s2t1}$ denotes dependency relationship information of attribute information $A_{s2t1}$.

The three-dimensional data encoding device need not generate and transmit geometry information and attribute information regarding a null tile.

Even when a tile division number is identical to all slices, there is a possibility that the number of tiles generated and transmitted is different between slices. For example, when a tile division number is different between geometry information and attribute information, there is a case in which a null tile is included in one of the geometry information and the attribute information, and a null tile is not included in the other of the geometry information and the attribute information. In the example shown in FIG. 52, geometry information of slice 1 ($G_{s1}$) is divided into two tiles $G_{s1t1}$ and $G_{s1t2}$, and $G_{s1t2}$ is a null tile. In contrast, attribute information of slice 1 ($A_{s1}$) is not divided, with the result that there are one $A_{s1t1}$ and no null tiles.

When data is included in at least a tile of attribution information regardless of whether a null tile is included in a slice of geometry information, the three-dimensional data encoding device generates and transmits dependency relationship information of the attribute information. For example, when the three-dimensional data encoding device stores slice division information of each tile in division information of each slice included in slice additional information regarding slice division, the three-dimensional data encoding device stores information indicating whether the tile is a null tile in the slice division information.

Figure 53:
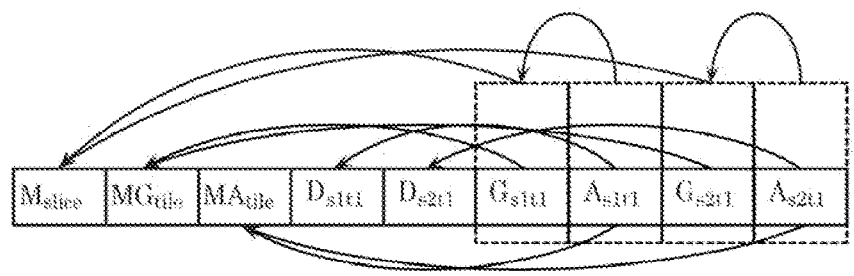
FIG. 53 is a diagram illustrating an example of decoding order of data according to Embodiment 5.

FIG. 53 is a diagram illustrating an example of decoding order of data. In the example shown in FIG. 53, data are decoded in order from the left. The three-dimensional data decoding device decodes, out of data having a dependency relationship with each other, data of a dependee first. For example, the three-dimensional data encoding device rearranges data in this order and transmits the data. It should be noted that any order may be used as long as data of a dependee takes precedence. Moreover, the three-dimensional data encoding device may transmit additional information and dependency relationship information before data.

Next, the following describe a data structure and data transmission when slice division is performed after tile division.

Figure 54:
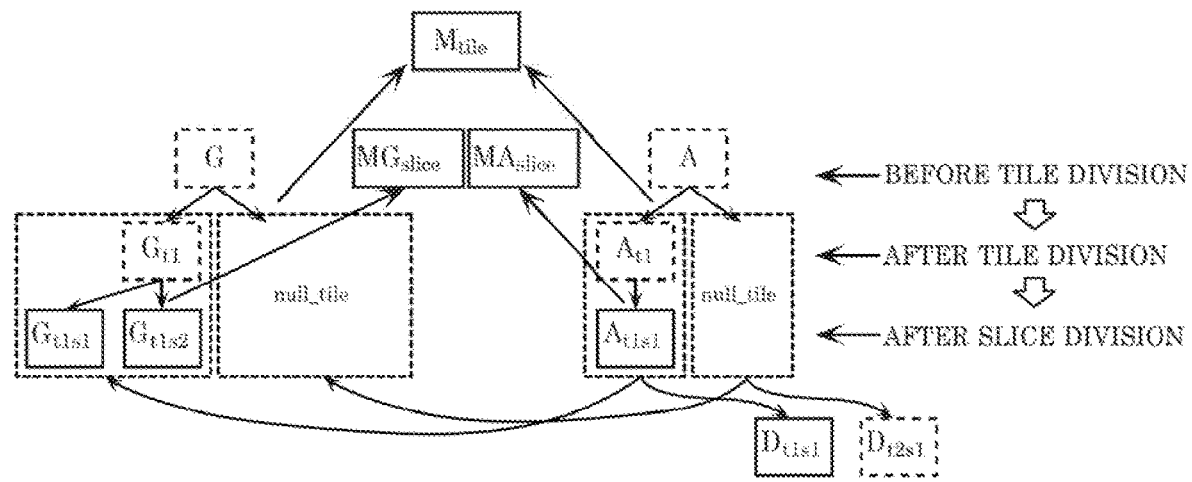
FIG. 54 is a diagram illustrating an example of dependency relationships according to Embodiment 5.

FIG. 54 is a diagram illustrating an example of a dependency relationship of each data when slice division is performed after tile division. The pointed end of an arrow in the figure indicates a dependee, and the other end of the arrow indicates a depender. Data indicated by a solid line in the figure is data actually transmitted, and data indicated by a broken line is data not transmitted.

In the figure, G denotes geometry information, and A denotes attribute information. $G_{t1}$ denotes geometry information for tile number 1. $G_{t1s1}$ denotes geometry information for tile number 1 and slice number 1, and $G_{t1s2}$ denotes geometry information for tile number 1 and slice number 2. Likewise, $A_{t1}$ denotes attribute information for tile number 1, and $A_{t1s1}$ denotes attribute information for tile number 1 and slice number 1.

$M_{tile}$ denotes tile additional information, $MG_{slice}$ denotes geometry slice additional information, and $MA_{slice}$ denotes attribute slice additional information. $D_{t1s1}$ denotes dependency relationship information of attribute information $A_{t1s1}$, and $D_{t2s1}$ denotes dependency relationship information of attribute information $A_{t2s1}$.

The three-dimensional data encoding device does not perform slice division on a null tile. In addition, the three-dimensional data encoding device need not generate and transmit geometry information and attribute information regarding a null tile, and dependency relationship information of the geometry information.

Figure 55:
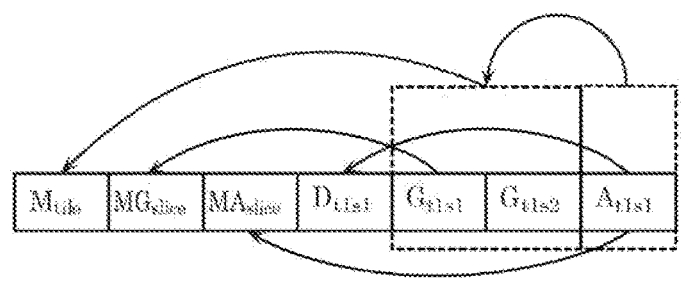
FIG. 55 is a diagram illustrating an example of decoding order of data according to Embodiment 5.

FIG. 55 is a diagram illustrating an example of decoding order of data. In the example shown in FIG. 55, data are decoded in order from the left. The three-dimensional data decoding device decodes, out of data having a dependency relationship with each other, data of a dependee first. For example, the three-dimensional data encoding device rearranges data in this order and transmits the data. It should be noted that any order may be used as long as data of a dependee takes precedence. Moreover, the three-dimensional data encoding device may transmit additional information and dependency relationship information before data.

The following describes procedures of a point cloud data division process and a point cloud data combination process. It should be noted that although examples of tile division and slice division will be described here, the same procedures can be applied to division of another space.

Figure 56:
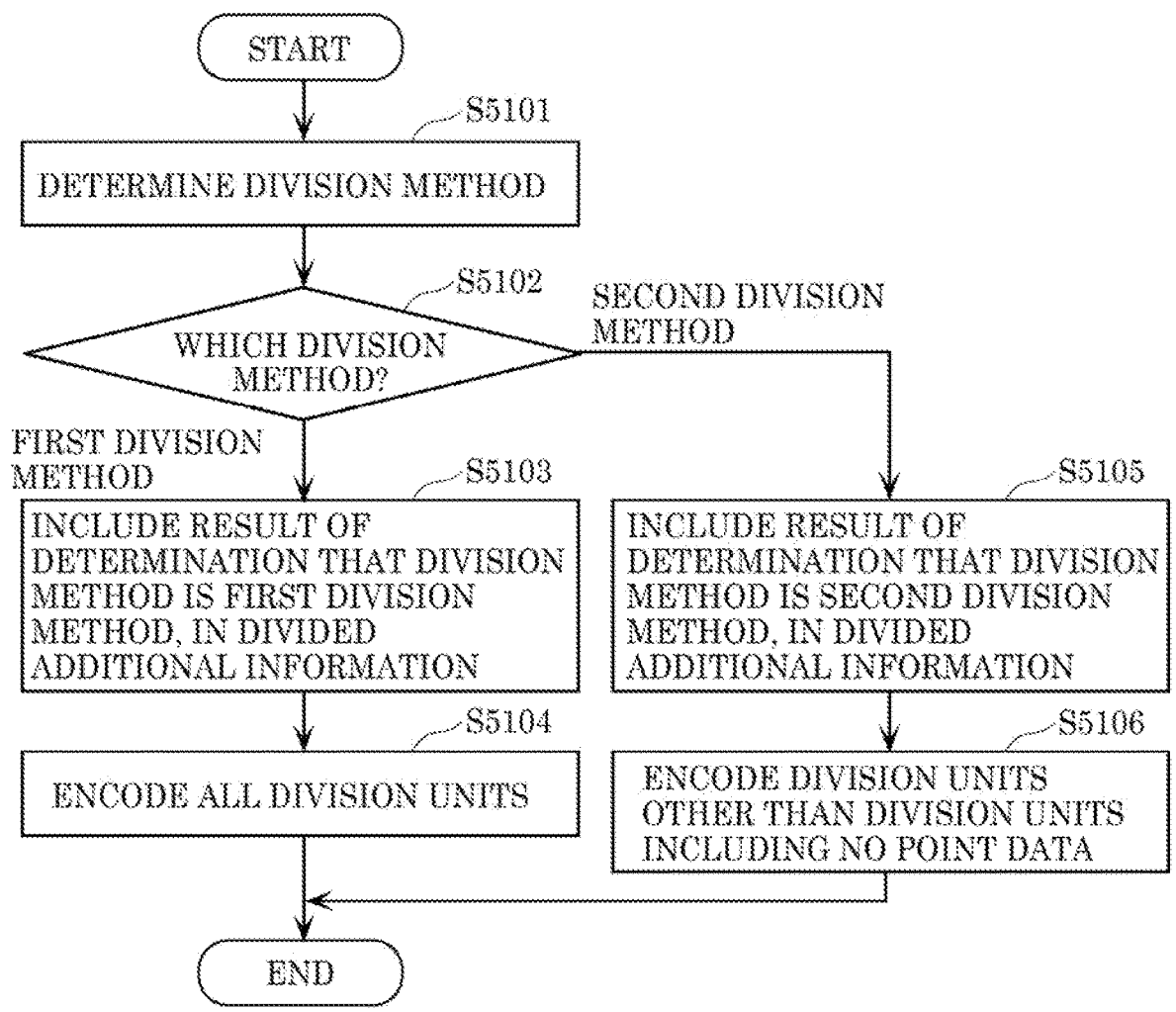
FIG. 56 is a flowchart of an encoding process according to Embodiment 5.

FIG. 56 is a flowchart of a three-dimensional data encoding process including a data division process performed by the three-dimensional data encoding device. First, the three-dimensional data encoding device determines a division method to be used (S5101). Specifically, the three-dimensional data encoding device determines whether to use a first division method or a second division method. For example, the three-dimensional data encoding device may determine a division method based on instructions from a user or an external device (e.g., the three-dimensional data decoding device), or determine a division method according to inputted point cloud data. In addition, a division method to be used may be predetermined.

Here, the first division method is a division method in which each of all division units (tiles or slices) always includes one or more point data. The second division method is a division method in which division units include one or more division units including no point data or a division method in which division units are likely to include one or more division units including no point data.

When the determined division method is the first division method (FIRST DIVISION METHOD in S5102), the three-dimensional data encoding device includes a result of the determination that the division method used is the first division method, in divided additional information (e.g., tile additional information or slice additional information) that is metadata regarding data division (S5103). Finally, the three-dimensional data encoding device encodes all division units (S5104).

On the other hand, when the determined division method is the second division method (SECOND DIVISION METHOD in S5102), the three-dimensional data encoding device includes a result of the determination that the division method used in the second division method, in divided additional information (S5105). Finally, the three-dimensional data encoding device encodes, among division units, division units other than division units (e.g., null tiles) including no point data (S5106).

Figure 57:
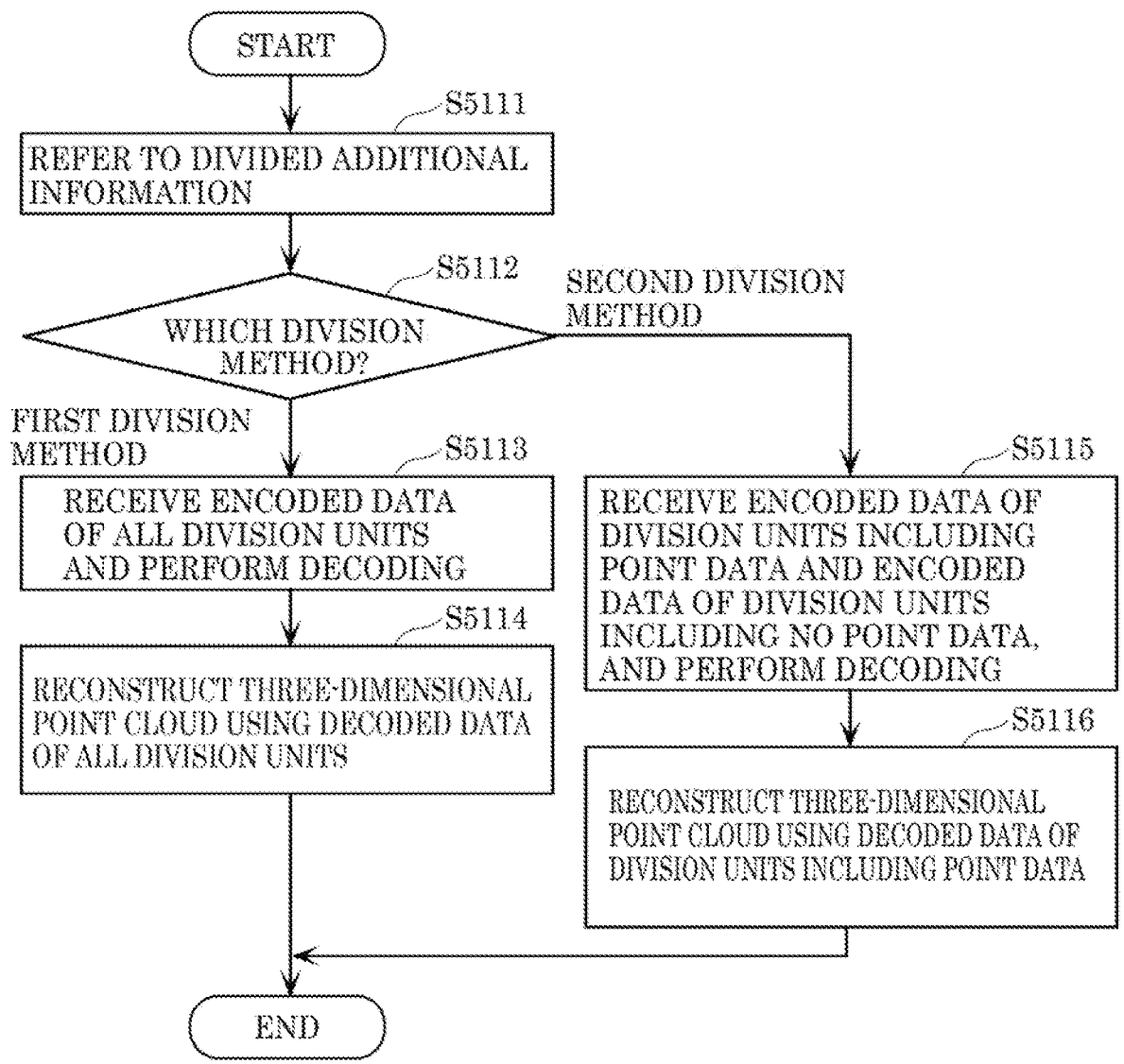
FIG. 57 is a flowchart of a decoding process according to Embodiment 5.

FIG. 57 is a flowchart of a three-dimensional data decoding process including a data combination process performed by the three-dimensional data decoding device. First, the three-dimensional data decoding device refers to divided additional information included in a bitstream and determines whether a division method used is the first division method or the second division method (S5111).

When the division method used is the first division method (FIRST DIVISION METHOD in S5112), the three-dimensional data decoding device receives encoded data of all division units and generates decoded data of all the division units by decoding the received encoded data (S5113). Finally, the three-dimensional data decoding device reconstructs a three-dimensional point cloud using the decoded data of all the division units (S5114). For example, the three-dimensional data decoding device reconstructs a three-dimensional point cloud by combining division units.

On the other hand, when the division method used is the second division method (SECOND DIVISION METHOD in S5112), the three-dimensional data decoding device receives encoded data of division units including point data and encoded data of division units including no point data, and generates decoded data by decoding the received encoded data of the division units (S5115). It should be noted that when division units including no point data are not transmitted, the three-dimensional data decoding device need not receive and decode the division units including no point data. Finally, the three-dimensional data decoding device reconstructs a three-dimensional point cloud using the decoded data of the division units including the point data (S5116). For example, the three-dimensional data decoding device reconstructs a three-dimensional point cloud by combining division units.

The following describes other point cloud data division methods. When a space is divided equally as shown in (c) in FIG. 45, a divided space may include no points. In this case, the three-dimensional data encoding device combines the space including no points with another space including points. As a result, the three-dimensional data encoding device can form division units so that each of the division units includes one or more points.

Figure 58:
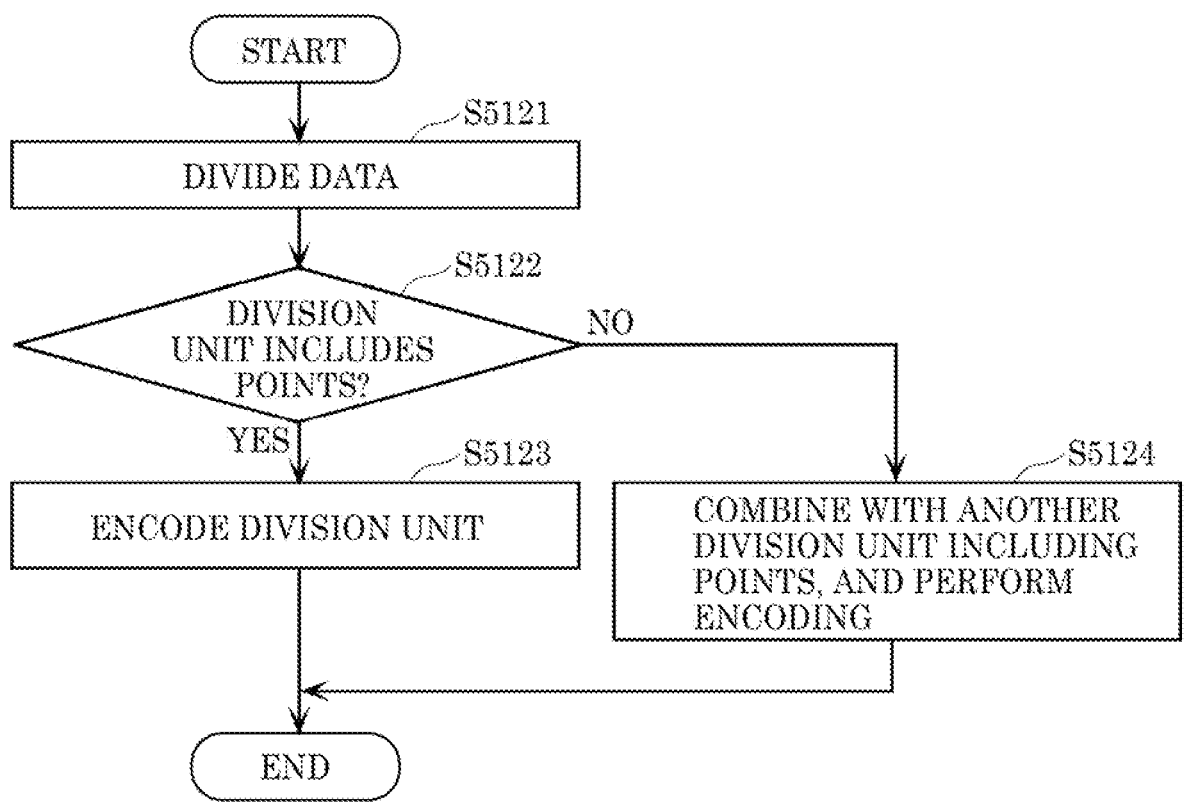
FIG. 58 is a flowchart of an encoding process according to Embodiment 5.

FIG. 58 is a flowchart for data division in the above case. First, the three-dimensional data encoding device divides data using a specific method (S5121). For example, the specific method is the above second division method.

Next, the three-dimensional data encoding device determines whether a current division unit that is a division unit to be processed includes points (S5122). When the current division unit includes points (YES in S5122), the three-dimensional data encoding device encodes the current division unit (S5123). On the other hand, when the current division unit includes no points (NO in S5122), the three-dimensional data encoding device combines the current division unit with another division unit including points, and encodes the combined division unit (S5124). To put it another way, the three-dimensional data encoding device encodes the current division unit together with the other division unit including the points.

It should be noted that although the example of performing determination and combination for each division unit has been described above, a processing method is not limited to this. For example, the three-dimensional data encoding device may determine whether each of division units includes points, perform combination so that any division unit including no points will disappear, and encode each of the combined division units.

Figure 59:
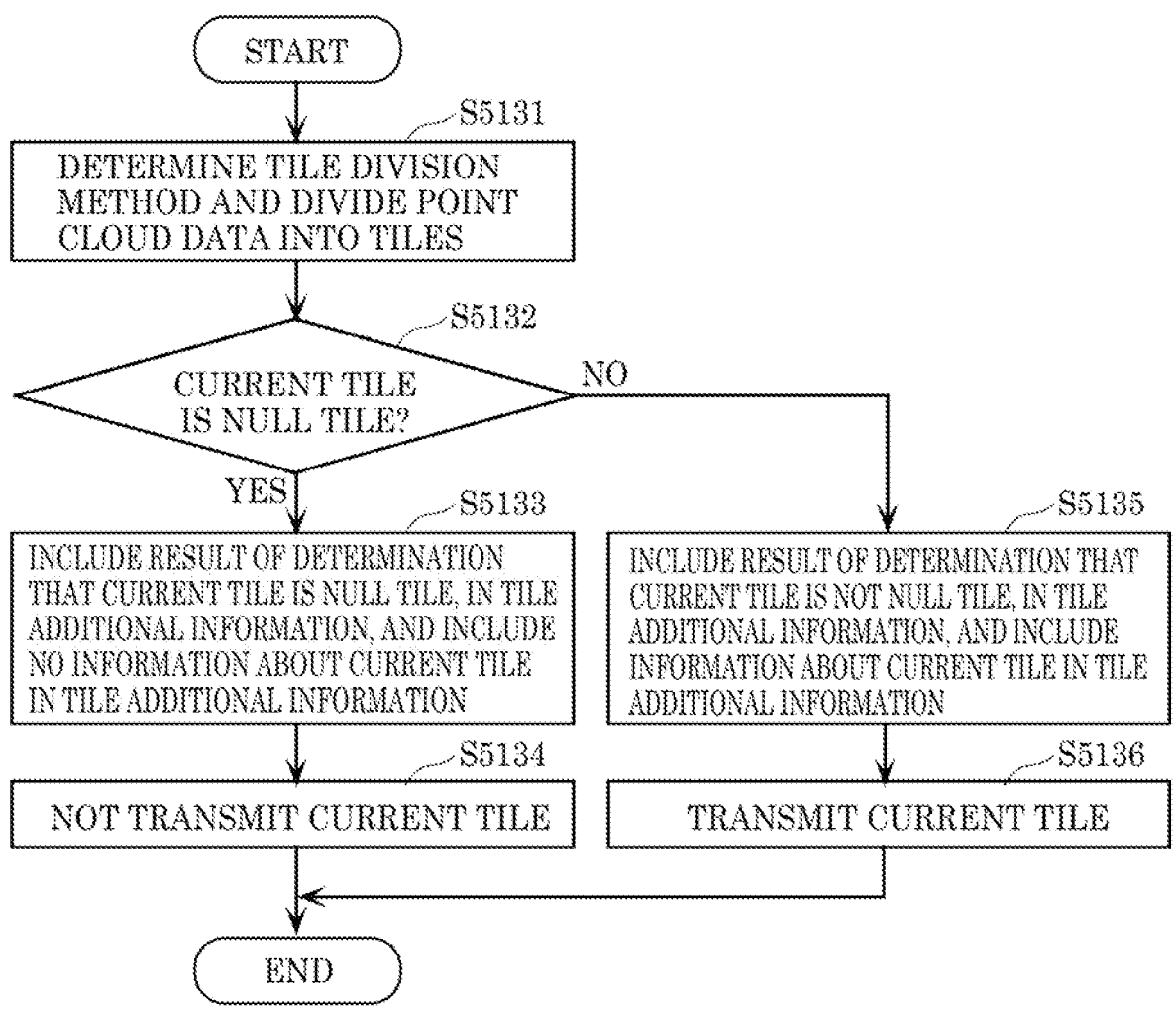
FIG. 59 is a flowchart of an encoding process according to Embodiment 5.

The following describes a method of transmitting data including a null tile. When a current tile that is a tile to be processed is a null tile, the three-dimensional data encoding device does not transmit data of the current tile. FIG. 59 is a flowchart of a data transmission process.

First, the three-dimensional data encoding device determines a tile division method and divides point cloud data into tiles using the determined division method (S5131).

Next, the three-dimensional data encoding device determines whether the current tile is a null tile (S5132). In other words, the three-dimensional data encoding device determines whether no data is included in the current tile.

When the current tile is the null tile (YES in S5132), the three-dimensional data encoding device includes a result of the determination that the current tile is the null tile, in tile additional information, and does not include information (tile position, size, etc.) about the current tile in the tile additional information (S5133). In addition, the three-dimensional data encoding device does not transmit the current tile (S5134).

On the other hand, when the current tile is not the null tile (NO in S5132), the three-dimensional data encoding device includes a result of the determination that the current tile is not the null tile, in tile additional information, and includes information about each tile in the tile additional information (S5135). In addition, the three-dimensional data encoding device transmits the current tile (S5136).

As stated above, it is possible to reduce the amount of tile additional information by omitting information about a null tile from the tile additional information.

The following describes a method of decoding encoded data including a null tile. First, a process when there is no packet loss will be described.

Figure 60:
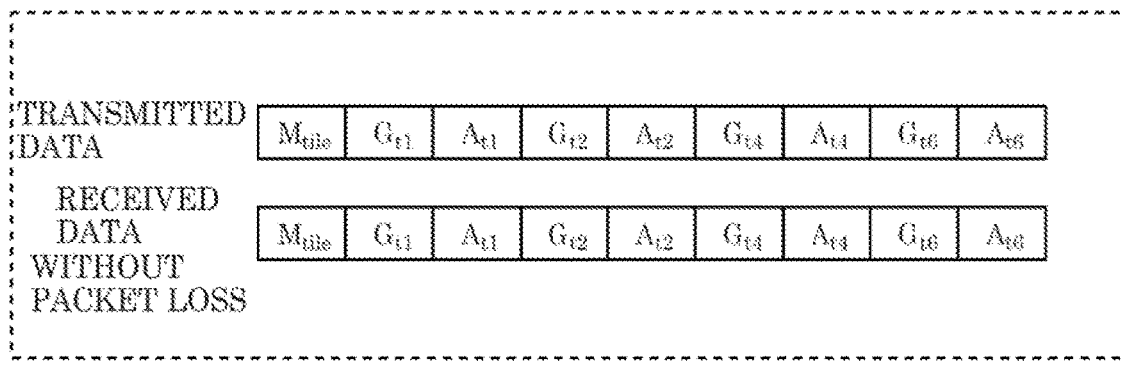
FIG. 60 is a diagram illustrating an example of transmitted data and an example of received data according to Embodiment 5.

FIG. 60 is a diagram illustrating an example of transmitted data that is encoded data transmitted by the three-dimensional data encoding device, and an example of received data inputted to the three-dimensional data decoding device. It should be noted that a system environment without packet loss is assumed here, and received data is identical to transmitted data.

Figure 61:
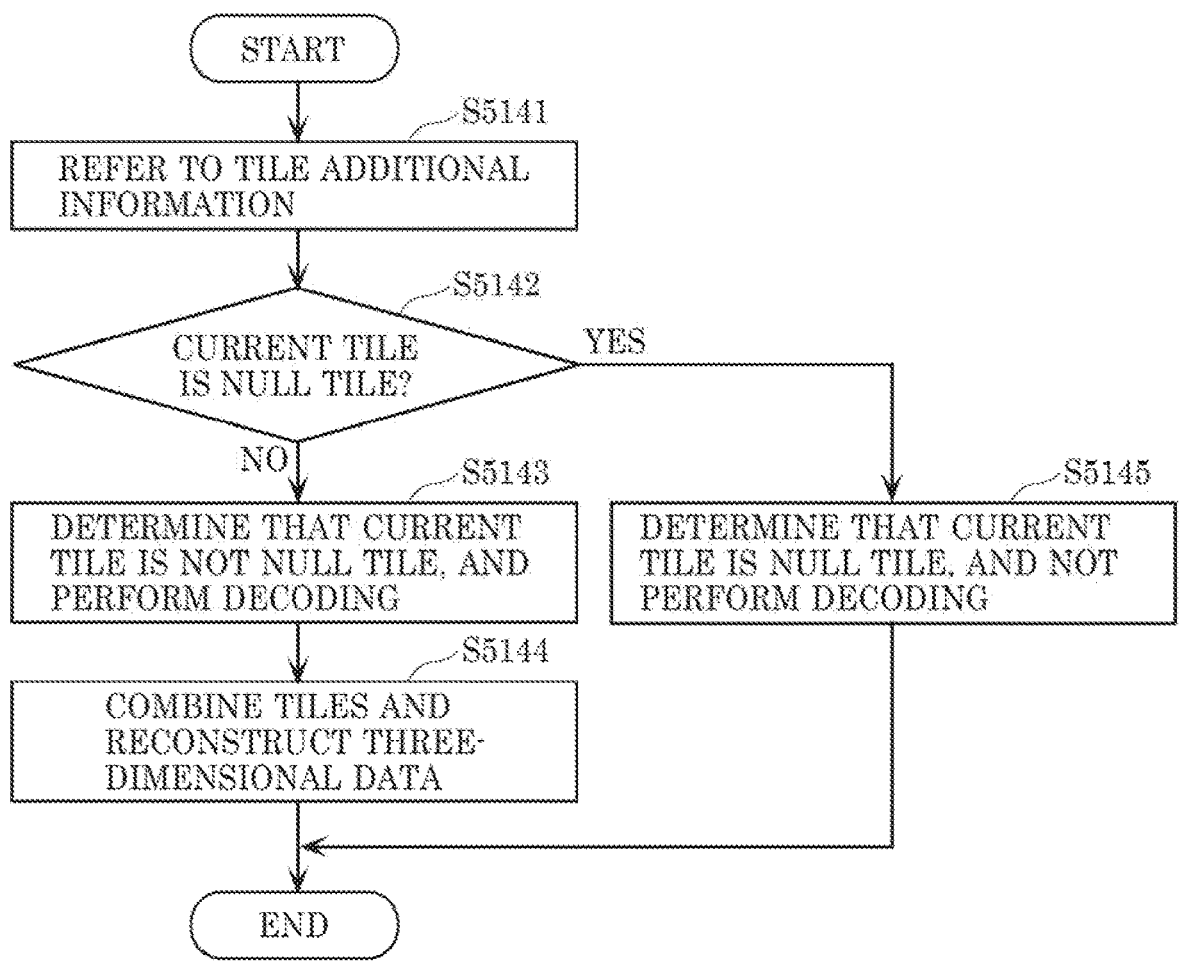
FIG. 61 is a flowchart of a decoding process according to Embodiment 5.

When a system environment is free from packet loss, the three-dimensional data decoding device receives all transmitted data. FIG. 61 is a flowchart of a process performed by the three-dimensional data decoding device.

First, the three-dimensional data decoding device refers to tile additional information (S5141) and determines whether each of tiles is a null tile (S5142).

When the tile additional information indicates that a current tile is not a null tile (NO in S5142), the three-dimensional data decoding device determines that the current tile is not the null tile and decodes the current tile (S5143). Finally, the three-dimensional data decoding device obtains information (position information (e.g., origin coordinates), size, etc. of the tiles) about the tiles from the tile additional information, and reconstructs three-dimensional data by combining the tiles using the obtained information (S5144).

On the other hand, when the tile additional information indicates that a current tile is a null tile (YES in S5142), the three-dimensional data decoding device determines that the current tile is the null tile and does not decode the current tile (S5145).

It should be noted that the three-dimensional data decoding device may determine that missing data is a null tile, by sequentially analyzing index information indicated by the header of encoded data. In addition, the three-dimensional data decoding device may combine a determination method using tile additional information and a determination method using index information.

Figure 62:
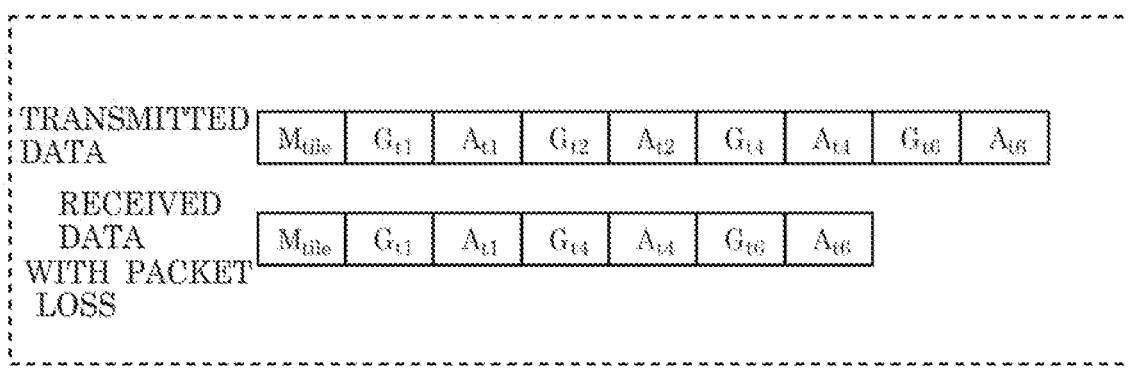
FIG. 62 is a diagram illustrating an example of transmitted data and an example of received data according to Embodiment 5.

The following describes a process when there is packet loss. FIG. 62 is a diagram illustrating an example of transmitted data from the three-dimensional data encoding device, and an example of received data inputted to the three-dimensional data decoding device. Here, a system environment with packet loss is assumed.

When packet loss occurs in a system environment, there is a possibility that the three-dimensional data decoding device cannot receive all transmitted data. In this example, packets of $G_{t2}$ and $A_{t2}$ are lost.

Figure 63:
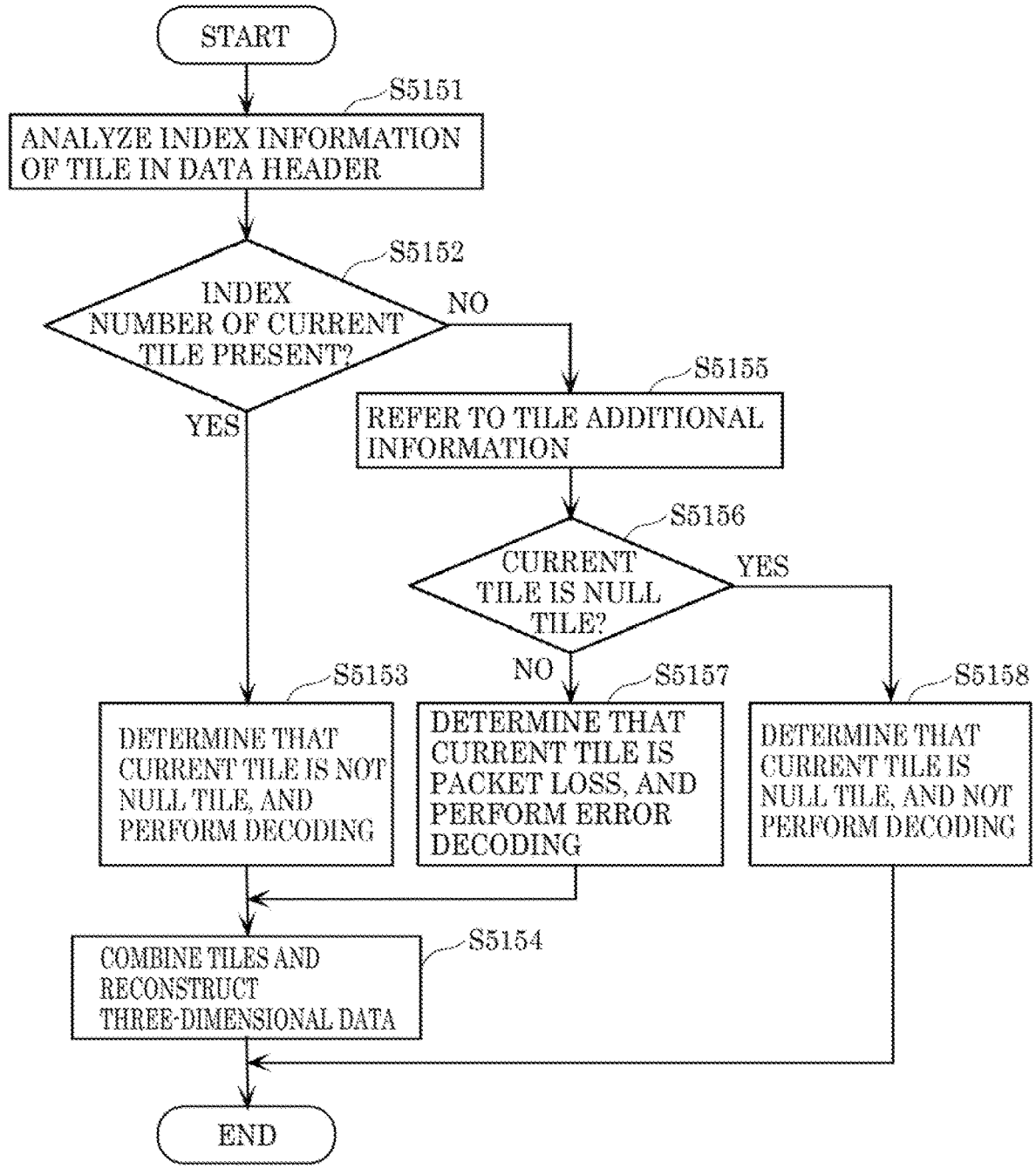
FIG. 63 is a flowchart of a decoding process according to Embodiment 5.

FIG. 63 is a flowchart of a process performed by the three-dimensional data decoding device in the above case. First, the three-dimensional data decoding device analyzes the continuity of index information indicated by the header of encoded data (S5151) and determines whether an index number of a current tile is present (S5152).

When the index number of the current tile is present (YES in S5152), the three-dimensional data decoding device determines that the current tile is not a null tile and decodes the current tile (S5153). Finally, the three-dimensional data decoding device obtains information (position information (e.g., origin coordinates), size, etc. of tiles) about tiles from tile additional information, and reconstructs three-dimensional data by combining the tiles using the obtained information (S5154).

On the other hand, when the index number of the current tile is not present (NO in S5152), the three-dimensional data decoding device refers to tile additional information (S5155) and determines whether the current tile is a null tile (S5156).

When the current tile is not the null tile (NO in S5156), the three-dimensional data decoding device determines that the current tile is lost (packet loss) and performs error decoding (S5157). Error decoding is, for example, a process of trying to decode original data assuming that the data existed. In this case, the three-dimensional data decoding device may regenerate three-dimensional data and reconstruct three-dimensional data (S5154).

In contrast, when the current tile is the null tile (YES in S5156), the three-dimensional data decoding device determines that the current tile is the null tile, and performs neither decoding nor the reconstruction of three-dimensional data (S5158).

The following describes an encoding method when no null tiles are clearly shown. The three-dimensional data encoding device may generate encoded data and additional information using the following method.

The three-dimensional data encoding device does not include information about a null tile in tile additional information. The three-dimensional data encoding device appends index numbers of tiles other than the null tile to a data header. The three-dimensional data encoding device does not transmit the null tile.

In this case, a tile division number (number_of_tiles) indicates a division number excluding a null tile. It should be noted that the three-dimensional data encoding device may separately store information indicating the number of null tiles in a bitstream. In addition, the three-dimensional data encoding device may include information about a null tile in additional information or include part of information about a null tile in the additional information.

Figure 64:
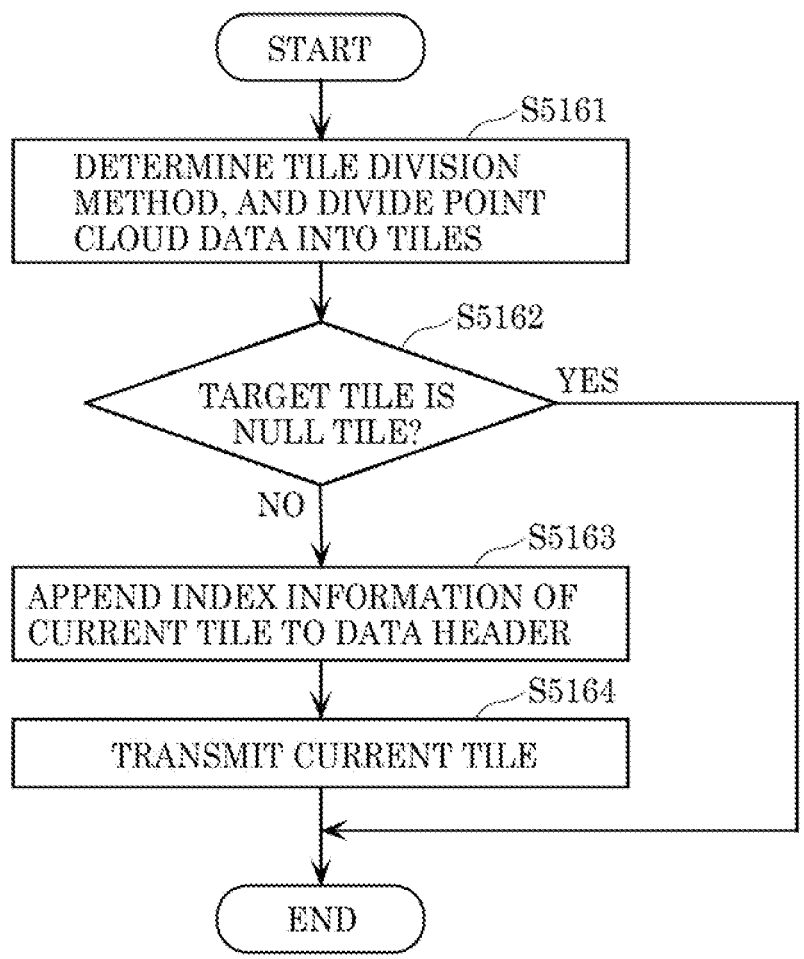
FIG. 64 is a flowchart of an encoding process according to Embodiment 5.

FIG. 64 is a flowchart of a three-dimensional data encoding process performed by the three-dimensional data decoding device in the above case. First, the three-dimensional data encoding device determines a tile division method and divides point cloud data into tiles using the determined division method (S5161).

Next, the three-dimensional data encoding device determines whether a current tile is a null tile (S5162). In other words, the three-dimensional data encoding device determines whether no data is included in the current tile.

When the current tile is not the null tile (NO in S5162), the three-dimensional data encoding device appends index information of the current tile other than a null tile to a data header (S5163). Finally, the three-dimensional data encoding device transmits the current tile (S5164).

On the other hand, when the current tile is the null tile (YES in S5162), the three-dimensional data encoding device neither appends index information of the current tile to a data header nor transmits the current tile.

Figure 65:
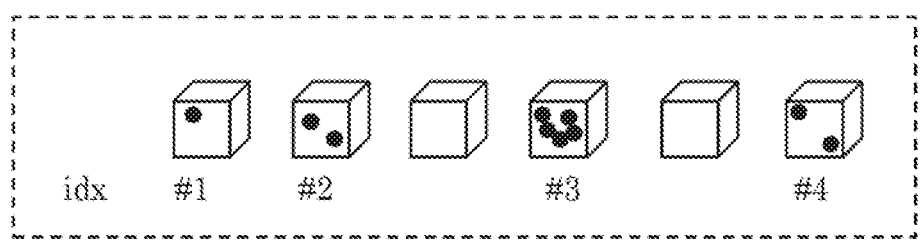
FIG. 65 is a diagram illustrating an example of index information according to Embodiment 5.

FIG. 65 is a diagram illustrating an example of index information (idx) to be appended to a data header. As shown in FIG. 65, index information of any null tile is not appended, and serial numbers are put on tiles other than null tiles.

Figure 66:
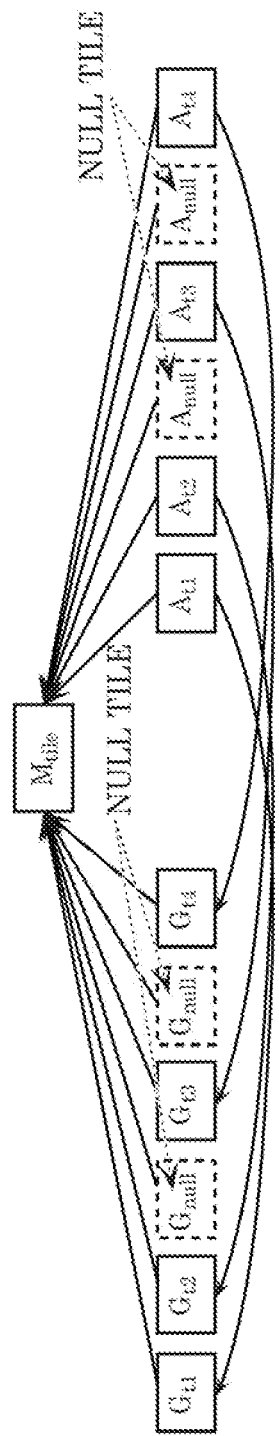
FIG. 66 is a diagram illustrating an example of dependency relationships according to Embodiment 5.

FIG. 66 is a diagram illustrating an example of a dependency relationship of each data. The pointed end of an arrow in the figure indicates a dependee, and the other end of the arrow indicates a depender. Moreover, in the figure, $G_n$ denotes geometry information for tile number n, and $A_n$ denotes attribute information for tile number n, n being an integer from 1 to 4. $M_{tile}$ denotes tile additional information.

Figure 67:
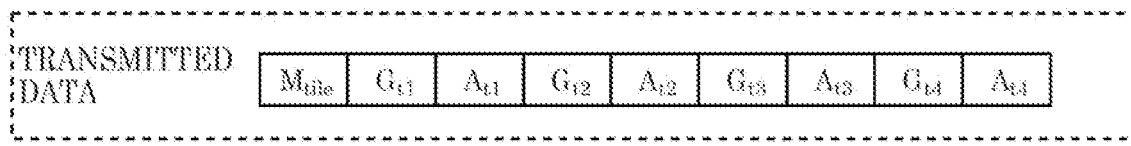
FIG. 67 is a diagram illustrating an example of transmitted data according to Embodiment 5.

FIG. 67 is a diagram illustrating a structural example of transmitted data that is encoded data transmitted by the three-dimensional data encoding device.

Figure 68:
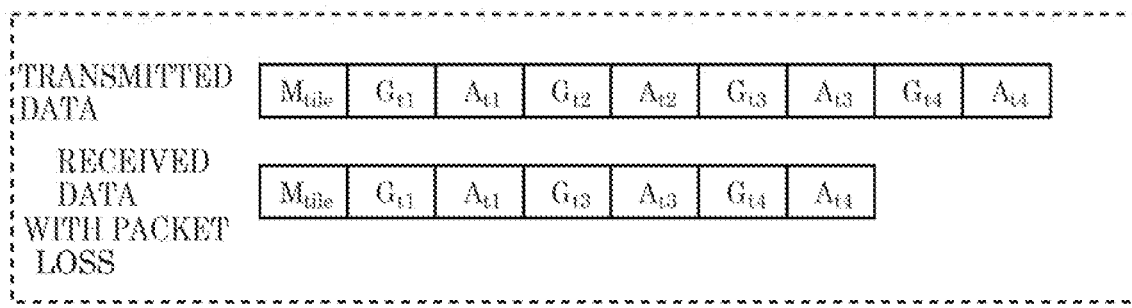
FIG. 68 is a diagram illustrating an example of transmitted data and an example of received data according to Embodiment 5.

The following describes a decoding method when no null tiles are clearly shown. FIG. 68 is a diagram illustrating an example of transmitted data from the three-dimensional data encoding device, and an example of received data inputted to the three-dimensional data decoding device. Here, a system environment with packet loss is assumed.

Figure 69:
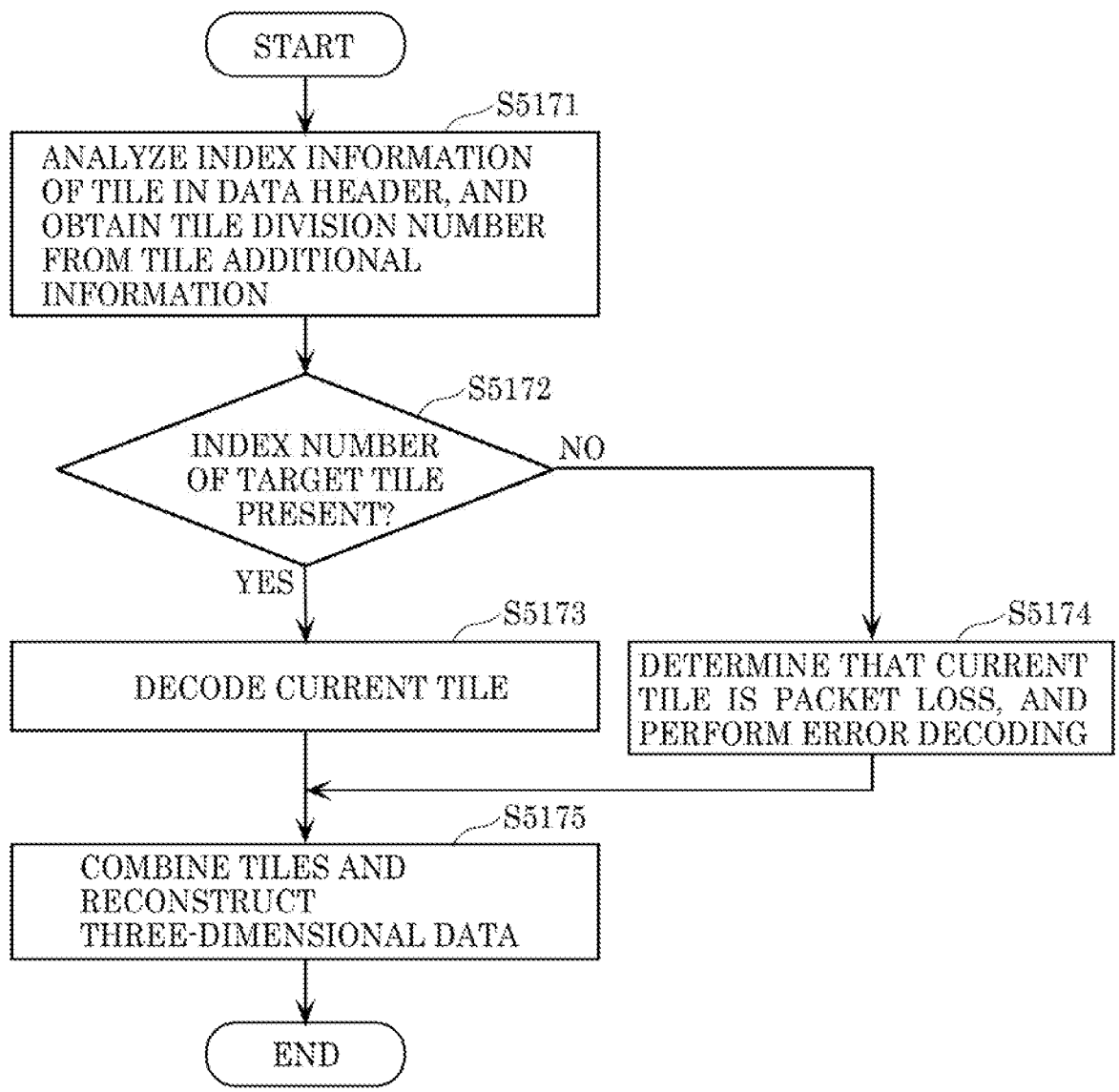
FIG. 69 is a flowchart of a decoding process according to Embodiment 5.

FIG. 69 is a flowchart of a process performed by the three-dimensional data decoding device in the above case. First, the three-dimensional data decoding device analyzes index information of tiles indicated by the header of encoded data, and determines whether an index number of a current tile is present. In addition, the three-dimensional data decoding device obtains a tile division number from tile additional information (S5171).

When the index number of the current tile is present (YES in S5172), the three-dimensional data decoding device decodes the current tile (S5173). Finally, the three-dimensional data decoding device obtains information (position information (e.g., origin coordinates), size, etc. of the tiles) about the tiles from the tile additional information, and reconstructs three-dimensional data by combining the tiles using the obtained information (S5175).

In contrast, when the index number of the current tile is not present (NO in S5172), the three-dimensional data decoding device determines that the current tile is lost and performs error decoding (S5174). In addition, the three-dimensional data decoding device determines that any space including no data is a null tile, and reconstructs three-dimensional data.

By clearly showing null tiles, the three-dimensional data encoding device can appropriately determine the absence of points in tiles, not data unavailability due to, for example, mismeasurement or data processing, or packet loss.

It should be noted that the three-dimensional data encoding device may use both a method of clearly showing null packets and a method of clearly showing no null packets. In this case, the three-dimensional data encoding device may include information indicating whether null packets are clearly shown, in tile additional information. Moreover, whether null packets are to be clearly shown may be determined in advance according to a type of a division method, and the three-dimensional data encoding device may indicate whether the null packets are to be dearly shown, by showing the type of the division method.

Although an example in which information regarding all tiles is included in tile additional information has been described in FIG. 47 etc., information regarding some of tiles or information regarding null tiles of some of tiles may be included in tile additional information.

Moreover, although an example in which information regarding divided data such as information indicating whether divided data (tiles) are present is stored in tile additional information has been described, part or all of these pieces of information may be stored in a parameter set or may be stored as data. When these pieces of information are stored as data, for example, nal_unit_type denoting information indicating whether divided data are present may be defined, and the pieces of information may be stored in a NAL unit. Additionally, the pieces of information may be stored in both additional information and data.

Embodiment 6

Figures 70, 71:
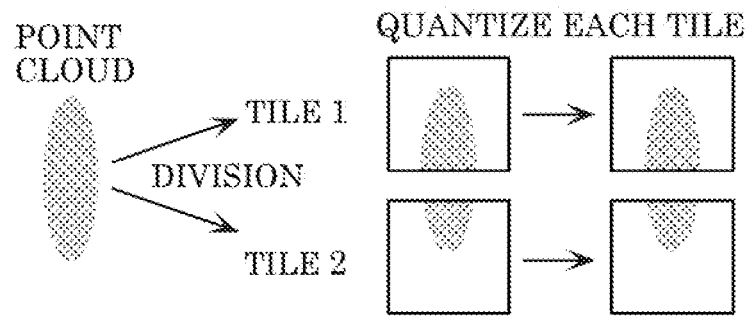
FIG. 70 is a diagram schematically showing a quantization process on a tile basis according to Embodiment 6.
FIG. 71 is a diagram showing a syntax example of GPS according to Embodiment 6.

In the following, a process of quantization on a tile basis will be described. FIG. 70 is a diagram schematically showing a quantization process on a tile basis.

The three-dimensional data encoding device divides point cloud data into a plurality of data units, such as tiles, that can be independently encoded and decoded, and quantizes each piece of divisional data obtained by the division.

If the quantization and the merging of duplicated points are performed in the tile division in the method described below, the coding efficiency of the quantized data can be improved.

When performing the quantization on a basis of divisional data, the three-dimensional data encoding device quantizes geometry information on a point belonging to each tile and merges duplicated points into one point. The three-dimensional data encoding device then transforms geometry information on the point cloud data into an occupancy code on a tile basis, and arithmetically encodes the occupancy code.

For example, the three-dimensional data encoding device may merge points A and B into point C having the same three-dimensional geometry information. Note that the three-dimensional data encoding device may assign an average value of the attribute information such as color or reflectance on points A and B to point C. The three-dimensional data encoding device may merge point B to point A or merge point A to point B.

When performing the merging, the three-dimensional data encoding device sets MergeDuplicatedPointFlag at 1. The MergeDuplicatedPointFlag indicates that any duplicated points in the tile are merged, and there are no duplicated points in the tile. The three-dimensional data encoding device stores MergeDuplicatedPointFlag in a parameter set as metadata (additional information).

When MergeDuplicatedPointFlag is 1, each leaf node includes one point in the occupancy code for each tile. Therefore, the three-dimensional data encoding device need not encode information indicating the number of points included in the leaf node as information on the leaf node. The three-dimensional data encoding device may encode three-dimensional geometry information and attribute information such as color and reflectance on one point.

When MergeDuplicatedPointFlag is 1, the three-dimensional data encoding device may merge M duplicated points into N points (M>N). In that case, the three-dimensional data encoding device may add information indicating the value of N to a header or the like. Alternatively, the value of N may be prescribed by a standard or the like. In that case, the three-dimensional data encoding device needs not add information indicating the value of N for each leaf node, and the required amount of encoding can be reduced.

When not quantizing the point cloud data divided into tiles, the three-dimensional data encoding device sets MergeDuplicatedPointFlag at 0. When MergeDuplicatedPointFlag is 0, the three-dimensional data encoding device encodes information concerning the duplicated points included in a leaf node in a tile as information on the leaf node. For example, each leaf node may include one or more duplicated points. Therefore, the three-dimensional data encoding device may encode information indicating the number of points included in a leaf node. The three-dimensional data encoding device may separately encode the attribute information on each duplicated point.

As described above, the three-dimensional data encoding device may change the encoded data structure based on MergeDuplicatedPointFlag.

The three-dimensional data encoding device may describe MergeDuplicatedPointFlag in GPS, which is a parameter set for each frame. In that case, a flag is used which indicates whether at least one of all the tiles excluding null tiles includes duplicated points or not, for example. The flag may be added for each frame, the same flag may be used for all or a plurality of frames. When the same flag is used for all or a plurality of frames, the three-dimensional data encoding device may describe the flag in SPS, rather than in GPS. This can reduce the amount of transmitted data. Here, SPS is a parameter set for a sequence (a plurality of frames).

Note that the three-dimensional data encoding device may change the quantization parameter for each tile, or may determine whether to perform the quantization or not for each tile.

When the three-dimensional data encoding device determines whether or not to perform the quantization or merging for each tile, the three-dimensional data encoding device stores a flag (such as MergeDuplicatedPointFlag) for each tile in GPS. Alternatively, the three-dimensional data encoding device stores MergeDuplicatedPointFlag in the header of the data for each tile and uses MergeDuplicatedPointFlag as a flag that indicates whether there are duplicated points in the tile or not. In that case, the three-dimensional data encoding device describes, in GPS, a flag that indicates that the flag is stored in the header of the data. Note that the three-dimensional data encoding device need not store a flag when the tile is a null tile.

Next, a data structure will be described. FIG. 71 is a diagram showing a syntax example of GPS, which is a geometry information parameter set for each frame. GPS includes at least one of gps_idx indicating a frame number and sps_idx indicating a sequence number.

GPS further includes duplicated point merging flag (MergeDuplicatedPointFlag) and tile information (tile_information).

When not performing the tile division, MergeDuplicatedPointFlag=1 indicates that the duplicated points in the point cloud data are merged and there are no duplicated points in the point cloud data. When performing the tile division, MergeDuplicatedPointFlag=1 indicates that the duplicated points are merged and there are no duplicated points in all the tiles excluding null tiles forming the point cloud data.

When not performing the tile division, MergeDuplicatedPointFlag=0 indicates that the duplicated points in the point cloud data are not merged and there can be duplicated points in the point cloud data. When performing the tile division, MergeDuplicatedPointFlag=0 indicates that the duplicated points are not merged in all the tiles excluding null tiles forming the point cloud data and there can be duplicated points in any of the tiles.

Tile information (tile_information) is information concerning the tile division. Specifically, the tile information indicates the type of the tile division, the number of divisions, the coordinates (position) of each tile, and the size of each tile, for example. Furthermore, the tile information may indicate the quantization parameter, or information on a null tile, for example. When the coordinates or size of each tile are known or can be derived on the three-dimensional data decoding device, information indicating the coordinates or size of each tile may be omitted. In this way, the code amount can be reduced.

FIG. 72 is a diagram showing a syntax example of the tile information (tile_information). The tile information includes an independent quantization flag (independent_quantization_flag). The independent quantization flag (independent_quantization_flag) is a flag that indicates whether to set the same quantization parameter for a plurality of tiles or set a different quantization parameter for each tile.

For example, independent_quantization_flag=1 indicates that the same quantization parameter is set for a plurality of tiles. In this case, MergeDuplicatedPointFlag and QP_value are indicated in GPS, and these pieces of information are used. Here, QP_value is a quantization parameter used for a plurality of tiles.

For example, independent_quantization_flag=2 indicates that a different quantization parameter is set for each tile. In this case, when the tile is not a null tile, TileMergeDuplicatedPointFlag and qp_value are indicated in a loop process for each tile. Alternatively, TileMergeDuplicatedPointFlag and qp_value are indicated in the header of the geometry information. Here, TileMergeDuplicatedPointFlag is a flag that indicates whether to merge duplicated points in a current tile, which is a tile to be processed. qp_value is a quantization parameter used for the current tile.

Note that a flag that indicates whether to set the same flag MergeDuplicatedPointFlag for a plurality of tiles or set a different flag MergeDuplicatedPointFlag for each tile and a flag that indicates whether to set the same QP value (quantization parameter) for a plurality of tiles or set a different QP value for each tile may be separately provided. Alternatively, a flag may be provided which indicates whether to indicate the value of MergeDuplicatedPointFlag or QP in GPS or in the header of the geometry information. In this way, an independent quantization parameter can be set for each tile.

FIG. 73 is a diagram showing a syntax example of node information (node (depth, index)) included in the data of the geometry information. When MergeDuplicatedPointFlag=0, the node information includes information (num_point_per_leaf) that indicates the number of duplicated points in a leaf node. Furthermore, the corresponding number of pieces of attribute information is indicated in leaf node information included in the data of the attribute information.

Figure 74:
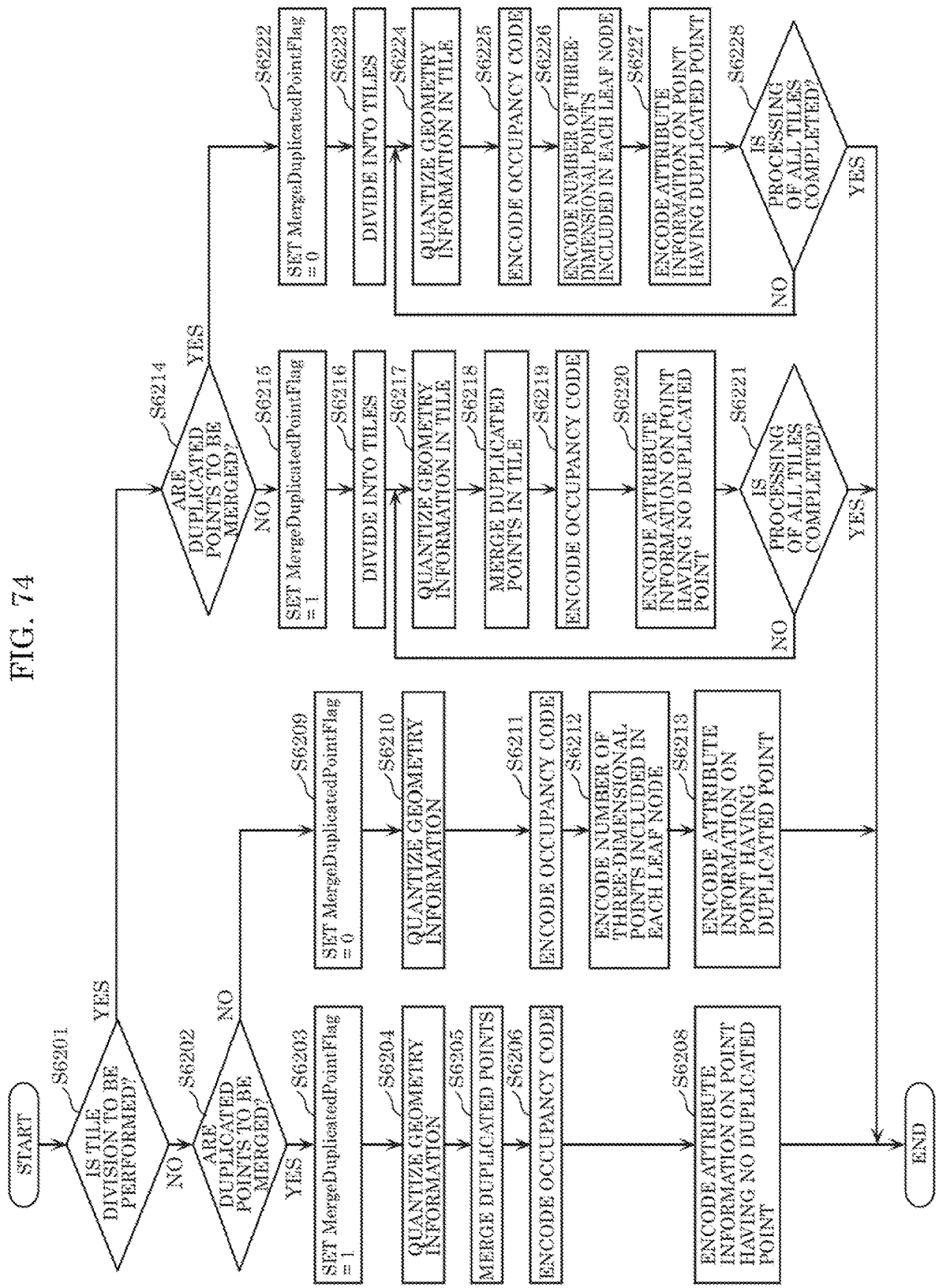
FIG. 74 is a flowchart of a three-dimensional data encoding process according to Embodiment 6.

In the following, a three-dimensional data encoding process according to this embodiment will be described. FIG. 74 is a flowchart of a three-dimensional data encoding process according to this embodiment.

First, the three-dimensional data encoding device determines whether or not to perform the tile division and whether or not to merge duplicated points (S6201, S6202, S6214). For example, the three-dimensional data encoding device determines whether or not to perform the tile division and whether or not to merge duplicated points according to an external indication.

When not performing the tile division but merging duplicated points (if No in S6201 and Yes in S6202), the three-dimensional data encoding device sets MergeDuplicatedPointFlag=1 that indicates that the point cloud to be output includes no duplicated points, and stores MergeDuplicatedPointFlag in metadata (additional information) (S6203).

The three-dimensional data encoding device then quantizes geometry information on the point cloud (S6204), and merges duplicated points based on the quantized geometry information (S6205). The three-dimensional data encoding device then encodes an occupancy code (S6206). The three-dimensional data encoding device then encodes attribute information on a point that has no duplicated point (S6208).

On the other hand, when not performing the tile division and not merging duplicated points (if No in S6201 and No in S6202), the three-dimensional data encoding device sets MergeDuplicatedPointFlag=0 that indicates that the point cloud to be output can include duplicated points, and stores MergeDuplicatedPointFlag in metadata (additional information) (S6209).

The three-dimensional data encoding device then quantizes geometry information on the point cloud (S6210), and encodes an occupancy code (S6211). In addition, the three-dimensional data encoding device encodes information that indicates the number of three-dimensional points included in each of all the leaf nodes (S6212). The three-dimensional data encoding device then encodes attribute information on a point that has a duplicated point (S6213).

On the other hand, when performing the tile division and merging duplicated points (if Yes in S6201 and Yes in S6214), the three-dimensional data encoding device sets MergeDuplicatedPointFlag=1 that indicates that there are no duplicated points in any tiles to be output, and stores MergeDuplicatedPointFlag in metadata (additional information) (S6215). The three-dimensional data encoding device then divides the point cloud into tiles (S6216).

The three-dimensional data encoding device then quantizes geometry information on a point cloud in a current tile to be processed (S6217), and merges duplicated points in the current tile based on the quantized geometry information (S6218). The three-dimensional data encoding device then encodes an occupancy code (S6219), and encodes attribute information on a point that has no duplicated point (S6220).

If the processing of all the tiles is not completed (if No in S6221), Step S6217 and the following processing are performed for the next tile. If the processing of all the tiles is completed (if Yes in S6221), the three-dimensional data encoding device ends the process.

On the other hand, when performing the tile division but not merging duplicated points (if Yes in S6201 and No in S6214), the three-dimensional data encoding device sets MergeDuplicatedPointFlag=0 that indicates that a tile to be output can include duplicated points, and stores MergeDuplicatedPointFlag in metadata (additional information) (S6222). The three-dimensional data encoding device divides the point cloud into tiles (S6223).

The three-dimensional data encoding device then quantizes geometry information on a point cloud in a current tile (S6224), and encodes an occupancy code (S6225). The three-dimensional data encoding device then encodes information that indicates the number of three-dimensional points included in each of all the leaf nodes (S6226). The three-dimensional data encoding device then encodes attribute information on a point that has a duplicated point (S6227).

If the processing of all the tiles is not completed (if No in S6228), Step S6224 and the following processing are performed for the next tile. If the processing of all the tiles is completed (if Yes in S6228), the three-dimensional data encoding device ends the process.

Note that, in the configuration of the encoder, the quantizer may be arranged to precede the tile divider. In other words, the tile division may be performed after all the point cloud data is quantized. The point cloud data is subjected to the position shift in the quantization, and the duplicated points are then merged. The duplicated points need not be merged.

In the case of the latter configuration, the flag (independent_quantization_flag) that indicates whether to set the same quantization parameter or different quantization parameters for the tiles is set at a value of 1 (which indicates to set the same quantization parameter for all the tiles).

Figure 75:
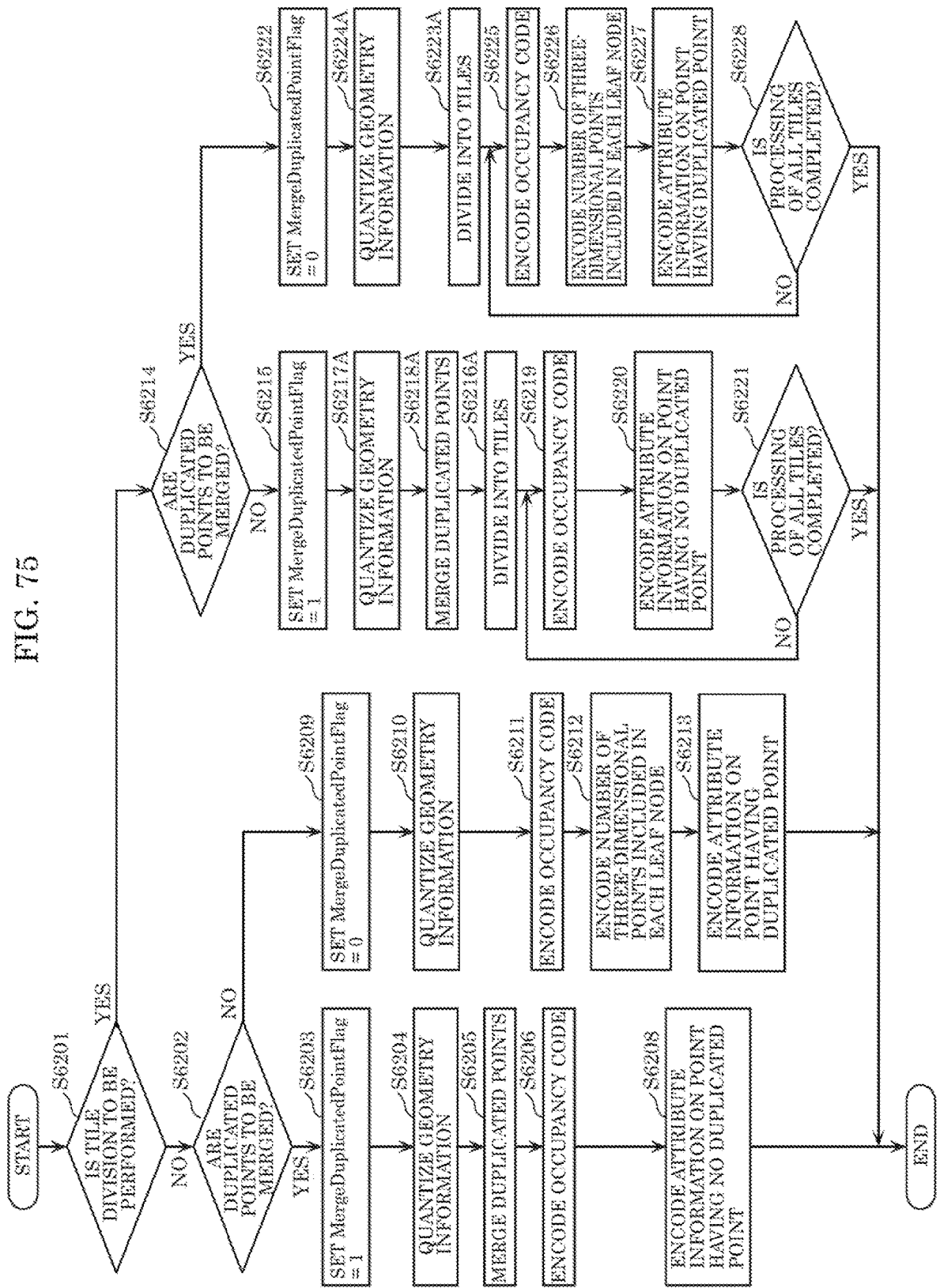
FIG. 75 is a flowchart of a three-dimensional data encoding process according to Embodiment 6.

FIG. 75 is a flowchart of a three-dimensional data encoding process in this case. Note that the process shown in FIG. 75 differs from the process shown in FIG. 74 in the order of the tile division processing and the quantization processing in the case where the tile division is performed (Yes in S6201). In the following, the difference will be primarily described.

When performing the tile division and merging duplicated points (if Yes in S6201 and Yes in S6214), the three-dimensional data encoding device sets MergeDuplicatedPointFlag=1 (S6215), and quantizes geometry information on the point cloud (S6217A). The three-dimensional data encoding device then merges the duplicated points based on the quantized geometry information (S6218A). The three-dimensional data encoding device then divides the point cloud resulting from the merging into tiles (S6216A).

On the other hand, when performing the tile division but not merging duplicated points (if Yes in S6201 and No in S6214), the three-dimensional data encoding device sets MergeDuplicatedPointFlag=0 (S6222), and quantizes geometry information on the point cloud (S6224A). The three-dimensional data encoding device then divides the point cloud after the quantization into tiles (S6223A).

Figure 76:
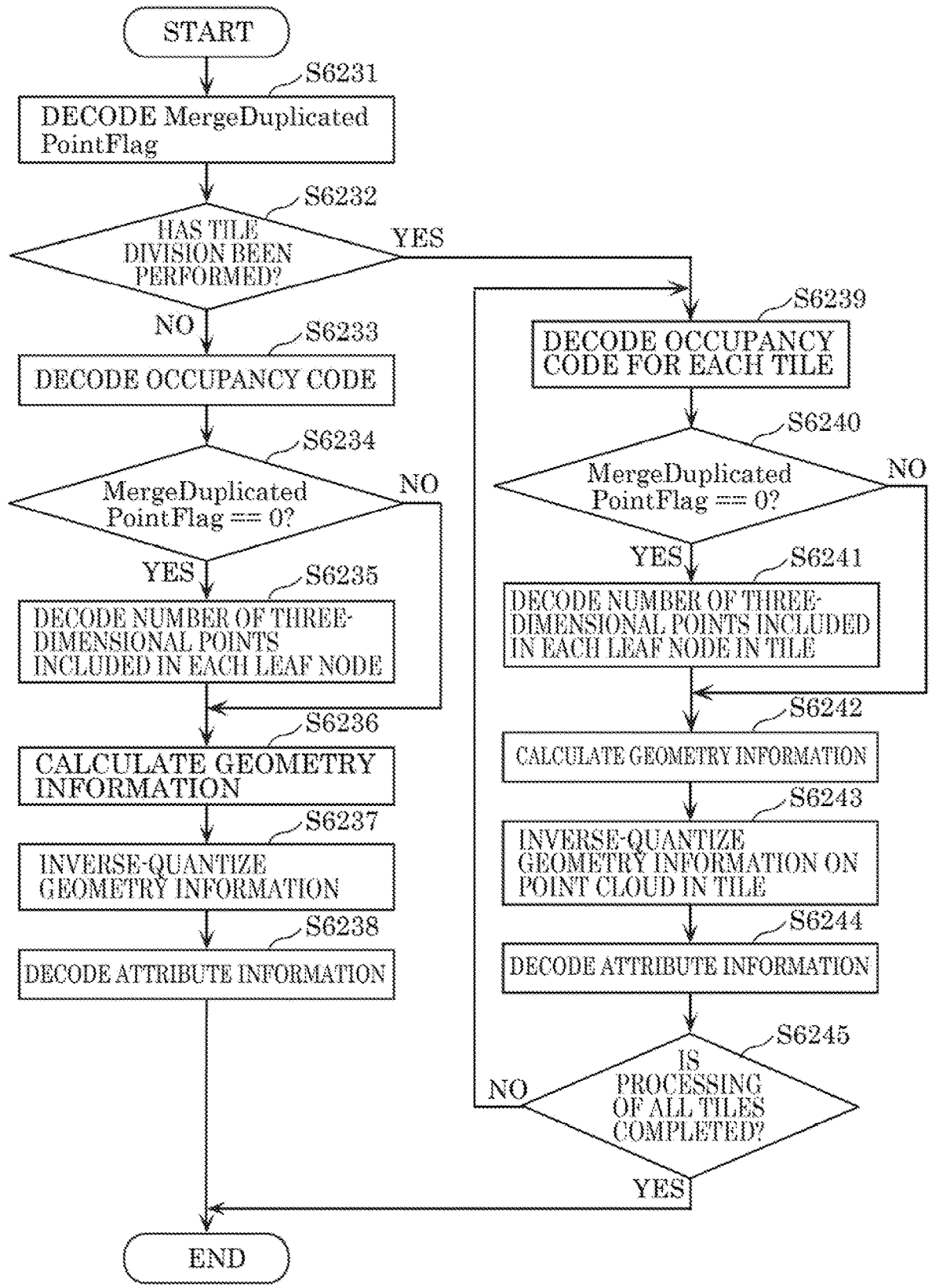
FIG. 76 is a flowchart of a three-dimensional data decoding process according to Embodiment 6.

Next, a three-dimensional data decoding process according to this embodiment will be described. FIG. 76 is a flowchart of a three-dimensional data decoding process according to this embodiment.

First, three-dimensional data decoding device decodes MergeDuplicatedPointFlag from the metadata included in the bitstream (S6231). The three-dimensional data decoding device then determines whether or not the tile division has been performed (S6232). For example, the three-dimensional data decoding device determines whether or not the tile division has been performed based on information included in the bitstream.

If the tile division has not been performed (if No in S6232), the three-dimensional data decoding device decodes the occupancy code from the bitstream (S6233). Specifically, the three-dimensional data decoding device generates an octree of a certain space (node) based on the header information included in the bitstream. For example, the three-dimensional data decoding device generates an octree by generating a large space (root node) based on dimensions in the x-axis direction, the y-axis direction, and the z-axis direction of a certain space added to the header information and dividing the large space into two parts in each of the x-axis direction, the y-axis direction, and the z-axis direction to generate eight small spaces A (nodes A0 to A7). Similarly, the three-dimensional data decoding device further divides each of nodes A0 to A7 into eight smaller spaces, and successively performs the decoding of the occupancy code for each node and the decoding of the leaf information in the process according to this flow.

When MergeDuplicatedPointFlag is 0 (if Yes in S6234), the three-dimensional data decoding device decodes the information that indicates the number of three-dimensional points included in each of all the leaf nodes (S6235). For example, the large space has a size of 8×8×8, a node resulting from three octree divisions has a size of 1×1×1. When this size is the minimum unit of division (leaf), the three-dimensional data decoding device determines whether each leaf node includes a point based on the decoded occupancy code for a parent node of the leaf node, and calculates the three-dimensional position of each leaf node.

After Step S6235, or when MergeDuplicatedPointFlag is 1 (if No in S6234), the three-dimensional data decoding device calculates the geometry information (three-dimensional position) on the leaf node based on information such as the decoded occupancy code or the number of divisions of the octree (S6236). The three-dimensional data decoding device then inverse-quantizes the geometry information (S6237).

Specifically, the three-dimensional data decoding device calculates the geometry information (three-dimensional position) on the point cloud by performing the inverse quantization using the quantization parameter decoded from the header. For example, the three-dimensional data decoding device calculates the inverse-quantized position (x×qx, y×qy, z×qz) by multiplying the three-dimensional position (x, y, z) yet to be inverse-quantized by the quantization parameter (qx, qy, qz). Note that, in lossless encoding, the inverse quantization process may be skipped.

The three-dimensional data decoding device then decodes the attribute information on a three-dimensional point whose geometry information has been decoded (S6238). When MergeDuplicatedPointFlag=1, each point having a different decoded three-dimensional position is linked with one piece of attribute information after the decoding. When MergeDuplicatedPointFlag=0, a plurality of points having the same decoded three-dimensional position are linked with a plurality of different decoded pieces of attribute information.

On the other hand, if the tile division has been performed (if Yes in S6232), the three-dimensional data decoding device decodes the occupancy code for each tile (S6239). When MergeDuplicatedPointFlag is 0 (if Yes in S6240), the three-dimensional data decoding device decodes the information that indicates the number of three-dimensional points included in each of all the leaf nodes in the tile (S6241).

After Step S6241, or when MergeDuplicatedPointFlag is 1 (if No in S6240), the three-dimensional data decoding device calculates the geometry information (three-dimensional position) on the leaf node based on information such as the decoded occupancy code or the number of divisions of the octree (S6242).

The three-dimensional data decoding device then inverse-quantizes the geometry information (three-dimensional position) on the point cloud in the tile (S6243), and decodes the attribute information on a three-dimensional point whose geometry information has been decoded (S6244).

If the processing of all the tiles is not completed (if No in S6245), Step S6239 and the following processing are performed for the next tile. If the processing of all the tiles is completed (if Yes in S6245), the three-dimensional data decoding device ends the process.

Figure 77:
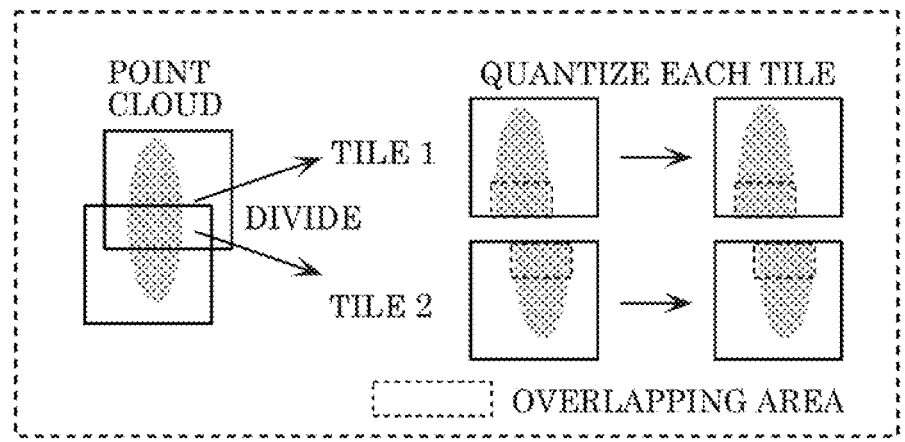
FIG. 77 is a diagram showing an example of tile division according to Embodiment 6.
Figure 78:
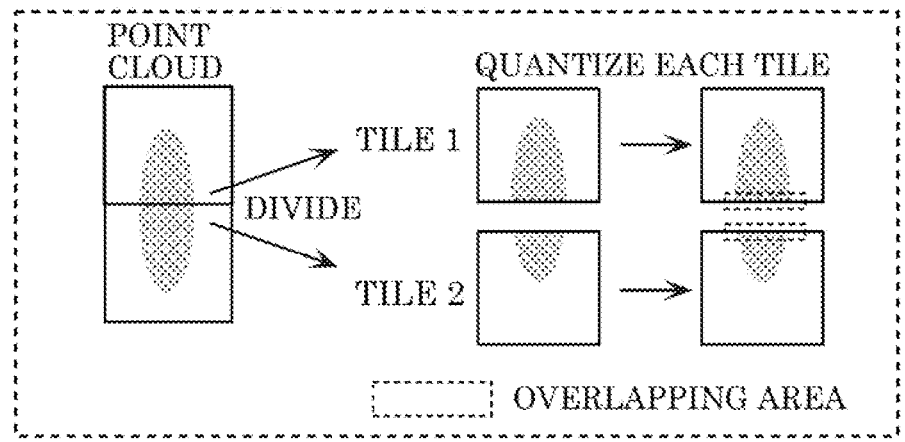
FIG. 78 is a diagram showing an example of tile division according to Embodiment 6.

In the following, an example where there is a three-dimensional point duplicated between tiles and an encoding method in such a case will be described. Cases where there is a point duplicated between tiles include the case described below. FIGS. 77 and 78 are diagrams showing examples of the tile division.

As shown in FIG. 77, when the divider divides a point cloud into tiles, if the point cloud is divided in such a manner that the tile areas overlap with each other as shown by the solid line, the division results in a point duplicated between tiles in the region indicated by the dashed line. If the point cloud is divided in such a manner that the tile areas do not overlap with each other as shown in FIG. 78, the division does not result in a point duplicated between tiles.

In addition, in the quantization of the geometry information on each tile, the position of each point is shifted. This also can result in a point duplicated in a tile or between tiles. In the subsequent intra-tile merging process for each tile, the duplicated points in each tile are merged into one point. However, points duplicated between tiles remain.

In the example in FIG. 77, a duplicated point can occur not only in the overlapping area of the tile areas but also in the vicinity of the tile boundary. In the example in FIG. 78, a duplicated point can occur in the vicinity of the tile boundary.

When there is a point duplicated between tiles, duplicated points occur in the point cloud data when the three-dimensional data decoding device reconstructs the tiles. As a result, the three-dimensional data decoding device is required to perform an unnecessary processing when the duplicated points are not necessary.

In view of this, the three-dimensional data encoding device stores MergeDuplicatedPointFlag or TileMergeDuplicatedPointFlag, which indicates whether there are duplicated points in a tile, in the bitstream and stores UniqueBetweenTilesFlag, which is a flag that indicates whether there is a point duplicated between tiles, in the bitstream. As a result, when UniqueBetweenTilesFlag=0, the three-dimensional data decoding device can delete or merge the duplicated points to reduce the number of points to be handled and can reduce the processing load.

When a duplicated point duplicated between tiles occurs in the tile division or quantization, the three-dimensional data encoding device may then delete or merge the points duplicated between tiles. In that case, the three-dimensional data encoding device stores, in the bitstream, UniqueBetweenTilesFlag=1 that indicates that there is no point duplicated between tiles. The three-dimensional data decoding device can determine that there is no need to merge duplicated points, based on UniqueBetweenTilesFlag.

When a point duplicated between tiles can occur, such as when the tile division is performed in such a manner that the tile areas overlap with each other or when each tile is quantized, the three-dimensional data encoding device sets UniqueBetweenTilesFlag at 0. Note that, even when the tile areas overlap with each other, if there is originally no point in the overlapping area, no duplicated point occurs. In such a case, again, the three-dimensional data encoding device can set UniqueBetweenTilesFlag at 0. When the three-dimensional data encoding device performs the quantization, even in a situation where a duplicated point does not always occur, the three-dimensional data encoding device can set UniqueBetweenTilesFlag at 0 if a duplicated point can occur.

Figure 79:
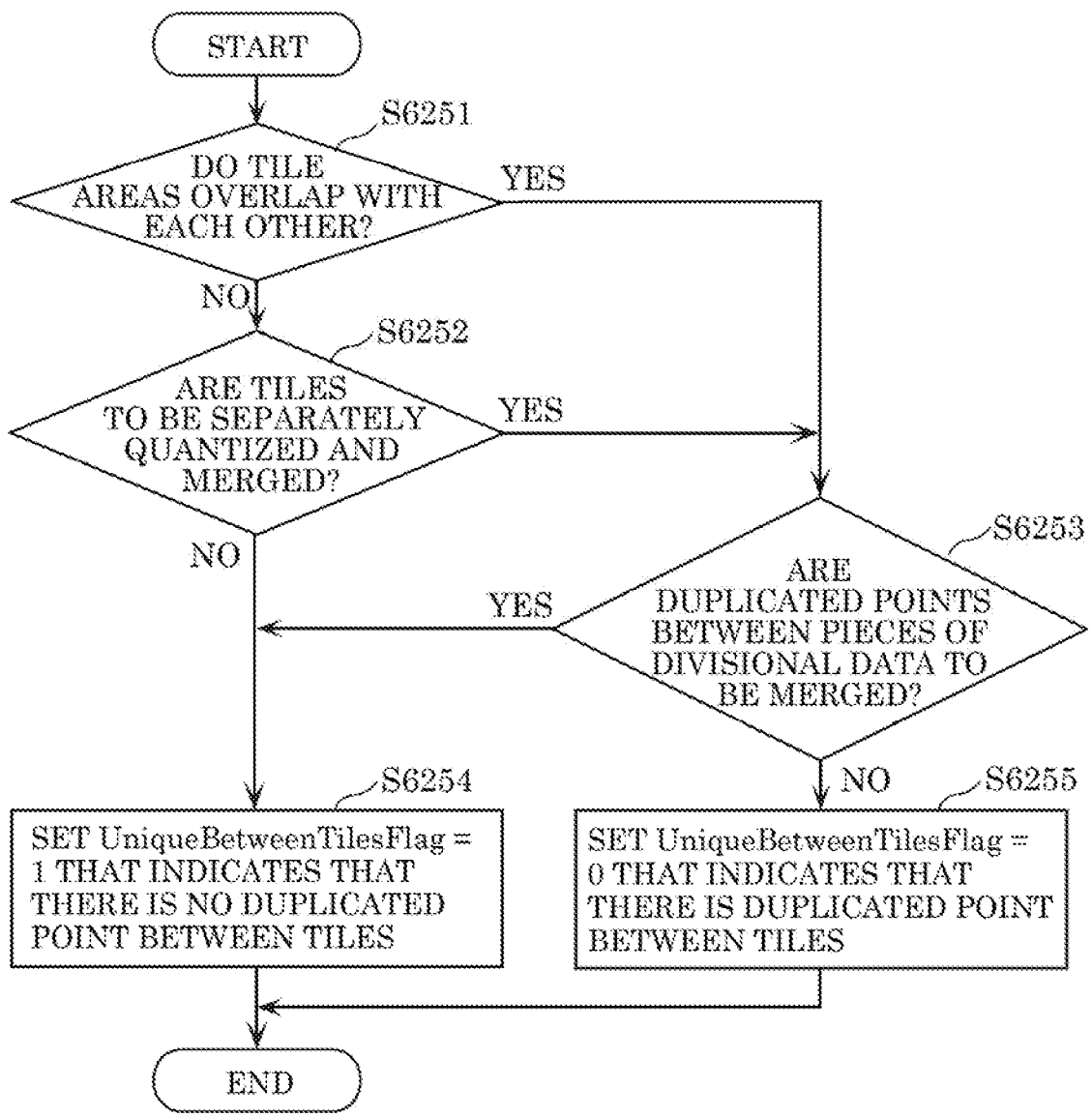
FIG. 79 is a flowchart of a three-dimensional data encoding process according to Embodiment 6.

FIG. 79 is a flowchart of a three-dimensional data encoding process. First, the three-dimensional data encoding device determines whether or not tile areas overlap with each other (S6251). When tile areas do not overlap with each other (if No in S6251), the three-dimensional data encoding device determines whether or not to separately quantize and merge the tiles (S6252). When tile areas overlap with each other (if Yes in S6251), or when separately quantizing and merging the tiles (if Yes in S6252), the three-dimensional data encoding device determines whether or not to merge points duplicated between pieces of divisional data (S6253).

When not separately quantizing and merging the tiles (if No in S6252), or when merging points duplicated between pieces of divisional data (if Yes in S6253), the three-dimensional data encoding device sets UniqueBetweenTilesFlag=1 that indicates that there is no point duplicated between tiles (S6254).

When not merging points duplicated between pieces of divisional data (if No in S6253), the three-dimensional data encoding device sets UniqueBetweenTilesFlag=0 that indicates that there is a point duplicated between tiles (S6255).

Note that a process other than the process shown in FIG. 79 may be used. For example, the three-dimensional data encoding device may determine whether there are duplicated points or not by actually reconstructing the tiles after the quantization and searching for a point duplicated between tiles, and set UniqueBetweenTilesFlag based on the result of the determination.

The three-dimensional data encoding device may store metadata concerning the overlapping area or range in the bitstream. For example, the metadata may indicate that there can be a point duplicated between tiles at the tile boundary. This allows the three-dimensional data decoding device to delete the duplicated points by searching the tile boundary, so that the processing load can be reduced.

Figure 80:
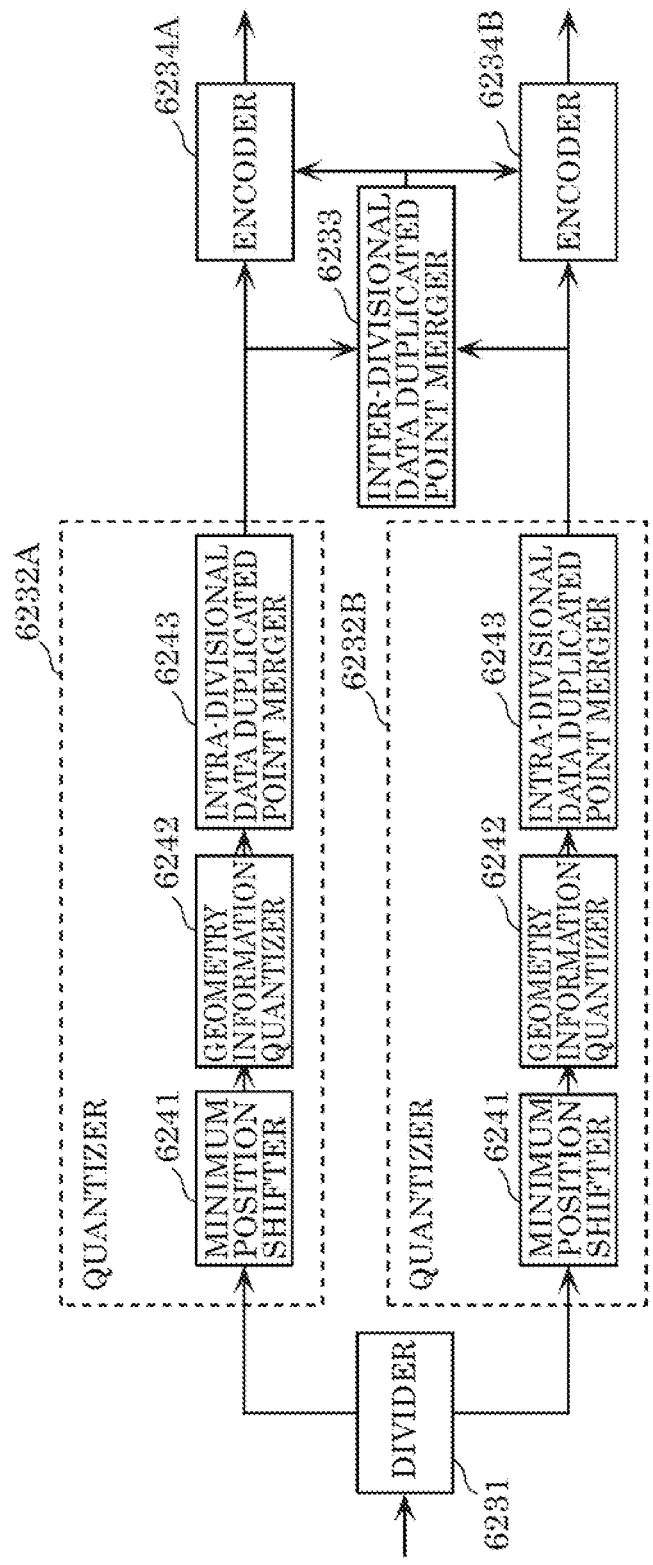
FIG. 80 is a block diagram showing a three-dimensional data encoding device according to Embodiment 6.

FIG. 80 is a block diagram showing a configuration of a three-dimensional data encoding device. As shown in FIG. 80, the three-dimensional data encoding device includes divider 6231, a plurality of quantizers 6232A and 6232B, inter-divisional data duplicated point merger 6233, and a plurality of encoders 6234A and 6234B.

Divider 6231 divides point cloud data into a plurality of tiles to generate a plurality of pieces of divisional data. The plurality of quantizers 6232A and 6232B quantizes the plurality of pieces of divisional data to generate a plurality of pieces of quantized data.

Each of the plurality of quantizers 6232A and 6232B includes minimum position shifter 6241, geometry information quantizer 62412, and intra-divisional data duplicated point merger 6243.

Minimum position shifter 6241 shifts a point cloud in such a manner that a minimum point, which has the smallest value of a coordinate in the point cloud, is shifted to the origin. Geometry information quantizer 6242 quantizes geometry information. Intra-divisional data duplicated point merger 6243 merges duplicated points in a tile.

Inter-divisional data duplicated point merger 6233 merges points duplicated between tiles. The plurality of encoders 6234A and 6234B encode a plurality of pieces of quantized data resulting from the merging of points duplicated between tiles to generate a plurality of pieces of encoded data.

A configuration in which the quantizers are arranged to precede the divider can also be used. That is, the three-dimensional data encoding device may perform the tile division after quantizing all the point cloud data. In that case, a point duplicated between tiles does not occur in the quantization.

FIG. 81 is a diagram showing a syntax example of GPS. As shown in FIG. 81, GPS includes an inter-tile duplicated point flag (UniqueBetweenTilesFlag). The inter-tile duplicated point flag is a flag that indicates whether or not there can be a point duplicated between tiles.

Figure 82:
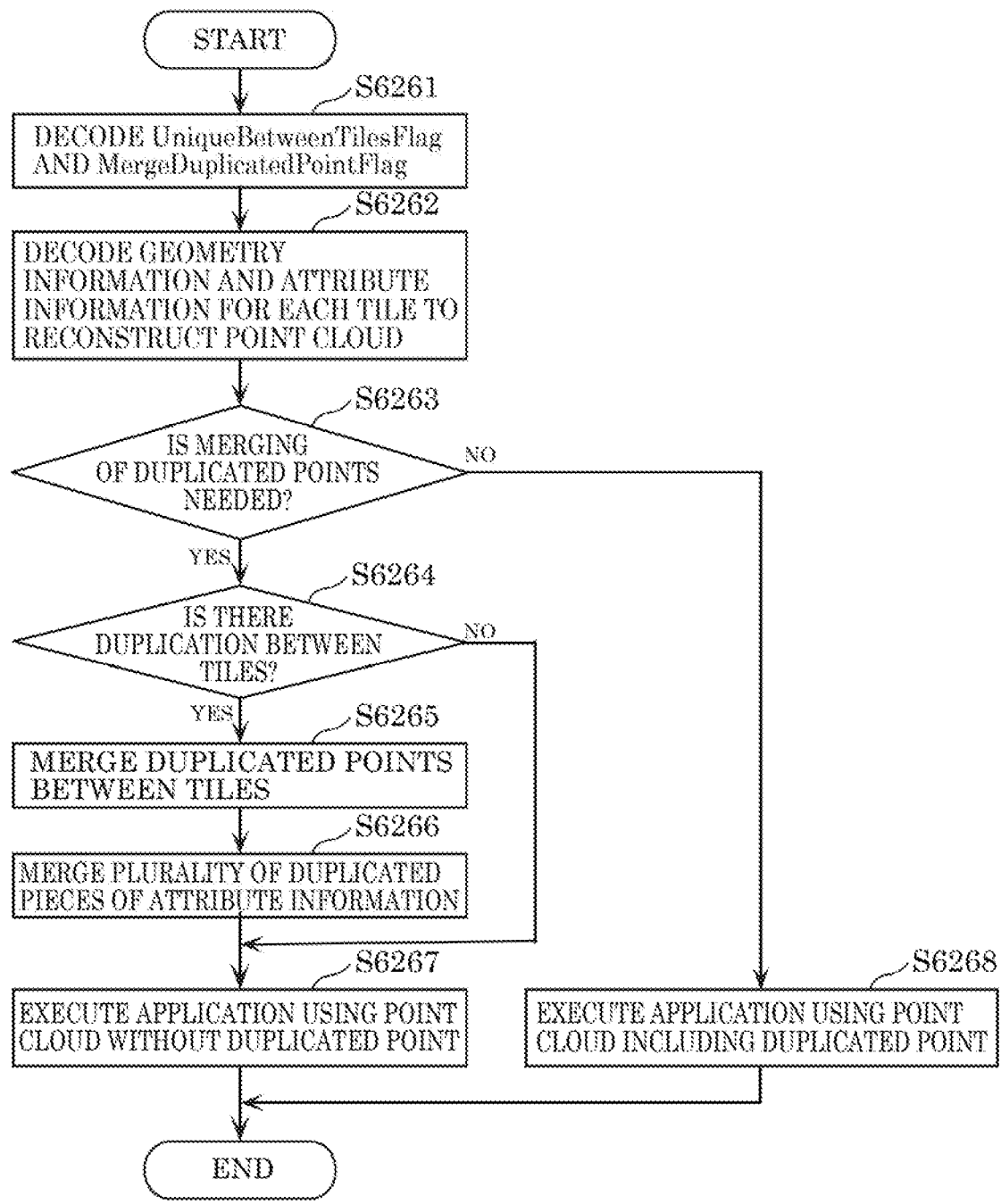
FIG. 82 is a flowchart of a three-dimensional data decoding process according to Embodiment 6.

FIG. 82 is a flowchart of a three-dimensional data decoding process. First, three-dimensional data decoding device decodes UniqueBetweenTilesFlag and MergeDuplicatedPointFlag from the metadata included in the bitstream (S6261). The three-dimensional data decoding device then decodes the attribute information and the geometry information for each tile to reconstruct the point cloud (S6262).

The three-dimensional data decoding device then determines whether the merging of duplicated points is needed or not (S6263). For example, the three-dimensional data decoding device determines whether the merging is needed or not based on whether an application can handle the duplicated points or not or whether the duplicated points should be merged or not. Alternatively, the three-dimensional data decoding device may perform a smoothing or filtering process on the plurality of pieces of attribute information on the duplicated points and determine to merge the duplicated points in order to remove noise or improve the estimation precision.

When the merging of duplicated points is needed (if Yes in S6263), the three-dimensional data decoding device determines whether there is a duplication between tiles (there is a point duplicated between tiles) or not (S6264). For example, the three-dimensional data decoding device may determine whether there is a duplication between tiles or not based on the result of the decoding of UniqueBetweenTilesFlag and MergeDuplicatedPointFlag. This eliminates the need for the three-dimensional data decoding device to search for a duplicated point, and the processing load on the three-dimensional data decoding device can be reduced. Note that the three-dimensional data decoding device may determine whether there is a duplicated point or not by searching for a duplicated point after reconstruction of the tiles.

When there is a duplication between tiles (if Yes in S6264), the three-dimensional data decoding device merges the points duplicated between tiles (S6265). The three-dimensional data decoding device then merges the plurality of duplicated pieces of attribute information (S6266).

After Step S6266, or when there is not a duplication between tiles (if No in S6264), the three-dimensional data decoding device executes an application using the point cloud without a duplicated point (S6267).

On the other hand, when the merging of duplicated points is not needed (if No in S6263), the three-dimensional data decoding device does not merge the duplicated points, and executes an application using the point cloud including duplicated points (S6268).

In the following, an example of an application will be described. First, an example of an application that uses a point cloud without a duplicated point will be described.

Figure 83:
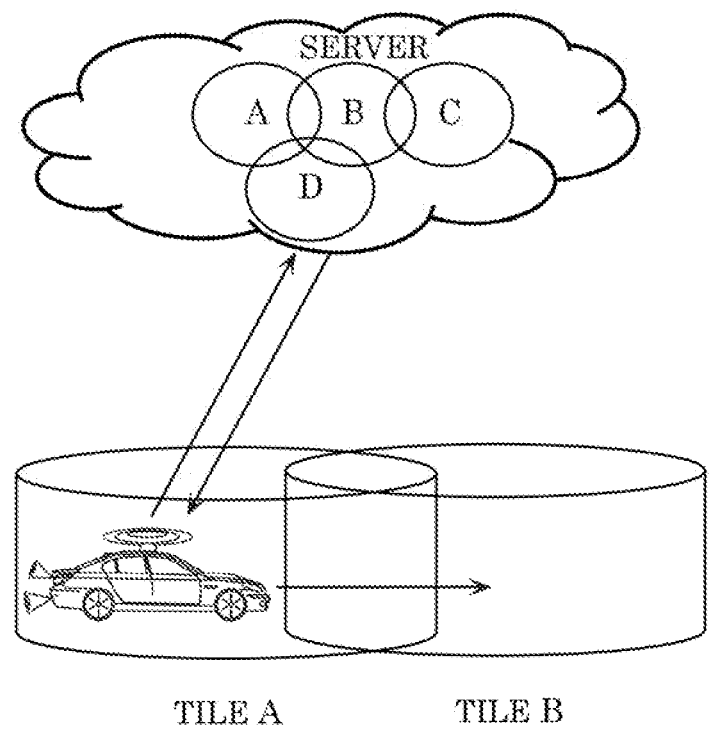
FIG. 83 is a diagram showing an example of an application according to Embodiment 6.

FIG. 83 is a diagram showing an example of an application. The example shown in FIG. 83 shows a use case where a moving body traveling from the area of tile A to the area of tile B downloads a map point cloud from a server in real time. The server stores encoded data of map point clouds of a plurality of overlapping areas. The moving body has already obtained map information on tile A and requests map information on tile B, which is located ahead in the direction of travel, from the server.

In this process, the moving body determines that the data on the part of tile B overlapping with tile A is unnecessary, and transmits to the server a direction to delete the part of tile B overlapping with tile A. The server deletes the overlapping part in tile B, and distributes the map information on tile B with the overlapping part deleted to the moving body. In this way, the amount of the transmission data and the load of the decoding process can be reduced.

Note that the moving body may confirm that there is no duplicated point based on a flag. If the moving body has not obtained the map information on tile A yet, the moving body requests the data on tile B in which the overlapping part is not deleted from the server. When the server does not have a capability of deleting a duplicated point, or when whether there is a duplicated point or not is unknown, the moving body can determine whether or not there are duplicated points by checking the distributed data, and merge duplicated points if there are duplicated points.

Next, an example of an application that uses a point cloud including duplicated points will be described. A moving body uploads map point cloud data obtained by LiDAR to a server in real time. For example, the moving body uploads data obtained for each tile to the server. In this case, although tile A and tile B have an overlapping area, the moving body on the encoding side does not merge the points duplicated between tiles but transmits data along with a flag indicating that there is a duplication between tiles to the server. The server does not merge duplicated data included in the received data and accumulates the received data without change.

When the point cloud data is transmitted or accumulated using a system, such as ISOBMFF, MPEG-DASH/MMT, or MPEG-TS, the device may replace the flag in GPS that indicates whether or not there are duplicated points in a tile or whether or not there are points duplicated between tiles with a describer or metadata in the system layer, and store the describer or metadata in SI, MPD, moov, or moof box, for example. This allows the application to use a function of the system.

Figure 84:
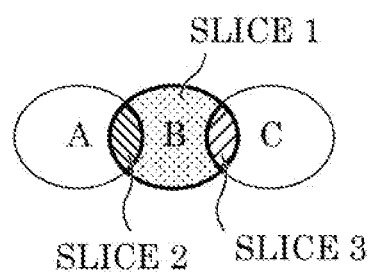
FIG. 84 is a diagram showing an example of tile division and slice division according to Embodiment 6.

As shown in FIG. 84, the three-dimensional data encoding device may divide tile B into a plurality of slices based on the areas overlapping with other tiles, for example. In the example shown in FIG. 84, slice 1 is an area that does not overlap with any other tile, slice 2 is an area that overlaps with tile A, and slice 3 is an area that overlaps with tile C. In this way, desired data can be more easily separated from the encoded data.

The map information may be point cloud data or mesh data. The point cloud data may be divided into tiles corresponding to different areas and saved in the server.

Figure 85:
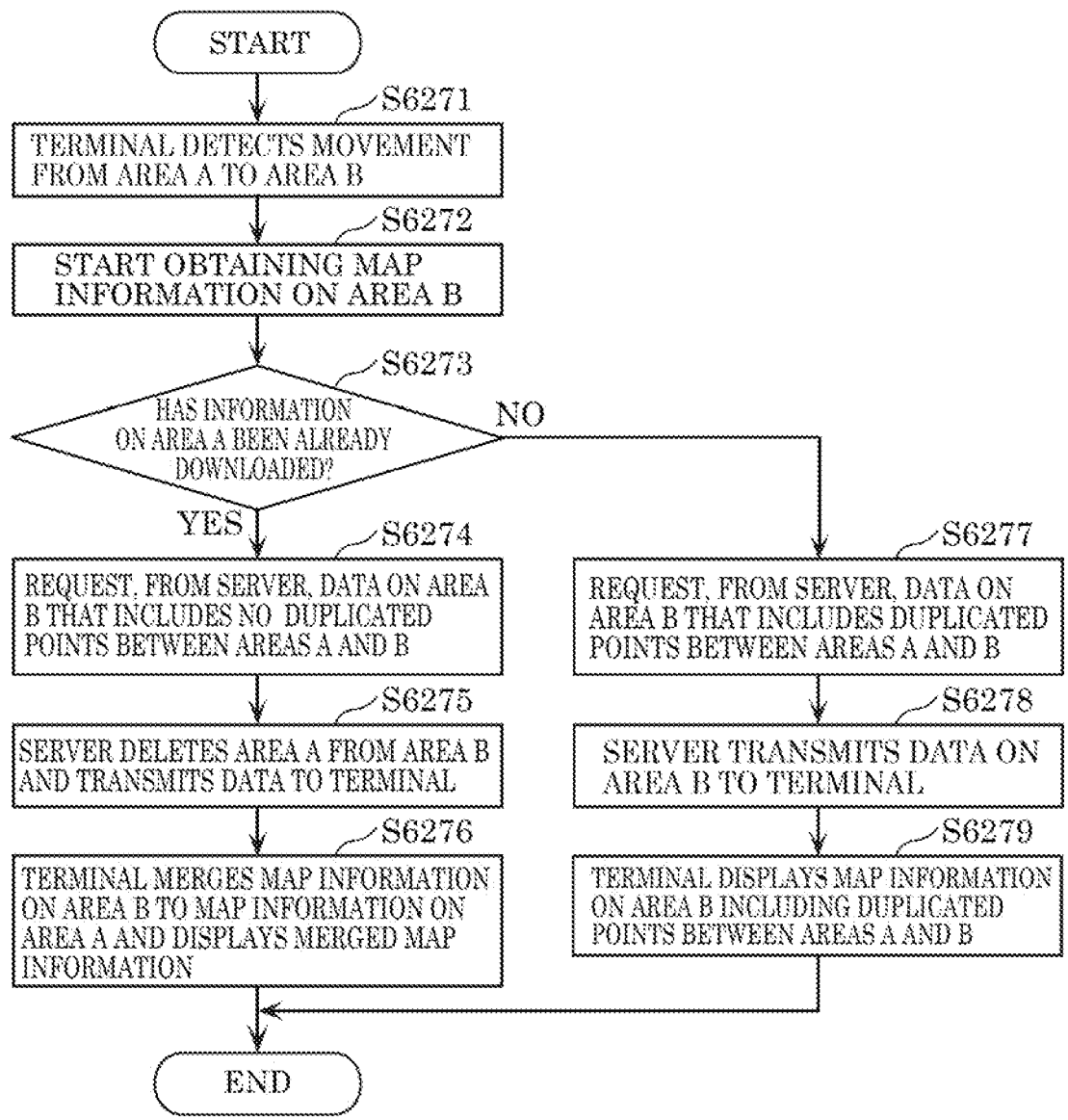
FIG. 85 is a flowchart showing a process performed by a system according to Embodiment 6.

FIG. 85 is a flowchart showing a flow of a process performed by the system described above. First, a terminal (such as a moving body) detects a movement of the terminal from area A to area B (S6271). The terminal then starts obtaining map information on area B (S6272).

If the terminal has already downloaded information on area A (if Yes in S6273), the terminal requests, from the server, data on area B that includes no points duplicated between areas A and B (S6274). The server deletes area A from area B, and transmits data on area B from which area A is deleted to the terminal (S6275). Note that, depending on the direction from the terminal, the server may transmit data on area B by encoding the data so that no duplicated point occurs in real time.

The terminal then merges (combines) the map information on area B to the map information on area A, and displays the merged map information (S6276).

On the other hand, if the terminal has not downloaded the information on area A yet (if No S6273), the terminal requests, from the server, data on area B that includes points duplicated between areas A and B (S6277). The server transmits data on area B to the terminal (S6278). The terminal then displays the map information on area B including points duplicated between areas A and B (S6279).

Figure 86:
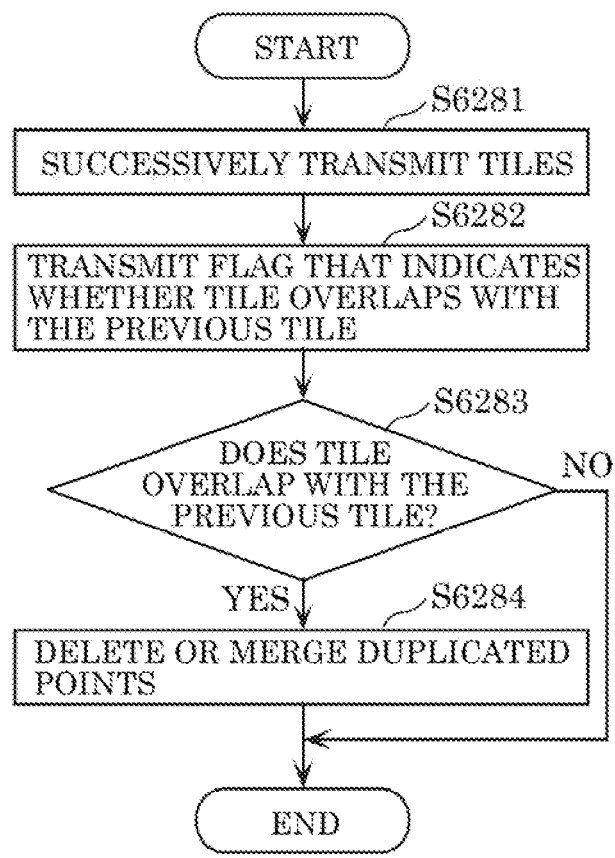
FIG. 86 is a flowchart showing a process performed by the system according to Embodiment 6.

FIG. 86 is a flowchart showing another example of the operation of the system. A transmission device (three-dimensional data encoding device) successively transmits data on tiles (S6281). The transmission device adds, to data on a tile to be transmitted, a flag that indicates whether the tile of the data to be transmitted overlaps with the tile of the previously transmitted data, and then transmits the data (S6282).

A receiving device (three-dimensional data decoding device) determines whether the tile of the received data overlaps with the tile of the previously received data based on the flag added to the data (S6283). If the tile of the received data overlaps with the tile of the previously received data (if Yes in S6283), the receiving device deletes or merges the duplicated points (S6284). On the other hand, if the tile of the received data does not overlap with the tile of the previously received data (if No in S6283), the receiving device does not perform the process of deleting or merging the duplicated points, and ends the process. In this way, the processing load on the receiving device can be reduced, and the precision of the estimation of the attribute information can be improved. Note that the receiving device need not to merge the duplicated points if the merging of the duplicated points is not needed.

Embodiment 7

In this embodiment, a display method based on a viewpoint, a random access method for encoded data, and encoding method and decoding method for point cloud data in an application using a point cloud will be described. With the increasing capabilities of sensors, three-dimensional point clouds of higher qualities have become able to be obtained. However, in order to view a three-dimensional point cloud of high quality, a viewing device (viewer) that can reproduce the three-dimensional point cloud of high quality is needed. Specifically, it is desired to be able to display, without delay, a three-dimensional point cloud (point cloud) of high quality having a large data amount. In this embodiment, a viewer (first application) for a three-dimensional point cloud that can efficiently display point cloud data having high density in a scalable method using point cloud compression will be described.

Point cloud compression is achieved by a plurality of data division methods. For example, using levels of details (LoDs), a resolution required to represent point cloud data is calculated in accordance with the distance between a virtual camera and the point cloud data. In this way, separations into layers or classifications into layers are achieved.

A three-dimensional point cloud viewing device (referred to also as a three-dimensional data decoding device) selects a visible point cloud for rendering. At this point, the three-dimensional data decoding device preferably confirms that all visible points are data obtained by actual scanning rather than approximation.

Figure 87:
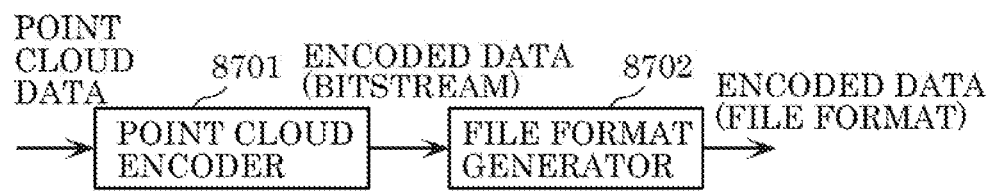
FIG. 87 is a block diagram of a three-dimensional data encoding device according to Embodiment 7.

FIG. 87 is a block diagram showing an example configuration of a three-dimensional data encoding device. The three-dimensional data encoding device includes point cloud encoder 8701 and file format generator 8702. Point cloud encoder 8701 generates encoded data (bitstream) by encoding point cloud data. For example, point cloud encoder 8701 encodes point cloud data using a geometry information-based encoding method using an octree or a video-based encoding method, for example.

File format generator 8702 changes the encoded data (bitstream) into data in a predetermined file format. For example, the file format is ISOBMFF or MP4. Note that the three-dimensional data encoding device may output (transmit to a three-dimensional data decoding device, for example) encoded data in a file format or output encoded data in a bitstream format of the encoding type.

Figure 88:
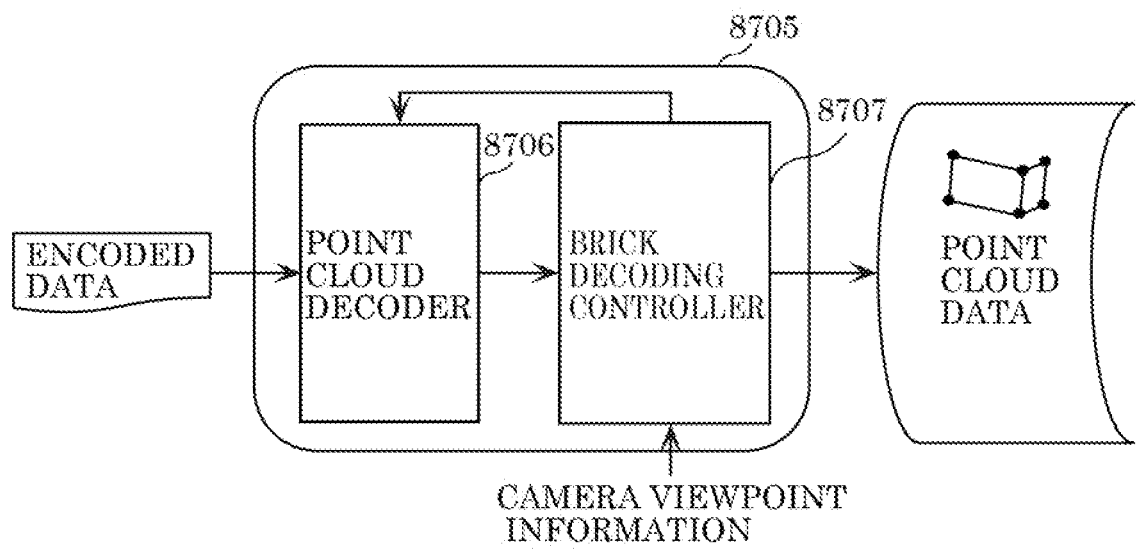
FIG. 88 is a block diagram of a three-dimensional data decoding device according to Embodiment 7.

FIG. 88 is a block diagram showing an example configuration of three-dimensional data decoding device 8705. Three-dimensional data decoding device 8705 generates point cloud data by decoding encoded data. Here, the encoded data is encoded data in a bitstream format or MP4 format, for example. Note that point cloud data that is not encoded can also be used.

The whole or a part of the group of data of a point cloud is referred to as a brick. Note that the brick may be referred to as divisional data, a tile, or a slice. Divisional data may be further divided.

Three-dimensional data decoding device 8705 obtains, from the outside, camera viewpoint information that indicates the viewpoint (angle) of a camera. Three-dimensional data decoding device 8705 generates point cloud data by obtaining the whole or a part of encoded data based on the camera viewpoint information and decoding the obtained encoded data. For example, the camera viewpoint information indicates the position and direction (orientation) of a camera. After that, three-dimensional data decoding device 8705 displays the decoded point cloud data.

Three-dimensional data decoding device 8705 includes point cloud decoder 8706 and brick decoding controller 8707. The camera viewpoint information (camera view angle) is input to brick decoding controller 8707. Brick decoding controller 8707 selects a brick to be decoded based on the visibility of bricks determined based on the camera viewpoint information. Point cloud decoder 8706 decodes the selected brick and outputs the decoded brick.

Figure 89:
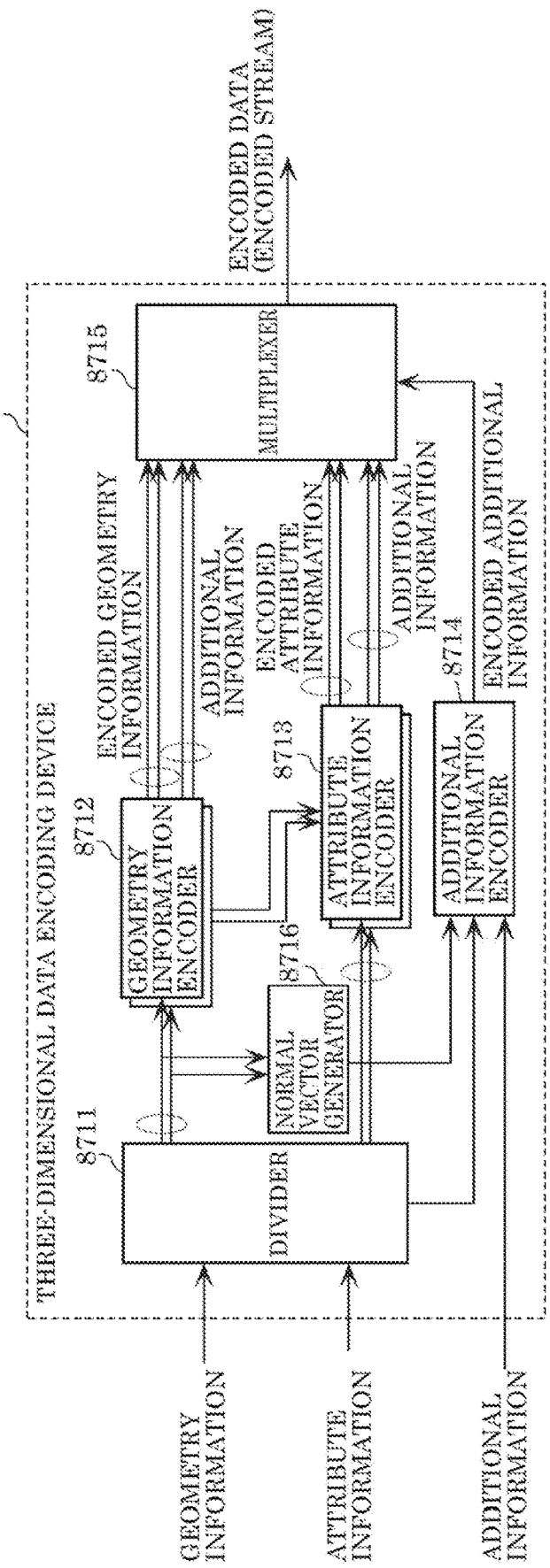
FIG. 89 is a block diagram of a three-dimensional data encoding device according to Embodiment 7.

In the following, a configuration of a three-dimensional data encoding device according to this embodiment will be described. FIG. 89 is a block diagram showing a configuration of three-dimensional data encoding device 8710 according to this embodiment. Three-dimensional data encoding device 8710 generates encoded data (encoded stream) by encoding point cloud data (point cloud). Three-dimensional data encoding device 8710 includes divider 8711, a plurality of geometry information encoders 8712, a plurality of attribute information encoders 8713, additional information encoder 8714, multiplexer 8715, and normal vector generator 8716.

Divider 8711 generates items of divisional data by dividing point cloud data. Specifically, divider 8711 generates items of divisional data by dividing a space of point cloud data into a plurality of subspaces. Here, a subspace is any of bricks, tiles, and slices, or a combination of two or more of bricks, tiles, and slices. More specifically, point cloud data includes geometry information, attribute information (such as color or reflectance), and additional information. Divider 8711 divides geometry information into items of divisional geometry information, and divides attribute information into items of divisional attribute information. Divider 8711 also generates additional information concerning the division.

The plurality of geometry information encoders 8712 generate items of encoded geometry information by encoding items of divisional geometry information. For example, geometry information encoders 8712 encode divisional geometry information using an N-ary tree structure, such as an octree. Specifically, in the case of an octree, a current space is divided into eight nodes (subspaces), and 8-bit information (occupancy code) that indicates whether each node includes a point cloud or not is generated. A node including a point cloud is further divided into eight nodes, and 8-bit information that indicates whether each of the eight nodes includes a point cloud or not is generated. This process is repeated until a predetermined layer is reached or the number of the point clouds included in each node becomes equal to or less than a threshold. For example, the plurality of geometry information encoders 8712 process items of divisional geometry information in parallel.

Attribute information encoder 8713 generates encoded attribute information, which is encoded data, by encoding attribute information using configuration information generated by geometry information encoder 8712. For example, attribute information encoder 8713 determines a reference point (reference node) that is to be referred to in encoding of a current point (current node) to be processed based on the octree structure generated by geometry information encoder 8712. For example, attribute information encoder 8713 refers to a node whose parent node in the octree is the same as the parent node of the current node, among peripheral nodes or neighboring nodes. Note that the method of determining a reference relationship is not limited to this method.

The process of encoding geometry information or attribute information may include at least one of a quantization process, a prediction process, and an arithmetic encoding process. In this case, "refer to" means using a reference node for calculation of a predicted value of attribute information or using a state of a reference node (occupancy information that indicates whether a reference node includes a point cloud or not, for example) for determination of a parameter of encoding. For example, the parameter of encoding is a quantization parameter in the quantization process or a context or the like in the arithmetic encoding.

Normal vector generator 8716 calculates a normal vector for each item of divisional data. Note that the input data need not be divided. In that case, normal vector generator 8716 may calculate a normal vector for each point, rather than a normal vector for each item of divisional data. Alternatively, normal vector generator 8716 may calculate both a normal vector for each item of divisional data and a normal vector for each point.

Additional information encoder 8714 generates encoded additional information by encoding additional information included in the point cloud data, the additional information concerning the data division generated in the division by divider 8711, and the normal vector generated by normal vector generator 8716.

Multiplexer 8715 generates encoded stream (encoded stream) by multiplexing the items of encoded geometry information, the items of encoded attribute information, and the encoded additional information, and transmits the generated encoded data. The encoded additional information is used in the decoding.

Figure 90:
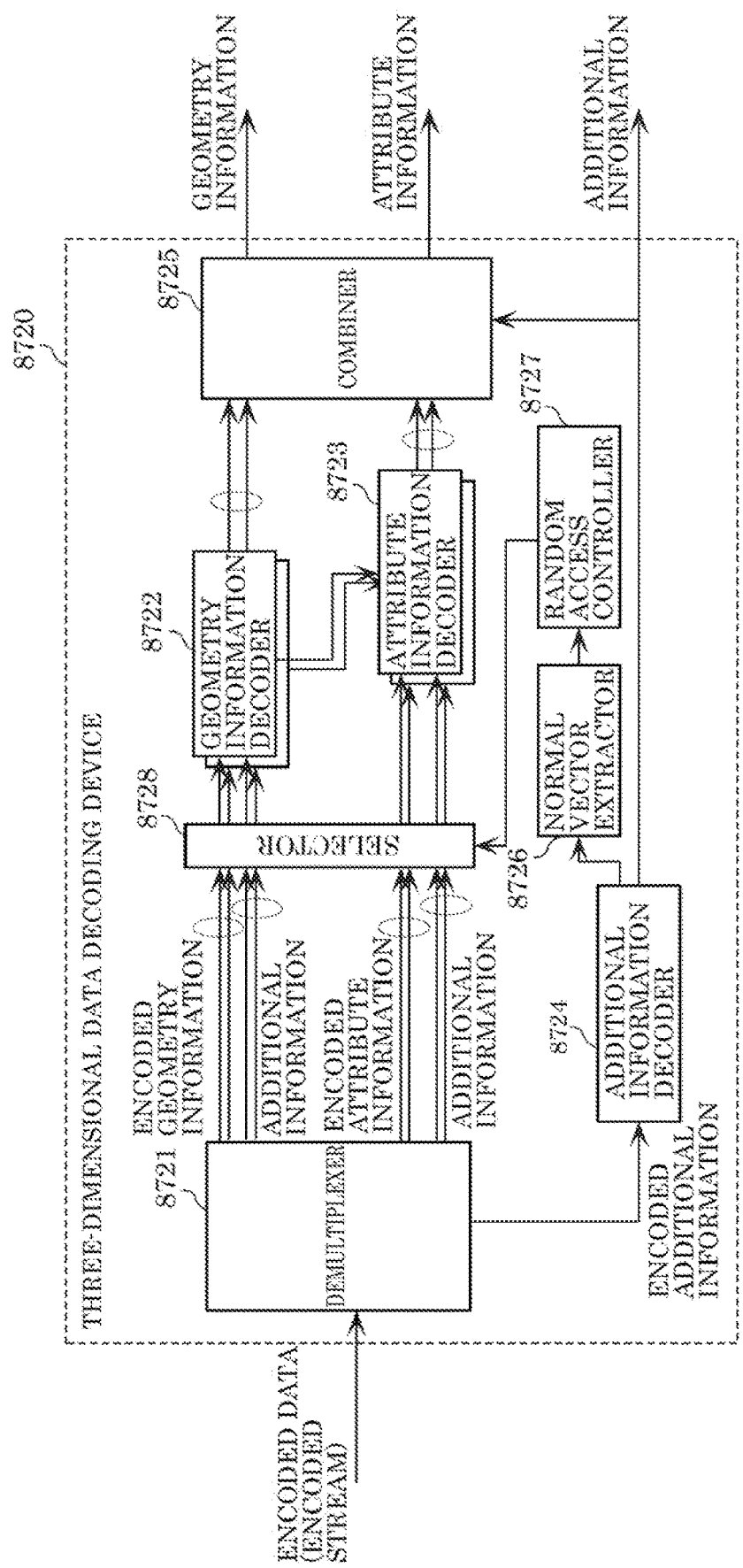
FIG. 90 is a block diagram showing a configuration of a three-dimensional data decoding device according to Embodiment 7.

In the following, a configuration of a three-dimensional data decoding device according to this embodiment will be described. FIG. 90 is a block diagram showing a configuration of three-dimensional data decoding device 8720. Three-dimensional data decoding device 8720 reproduces point cloud data by decoding encoded data (encoded stream) generated by encoding the point cloud data. Three-dimensional data decoding device 8720 includes demultiplexer 8721, a plurality of geometry information decoders 8722, a plurality of attribute information decoders 8723, additional information decoder 8724, combiner 8725, normal vector extractor 8726, random access controller 8727, and selector 8728.

Demultiplexer 8721 generates items of encoded geometry information, items of encoded attribute information, and encoded additional information by demultiplexing encoded data (encoded stream). Additional information decoder 8724 generates additional information by decoding the encoded additional information.

Normal vector extractor 8726 extracts a normal vector from the additional information. Random access controller 8727 determines divisional data to be extracted based on the normal vector for each item of divisional data. Selector 8728 extracts items of divisional data (items of encoded geometry information and items of encoded attribute information) determined by random access controller 8727 from the items of divisional data (the items of encoded geometry information and the items of encoded attribute information). Note that selector 8728 may extract one item of divisional data.

The plurality of geometry information decoders 8722 generates items of divisional geometry information by decoding the items of encoded geometry information extracted by selector 8728. For example, the plurality of geometry information decoders 8722 process the items of encoded geometry information in parallel.

The plurality of attribute information decoders 8723 generate items of divisional attribute information by decoding the items of encoded attribute information extracted by selector 8728. For example, the plurality of attribute information decoders 8723 process the items of encoded attribute information in parallel.

Combiner 8725 generates geometry information by combining the items of divisional geometry information using the additional information. Combiner 8725 generates attribute information by combining the items of divisional attribute information using the additional information.

Next, a first example in which a normal vector for each point is generated and encoded will be described. FIG. 91 is a diagram showing an example of point cloud data. FIG. 92 is a diagram showing an example of a normal vector for each point. Encoding of normal vectors can be independently performed for each three-dimensional point cloud. FIG. 91 and FIG. 92 show a three-dimensional point cloud of a book and normal vectors for the three-dimensional point cloud. As shown in FIG. 92, there are a plurality of normal vectors extending upward, rightward, and forward. Here, the surfaces of the book are flat surfaces, and a plurality of normal vectors to a surface extend in the same direction. On the other hand, if the surface is round, the normal vectors extend in a plurality of directions in conformity with the normal to the surface.

FIG. 93 is a diagram showing a syntax example of a normal vector in a bitstream. Concerning Normal vector NormalVector[i][face] shown in FIG. 93, [i] represents a counter of each three-dimensional point cloud, and [face] represents an x-axis, a y-axis, or a z-axis that represents a three-dimensional point cloud. That is, NormalVector represents the magnitude of a normal vector along each axis.

Figure 94:
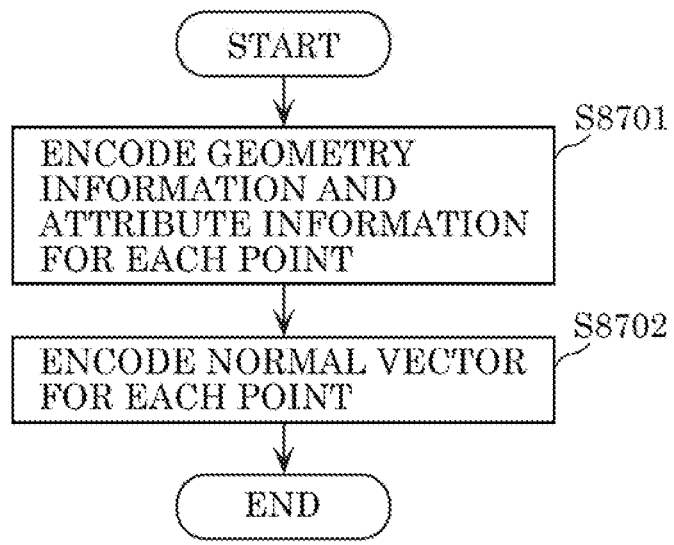
FIG. 94 is a flowchart of a three-dimensional data encoding process according to Embodiment 7.

FIG. 94 is a flowchart of a three-dimensional data encoding process. First, the three-dimensional data encoding device encodes geometry information (geometry) and attribute information for each point (S8701). For example, the three-dimensional data encoding device encodes geometry information for each point. When there is attribute information corresponding to points, the three-dimensional data encoding device may encode attribute information for each point.

The three-dimensional data encoding device then encodes a normal vector (x, y, z) for each point (S8702). The three-dimensional data encoding device may encode a normal vector for each point. The three-dimensional data encoding device may encode difference information that indicates the difference between a normal vector for a point to be processed and a normal vector for another point, for example. In that case, the data amount can be reduced.

The three-dimensional data encoding device may encode a normal vector included in geometry information or a normal vector included in attribute information. The three-dimensional data encoding device may encode a normal vector independently from geometry information or attribute information. Note that when there are a plurality of normal vectors for one point, the three-dimensional data encoding device may encode a plurality of normal vectors for each point.

Figure 95:
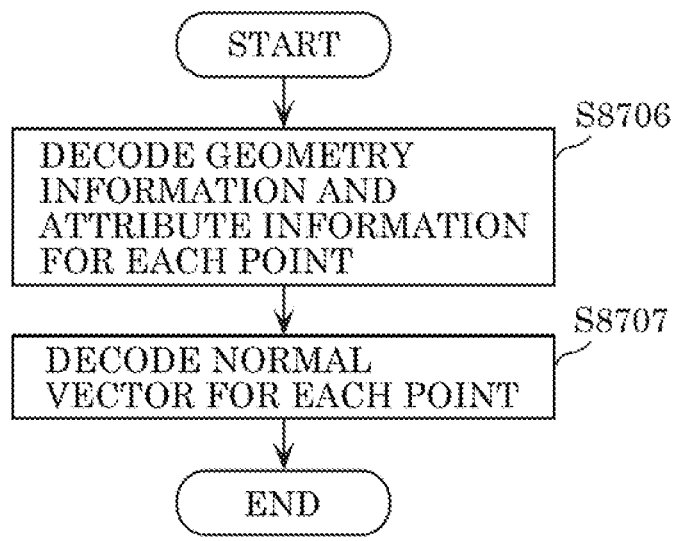
FIG. 95 is a flowchart of a three-dimensional data decoding process according to Embodiment 7.

FIG. 95 is a flowchart of a three-dimensional data decoding process. First, the three-dimensional data decoding device decodes geometry information and attribute information for each point from the bitstream (S8706). The three-dimensional data decoding device then decodes a normal vector for each point from the bitstream (S8707).

The orders of processings shown in FIG. 94 and FIG. 95 are examples, and the encoding order and the decoding order can be changed.

The three-dimensional data encoding device may reduce the data amount by encoding a normal vector using geometry information or a correlation between items of geometry information. In that case, the three-dimensional data decoding device decodes a normal vector using geometry information. In the manner described above, a normal vector for each point in a point cloud can be encoded and decoded.

Next, a second example in which a normal vector for each point is generated and encoded will be described. In another method of encoding a normal vector for each point, a normal vector is encoded as an item of attribute information. In the following, an example will be described in which an attribute information encoder or an attribute information decoder encodes a normal vector as an item of attribute information.

Figures 96, 97:
FIG. 96 is a diagram showing an example configuration of a bitstream according to Embodiment 7.
FIG. 97 is a diagram showing an example of point cloud information according to Embodiment 7.

For example, the three-dimensional data encoding device encodes color information as first attribute information and encodes a normal vector as second attribute information. FIG. 96 is a diagram showing an example configuration of a bitstream. For example, Attr(0) shown in FIG. 96 represents encoded data of first attribute information, and Attr(1) represents encoded data of second attribute information. Metadata concerning the encoding is stored in a parameter set (APS). The three-dimensional data decoding device decodes encoded data by referring to APS corresponding to the encoded data.

Note that SPS stores identification information (attribute_type=Normal Vector) that indicates that the second attribute information is a normal vector. When the attribute information is a normal vector, information that indicates that a normal vector is data having three elements for one point may be stored in SPS or the like. SPS also stores identification information (attribute_type=Color) that indicates that the first attribute information is color information.

FIG. 97 is a diagram showing an example of point cloud information including geometry information, color information, and a normal vector. The three-dimensional data encoding device encodes point cloud data that is not compressed shown in FIG. 97.

The value of a normal vector ranges from a floating-point value of −1 to a floating-point value of 1. To simplify the representation, the three-dimensional data encoding device may transform a floating-point value into an integer in accordance with the required precision. For example, the three-dimensional data encoding device may transform a floating-point value into a value from −127 to 128 using an 8-bit representation. That is, the three-dimensional data encoding device can transform a floating-point value into an integer value or a positive integer value. Since the normal vector is treated as an item of attribute information, a different quantization process can be applied to the normal vector. For example, a different quantization parameter may be used for each item of attribute information. In that case, different precision levels can be achieved. The quantization parameters are stored in APS, for example.

Figure 98:
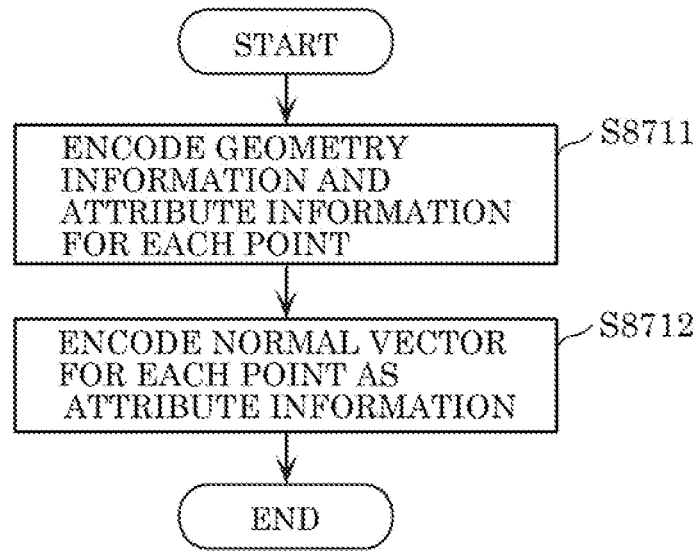
FIG. 98 is a flowchart of a three-dimensional data encoding process according to Embodiment 7.

FIG. 98 is a flowchart of a three-dimensional data encoding process. The three-dimensional data encoding device encodes geometry information and attribute information (such as color information) for each point (S8711). The three-dimensional data encoding device also encodes a normal vector for each point as an item of attribute information having attribute_type="normal vector" in a predetermined method (S8712).

Figure 99:
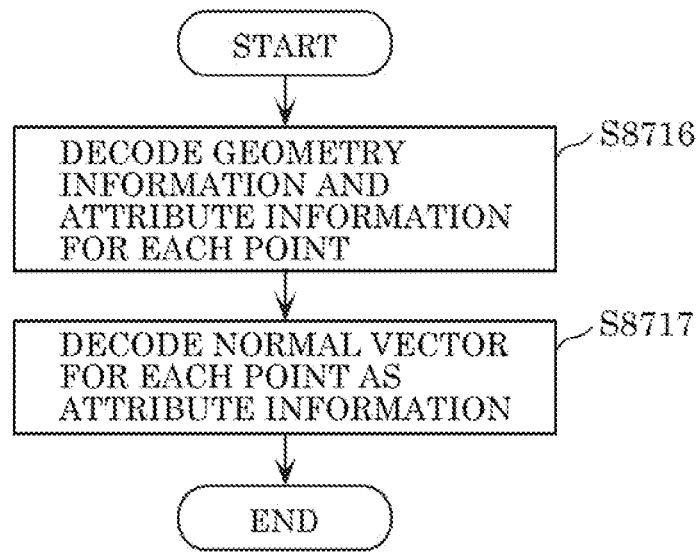
FIG. 99 is a flowchart of a three-dimensional data decoding process according to Embodiment 7.

FIG. 99 is a flowchart of a three-dimensional data decoding process. The three-dimensional data decoding device decodes geometry information and attribute information for each point from the bitstream (S8716). The three-dimensional data decoding device also decodes a normal vector for each point as an item of attribute information having attribute_type="normal vector" from the bitstream in a predetermined method (S8717).

Note that the orders of processings shown in FIG. 98 and FIG. 99 are examples, and the encoding order and the decoding order can be changed.

Next, an example in which a normal vector is generated for each data unit including a plurality of points will be described. The three-dimensional data encoding device divides point cloud data into a plurality of objects or regions based on geometry information and characteristics of the point cloud. The divisional data is a tile or a slice, or layered data. The three-dimensional data encoding device generates a normal vector on a basis of the divisional data or, in other words, on a basis of a data unit containing one or more points.

Figure 100:
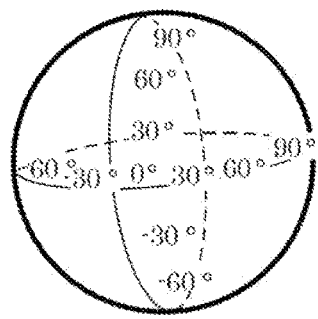
FIG. 100 is a diagram showing an example of normal vector division according to Embodiment 7.
Figure 101:
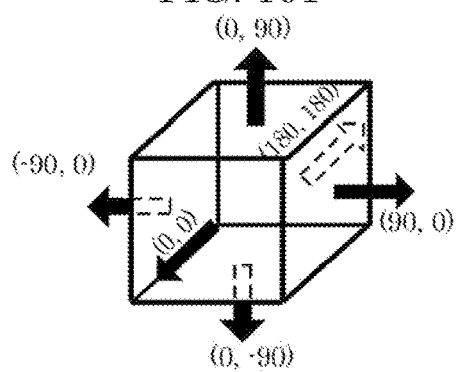
FIG. 101 is a diagram showing an example of normal vector division according to Embodiment 7.

Here, the visibility can be determined as the representation of a normal vector of an object in a brick. FIG. 100 and FIG. 101 are diagrams for illustrating this process. For example, as shown in FIG. 100, the three-dimensional data encoding device defines normal vector directions that are 30° apart from each other with respect to a horizontal axis and a vertical axis. In a simpler method, as shown in FIG. 101, the three-dimensional data encoding device may divide a normal vector into six directions (0, 0), (0, 90), (0, −90), (90, 0), (−90, 0), and (180, 180).

The three-dimensional data encoding device may calculate an effective normal vector by using a median, an average, or other more effective algorithm. The three-dimensional data encoding device may use a representative value as an effective normal vector or represent an effective normal vector in other ways.

A normal vector for each item of divisional data may be represented by original values of x, y, and z, quantized every 30 degrees as described above, or quantized every 90 degrees. The information amount can be reduced by the quantization.

Figure 102:
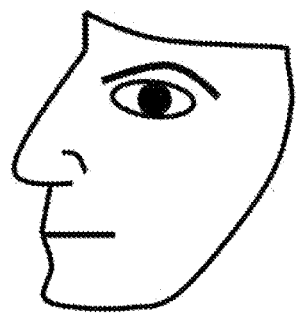
FIG. 102 is a diagram showing an example of point cloud data according to Embodiment 7.
Figure 103:
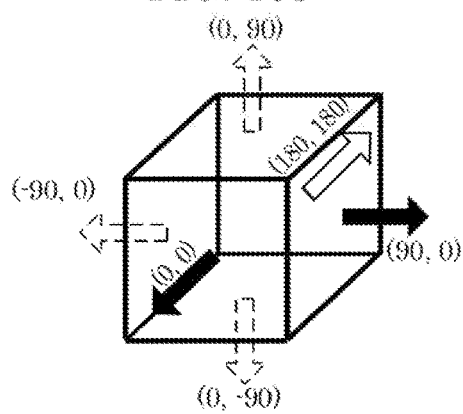
FIG. 103 is a diagram showing an example of normal vectors according to Embodiment 7.

FIG. 102 is a diagram showing a human face as an example object, which is an example of point cloud data. FIG. 103 is a diagram showing an example of normal vectors in this case. As shown in FIG. 103, normal vectors of the human face object shown in FIG. 102 are oriented in the (0, 0) direction and the (90, 0) direction. The three-dimensional data encoding device can indicate whether an object has a normal vector in a direction by using one bit for each direction.

As described above, there may be two or more normal vectors for one item of divisional data. In that case, a plurality of normal vectors may be indicated for one divisional data unit.

For example, in the example of data including a human face object shown in FIG. 102 and FIG. 103, the data has six normal vectors provided on a 90-degree basis, one normal vector for each face. In this example, two normal vectors in the (0, 0) direction and the (90, 0) direction are normal vectors for the divisional data.

In a method of indicating a normal vector, each of the six normal vectors may be represented by 1-bit information. FIG. 104 is a diagram showing an example of such normal vector information. The 1-bit information is set at a value of 1 when the divisional data has a corresponding normal vector, and is set at a value of 0 when the divisional data has no corresponding normal vector. In this way, compared with the method of indicating the values of x, y, and z as they are, the information amount can be reduced since the data is quantized.

Figure 108:
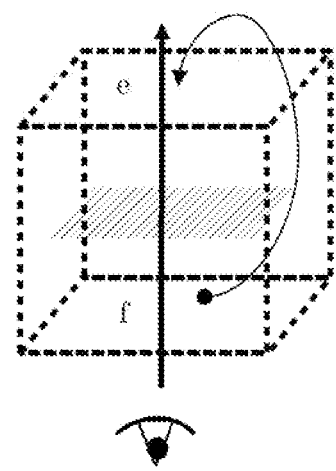
FIG. 108 is a diagram showing an example of faces of the cube according to Embodiment 7.

In the following, a simpler method of representing a normal vector will be described. A normal vector and the feasibility (visibility) thereof are represented with respect to a particular camera viewpoint using a cube having six faces. FIG. 105 to FIG. 108 are diagrams for illustrating this process. FIG. 105 shows an example of a cube having six faces. FIG. 106, FIG. 107, and FIG. 108 are a diagram showing front face a and rear face b, a diagram showing left face c and right face d, and a diagram showing top face e and bottom face f, respectively. Depending on the orientation of the object depending on the view angle, a normal vector may pass through at least one or three faces. Any of the six faces (a, b, c, d, e, and f) of the cube representing each system can be represented using six 1-bit flags. For example, (100000) is generated when the object is viewed from the front, (001000) is generated when the object is viewed from a side, and (000001) is generated when the object is viewed from the bottom. In this representation, magnitude is not significant, and only directions are represented. An object for which three faces are designated may occur. Face a is opposite to face b, face c is opposite to face d, and face e is opposite to face f. Therefore, face a and face b cannot be seen at the same time. That is, a normal vector can be represented using three flags (ace).

Figure 109:
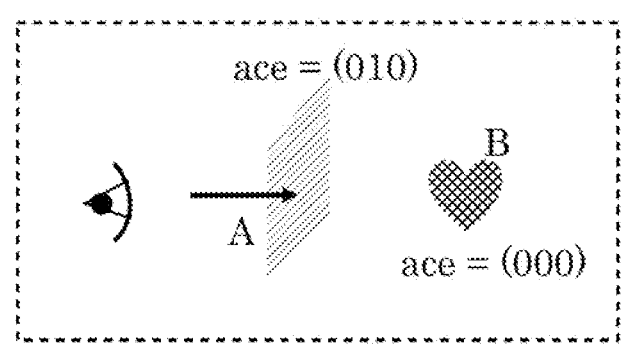
FIG. 109 is a diagram showing an example of the visibility of a slice according to Embodiment 7.

As described above, when the camera viewpoint (camera angle) is known in advance, information on a normal vector can be represented by three bits. FIG. 109 is a diagram showing the visibility at the time when objects of slice A and slice B are viewed from the direction of face c. Slice A is visible from the direction of face c, and therefore is represented by ace=(010). On the other hand, slice B is hidden behind slice A when viewed from the direction of face c, and therefore is represented by ace=(000).

Figures 110, 111, 112:
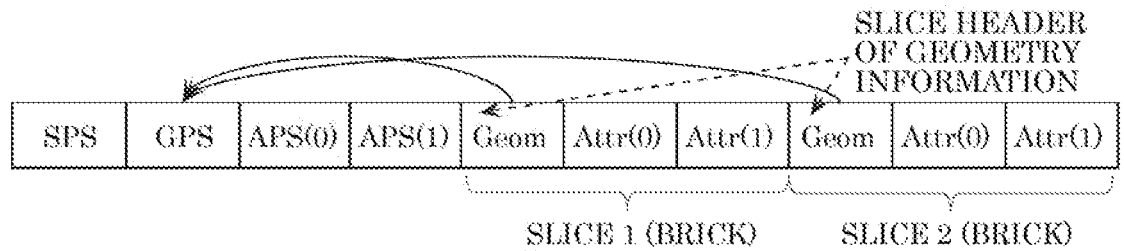
FIG. 110 is a diagram showing an example configuration of a bitstream according to Embodiment 7.
FIG. 111 is a diagram showing a syntax example of a slice header of geometry information according to Embodiment 7.
FIG. 112 is a diagram showing a syntax example of a slice header of geometry information according to Embodiment 7.

Next, a first method in which a normal vector is encoded and decoded for each brick will be described. FIG. 110 is a diagram showing an example configuration of a bitstream in this case. In the example shown in FIG. 110, information on a normal vector is stored in a slide header of geometry information on each slice. Note that the information on a normal vector may be stored in a header of attribute information or may be stored in metadata that is independent from the geometry information and the attribute information.

FIG. 111 is a diagram showing a syntax example of a slice header of geometry information (Geometry slice header information). The slice header of geometry information includes normal_vector_number, normal_vector_x, normal_vector_y, and normal_vector_z.

normal_vector_number indicates the number of normal vectors corresponding to slice data. normal_vector_x, normal_vector_y, and normal_vector_z represent elements (x, y, z) of a normal vector corresponding to slice data, respectively.

In this example, the number of elements normal_vector can be changed. As many elements normal_vector as indicated by normal_vector_number are shown.

Note that when the information on normal vectors is common to all slices, normal_vector_number may be stored in GPS or SPS that can store information common to a plurality of slices.

The values of x, y, and z of a normal vector may be quantized. For example, the three-dimensional data encoding device may quantize the original values of a normal vector by shifting the values by common bit amount s (bit), and transmit information that indicates bit amount s and information that indicates the quantized normal vector (normal_vector_x<<s, normal_vector_y<<s, and normal_vector_z<<z). In this way, the bit amount can be reduced.

FIG. 112 is a diagram showing another syntax example of a slice header of geometry information. In this example, a normal vector simplified (quantized) into six-face data is shown for each item of divisional data. Whether there is a normal vector or not is indicated for each face.

The slice header of geometry information includes is_normal_vector. is_normal_vector is set at 1 when there is a normal vector corresponding to the slice data, and is set at 0 when there is no normal vector corresponding to the slice data. For example, the order of the faces is predetermined.

Note that the precision of the quantization and the number or order of normal vectors are not limited to these. The precision of the quantization and the number or order of normal vectors may be fixed or variable.

Figure 113:
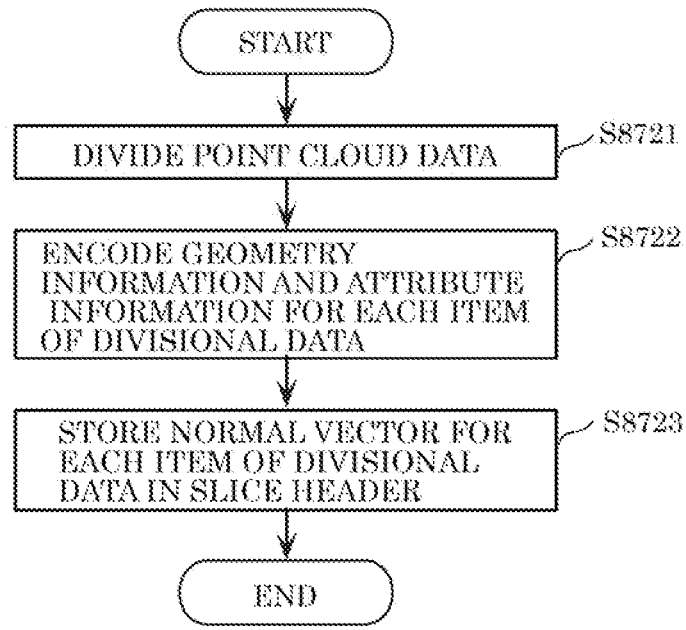
FIG. 113 is a flowchart of a three-dimensional data encoding process according to Embodiment 7.

FIG. 113 is a flowchart of a three-dimensional data encoding process. First, the three-dimensional data encoding device generates items of divisional data by dividing point cloud data (S8721). The three-dimensional data encoding device then encodes geometry information and attribute information for each item of divisional data (S8722). The three-dimensional data encoding device then stores a normal vector for each item of divisional data in a slice header (S8723).

Figure 114:
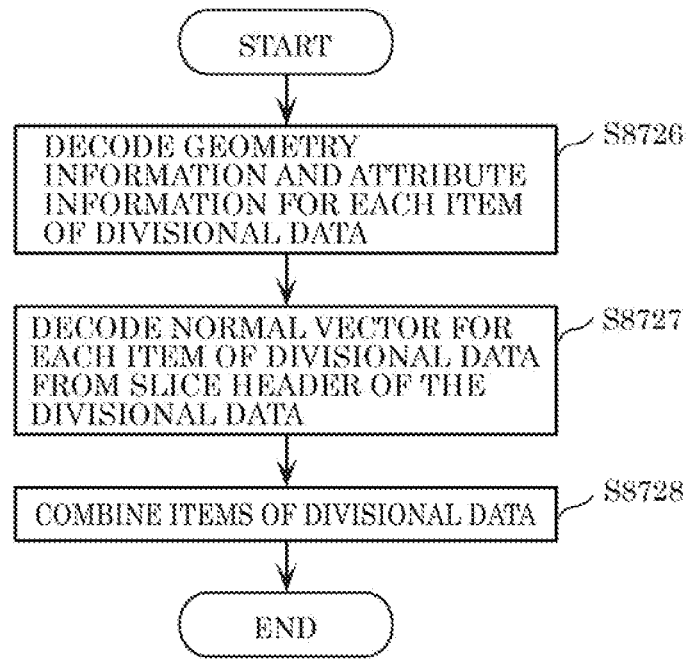
FIG. 114 is a flowchart of a three-dimensional data decoding process according to Embodiment 7.

FIG. 114 is a flowchart of a three-dimensional data decoding process. The three-dimensional data decoding device decodes geometry information and attribute information for each item of divisional data from a bitstream (S8726). The three-dimensional data decoding device then decodes a normal vector for each item of divisional data from a slice header of the divisional data (S8727). The three-dimensional data decoding device then integrates the items of divisional data (S8728).

Figure 115:
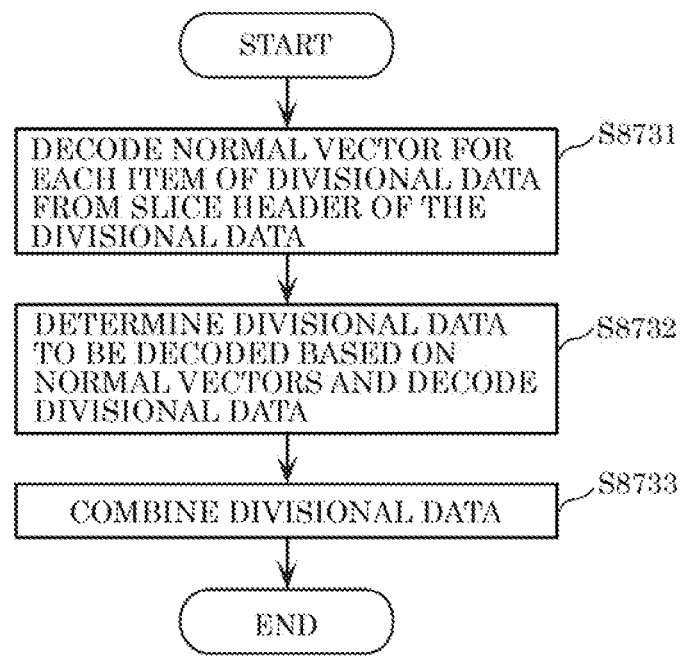
FIG. 115 is a flowchart of a three-dimensional data decoding process according to Embodiment 7.

FIG. 115 is a flowchart of a three-dimensional data decoding process in the case where data is partially decoded. First, the three-dimensional data decoding device decodes a normal vector for each item of divisional data from a slice header of the divisional data (S8731). The three-dimensional data decoding device then determines divisional data to be decoded based on the normal vectors, and decodes the determined divisional data (S8732). The three-dimensional data decoding device then integrates the items of decoded divisional data (S8733).

Figures 116, 117:
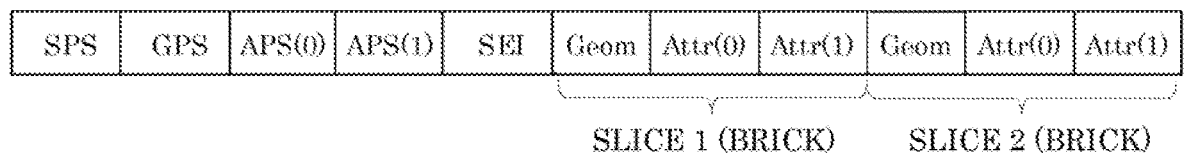
FIG. 116 is a diagram showing an example configuration of a bitstream according to Embodiment 7.
FIG. 117 is a diagram showing a syntax example of slice information according to Embodiment 7.

Next, a second example in which a normal vector is encoded and decoded for each brick will be described. Another method of encoding information on a normal vector is a method that uses metadata (such as SEI: supplemental enhancement information). FIG. 116 is a diagram showing an example configuration of a bitstream. SEI may be included in the bitstream as shown in FIG. 116, or may be generated as a file different from the main encoded bitstream depending on how SEI is implemented in both the encoding device and the decoding device.

FIG. 117 is a diagram showing a syntax example of slice information (slice_information) included in SEI. Slice information includes number_of_slice, bounding_box_origin_x, bounding_box_origin_y, boundingbox_origin_z, bounding_box_width, bounding_box_height, bounding_box_depth, normalVector_QP, number_of_normal_vector, normal_vector_x, normal_vector_y, and normal_vector_z.

number_of_slice indicates the number of items of divisional data. bounding_box_origin_x, bounding_box_origin_y, and bounding_box_origin_z indicate coordinates of the origin of a bounding box of slice data. bounding_box_width, bounding_box_height, and bounding_box_depth indicate the width, the height, and the depth of a bounding box of slice data, respectively.

normalVector_QP indicates scale information or bit shift information of the quantization when normal_vector is quantized. number_of_normal_vector indicates the number of normal vectors included in slice data. normal_vector_x, normal_vector_y, and normal_vector_z indicate elements or components (x, y, z) of a normal vector, respectively.

FIG. 118 is a diagram showing another example of slice information included in SEI. In the example shown in FIG. 118, a normal vector simplified (quantized) into six-face data is shown for each item of divisional data. Whether there is a normal vector or not is indicated for each face.

The slice information includes is_normal_vector. is_normal_vector is set at 1 when there is a normal vector corresponding to the slice data, and is set at 0 when there is no normal vector corresponding to the slice data. For example, the order of the faces is predetermined.

Note that the slice information may include a flag that indicates whether or not the slice information includes information (origin, width, height, and depth) on the bounding box of each slice. In that case, the slice information include information on the bounding box of each slice when the flag is on (such as 1), and does not include information on the bounding box of each slice when the flag is off (such as 0). The slice information may include a flag that indicates whether or not the slice information includes information on a normal vector of each slice. In that case, the slice information includes information on a normal vector of each slice when the flag is on (such as 1), and does not include information on a normal vector of each slice when the flag is off (such as 0).

Next, random access and partial decoding will be described. The three-dimensional data decoding device independently decode data of each slice by using one or both of information on the slice, such as bounding box information on and a normal vector of the slice.

Figure 119:
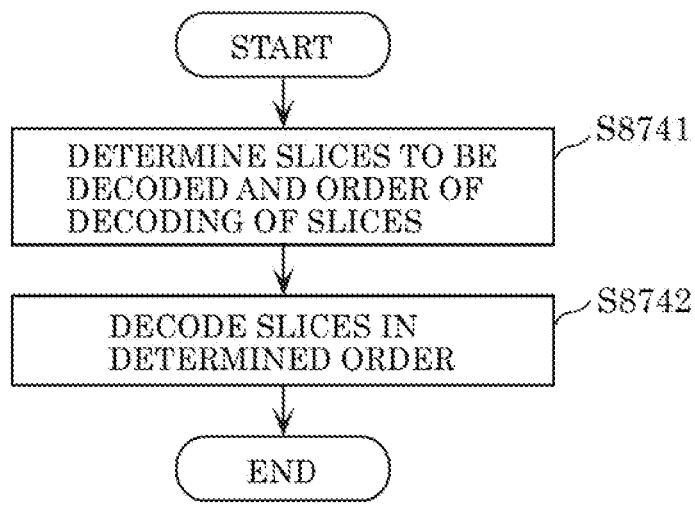

FIG. 119 is a flowchart of a three-dimensional data decoding process. First, the three-dimensional data decoding device determines the slices to be decoded and the decoding order of the slices in a predetermined manner (S8741). The three-dimensional data decoding device decodes particular slices in the determined order (S8742).

Figure 120:
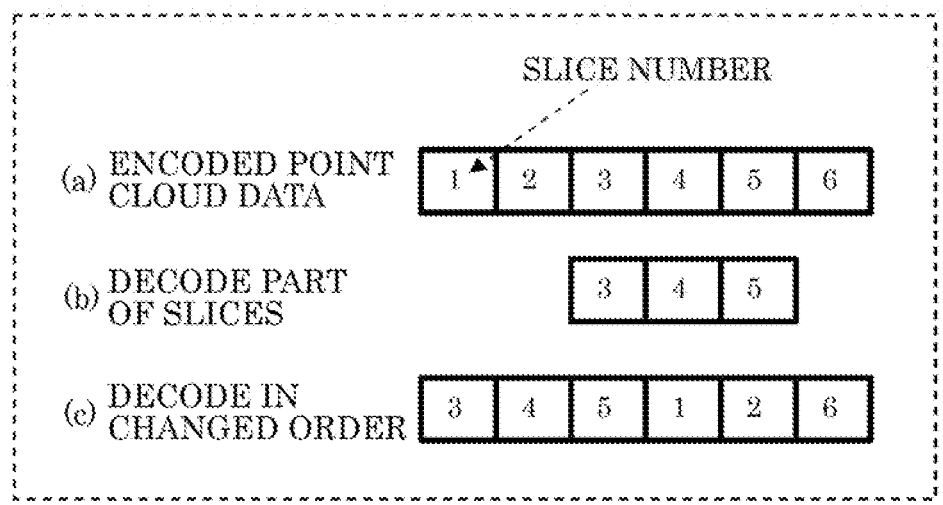

FIG. 120 is a diagram showing an example of this partial decoding process. For example, the three-dimensional data decoding device receives encoded data divided into slices shown in Part (a) of FIG. 120. As shown in Part (b) of FIG. 120, the three-dimensional data decoding device decodes encoded data of some slices and does not decode encoded data of the other slices. Alternatively, as shown in Part (c) of FIG. 120, the three-dimensional data decoding device decodes items of encoded data by changing the order of the items of encoded data.

Figure 121:
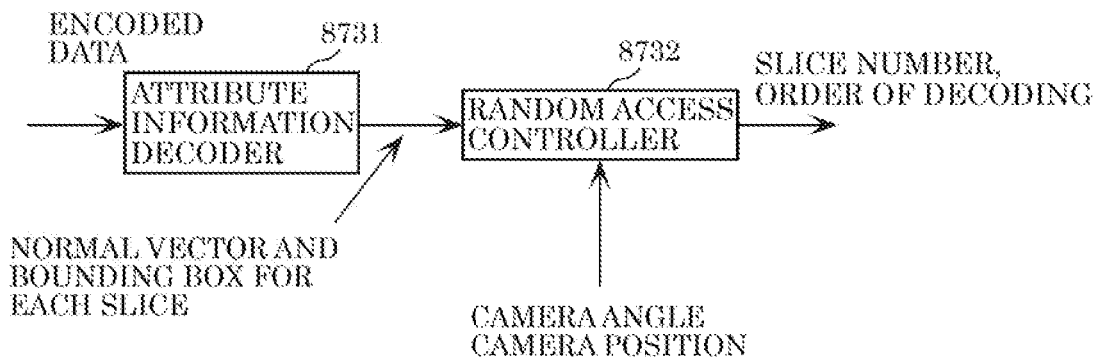

FIG. 121 is a diagram showing an example configuration of a three-dimensional data decoding device. As shown in FIG. 121, the three-dimensional data decoding device includes attribute information decoder 8731 and random access controller 8732. Attribute information decoder 8731 extracts bounding box information and a normal vector for each slice from encoded data. Random access controller 8732 determines the identification numbers and orders of slices to be decoded based on the bounding box information and the normal vector for each slice and sensor information obtained from the outside, such as camera angle (camera orientation) and camera position.

Figure 122:
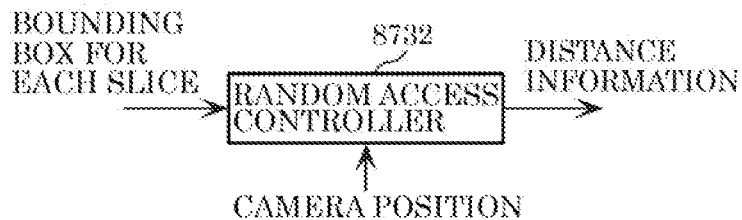
Figure 123:
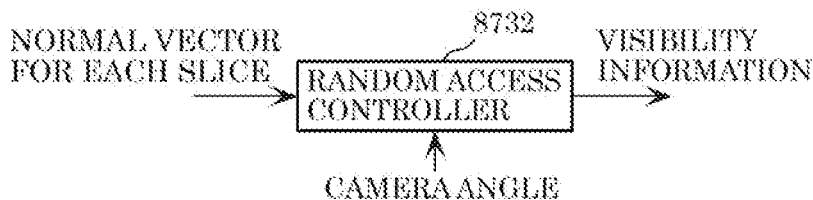

FIG. 122 and FIG. 123 are diagrams showing example processes performed by random access controller 8732. As shown in FIG. 122, for example, random access controller 8732 may calculate distance information that indicates the distance between each slice and the camera from the bounding box of the slice and the camera position. Alternatively, as shown in FIG. 123, random access controller 8732 may derive, for each slice, visibility information that indicates whether the object is visible from the camera or not from the normal vector of the slice and the camera angle. Note that random access controller 8732 may calculate one or both of the distance information and the visibility information.

Figure 124:
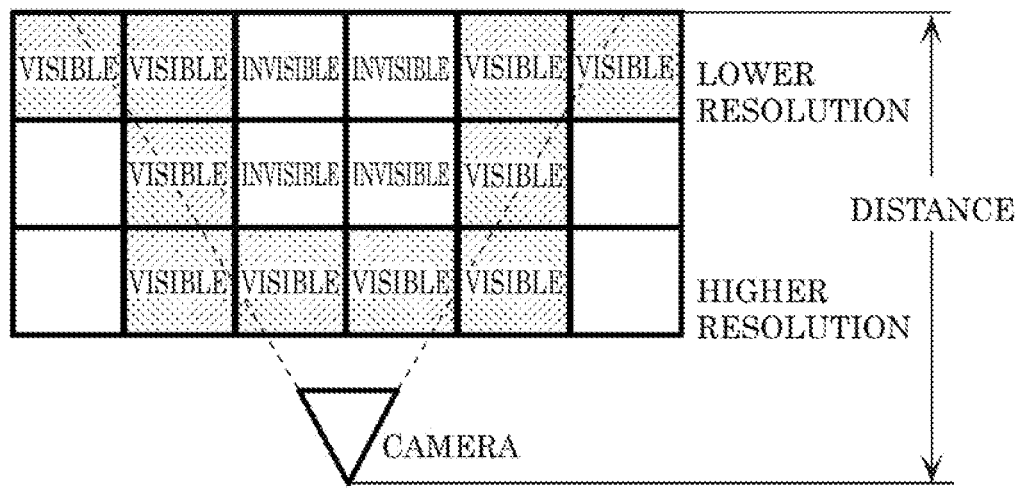

In the following, the visibility information and the distance information will be described. FIG. 124 is a diagram showing an example of a relationship between distance and resolution. For example, a thing that is visible from the camera is decoded (frustum culling). Furthermore, the resolution of the decoding depends on the distance between the virtual camera and the point cloud data.

That is, the three-dimensional data decoding device determines whether or not each slice is visible from the camera based on the normal vector of the slice and the camera viewpoint (camera angle), and decodes any slice that is visible from the camera. Furthermore, the three-dimensional data decoding device may calculate the distance between the slice to be decoded and the camera, and decode data of high resolution when the distance from the camera is short and decode data of low resolution when the distance from the camera is long.

Note that in this case, the encoded data is layered when the data is encoded, and the three-dimensional data decoding device can independently decode data of low resolution. When decoding data of high resolution, the three-dimensional data decoding device decode difference information between the data of low resolution and the data of high resolution, and generates the data of high resolution by adding the difference information to the data of low resolution. Note that when the encoded data is not layered when the data is encoded, the three-dimensional data decoding device need not perform this process, and may determine whether to perform this process or not based on whether the data is layered or not.

Figure 125:
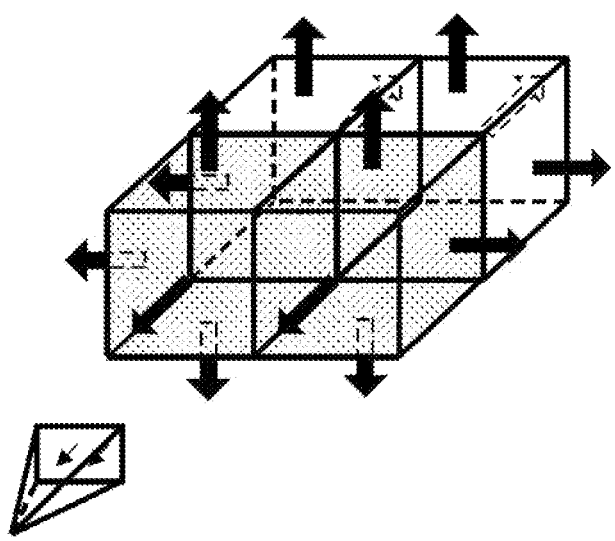

Next, the determination of the visibility based on the normal vector will be described. FIG. 125 is a diagram showing an example of bricks and normal vectors. In the example shown in FIG. 125, two bricks (such as slices) at the front facing the camera (frustum) or, in other words, the bricks having a normal vector extending toward the camera are decoded.

First, the three-dimensional data decoding device determines, for each item of slice data, whether or not one or more normal vectors included in the metadata include a normal vector extending in the opposite direction to the camera direction. If the slice data of the current slice includes a normal vector extending in the opposite direction to the camera direction, the three-dimensional data decoding device determines the current slice to be visible, and determines the current slice as a target of decoding.

Note that when there is another slice between the camera and the current slice, the three-dimensional data decoding device may determine the current slice to be invisible (that is, to be unable to be seen). The three-dimensional data decoding device may determine whether a slice is visible or not by determining whether the angle of the normal vector with respect to the camera direction falls within a predetermined angle range or not, rather than by determining whether the direction of the normal vector and the camera direction are exactly opposite to each other or not.

Next, a process using Level of Detail (LoD) will be described. In the following, an example of a decoding process for layers of different resolutions will be described.

Figure 126:
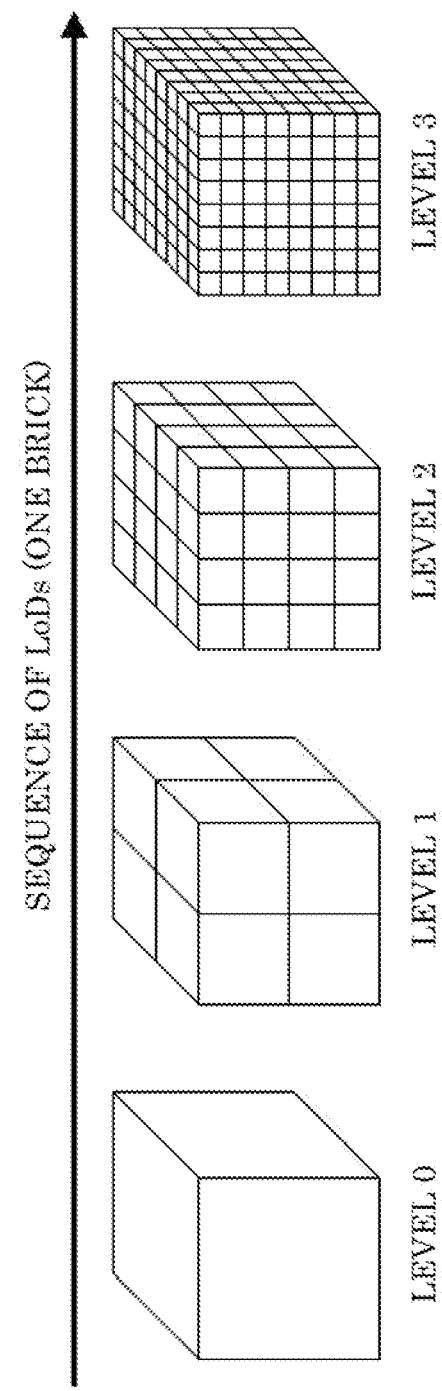
Figure 127:
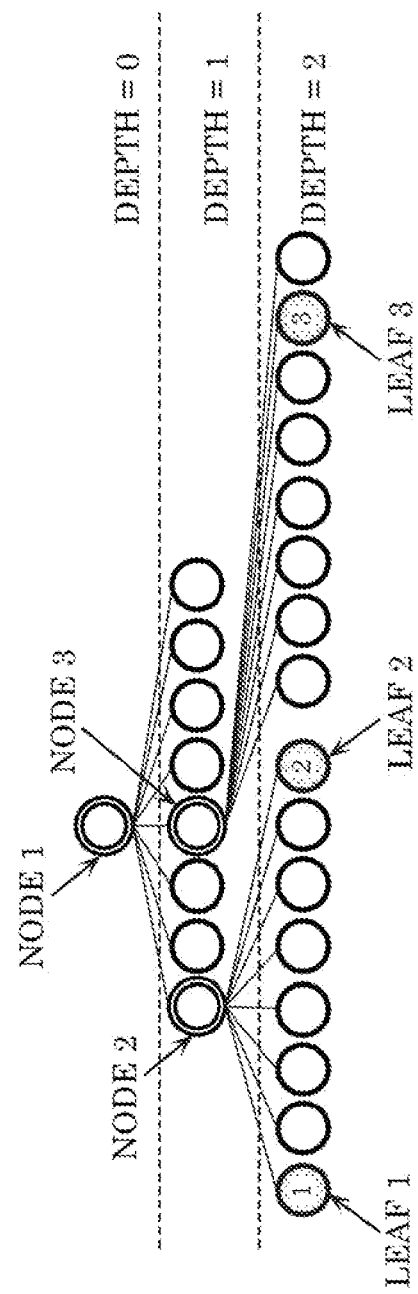

FIG. 126 is a diagram showing an example of levels (LoDs). FIG. 127 is a diagram showing an example of an octree structure. Each brick is divided into layers in order to control the levels of resolution to be decoded. For example, the level is the depth of division in the division into octrees. As shown in FIG. 126, the number of voxels (Voxels)

included in each level may be defined as $2^{(3 \times level)}$. Note that the level-based division method and the number of voxels may be defined in other manners.

By using LoD, the three-dimensional data decoding device can achieve a quick visibility determination and a quick distance calculation. The decoding time affects the real-time rendering. Using LoD allows display of an intermediate brick, so that real-time rendering and smooth interaction can be achieved.

Figure 128:
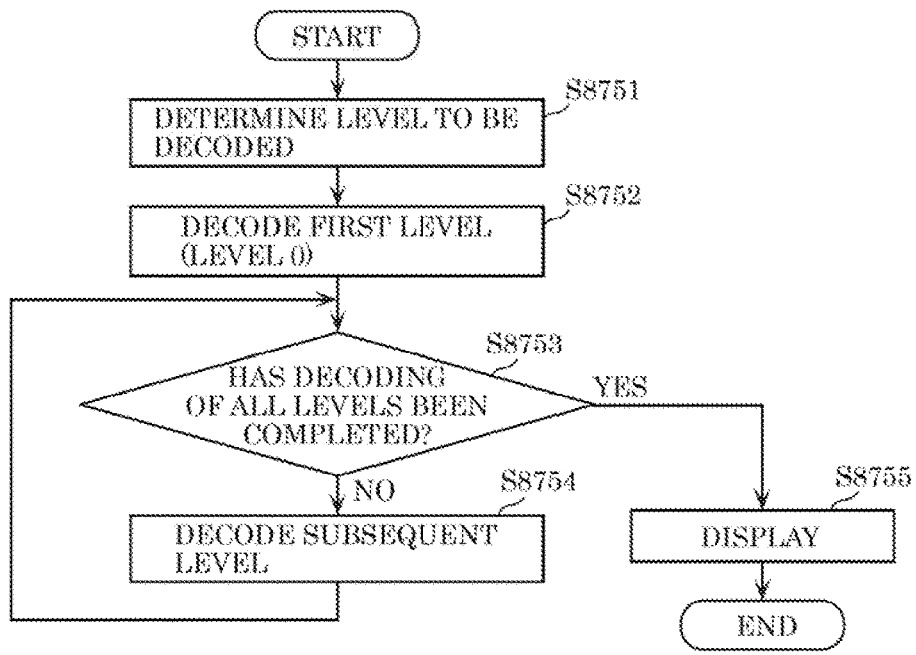

FIG. 128 is a flowchart of a three-dimensional data decoding process using LoD. First, the three-dimensional data decoding device determines a level to be decoded in accordance with the purpose (S8751). The three-dimensional data decoding device then decodes a first level (level 0) (S8752). The three-dimensional data decoding device then determines whether or not decoding of all levels to be decoded has been completed (S8753). When decoding of all levels has not been completed (if No in S8753), the three-dimensional data decoding device decodes the subsequent level (S8754). In this step, the three-dimensional data decoding device may decode the subsequent level using data of the previous level. When decoding of all levels to be decoded has been completed (if Yes in S8753), the three-dimensional data decoding device displays the decoded data (S8755).

As described above, the three-dimensional data decoding device decodes data up to the determined level, and does not decode data for the levels following the determined level. In this way, the processing amount involved with the decoding can be reduced, and the processing speed can be increased. In addition, the three-dimensional data decoding device displays data up to the determined level, and does not display data for the levels following the determined level. In this way, the processing amount involved with the display can be reduced, and the processing speed can be increased. Note that the three-dimensional data decoding device may determine the level to be decoded of the brick based on the distance between the brick and the camera or based on whether the brick is visible from the camera or not, for example.

Figure 129:
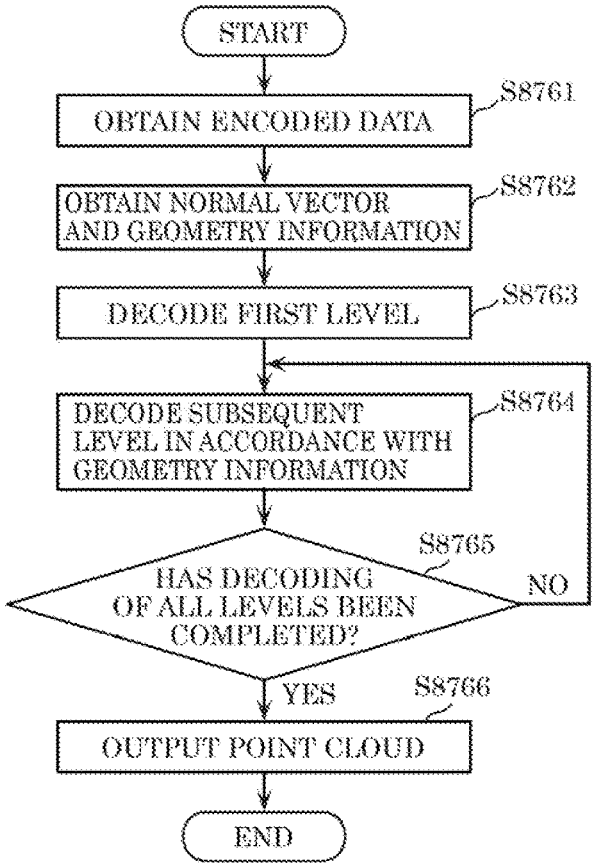

Next, an example implementation of the process using LoD will be described. FIG. 129 is a flowchart of a three-dimensional data decoding process. First, the three-dimensional data decoding device obtains encoded data (S8761). For example, the encoded data is point cloud data compressed by encoding in an arbitrary encoding method. The encoded data may be in the bitstream format or the file format.

The three-dimensional data decoding device then obtains, from the encoded data, a normal vector of and geometry information on a brick to be processed (S8762). For example, the three-dimensional data decoding device obtains a normal vector for each brick and geometry information on the brick from metadata (SEI or data header) included in the encoded data. Note that the three-dimensional data decoding device may determine the distance between the brick and the camera based on the geometry information on the brick and information on the camera position. The three-dimensional data decoding device may determine the visibility of the brick (whether the brick is oriented in the direction of the camera or not) based on the normal vector and the camera direction.

Figure 130:
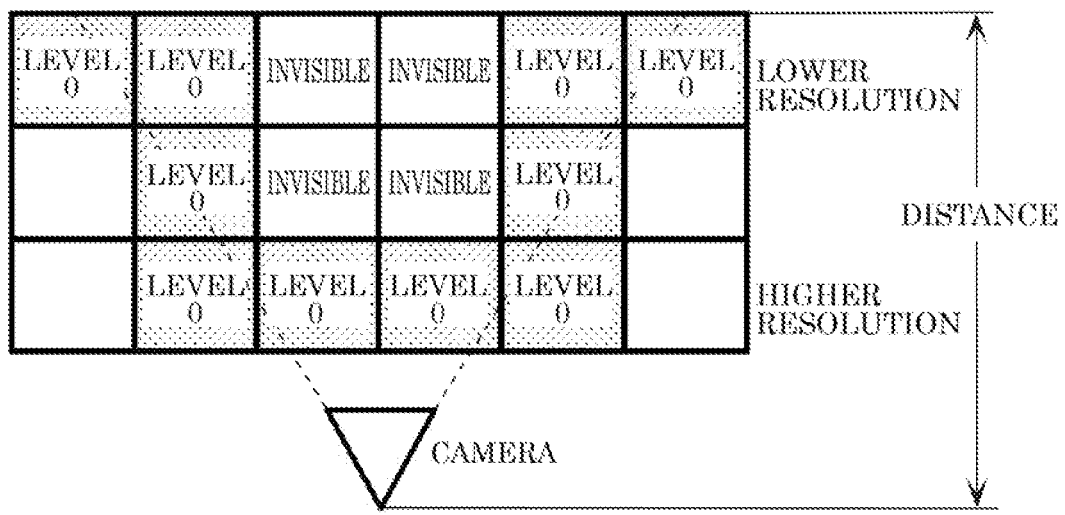

The three-dimensional data decoding device then determines which brick is to be decoded, and decodes a first level (level 0) of the determined brick (S8763). FIG. 130 is a diagram showing an example of a brick to be decoded. As shown in FIG. 130, the three-dimensional data decoding device decodes all visible bricks with a resolution of level 0.

The three-dimensional data decoding device then determines whether to decode the subsequent level of each brick or not based on the geometry information, and decodes the subsequent level of the brick determined to be decoded (S8764). This process is repeated until the decoding processing of all levels is completed (S8765). Specifically, the resolution of bricks closer to the position of the virtual camera is set to be higher. For example, in accordance with the resource of the memory or the like, levels to be decoded are gradually added by giving priority to bricks closer to the camera.

FIG. 131 is a diagram showing an example of levels to be decoded of each brick. As shown in FIG. 131, the three-dimensional data decoding device decodes bricks closer to the camera with higher resolutions and decodes bricks farther from the camera with lower resolutions, in accordance with the distance from the camera. The three-dimensional data decoding device does not decode any invisible brick.

When decoding of all levels has been completed (if Yes in S8765), the three-dimensional data decoding device outputs the obtained three-dimensional point cloud (S8766).

A method has been described above in which the three-dimensional data encoding device calculates and encodes a normal vector and bounding box information for each item of slice data, and the three-dimensional data decoding device calculates visibility and distance information based on the information and sensor input information to determine the slice to be decoded. In the following, an example will be described in which the three-dimensional data encoding device calculates and encodes visibility and distance information for the camera direction for data of each slice in advance.

FIG. 132 is a diagram showing a syntax example of a slice header of geometry information (Geometry slice header information). The slice header of geometry information includes number_of_angle, view_angle, and visibility.

number_of_angle indicates the number of camera angles (camera directions). view_angle indicates the camera angle, such as the vector of a camera angle. visibility indicates whether a slice is visible from the relevant camera angle or not. Note that the number of elements view_angle may be variable or a predetermined fixed value. When the number of elements view_angle and the value of view_angle are predetermined, view_angle may be omitted.

Although an example in which visibility for the camera angle is indicated has been shown here, in another example, the three-dimensional data encoding device may calculate visibility for the camera position or a camera parameter in advance, and store the calculated visibility in the encoded data.

FIG. 133 is a flowchart of a three-dimensional data encoding process. First, the three-dimensional data encoding device divides point cloud data into items of divisional data (such as slices) (S8771). The three-dimensional data encoding device then encodes geometry information and attribute information on a basis of the divisional data (S8772). The three-dimensional data encoding device stores visibility information (visibility) for the camera angle in metadata for each item of divisional data (S8773).

FIG. 134 is a flowchart of a three-dimensional data decoding process. First, the three-dimensional data decoding device obtains visibility information for the camera angle from metadata of each item of divisional data (S8776). The three-dimensional data decoding device then determines, based on the visibility information, divisional data that is visible from a desired camera angle, and decodes the divisional data that is visible (S8777).

FIG. 135 and FIG. 136 are diagrams showing examples of point cloud data. In these drawings, a, c, d, and e each denote a plane. Therefore, the three-dimensional data encoding device can perform the slice division by taking advantage of the fact that the three-dimensional points of each slice have normal vectors extending in the same direction. The same approach can be applied to the tile division.

FIG. 137 to FIG. 140 are diagrams showing example configurations of a system including a three-dimensional data encoding device, a three-dimensional data decoding device, and a display device.

In the example shown in FIG. 137, the three-dimensional data encoding device generates encoded data by encoding slice data, and a normal vector and bounding box information for each slice. The three-dimensional data decoding device identifies data to be decoded based on the encoded data and sensor information, and generates decoded slice data by decoding the identified data. The display device displays the decoded slice data. With this configuration, the three-dimensional data decoding device can flexibly determine camera viewpoint information and whether to perform decoding or not.

In the example shown in FIG. 138, the three-dimensional data encoding device generates encoded data by encoding slice data, and a normal vector and bounding box information for each slice. The three-dimensional data decoding device determines data to be decoded and the order of decoding based on the encoded data and sensor information, and decodes the determined data in the determined order. With this configuration, the three-dimensional data decoding device can first decode data (3, 4, and 5, for example) that need to be displayed first, and therefore, the ease of viewing of the display can be improved.

In the example shown in FIG. 139, the three-dimensional data encoding device generates encoded data by encoding slice data, and visibility information for each camera angle. The three-dimensional data decoding device identifies data to be decoded based on the encoded data information and sensor information, and decodes the identified data. Note that the three-dimensional data decoding device may further determine the order of decoding. With this configuration, the three-dimensional data decoding device need not calculate visibility information, so that the processing amount of the three-dimensional data decoding device can be reduced.

In the example shown in FIG. 140, the three-dimensional data decoding device notifies the three-dimensional data encoding device of the camera angle, the camera position or the like of the three-dimensional data decoding device by communication or the like. The three-dimensional data encoding device calculates visibility information for each slice, determines data to be encoded and the order of encoding, and generates encoded data by encoding the determined data in the determined order. The three-dimensional data decoding device directly decodes the received slice data. With this configuration that allow interactions, required parts are encoded and decoded, so that the processing amount and the communication band can be reduced.

Note that when the camera position or the camera angle varies, the three-dimensional data decoding device may determine the slice to be decoded again when the variation exceeds a predetermined value. In that case, quick decoding and display can be achieved if differential data excluding the data already decoded is decoded.

In the following, a method of storing encoded data in a file format, such as ISOBMFF, will be described. FIG. 141 is a diagram showing an example configuration of a bitstream. FIG. 142 is a diagram showing an example configuration of a three-dimensional data encoding device. The three-dimensional data encoding device includes encoder 8741 and file transformer 8742. Encoder 8741 generates a bitstream including encoded data and control information by encoding point cloud data. File transformer 8742 transforms the bitstream into a file format.

FIG. 143 is a diagram showing an example configuration of a three-dimensional data decoding device. The three-dimensional data decoding device includes file inverse transformer 8751 and decoder 8752. File inverse transformer 8751 transforms a file format into a bitstream including encoded data and control information. Decoder 8752 generates point cloud data by decoding the bitstream.

FIG. 144 is a diagram showing a basic structure of ISOBMFF. FIG. 145 is a diagram showing a protocol stack in a case where a common PCC codec NAL unit is stored in ISOBMFF. Here, what is stored in ISOBMFF is a PCC codec NAL unit.

NAL units include NAL units for data and NAL units for metadata. NAL units for data include geometry information slice data (Geometry Slice Data) and attribute information slice data (Attribute Slice Data). NAL units for metadata include SPS, GPS, APS, and SEI, for example.

ISO based media file format (ISOBMFF) is a file format standard prescribed in ISO/IEC14496-12. ISOBMFF is a standard that does not depend on any medium, and prescribes a format that allows various media, such as a video, an audio, and a text, to be multiplexed and stored.

A basic unit of ISOBMFF is a box. A box is formed by type, length, and data, and a file is a set of various types of boxes. A file mainly includes boxes, such as ftyp that indicates the brand of the file by 4CC, moov that stores metadata, such as control information, and mdat that stores data.

A method for storing each medium in ISOBMFF is separately prescribed. For example, a method of storing an AVC video or an HEVC video is prescribed in ISO/IEC14496-15. Here, it can be contemplated to expand the functionality of ISOBMFF and use ISOBMFF to accumulate or transmit PCC-encoded data.

When storing a NAL unit for metadata in ISOBMFF, SEI may be stored in "mdat box" along with PCC data, or may be stored in "track box" that describes control information concerning the stream. When packetizing and transmitting data, SEI may be stored in the packet header. By indicating SEI in a system layer, attribute information, tiles and slice data can be more easily accessed, and the access speed is improved.

Next, a method of generating a PCC random access table will be described. The three-dimensional data encoding device generates a random access table using metadata including bounding box information and normal vector information for each slice. FIG. 146 is a diagram showing an example of a transform of a bitstream into a file format.

The three-dimensional data encoding device stores each item of slice data in mdat of the file format. The three-dimensional data encoding device calculates a memory location of the slice data as offset information (offsets 1 to 4 in FIG. 146) on the beginning of the file, and includes the calculated offset information in the random access table (PCC random access table).

FIG. 147 is a diagram showing a syntax example of slice information (slice_information). FIG. 148 to FIG. 150 are diagrams showing syntax examples of a PCC random access table.

The PCC random access table includes bounding box information (bounding_box_info), normal vector information (normal_vector_info), and offset information (offset) stored in slice information (slice_information).

The three-dimensional data decoding device analyzes the PCC random access table, and identifies a slice to be decoded. The three-dimensional data decoding device can access desired data by obtaining the offset information from the PCC random access table.

As described above, the three-dimensional data encoding device according to this embodiment performs the process shown in FIG. 151. The three-dimensional data encoding device generates a bitstream by encoding geometry information and one or more items of attribute information on each of a plurality of three-dimensional points included in point cloud data (S8781). In the encoding (S8781), the three-dimensional data encoding device encodes a normal vector of each of the plurality of three-dimensional points as an item of attribute information included in the one or more items of attribute information.

With this configuration, the three-dimensional data encoding device encodes a normal vector as attribute information, and therefore can process the normal vector in the same manner as other attribute information. Therefore, the three-dimensional data encoding device can reduce the processing amount. That is, the three-dimensional data encoding device can encode a normal vector as attribute information without changing the definition or the like of the attribute information.

For example, in the encoding (S8781), the three-dimensional data encoding device encodes a normal vector represented by a floating-point number after transforming the normal vector into an integer. Therefore, the three-dimensional data encoding device can process the normal vector in the same manner as other attribute information when other attribute information is represented by an integer, for example.

For example, the bitstream includes control information (such as SPS) common to geometry information and one or more items of attribute information, and the control information (such as SPS) includes at least one of information (such as attribute_type=Normal Vector) that indicates that an item of attribute information included in the one or more items of attribute information is a normal vector and information that indicates that a normal vector is data having three elements for one point.

For example, the three-dimensional data encoding device includes a processor and a memory, and the processor performs the process described above using the memory.

The three-dimensional data decoding device according to this embodiment performs the process shown in FIG. 152. The three-dimensional data decoding device obtains a bitstream generated by encoding geometry information and one or more items of attribute information on each of a plurality of three-dimensional points included in point cloud data, a normal vector of each of the plurality of three-dimensional points being encoded in the bitstream as an item of attribute information included in the one or more items of attribute information (S8786), and obtains a normal vector by decoding an item of attribute information from the bitstream (S8787).

With this configuration, the three-dimensional data decoding device decodes a normal vector as attribute information, and therefore can process the normal vector in the same manner as other attribute information. Therefore, the three-dimensional data decoding device can reduce the processing amount.

For example, in the obtaining of a normal vector (S8787), the three-dimensional data decoding device obtains a normal vector represented by an integer. Therefore, the three-dimensional data decoding device can process the normal vector in the same manner as other attribute information when other attribute information is represented by an integer, for example.

For example, the bitstream includes control information (such as SPS) common to geometry information and one or more items of attribute information, and the control information (such as SPS) includes at least one of information (such as attribute_type=Normal Vector) that indicates that an item of attribute information included in the one or more items of attribute information is a normal vector and information that indicates that a normal vector is data having three elements for one point.

For example, the three-dimensional data decoding device includes a processor and a memory, and the processor performs the process described above using the memory.

The three-dimensional data encoding device according to this embodiment performs the process shown in FIG. 153. The three-dimensional data encoding device divides point cloud data into items of divisional data (such as bricks, slices, or tiles) (S8791), and generates a bitstream by encoding the items of divisional data (S8792). The bitstream includes information that indicates a normal vector for each of the items of divisional data.

By encoding a normal vector for each item of divisional data in this way, the three-dimensional data encoding device can reduce the processing amount and the code amount compared with the case where a normal vector is encoded for each point. For example, each of the items of divisional data is a unit of random access.

For example, the three-dimensional data encoding device includes a processor and a memory, and the processor performs the process described above using the memory.

The three-dimensional data decoding device according to this embodiment performs the process shown in FIG. 154. The three-dimensional data decoding device obtains a bitstream generated by encoding items of divisional data (such as bricks, slices, or tiles) generated by dividing point cloud data (S8796), and obtains, from the bitstream, information that indicates a normal vector for each of the items of divisional data (S8797).

By decoding a normal vector for each item of divisional data in this way, the three-dimensional data decoding device can reduce the processing amount compared with the case where a normal vector is decoded for each point. For example, each of the items of divisional data is a unit of random access.

For example, the three-dimensional data decoding device further determines divisional data to be decoded among the items of divisional data based on the normal vectors, and decodes the divisional data to be decoded.

For example, the three-dimensional data decoding device further determines the order of decoding of the items of divisional data based on the normal vectors, and decodes the items of divisional data in the determined order.

For example, the three-dimensional data decoding device includes a processor and a memory, and the processor performs the process described above using the memory.

Embodiment 8

The following describes the structure of three-dimensional data creation device 810 according to the present embodiment. FIG. 155 is a block diagram of an exemplary structure of three-dimensional data creation device 810 according to the present embodiment. Such three-dimensional data creation device 810 is equipped, for example, in a vehicle. Three-dimensional data creation device 810 transmits and receives three-dimensional data to and from an external cloud-based traffic monitoring system, a preceding vehicle, or a following vehicle, and creates and stores three-dimensional data.

Three-dimensional data creation device 810 includes data receiver 811, communication unit 812, reception controller 813, format converter 814, a plurality of sensors 815, three-dimensional data creator 816, three-dimensional data synthesizer 817, three-dimensional data storage 818, communication unit 819, transmission controller 820, format converter 821, and data transmitter 822.

Data receiver 811 receives three-dimensional data 831 from a cloud-based traffic monitoring system or a preceding vehicle. Three-dimensional data 831 includes, for example, information on a region undetectable by sensors 815 of the own vehicle, such as a point cloud, visible light video, depth information, sensor position information, and speed information.

Communication unit 812 communicates with the cloud-based traffic monitoring system or the preceding vehicle to transmit a data transmission request, etc. to the cloud-based traffic monitoring system or the preceding vehicle.

Reception controller 813 exchanges information, such as information on supported formats, with a communications partner via communication unit 812 to establish communication with the communications partner.

Format converter 814 applies format conversion, etc. on three-dimensional data 831 received by data receiver 811 to generate three-dimensional data 832. Format converter 814 also decompresses or decodes three-dimensional data 831 when three-dimensional data 831 is compressed or encoded.

A plurality of sensors 815 are a group of sensors, such as visible light cameras and infrared cameras, that obtain information on the outside of the vehicle and generate sensor information 833. Sensor information 833 is, for example, three-dimensional data such as a point cloud (point group data), when sensors 815 are laser sensors such as LiDARs. Note that a single sensor may serve as a plurality of sensors 815.

Three-dimensional data creator 816 generates three-dimensional data 834 from sensor information 833. Three-dimensional data 834 includes, for example, information such as a point cloud, visible light video, depth information, sensor position information, and speed information.

Three-dimensional data synthesizer 817 synthesizes three-dimensional data 834 created on the basis of sensor information 833 of the own vehicle with three-dimensional data 832 created by the cloud-based traffic monitoring system or the preceding vehicle, etc., thereby forming three-dimensional data 835 of a space that includes the space ahead of the preceding vehicle undetectable by sensors 815 of the own vehicle.

Three-dimensional data storage 818 stores generated three-dimensional data 835, etc.

Communication unit 819 communicates with the cloud-based traffic monitoring system or the following vehicle to transmit a data transmission request, etc. to the cloud-based traffic monitoring system or the following vehicle.

Transmission controller 820 exchanges information such as information on supported formats with a communications partner via communication unit 819 to establish communication with the communications partner. Transmission controller 820 also determines a transmission region, which is a space of the three-dimensional data to be transmitted, on the basis of three-dimensional data formation information on three-dimensional data 832 generated by three-dimensional data synthesizer 817 and the data transmission request from the communications partner.

More specifically, transmission controller 820 determines a transmission region that includes the space ahead of the own vehicle undetectable by a sensor of the following vehicle, in response to the data transmission request from the cloud-based traffic monitoring system or the following vehicle. Transmission controller 820 judges, for example, whether a space is transmittable or whether the already transmitted space includes an update, on the basis of the three-dimensional data formation information to determine a transmission region. For example, transmission controller 820 determines, as a transmission region, a region that is: a region specified by the data transmission request; and a region, corresponding three-dimensional data 835 of which is present. Transmission controller 820 then notifies format converter 821 of the format supported by the communications partner and the transmission region.

Of three-dimensional data 835 stored in three-dimensional data storage 818, format converter 821 converts three-dimensional data 836 of the transmission region into the format supported by the receiver end to generate three-dimensional data 837. Note that format converter 821 may compress or encode three-dimensional data 837 to reduce the data amount.

Data transmitter 822 transmits three-dimensional data 837 to the cloud-based traffic monitoring system or the following vehicle. Such three-dimensional data 837 includes, for example, information on a blind spot, which is a region hidden from view of the following vehicle, such as a point cloud ahead of the own vehicle, visible light video, depth information, and sensor position information.

Note that an example has been described in which format converter 814 and format converter 821 perform format conversion, etc., but format conversion may not be performed.

With the above structure, three-dimensional data creation device 810 obtains, from an external device, three-dimensional data 831 of a region undetectable by sensors 815 of the own vehicle, and synthesizes three-dimensional data 831 with three-dimensional data 834 that is based on sensor information 833 detected by sensors 815 of the own vehicle, thereby generating three-dimensional data 835. Three-dimensional data creation device 810 is thus capable of generating three-dimensional data of a range undetectable by sensors 815 of the own vehicle.

Three-dimensional data creation device 810 is also capable of transmitting, to the cloud-based traffic monitoring system or the following vehicle, etc., three-dimensional data of a space that includes the space ahead of the own vehicle undetectable by a sensor of the following vehicle, in response to the data transmission request from the cloud-based traffic monitoring system or the following vehicle.

The following describes the steps performed by three-dimensional data creation device 810 of transmitting three-dimensional data to a following vehicle. FIG. 156 is a flowchart showing exemplary steps performed by three-dimensional data creation device 810 of transmitting three-dimensional data to a cloud-based traffic monitoring system or a following vehicle.

First, three-dimensional data creation device 810 generates and updates three-dimensional data 835 of a space that includes space on the road ahead of the own vehicle (S801). More specifically, three-dimensional data creation device 810 synthesizes three-dimensional data 834 created on the basis of sensor information 833 of the own vehicle with three-dimensional data 831 created by the cloud-based traffic monitoring system or the preceding vehicle, etc., for example, thereby forming three-dimensional data 835 of a space that also includes the space ahead of the preceding vehicle undetectable by sensors 815 of the own vehicle.

Three-dimensional data creation device 810 then judges whether any change has occurred in three-dimensional data 835 of the space included in the space already transmitted (S802).

When a change has occurred in three-dimensional data 835 of the space included in the space already transmitted due to, for example, a vehicle or a person entering such space from outside (Yes in S802), three-dimensional data creation device 810 transmits, to the cloud-based traffic monitoring system or the following vehicle, the three-dimensional data that includes three-dimensional data 835 of the space in which the change has occurred (S803).

Three-dimensional data creation device 810 may transmit three-dimensional data in which a change has occurred, at the same timing of transmitting three-dimensional data that is transmitted at a predetermined time interval, or may transmit three-dimensional data in which a change has occurred soon after the detection of such change. Stated differently, three-dimensional data creation device 810 may prioritize the transmission of three-dimensional data of the space in which a change has occurred to the transmission of three-dimensional data that is transmitted at a predetermined time interval.

Also, three-dimensional data creation device 810 may transmit, as three-dimensional data of a space in which a change has occurred, the whole three-dimensional data of the space in which such change has occurred, or may transmit only a difference in the three-dimensional data (e.g., information on three-dimensional points that have appeared or vanished, or information on the displacement of three-dimensional points).

Three-dimensional data creation device 810 may also transmit, to the following vehicle, meta-data on a risk avoidance behavior of the own vehicle such as hard breaking warning, before transmitting three-dimensional data of the space in which a change has occurred. This enables the following vehicle to recognize at an early stage that the preceding vehicle is to perform hard braking, etc., and thus to start performing a risk avoidance behavior at an early stage such as speed reduction.

When no change has occurred in three-dimensional data 835 of the space included in the space already transmitted (No in S802), or after step S803, three-dimensional data creation device 810 transmits, to the cloud-based traffic monitoring system or the following vehicle, three-dimensional data of the space included in the space having a predetermined shape and located ahead of the own vehicle by distance L (S804).

The processes of step S801 through step S804 are repeated, for example at a predetermined time interval.

When three-dimensional data 835 of the current space to be transmitted includes no difference from the three-dimensional map, three-dimensional data creation device 810 may not transmit three-dimensional data 837 of the space.

In the present embodiment, a client device transmits sensor information obtained through a sensor to a server or another client device.

A structure of a system according to the present embodiment will first be described. FIG. 157 is a diagram showing the structure of a transmission/reception system of a three-dimensional map and sensor information according to the present embodiment. This system includes server 901, and client devices 902A and 902B. Note that client devices 902A and 902B are also referred to as client device 902 when no particular distinction is made therebetween.

Client device 902 is, for example, a vehicle-mounted device equipped in a mobile object such as a vehicle. Server 901 is, for example, a cloud-based traffic monitoring system, and is capable of communicating with the plurality of client devices 902.

Server 901 transmits the three-dimensional map formed by a point cloud to client device 902. Note that a structure of the three-dimensional map is not limited to a point cloud, and may also be another structure expressing three-dimensional data such as a mesh structure.

Client device 902 transmits the sensor information obtained by client device 902 to server 901. The sensor information includes, for example, at least one of information obtained by LiDAR, a visible light image, an infrared image, a depth image, sensor position information, or sensor speed information.

The data to be transmitted and received between server 901 and client device 902 may be compressed in order to reduce data volume, and may also be transmitted uncompressed in order to maintain data precision. When compressing the data, it is possible to use a three-dimensional compression method on the point cloud based on, for example, an octree structure. It is possible to use a two-dimensional image compression method on the visible light image, the infrared image, and the depth image. The two-dimensional image compression method is, for example, MPEG-4 AVC or HEVC standardized by MPEG.

Server 901 transmits the three-dimensional map managed by server 901 to client device 902 in response to a transmission request for the three-dimensional map from client device 902. Note that server 901 may also transmit the three-dimensional map without waiting for the transmission request for the three-dimensional map from client device 902. For example, server 901 may broadcast the three-dimensional map to at least one client device 902 located in a predetermined space. Server 901 may also transmit the three-dimensional map suited to a position of client device 902 at fixed time intervals to client device 902 that has received the transmission request once. Server 901 may also transmit the three-dimensional map managed by server 901 to client device 902 every time the three-dimensional map is updated.

Client device 902 sends the transmission request for the three-dimensional map to server 901. For example, when client device 902 wants to perform the self-location estimation during traveling, client device 902 transmits the transmission request for the three-dimensional map to server 901.

Note that in the following cases, client device 902 may send the transmission request for the three-dimensional map to server 901. Client device 902 may send the transmission request for the three-dimensional map to server 901 when the three-dimensional map stored by client device 902 is old. For example, client device 902 may send the transmission request for the three-dimensional map to server 901 when a fixed period has passed since the three-dimensional map is obtained by client device 902.

Client device 902 may also send the transmission request for the three-dimensional map to server 901 before a fixed time when client device 902 exits a space shown in the three-dimensional map stored by client device 902. For example, client device 902 may send the transmission request for the three-dimensional map to server 901 when client device 902 is located within a predetermined distance from a boundary of the space shown in the three-dimensional map stored by client device 902. When a movement path and a movement speed of client device 902 are understood, a time when client device 902 exits the space shown in the three-dimensional map stored by client device 902 may be predicted based on the movement path and the movement speed of client device 902.

Client device 902 may also send the transmission request for the three-dimensional map to server 901 when an error during alignment of the three-dimensional data and the three-dimensional map created from the sensor information by client device 902 is at least at a fixed level.

Client device 902 transmits the sensor information to server 901 in response to a transmission request for the sensor information from server 901. Note that client device 902 may transmit the sensor information to server 901 without waiting for the transmission request for the sensor information from server 901. For example, client device 902 may periodically transmit the sensor information during a fixed period when client device 902 has received the transmission request for the sensor information from server 901 once. Client device 902 may determine that there is a possibility of a change in the three-dimensional map of a surrounding area of client device 902 having occurred, and transmit this information and the sensor information to server 901, when the error during alignment of the three-dimensional data created by client device 902 based on the sensor information and the three-dimensional map obtained from server 901 is at least at the fixed level.

Server 901 sends a transmission request for the sensor information to client device 902. For example, server 901 receives position information, such as GPS information, about client device 902 from client device 902. Server 901 sends the transmission request for the sensor information to client device 902 in order to generate a new three-dimensional map, when it is determined that client device 902 is approaching a space in which the three-dimensional map managed by server 901 contains little information, based on the position information about client device 902. Server 901 may also send the transmission request for the sensor information, when wanting to (i) update the three-dimensional map, (ii) check road conditions during snowfall, a disaster, or the like, or (iii) check traffic congestion conditions, accident/incident conditions, or the like.

Client device 902 may set an amount of data of the sensor information to be transmitted to server 901 in accordance with communication conditions or bandwidth during reception of the transmission request for the sensor information to be received from server 901. Setting the amount of data of the sensor information to be transmitted to server 901 is, for example, increasing/reducing the data itself or appropriately selecting a compression method.

FIG. 158 is a block diagram showing an example structure of client device 902. Client device 902 receives the three-dimensional map formed by a point cloud and the like from server 901, and estimates a self-location of client device 902 using the three-dimensional map created based on the sensor information of client device 902. Client device 902 transmits the obtained sensor information to server 901.

Client device 902 includes data receiver 1011, communication unit 1012, reception controller 1013, format converter 1014, sensors 1015, three-dimensional data creator 1016, three-dimensional image processor 1017, three-dimensional data storage 1018, format converter 1019, communication unit 1020, transmission controller 1021, and data transmitter 1022.

Data receiver 1011 receives three-dimensional map 1031 from server 901. Three-dimensional map 1031 is data that includes a point cloud such as a WLD or a SWLD. Three-dimensional map 1031 may include compressed data or uncompressed data.

Communication unit 1012 communicates with server 901 and transmits a data transmission request (e.g. transmission request for three-dimensional map) to server 901.

Reception controller 1013 exchanges information, such as information on supported formats, with a communications partner via communication unit 1012 to establish communication with the communications partner.

Format converter 1014 performs a format conversion and the like on three-dimensional map 1031 received by data receiver 1011 to generate three-dimensional map 1032. Format converter 1014 also performs a decompression or decoding process when three-dimensional map 1031 is compressed or encoded. Note that format converter 1014 does not perform the decompression or decoding process when three-dimensional map 1031 is uncompressed data.

Sensors 1015 are a group of sensors, such as LiDARs, visible light cameras, infrared cameras, or depth sensors that obtain information about the outside of a vehicle equipped with client device 902, and generate sensor information 1033. Sensor information 1033 is, for example, three-dimensional data such as a point cloud (point group data) when sensors 1015 are laser sensors such as LiDARs. Note that a single sensor may serve as sensors 1015.

Three-dimensional data creator 1016 generates three-dimensional data 1034 of a surrounding area of the own vehicle based on sensor information 1033. For example, three-dimensional data creator 1016 generates point cloud data with color information on the surrounding area of the own vehicle using information obtained by LiDAR and visible light video obtained by a visible light camera.

Three-dimensional image processor 1017 performs a self-location estimation process and the like of the own vehicle, using (i) the received three-dimensional map 1032 such as a point cloud, and (ii) three-dimensional data 1034 of the surrounding area of the own vehicle generated using sensor information 1033. Note that three-dimensional image processor 1017 may generate three-dimensional data 1035 about the surroundings of the own vehicle by merging three-dimensional map 1032 and three-dimensional data 1034, and may perform the self-location estimation process using the created three-dimensional data 1035.

Three-dimensional data storage 1018 stores three-dimensional map 1032, three-dimensional data 1034, three-dimensional data 1035, and the like.

Format converter 1019 generates sensor information 1037 by converting sensor information 1033 to a format supported by a receiver end. Note that format converter 1019 may reduce the amount of data by compressing or encoding sensor information 1037. Format converter 1019 may omit this process when format conversion is not necessary. Format converter 1019 may also control the amount of data to be transmitted in accordance with a specified transmission range.

Communication unit 1020 communicates with server 901 and receives a data transmission request (transmission request for sensor information) and the like from server 901.

Transmission controller 1021 exchanges information, such as information on supported formats, with a communications partner via communication unit 1020 to establish communication with the communications partner.

Data transmitter 1022 transmits sensor information 1037 to server 901. Sensor information 1037 includes, for example, information obtained through sensors 1015, such as information obtained by LiDAR, a luminance image obtained by a visible light camera, an infrared image obtained by an infrared camera, a depth image obtained by a depth sensor, sensor position information, and sensor speed information.

A structure of server 901 will be described next. FIG. 159 is a block diagram showing an example structure of server 901. Server 901 transmits sensor information from client device 902 and creates three-dimensional data based on the received sensor information. Server 901 updates the three-dimensional map managed by server 901 using the created three-dimensional data. Server 901 transmits the updated three-dimensional map to client device 902 in response to a transmission request for the three-dimensional map from client device 902.

Server 901 includes data receiver 1111, communication unit 1112, reception controller 1113, format converter 1114, three-dimensional data creator 1116, three-dimensional data merger 1117, three-dimensional data storage 1118, format converter 1119, communication unit 1120, transmission controller 1121, and data transmitter 1122.

Data receiver 1111 receives sensor information 1037 from client device 902. Sensor information 1037 includes, for example, information obtained by LiDAR, a luminance image obtained by a visible light camera, an infrared image obtained by an infrared camera, a depth image obtained by a depth sensor, sensor position information, sensor speed information, and the like.

Communication unit 1112 communicates with client device 902 and transmits a data transmission request (e.g. transmission request for sensor information) and the like to client device 902.

Reception controller 1113 exchanges information, such as information on supported formats, with a communications partner via communication unit 1112 to establish communication with the communications partner.

Format converter 1114 generates sensor information 1132 by performing a decompression or decoding process when received sensor information 1037 is compressed or encoded. Note that format converter 1114 does not perform the decompression or decoding process when sensor information 1037 is uncompressed data.

Three-dimensional data creator 1116 generates three-dimensional data 1134 of a surrounding area of client device 902 based on sensor information 1132. For example, three-dimensional data creator 1116 generates point cloud data with color information on the surrounding area of client device 902 using information obtained by LiDAR and visible light video obtained by a visible light camera.

Three-dimensional data merger 1117 updates three-dimensional map 1135 by merging three-dimensional data 1134 created based on sensor information 1132 with three-dimensional map 1135 managed by server 901.

Three-dimensional data storage 1118 stores three-dimensional map 1135 and the like.

Format converter 1119 generates three-dimensional map 1031 by converting three-dimensional map 1135 to a format supported by the receiver end. Note that format converter 1119 may reduce the amount of data by compressing or encoding three-dimensional map 1135. Format converter 1119 may omit this process when format conversion is not necessary. Format converter 1119 may also control the amount of data to be transmitted in accordance with a specified transmission range.

Communication unit 1120 communicates with client device 902 and receives a data transmission request (transmission request for three-dimensional map) and the like from client device 902.

Transmission controller 1121 exchanges information, such as information on supported formats, with a communications partner via communication unit 1120 to establish communication with the communications partner.

Data transmitter 1122 transmits three-dimensional map 1031 to client device 902. Three-dimensional map 1031 is data that includes a point cloud such as a WLD or a SWLD. Three-dimensional map 1031 may include one of compressed data and uncompressed data.

An operational flow of client device 902 will be described next. FIG. 160 is a flowchart of an operation when client device 902 obtains the three-dimensional map.

Client device 902 first requests server 901 to transmit the three-dimensional map (point cloud, etc.) (S1001). At this point, by also transmitting the position information about client device 902 obtained through GPS and the like, client device 902 may also request server 901 to transmit a three-dimensional map relating to this position information.

Client device 902 next receives the three-dimensional map from server 901 (S1002). When the received three-dimensional map is compressed data, client device 902 decodes the received three-dimensional map and generates an uncompressed three-dimensional map (S1003).

Client device 902 next creates three-dimensional data 1034 of the surrounding area of client device 902 using sensor information 1033 obtained by sensors 1015 (S1004). Client device 902 next estimates the self-location of client device 902 using three-dimensional map 1032 received from server 901 and three-dimensional data 1034 created using sensor information 1033 (S1005).

FIG. 161 is a flowchart of an operation when client device 902 transmits the sensor information. Client device 902 first receives a transmission request for the sensor information from server 901 (S1011). Client device 902 that has received the transmission request transmits sensor information 1037 to server 901 (S1012). Note that client device 902 may generate sensor information 1037 by compressing each piece of information using a compression method suited to each piece of information, when sensor information 1033 includes a plurality of pieces of information obtained by sensors 1015.

An operational flow of server 901 will be described next. FIG. 162 is a flowchart of an operation when server 901 obtains the sensor information. Server 901 first requests client device 902 to transmit the sensor information (S1021). Server 901 next receives sensor information 1037 transmitted from client device 902 in accordance with the request (S1022). Server 901 next creates three-dimensional data 1134 using the received sensor information 1037 (S1023). Server 901 next reflects the created three-dimensional data 1134 in three-dimensional map 1135 (S1024).

FIG. 163 is a flowchart of an operation when server 901 transmits the three-dimensional map. Server 901 first receives a transmission request for the three-dimensional map from client device 902 (S1031). Server 901 that has received the transmission request for the three-dimensional map transmits the three-dimensional map to client device 902 (S1032). At this point, server 901 may extract a three-dimensional map of a vicinity of client device 902 along with the position information about client device 902, and transmit the extracted three-dimensional map. Server 901 may compress the three-dimensional map formed by a point cloud using, for example, an octree structure compression method, and transmit the compressed three-dimensional map.

The following describes variations of the present embodiment.

Server 901 creates three-dimensional data 1134 of a vicinity of a position of client device 902 using sensor information 1037 received from client device 902. Server 901 next calculates a difference between three-dimensional data 1134 and three-dimensional map 1135, by matching the created three-dimensional data 1134 with three-dimensional map 1135 of the same area managed by server 901. Server 901 determines that a type of anomaly has occurred in the surrounding area of client device 902, when the difference is greater than or equal to a predetermined threshold. For example, it is conceivable that a large difference occurs between three-dimensional map 1135 managed by server 901 and three-dimensional data 1134 created based on sensor information 1037, when land subsidence and the like occurs due to a natural disaster such as an earthquake.

Sensor information 1037 may include information indicating at least one of a sensor type, a sensor performance, and a sensor model number. Sensor information 1037 may also be appended with a class ID and the like in accordance with the sensor performance. For example, when sensor information 1037 is obtained by LiDAR, it is conceivable to assign identifiers to the sensor performance. A sensor capable of obtaining information with precision in units of several millimeters is class 1, a sensor capable of obtaining information with precision in units of several centimeters is class 2, and a sensor capable of obtaining information with precision in units of several meters is class 3. Server 901 may estimate sensor performance information and the like from a model number of client device 902. For example, when client device 902 is equipped in a vehicle, server 901 may determine sensor specification information from a type of the vehicle. In this case, server 901 may obtain information on the type of the vehicle in advance, and the information may also be included in the sensor information. Server 901 may change a degree of correction with respect to three-dimensional data 1134 created using sensor information 1037, using obtained sensor information 1037. For example, when the sensor performance is high in precision (class 1), server 901 does not correct three-dimensional data 1134. When the sensor performance is low in precision (class 3), server 901 corrects three-dimensional data 1134 in accordance with the precision of the sensor. For example, server 901 increases the degree (intensity) of correction with a decrease in the precision of the sensor.

Server 901 may simultaneously send the transmission request for the sensor information to the plurality of client devices 902 in a certain space. Server 901 does not need to use all of the sensor information for creating three-dimensional data 1134 and may, for example, select sensor information to be used in accordance with the sensor performance, when having received a plurality of pieces of sensor information from the plurality of client devices 902. For example, when updating three-dimensional map 1135, server 901 may select high-precision sensor information (class 1) from among the received plurality of pieces of sensor information, and create three-dimensional data 1134 using the selected sensor information.

Server 901 is not limited to only being a server such as a cloud-based traffic monitoring system, and may also be another (vehicle-mounted) client device. FIG. 164 is a diagram of a system structure in this case.

For example, client device 902C sends a transmission request for sensor information to client device 902A located nearby, and obtains the sensor information from client device 902A. Client device 902C then creates three-dimensional data using the obtained sensor information of client device 902A, and updates a three-dimensional map of client device 902C. This enables client device 902C to generate a three-dimensional map of a space that can be obtained from client device 902A, and fully utilize the performance of client device 902C. For example, such a case is conceivable when client device 902C has high performance.

In this case, client device 902A that has provided the sensor information is given rights to obtain the high-precision three-dimensional map generated by client device 902C. Client device 902A receives the high-precision three-dimensional map from client device 902C in accordance with these rights.

Server 901 may send the transmission request for the sensor information to the plurality of client devices 902 (client device 902A and client device 902B) located nearby client device 902C. When a sensor of client device 902A or client device 902B has high performance, client device 902C is capable of creating the three-dimensional data using the sensor information obtained by this high-performance sensor.

FIG. 165 is a block diagram showing a functionality structure of server 901 and client device 902. Server 901 includes, for example, three-dimensional map compression/decoding processor 1201 that compresses and decodes the three-dimensional map and sensor information 1'73 compression/decoding processor 1202 that compresses and decodes the sensor information.

Client device 902 includes three-dimensional map decoding processor 1211 and sensor information compression processor 1212. Three-dimensional map decoding processor 1211 receives encoded data of the compressed three-dimensional map, decodes the encoded data, and obtains the three-dimensional map. Sensor information compression processor 1212 compresses the sensor information itself instead of the three-dimensional data created using the obtained sensor information, and transmits the encoded data of the compressed sensor information to server 901. With this structure, client device 902 does not need to internally store a processor that performs a process for compressing the three-dimensional data of the three-dimensional map (point cloud, etc.), as long as client device 902 internally stores a processor that performs a process for decoding the three-dimensional map (point cloud, etc.). This makes it possible to limit costs, power consumption, and the like of client device 902.

As stated above, client device 902 according to the present embodiment is equipped in the mobile object, and creates three-dimensional data 1034 of a surrounding area of the mobile object using sensor information 1033 that is obtained through sensor 1015 equipped in the mobile object and indicates a surrounding condition of the mobile object. Client device 902 estimates a self-location of the mobile object using the created three-dimensional data 1034. Client device 902 transmits obtained sensor information 1033 to server 901 or another client device 902.

This enables client device 902 to transmit sensor information 1033 to server 901 or the like. This makes it possible to further reduce the amount of transmission data compared to when transmitting the three-dimensional data. Since there is no need for client device 902 to perform processes such as compressing or encoding the three-dimensional data, it is possible to reduce the processing amount of client device

902. As such, client device 902 is capable of reducing the amount of data to be transmitted or simplifying the structure of the device.

Client device 902 further transmits the transmission request for the three-dimensional map to server 901 and receives three-dimensional map 1031 from server 901. In the estimating of the self-location, client device 902 estimates the self-location using three-dimensional data 1034 and three-dimensional map 1032.

Sensor information 1033 includes at least one of information obtained by a laser sensor, a luminance image, an infrared image, a depth image, sensor position information, or sensor speed information.

Sensor information 1033 includes information that indicates a performance of the sensor.

Client device 902 encodes or compresses sensor information 1033, and in the transmitting of the sensor information, transmits sensor information 1037 that has been encoded or compressed to server 901 or another client device 902. This enables client device 902 to reduce the amount of data to be transmitted.

For example, client device 902 includes a processor and memory. The processor performs the above processes using the memory.

Server 901 according to the present embodiment is capable of communicating with client device 902 equipped in the mobile object, and receives sensor information 1037 that is obtained through sensor 1015 equipped in the mobile object and indicates a surrounding condition of the mobile object. Server 901 creates three-dimensional data 1134 of a surrounding area of the mobile object using received sensor information 1037.

With this, server 901 creates three-dimensional data 1134 using sensor information 1037 transmitted from client device 902. This makes it possible to further reduce the amount of transmission data compared to when client device 902 transmits the three-dimensional data. Since there is no need for client device 902 to perform processes such as compressing or encoding the three-dimensional data, it is possible to reduce the processing amount of client device 902. As such, server 901 is capable of reducing the amount of data to be transmitted or simplifying the structure of the device.

Server 901 further transmits a transmission request for the sensor information to client device 902.

Server 901 further updates three-dimensional map 1135 using the created three-dimensional data 1134, and transmits three-dimensional map 1135 to client device 902 in response to the transmission request for three-dimensional map 1135 from client device 902.

Sensor information 1037 includes at least one of information obtained by a laser sensor, a luminance image, an infrared image, a depth image, sensor position information, or sensor speed information.

Sensor information 1037 includes information that indicates a performance of the sensor.

Server 901 further corrects the three-dimensional data in accordance with the performance of the sensor. This enables the three-dimensional data creation method to improve the quality of the three-dimensional data.

In the receiving of the sensor information, server 901 receives a plurality of pieces of sensor information 1037 received from a plurality of client devices 902, and selects sensor information 1037 to be used in the creating of three-dimensional data 1134, based on a plurality of pieces of information that each indicates the performance of the sensor included in the plurality of pieces of sensor information 1037. This enables server 901 to improve the quality of three-dimensional data 1134.

Server 901 decodes or decompresses received sensor information 1037, and creates three-dimensional data 1134 using sensor information 1132 that has been decoded or decompressed. This enables server 901 to reduce the amount of data to be transmitted.

For example, server 901 includes a processor and memory. The processor performs the above processes using the memory.

The following will describe a variation of the present embodiment. FIG. 166 is a diagram illustrating a configuration of a system according to the present embodiment. The system illustrated in FIG. 166 includes server 2001, client device 2002A, and client device 2002B.

Client device 2002A and client device 2002B are each provided in a mobile object such as a vehicle, and transmit sensor information to server 2001. Server 2001 transmits a three-dimensional map (a point cloud) to client device 2002A and client device 2002B.

Client device 2002A includes sensor information obtainer 2011, storage 2012, and data transmission possibility determiner 2013. It should be noted that client device 2002B has the same configuration. Additionally, when client device 2002A and client device 2002B are not particularly distinguished below, client device 2002A and client device 2002B are also referred to as client device 2002.

FIG. 167 is a flowchart illustrating operation of client device 2002 according to the present embodiment.

Sensor information obtainer 2011 obtains a variety of sensor information using sensors (a group of sensors) provided in a mobile object. In other words, sensor information obtainer 2011 obtains sensor information obtained by the sensors (the group of sensors) provided in the mobile object and indicating a surrounding state of the mobile object. Sensor information obtainer 2011 also stores the obtained sensor information into storage 2012. This sensor information includes at least one of information obtained by LiDAR, a visible light image, an infrared image, or a depth image. Additionally, the sensor information may include at least one of sensor position information, speed information, obtainment time information, or obtainment location information. Sensor position information indicates a position of a sensor that has obtained sensor information. Speed information indicates a speed of the mobile object when a sensor obtained sensor information. Obtainment time information indicates a time when a sensor obtained sensor information. Obtainment location information indicates a position of the mobile object or a sensor when the sensor obtained sensor information.

Next, data transmission possibility determiner 2013 determines whether the mobile object (client device 2002) is in an environment in which the mobile object can transmit sensor information to server 2001 (S2002). For example, data transmission possibility determiner 2013 may specify a location and a time at which client device 2002 is present using GPS information etc., and may determine whether data can be transmitted. Additionally, data transmission possibility determiner 2013 may determine whether data can be transmitted, depending on whether it is possible to connect to a specific access point.

When client device 2002 determines that the mobile object is in the environment in which the mobile object can transmit the sensor information to server 2001 (YES in S2002), client device 2002 transmits the sensor information to server 2001 (S2003). In other words, when client device 2002 becomes capable of transmitting sensor information to server 2001, client device 2002 transmits the sensor information held by client device 2002 to server 2001. For example, an access point that enables high-speed communication using millimeter waves is provided in an intersection or the like. When client device 2002 enters the intersection, client device 2002 transmits the sensor information held by client device 2002 to server 2001 at high speed using the millimeter-wave communication.

Next, client device 2002 deletes from storage 2012 the sensor information that has been transmitted to server 2001 (S2004). It should be noted that when sensor information that has not been transmitted to server 2001 meets predetermined conditions, client device 2002 may delete the sensor information. For example, when an obtainment time of sensor information held by client device 2002 precedes a current time by a certain time, client device 2002 may delete the sensor information from storage 2012. In other words, when a difference between the current time and a time when a sensor obtained sensor information exceeds a predetermined time, client device 2002 may delete the sensor information from storage 2012. Besides, when an obtainment location of sensor information held by client device 2002 is separated from a current location by a certain distance, client device 2002 may delete the sensor information from storage 2012. In other words, when a difference between a current position of the mobile object or a sensor and a position of the mobile object or the sensor when the sensor obtained sensor information exceeds a predetermined distance, client device 2002 may delete the sensor information from storage 2012. Accordingly, it is possible to reduce the capacity of storage 2012 of client device 2002.

When client device 2002 does not finish obtaining sensor information (NO in S2005), client device 2002 performs step S2001 and the subsequent steps again. Further, when client device 2002 finishes obtaining sensor information (YES in S2005), client device 2002 completes the process.

Client device 2002 may select sensor information to be transmitted to server 2001, in accordance with communication conditions. For example, when high-speed communication is available, client device 2002 preferentially transmits sensor information (e.g., information obtained by LiDAR) of which the data size held in storage 2012 is large. Additionally, when high-speed communication is not readily available, client device 2002 transmits sensor information (e.g., a visible light image) which has high priority and of which the data size held in storage 2012 is small. Accordingly, client device 2002 can efficiently transmit sensor information held in storage 2012, in accordance with network conditions Client device 2002 may obtain, from server 2001, time information indicating a current time and location information indicating a current location. Moreover, client device 2002 may determine an obtainment time and an obtainment location of sensor information based on the obtained time information and location information. In other words, client device 2002 may obtain time information from server 2001 and generate obtainment time information using the obtained time information. Client device 2002 may also obtain location information from server 2001 and generate obtainment location information using the obtained location information.

For example, regarding time information, server 2001 and client device 2002 perform clock synchronization using a means such as the Network Time Protocol (NTP) or the Precision Time Protocol (PTP). This enables client device 2002 to obtain accurate time information. What's more, since it is possible to synchronize clocks between server 2001 and client devices 2002, it is possible to synchronize times included in pieces of sensor information obtained by separate client devices 2002. As a result, server 2001 can handle sensor information indicating a synchronized time. It should be noted that a means of synchronizing clocks may be any means other than the NTP or PTP. In addition, GPS information may be used as the time information and the location information.

Server 2001 may specify a time or a location and obtain pieces of sensor information from client devices 2002. For example, when an accident occurs, in order to search for a client device in the vicinity of the accident, server 2001 specifies an accident occurrence time and an accident occurrence location and broadcasts sensor information transmission requests to client devices 2002. Then, client device 2002 having sensor information obtained at the corresponding time and location transmits the sensor information to server 2001. In other words, client device 2002 receives, from server 2001, a sensor information transmission request including specification information specifying a location and a time. When sensor information obtained at a location and a time indicated by the specification information is stored in storage 2012, and client device 2002 determines that the mobile object is present in the environment in which the mobile object can transmit the sensor information to server 2001, client device 2002 transmits, to server 2001, the sensor information obtained at the location and the time indicated by the specification information. Consequently, server 2001 can obtain the pieces of sensor information pertaining to the occurrence of the accident from client devices 2002, and use the pieces of sensor information for accident analysis etc.

It should be noted that when client device 2002 receives a sensor information transmission request from server 2001, client device 2002 may refuse to transmit sensor information. Additionally, client device 2002 may set in advance which pieces of sensor information can be transmitted. Alternatively, server 2001 may inquire of client device 2002 each time whether sensor information can be transmitted.

A point may be given to client device 2002 that has transmitted sensor information to server 2001. This point can be used in payment for, for example, gasoline expenses, electric vehicle (EV) charging expenses, a highway toll, or rental car expenses. After obtaining sensor information, server 2001 may delete information for specifying client device 2002 that has transmitted the sensor information. For example, this information is a network address of client device 2002. Since this enables the anonymization of sensor information, a user of client device 2002 can securely transmit sensor information from client device 2002 to server 2001. Server 2001 may include servers. For example, by servers sharing sensor information, even when one of the servers breaks down, the other servers can communicate with client device 2002. Accordingly, it is possible to avoid service outage due to a server breakdown.

A specified location specified by a sensor information transmission request indicates an accident occurrence location etc., and may be different from a position of client device 2002 at a specified time specified by the sensor information transmission request. For this reason, for example, by specifying, as a specified location, a range such as within XX meters of a surrounding area, server 2001 can request information from client device 2002 within the range. Similarly, server 2001 may also specify, as a specified time, a range such as within N seconds before and after a certain time. As a result, server 2001 can obtain sensor information from client device 2002 present for a time from t-N to t+N and in a location within XX meters from absolute position S. When client device 2002 transmits three-dimensional data such as LiDAR, client device 2002 may transmit data created immediately after time t.

Server 2001 may separately specify information indicating, as a specified location, a location of client device 2002 from which sensor information is to be obtained, and a location at which sensor information is desirably obtained. For example, server 2001 specifies that sensor information including at least a range within YY meters from absolute position S is to be obtained from client device 2002 present within XX meters from absolute position S. When client device 2002 selects three-dimensional data to be transmitted, client device 2002 selects one or more pieces of three-dimensional data so that the one or more pieces of three-dimensional data include at least the sensor information including the specified range. Each of the one or more pieces of three-dimensional data is a random-accessible unit of data. In addition, when client device 2002 transmits a visible light image, client device 2002 may transmit pieces of temporally continuous image data including at least a frame immediately before or immediately after time t.

When client device 2002 can use physical networks such as 5G, Wi-Fi, or modes in 5G for transmitting sensor information, client device 2002 may select a network to be used according to the order of priority notified by server 2001. Alternatively, client device 2002 may select a network that enables client device 2002 to ensure an appropriate bandwidth based on the size of transmit data. Alternatively, client device 2002 may select a network to be used, based on data transmission expenses etc. A transmission request from server 2001 may include information indicating a transmission deadline, for example, performing transmission when client device 2002 can start transmission by time t. When server 2001 cannot obtain sufficient sensor information within a time limit, server 2001 may issue a transmission request again.

Sensor information may include header information indicating characteristics of sensor data along with compressed or uncompressed sensor data. Client device 2002 may transmit header information to server 2001 via a physical network or a communication protocol that is different from a physical network or a communication protocol used for sensor data. For example, client device 2002 transmits header information to server 2001 prior to transmitting sensor data. Server 2001 determines whether to obtain the sensor data of client device 2002, based on a result of analysis of the header information. For example, header information may include information indicating a point cloud obtainment density, an elevation angle, or a frame rate of LiDAR, or information indicating, for example, a resolution, an SN ratio, or a frame rate of a visible light image. Accordingly, server 2001 can obtain the sensor information from client device 2002 having the sensor data of determined quality.

As stated above, client device 2002 is provided in the mobile object, obtains sensor information that has been obtained by a sensor provided in the mobile object and indicates a surrounding state of the mobile object, and stores the sensor information into storage 2012. Client device 2002 determines whether the mobile object is present in an environment in which the mobile object is capable of transmitting the sensor information to server 2001, and transmits the sensor information to server 2001 when the mobile object is determined to be present in the environment in which the mobile object is capable of transmitting the sensor information to server 2001.

Additionally, client device 2002 further creates, from the sensor information, three-dimensional data of a surrounding area of the mobile object, and estimates a self-location of the mobile object using the three-dimensional data created.

Besides, client device 2002 further transmits a transmission request for a three-dimensional map to server 2001, and receives the three-dimensional map from server 2001. In the estimating, client device 2002 estimates the self-location using the three-dimensional data and the three-dimensional map.

It should be noted that the above process performed by client device 2002 may be realized as an information transmission method for use in client device 2002.

In addition, client device 2002 may include a processor and memory. Using the memory, the processor may perform the above process.

Next, a sensor information collection system according to the present embodiment will be described. FIG. 168 is a diagram illustrating a configuration of the sensor information collection system according to the present embodiment. As illustrated in FIG. 168, the sensor information collection system according to the present embodiment includes terminal 2021A, terminal 2021B, communication device 2022A, communication device 2022B, network 2023, data collection server 2024, map server 2025, and client device 2026. It should be noted that when terminal 2021A and terminal 2021B are not particularly distinguished, terminal 2021A and terminal 2021B are also referred to as terminal 2021. Additionally, when communication device 2022A and communication device 2022B are not particularly distinguished, communication device 2022A and communication device 2022B are also referred to as communication device 2022.

Data collection server 2024 collects data such as sensor data obtained by a sensor included in terminal 2021 as position-related data in which the data is associated with a position in a three-dimensional space.

Sensor data is data obtained by, for example, detecting a surrounding state of terminal 2021 or an internal state of terminal 2021 using a sensor included in terminal 2021. Terminal 2021 transmits, to data collection server 2024, one or more pieces of sensor data collected from one or more sensor devices in locations at which direct communication with terminal 2021 is possible or at which communication with terminal 2021 is possible by the same communication system or via one or more relay devices.

Data included in position-related data may include, for example, information indicating an operating state, an operating log, a service use state, etc. of a terminal or a device included in the terminal. In addition, the data include in the position-related data may include, for example, information in which an identifier of terminal 2021 is associated with a position or a movement path etc. of terminal 2021.

Information indicating a position included in position-related data is associated with, for example, information indicating a position in three-dimensional data such as three-dimensional map data. The details of information indicating a position will be described later.

Position-related data may include at least one of the above-described time information or information indicating an attribute of data included in the position-related data or a type (e.g., a model number) of a sensor that has created the data, in addition to position information that is information indicating a position. The position information and the time information may be stored in a header area of the position-related data or a header area of a frame that stores the position-related data. Further, the position information and the time information may be transmitted and/or stored as metadata associated with the position-related data, separately from the position-related data.

Map server 2025 is connected to, for example, network 2023, and transmits three-dimensional data such as three-dimensional map data in response to a request from another device such as terminal 2021. Besides, as described in the aforementioned embodiments, map server 2025 may have, for example, a function of updating three-dimensional data using sensor information transmitted from terminal 2021.

Data collection server 2024 is connected to, for example, network 2023, collects position-related data from another device such as terminal 2021, and stores the collected position-related data into a storage of data collection server 2024 or a storage of another server. In addition, data collection server 2024 transmits, for example, metadata of collected position-related data or three-dimensional data generated based on the position-related data, to terminal 2021 in response to a request from terminal 2021.

Network 2023 is, for example, a communication network such as the Internet. Terminal 2021 is connected to network 2023 via communication device 2022. Communication device 2022 communicates with terminal 2021 using one communication system or switching between communication systems.

Communication device 2022 is a communication satellite that performs communication using, for example, (1) a base station compliant with Long-Term Evolution (LTE) etc., (2) an access point (AP) for Wi-Fi or millimeter-wave communication etc., (3) a low-power wide-area (LPWA) network gateway such as SIGFOX, LoRaWAN, or Wi-SUN, or (4) a satellite communication system such as DVB-S2.

It should be noted that a base station may communicate with terminal 2021 using a system classified as an LPWA network such as Narrowband Internet of Things (NB IoT) or LTE-M, or switching between these systems.

Here, although, in the example given, terminal 2021 has a function of communicating with communication device 2022 that uses two types of communication systems, and communicates with map server 2025 or data collection server 2024 using one of the communication systems or switching between the communication systems and between communication devices 2022 to be a direct communication partner; a configuration of the sensor information collection system and terminal 2021 is not limited to this. For example, terminal 2021 need not have a function of performing communication using communication systems, and may have a function of performing communication using one of the communication systems. Terminal 2021 may also support three or more communication systems. Additionally, each terminal 2021 may support a different communication system.

Terminal 2021 includes, for example, the configuration of client device 902 illustrated in FIG. 158. Terminal 2021 estimates a self-location etc. using received three-dimensional data. Besides, terminal 2021 associates sensor data obtained from a sensor and position information obtained by self-location estimation to generate position-related data.

Position information appended to position-related data indicates, for example, a position in a coordinate system used for three-dimensional data. For example, the position information is coordinate values represented using a value of a latitude and a value of a longitude. Here, terminal 2021 may include, in the position information, a coordinate system serving as a reference for the coordinate values and information indicating three-dimensional data used for location estimation, along with the coordinate values. Coordinate values may also include altitude information.

The position information may be associated with a data unit or a space unit usable for encoding the above three-dimensional data. Such a unit is, for example, WLD, GOS, SPC, VLM, or VXL. Here, the position information is represented by, for example, an identifier for identifying a data unit such as the SPC corresponding to position-related data. It should be noted that the position information may include, for example, information indicating three-dimensional data obtained by encoding a three-dimensional space including a data unit such as the SPC or information indicating a detailed position within the SPC, in addition to the identifier for identifying the data unit such as the SPC. The information indicating the three-dimensional data is, for example, a file name of the three-dimensional data.

As stated above, by generating position-related data associated with position information based on location estimation using three-dimensional data, the system can give more accurate position information to sensor information than when the system appends position information based on a self-location of a client device (terminal 2021) obtained using a GPS to sensor information. As a result, even when another device uses the position-related data in another service, there is a possibility of more accurately determining a position corresponding to the position-related data in an actual space, by performing location estimation based on the same three-dimensional data.

It should be noted that although the data transmitted from terminal 2021 is the position-related data in the example given in the present embodiment, the data transmitted from terminal 2021 may be data unassociated with position information. In other words, the transmission and reception of three-dimensional data or sensor data described in the other embodiments may be performed via network 2023 described in the present embodiment.

Next, a different example of position information indicating a position in a three-dimensional or two-dimensional actual space or in a map space will be described. The position information appended to position-related data may be information indicating a relative position relative to a keypoint in three-dimensional data. Here, the keypoint serving as a reference for the position information is encoded as, for example, SWLD, and notified to terminal 2021 as three-dimensional data.

The information indicating the relative position relative to the keypoint may be, for example, information that is represented by a vector from the keypoint to the point indicated by the position information, and indicates a direction and a distance from the keypoint to the point indicated by the position information. Alternatively, the information indicating the relative position relative to the keypoint may be information indicating an amount of displacement from the keypoint to the point indicated by the position information along each of the x axis, the y axis, and the z axis. Additionally, the information indicating the relative position relative to the keypoint may be information indicating a distance from each of three or more keypoints to the point indicated by the position information. It should be noted that the relative position need not be a relative position of the point indicated by the position information represented using each keypoint as a reference, and may be a relative position of each keypoint represented with respect to the point indicated by the position information. Examples of position information based on a relative position relative to a keypoint include information for identifying a keypoint to be a reference, and information indicating the relative position of the point indicated by the position information and relative to the keypoint. When the information indicating the relative position relative to the keypoint is provided separately from three-dimensional data, the information indicating the relative position relative to the keypoint may include, for example, coordinate axes used in deriving the relative position, information indicating a type of the three-dimensional data, and/or information indicating a magnitude per unit amount (e.g., a scale) of a value of the information indicating the relative position.

The position information may include, for each keypoint, information indicating a relative position relative to the keypoint. When the position information is represented by relative positions relative to keypoints, terminal 2021 that intends to identify a position in an actual space indicated by the position information may calculate candidate points of the position indicated by the position information from positions of the keypoints each estimated from sensor data, and may determine that a point obtained by averaging the calculated candidate points is the point indicated by the position information. Since this configuration reduces the effects of errors when the positions of the keypoints are estimated from the sensor data, it is possible to improve the estimation accuracy for the point in the actual space indicated by the position information. Besides, when the position information includes information indicating relative positions relative to keypoints, if it is possible to detect any one of the keypoints regardless of the presence of keypoints undetectable due to a limitation such as a type or performance of a sensor included in terminal 2021, it is possible to estimate a value of the point indicated by the position information.

A point identifiable from sensor data can be used as a keypoint. Examples of the point identifiable from the sensor data include a point or a point within a region that satisfies a predetermined keypoint detection condition, such as the above-described three-dimensional feature or feature of visible light data is greater than or equal to a threshold value.

Moreover, a marker etc. placed in an actual space may be used as a keypoint. In this case, the maker may be detected and located from data obtained using a sensor such as LiDER or a camera. For example, the marker may be represented by a change in color or luminance value (degree of reflection), or a three-dimensional shape (e.g., unevenness). Coordinate values indicating a position of the marker, or a two-dimensional bar code or a bar code etc. generated from an identifier of the marker may be also used.

Furthermore, a light source that transmits an optical signal may be used as a marker. When a light source of an optical signal is used as a marker, not only information for obtaining a position such as coordinate values or an identifier but also other data may be transmitted using an optical signal. For example, an optical signal may include contents of service corresponding to the position of the marker, an address for obtaining contents such as a URL, or an identifier of a wireless communication device for receiving service, and information indicating a wireless communication system etc. for connecting to the wireless communication device. The use of an optical communication device (a light source) as a marker not only facilitates the transmission of data other than information indicating a position but also makes it possible to dynamically change the data.

Terminal 2021 finds out a correspondence relationship of keypoints between mutually different data using, for example, a common identifier used for the data, or information or a table indicating the correspondence relationship of the keypoints between the data. When there is no information indicating a correspondence relationship between keytpoints, terminal 2021 may also determine that when coordinates of a keypoint in three-dimensional data are converted into a position in a space of another three-dimensional data, a keypoint closest to the position is a corresponding keypoint.

When the position information based on the relative position described above is used, terminal 2021 that uses mutually different three-dimensional data or services can identify or estimate a position indicated by the position information with respect to a common keypoint included in or associated with each three-dimensional data. As a result, terminal 2021 that uses the mutually different three-dimensional data or the services can identify or estimate the same position with higher accuracy.

Even when map data or three-dimensional data represented using mutually different coordinate systems are used, since it is possible to reduce the effects of errors caused by the conversion of a coordinate system, it is possible to coordinate services based on more accurate position information.

Hereinafter, an example of functions provided by data collection server 2024 will be described. Data collection server 2024 may transfer received position-related data to another data server. When there are data servers, data collection server 2024 determines to which data server received position-related data is to be transferred, and transfers the position-related data to a data server determined as a transfer destination.

Data collection server 2024 determines a transfer destination based on, for example, transfer destination server determination rules preset to data collection server 2024. The transfer destination server determination rules are set by, for example, a transfer destination table in which identifiers respectively associated with terminals 2021 are associated with transfer destination data servers.

Terminal 2021 appends an identifier associated with terminal 2021 to position-related data to be transmitted, and transmits the position-related data to data collection server 2024. Data collection server 2024 determines a transfer destination data server corresponding to the identifier appended to the position-related data, based on the transfer destination server determination rules set out using the transfer destination table etc.; and transmits the position-related data to the determined data server. The transfer destination server determination rules may be specified based on a determination condition set using a time, a place, etc. at which position-related data is obtained. Here, examples of the identifier associated with transmission source terminal 2021 include an identifier unique to each terminal 2021 or an identifier indicating a group to which terminal 2021 belongs.

The transfer destination table need not be a table in which identifiers associated with transmission source terminals are directly associated with transfer destination data servers. For example, data collection server 2024 holds a management table that stores tag information assigned to each identifier unique to terminal 2021, and a transfer destination table in which the pieces of tag information are associated with transfer destination data servers. Data collection server 2024 may determine a transfer destination data server based on tag information, using the management table and the transfer destination table. Here, the tag information is, for example, control information for management or control information for providing service assigned to a type, a model number, an owner of terminal 2021 corresponding to the identifier, a group to which terminal 2021 belongs, or another identifier. Moreover, in the transfer destination able, identifiers unique to respective sensors may be used instead of the identifiers associated with transmission source terminals 2021. Furthermore, the transfer destination server determination rules may be set by client device 2026.

Data collection server 2024 may determine data servers as transfer destinations, and transfer received position-related data to the data servers. According to this configuration, for example, when position-related data is automatically backed up or when, in order that position-related data is commonly used by different services, there is a need to transmit the position-related data to a data server for providing each service, it is possible to achieve data transfer as intended by changing a setting of data collection server 2024. As a result, it is possible to reduce the number of steps necessary for building and changing a system, compared to when a transmission destination of position-related data is set for each terminal 2021.

Data collection server 2024 may register, as a new transfer destination, a data server specified by a transfer request signal received from a data server; and transmit position-related data subsequently received to the data server, in response to the transfer request signal.

Data collection server 2024 may store position-related data received from terminal 2021 into a recording device, and transmit position-related data specified by a transmission request signal received from terminal 2021 or a data server to request source terminal 2021 or the data server in response to the transmission request signal.

Data collection server 2024 may determine whether position-related data is suppliable to a request source data server or terminal 2021, and transfer or transmit the position-related data to the request source data server or terminal 2021 when determining that the position-related data is suppliable.

When data collection server 2024 receives a request for current position-related data from client device 2026, even if it is not a timing for transmitting position-related data by terminal 2021, data collection server 2024 may send a transmission request for the current position-related data to terminal 2021, and terminal 2021 may transmit the current position-related data in response to the transmission request.

Although terminal 2021 transmits position information data to data collection server 2024 in the above description, data collection server 2024 may have a function of managing terminal 2021 such as a function necessary for collecting position-related data from terminal 2021 or a function used when collecting position-related data from terminal 2021.

Data collection server 2024 may have a function of transmitting, to terminal 2021, a data request signal for requesting transmission of position information data, and collecting position-related data.

Management information such as an address for communicating with terminal 2021 from which data is to be collected or an identifier unique to terminal 2021 is registered in advance in data collection server 2024. Data collection server 2024 collects position-related data from terminal 2021 based on the registered management information. Management information may include information such as types of sensors included in terminal 2021, the number of sensors included in terminal 2021, and communication systems supported by terminal 2021.

Data collection server 2024 may collect information such as an operating state or a current position of terminal 2021 from terminal 2021.

Registration of management information may be instructed by client device 2026, or a process for the registration may be started by terminal 2021 transmitting a registration request to data collection server 2024. Data collection server 2024 may have a function of controlling communication between data collection server 2024 and terminal 2021.

Communication between data collection server 2024 and terminal 2021 may be established using a dedicated line provided by a service provider such as a mobile network operator (MNO) or a mobile virtual network operator (MVNO), or a virtual dedicated line based on a virtual private network (VPN). According to this configuration, it is possible to perform secure communication between terminal 2021 and data collection server 2024.

Data collection server 2024 may have a function of authenticating terminal 2021 or a function of encrypting data to be transmitted and received between data collection server 2024 and terminal 2021. Here, the authentication of terminal 2021 or the encryption of data is performed using, for example, an identifier unique to terminal 2021 or an identifier unique to a terminal group including terminals 2021, which is shared in advance between data collection server 2024 and terminal 2021. Examples of the identifier include an international mobile subscriber identity (IMSI) that is a unique number stored in a subscriber identity module (SIM) card. An identifier for use in authentication and an identifier for use in encryption of data may be identical or different.

The authentication or the encryption of data between data collection server 2024 and terminal 2021 is feasible when both data collection server 2024 and terminal 2021 have a function of performing the process. The process does not depend on a communication system used by communication device 2022 that performs relay. Accordingly, since it is possible to perform the common authentication or encryption without considering whether terminal 2021 uses a communication system, the user's convenience of system architecture is increased. However, the expression "does not depend on a communication system used by communication device 2022 that performs relay" means a change according to a communication system is not essential. In other words, in order to improve the transfer efficiency or ensure security, the authentication or the encryption of data between data collection server 2024 and terminal 2021 may be changed according to a communication system used by a relay device.

Data collection server 2024 may provide client device 2026 with a User Interface (UI) that manages data collection rules such as types of position-related data collected from terminal 2021 and data collection schedules. Accordingly, a user can specify, for example, terminal 2021 from which data is to be collected using client device 2026, a data collection time, and a data collection frequency. Additionally, data collection server 2024 may specify, for example, a region on a map from which data is to be desirably collected, and collect position-related data from terminal 2021 included in the region.

When the data collection rules are managed on a per terminal 2021 basis, client device 2026 presents, on a screen, a list of terminals 2021 or sensors to be managed. The user sets, for example, a necessity for data collection or a collection schedule for each item in the list.

When a region on a map from which data is to be desirably collected is specified, client device 2026 presents, on a screen, a two-dimensional or three-dimensional map of a region to be managed. The user selects the region from which data is to be collected on the displayed map. Examples of the region selected on the map include a circular or rectangular region having a point specified on the map as the center, or a circular or rectangular region specifiable by a drag operation. Client device 2026 may also select a region in a preset unit such as a city, an area or a block in a city, or a main road, etc. Instead of specifying a region using a map, a region may be set by inputting values of a latitude and a longitude, or a region may be selected from a list of candidate regions derived based on inputted text information. Text information is, for example, a name of a region, a city, or a landmark.

Moreover, data may be collected while the user dynamically changes a specified region by specifying one or more terminals 2021 and setting a condition such as within 100 meters of one or more terminals 2021.

When client device 2026 includes a sensor such as a camera, a region on a map may be specified based on a position of client device 2026 in an actual space obtained from sensor data. For example, client device 2026 may estimate a self-location using sensor data, and specify, as a region from which data is to be collected, a region within a predetermined distance from a point on a map corresponding to the estimated location or a region within a distance specified by the user. Client device 2026 may also specify, as the region from which the data is to be collected, a sensing region of the sensor, that is, a region corresponding to obtained sensor data. Alternatively, client device 2026 may specify, as the region from which the data is to be collected, a region based on a location corresponding to sensor data specified by the user. Either client device 2026 or data collection server 2024 may estimate a region on a map or a location corresponding to sensor data.

When a region on a map is specified, data collection server 2024 may specify terminal 2021 within the specified region by collecting current position information of each terminal 2021, and may send a transmission request for position-related data to specified terminal 2021. When data collection server 2024 transmits information indicating a specified region to terminal 2021, determines whether terminal 2021 is present within the specified region, and determines that terminal 2021 is present within the specified region, rather than specifying terminal 2021 within the region, terminal 2021 may transmit position-related data.

Data collection server 2024 transmits, to client device 2026, data such as a list or a map for providing the above-described User Interface (UI) in an application executed by client device 2026. Data collection server 2024 may transmit, to client device 2026, not only the data such as the list or the map but also an application program. Additionally, the above UI may be provided as contents created using HTML displayable by a browser. It should be noted that part of data such as map data may be supplied from a server, such as map server 2025, other than data collection server 2024.

When client device 2026 receives an input for notifying the completion of an input such as pressing of a setup key by the user, client device 2026 transmits the inputted information as configuration information to data collection server 2024. Data collection server 2024 transmits, to each terminal 2021, a signal for requesting position-related data or notifying position-related data collection rules, based on the configuration information received from client device 2026, and collects the position-related data.

Next, an example of controlling operation of terminal 2021 based on additional information added to three-dimensional or two-dimensional map data will be described.

In the present configuration, object information that indicates a position of a power feeding part such as a feeder antenna or a feeder coil for wireless power feeding buried under a road or a parking lot is included in or associated with three-dimensional data, and such object information is provided to terminal 2021 that is a vehicle or a drone.

A vehicle or a drone that has obtained the object information to get charged automatically moves so that a position of a charging part such as a charging antenna or a charging coil included in the vehicle or the drone becomes opposite to a region indicated by the object information, and such vehicle or a drone starts to charge itself. It should be noted that when a vehicle or a drone has no automatic driving function, a direction to move in or an operation to perform is presented to a driver or an operator by using an image displayed on a screen, audio, etc. When a position of a charging part calculated based on an estimated self-location is determined to fall within the region indicated by the object information or a predetermined distance from the region, an image or audio to be presented is changed to a content that puts a stop to driving or operating, and the charging is started.

Object information need not be information indicating a position of a power feeding part, and may be information indicating a region within which placement of a charging part results in a charging efficiency greater than or equal to a predetermined threshold value. A position indicated by object information may be represented by, for example, the central point of a region indicated by the object information, a region or a line within a two-dimensional plane, or a region, a line, or a plane within a three-dimensional space.

According to this configuration, since it is possible to identify the position of the power feeding antenna unidentifiable by sensing data of LiDER or an image captured by the camera, it is possible to highly accurately align a wireless charging antenna included in terminal 2021 such as a vehicle with a wireless power feeding antenna buried under a road. As a result, it is possible to increase a charging speed at the time of wireless charging and improve the charging efficiency.

Object information may be an object other than a power feeding antenna. For example, three-dimensional data includes, for example, a position of an AP for millimeter-wave wireless communication as object information. Accordingly, since terminal 2021 can identify the position of the AP in advance, terminal 2021 can steer a directivity of beam to a direction of the object information and start communication. As a result, it is possible to improve communication quality such as increasing transmission rates, reducing the duration of time before starting communication, and extending a communicable period.

Object information may include information indicating a type of an object corresponding to the object information. In addition, when terminal 2021 is present within a region in an actual space corresponding to a position in three-dimensional data of the object information or within a predetermined distance from the region, the object information may include information indicating a process to be performed by terminal 2021.

Object information may be provided by a server different from a server that provides three-dimensional data. When object information is provided separately from three-dimensional data, object groups in which object information used by the same service is stored may be each provided as separate data according to a type of a target service or a target device.

Three-dimensional data used in combination with object information may be point cloud data of WLD or keypoint data of SWLD.

In the three-dimensional data encoding device, when attribute information of a current three-dimensional point to be encoded is layer-encoded using Levels of Detail (LoDs), the three-dimensional data decoding device may decode the attribute information in layers down to LoD required by the three-dimensional data decoding device and need not decode the attribute information in layers not required. For example, when the total number of LoDs for the attribute information in a bitstream generated by the three-dimensional data encoding device is N, the three-dimensional data decoding device may decode M LoDs (M<N), i.e., layers from the uppermost layer LoD0 to LoD(M−1), and need not decode the remaining LoDs, i.e., layers down to LoD(N−1). With this, while reducing the processing load, the three-dimensional data decoding device can decode the attribute information in layers from LoD0 to LoD(M−1) required by the three-dimensional data decoding device.

FIG. 169 is a diagram illustrating the foregoing use case. In the example shown in FIG. 169, a server stores a three-dimensional map obtained by encoding three-dimensional geometry information and attribute information. The server (the three-dimensional data encoding device) broadcasts the three-dimensional map to client devices (the three-dimensional data decoding devices: for example, vehicles, drones, etc.) in an area managed by the server, and each client device uses the three-dimensional map received from the server to perform a process for identifying the self-position of the client device or a process for displaying map information to a user or the like who operates the client device.

The following describes an example of the operation in this case. First, the server encodes the geometry information of the three-dimensional map using an octree structure or the like. Then, the sever layer-encodes the attribute information of the three-dimensional map using N LoDs established based on the geometry information. The server stores a bitstream of the three-dimensional map obtained by the layer-encoding.

Next, in response to a send request for the map information from the client device in the area managed by the server, the server sends the bitstream of the encoded three-dimensional map to the client device.

The client device receives the bitstream of the three-dimensional map sent from the server, and decodes the geometry information and the attribute information of the three-dimensional map in accordance with the intended use of the client device. For example, when the client device performs highly accurate estimation of the self-position using the geometry information and the attribute information in N LoDs, the client device determines that a decoding result to the dense three-dimensional points is necessary as the attribute information, and decodes all the information in the bitstream.

Moreover, when the client device displays the three-dimensional map information to a user or the like, the client device determines that a decoding result to the sparse three-dimensional points is necessary as the attribute information, and decodes the geometry information and the attribute information in M LoDs (M<N) starting from an upper layer LoD0.

In this way, the processing load of the client device can be reduced by changing LoDs for the attribute information to be decoded in accordance with the intended use of the client device.

In the example shown in FIG. 169, for example, the three-dimensional map includes geometry information and attribute information. The geometry information is encoded using the octree. The attribute information is encoded using N LoDs.

Client device A performs highly accurate estimation of the self-position. In this case, client device A determines that all the geometry information and all the attribute information are necessary, and decodes all the geometry information and all the attribute information constructed from N LoDs in the bitstream.

Client device B displays the three-dimensional map to a user. In this case, client device B determines that the geometry information and the attribute information in M LoDs (M<N) are necessary, and decodes the geometry information and the attribute information constructed from M LoDs in the bitstream.

It is to be noted that the server may broadcast the three-dimensional map to the client devices, or multicast or unicast the three-dimensional map to the client devices.

The following describes a variation of the system according to the present embodiment. In the three-dimensional data encoding device, when attribute information of a current three-dimensional point to be encoded is layer-encoded using LoDs, the three-dimensional data encoding device may encode the attribute information in layers down to LoD required by the three-dimensional data decoding device and need not encode the attribute information in layers not required. For example, when the total number of LoDs is N, the three-dimensional data encoding device may generate a bitstream by encoding M LoDs (M<N), i.e., layers from the uppermost layer LoD0 to LoD(M−1), and not encoding the remaining LoDs, i.e., layers down to LoD(N−1). With this, in response to a request from the three-dimensional data decoding device, the three-dimensional data encoding device can provide a bitstream in which the attribute information from LoD0 to LoD(M−1) required by the three-dimensional data decoding device is encoded.

FIG. 170 is a diagram illustrating the foregoing use case. In the example shown in FIG. 170, a server stores a three-dimensional map obtained by encoding three-dimensional geometry information and attribute information. The server (the three-dimensional data encoding device) unicasts, in response to a request from the client device, the three-dimensional map to a client device (the three-dimensional data decoding device: for example, a vehicle, a drone, etc.) in an area managed by the server, and the client device uses the three-dimensional map received from the server to perform a process for identifying the self-position of the client device or a process for displaying map information to a user or the like who operates the client device.

The following describes an example of the operation in this case. First, the server encodes the geometry information of the three-dimensional map using an octree structure, or the like. Then, the sever generates a bitstream of three-dimensional map A by layer-encoding the attribute information of the three-dimensional map using N LoDs established based on the geometry information, and stores the generated bitstream in the server. The sever also generates a bitstream of three-dimensional map B by layer-encoding the attribute information of the three-dimensional map using M LoDs (M<N) established based on the geometry information, and stores the generated bitstream in the server.

Next, the client device requests the server to send the three-dimensional map in accordance with the intended use of the client device. For example, when the client device performs highly accurate estimation of the self-position using the geometry information and the attribute information in N LoDs, the client device determines that a decoding result to the dense three-dimensional points is necessary as the attribute information, and requests the server to send the bitstream of three-dimensional map A.

Moreover, when the client device displays the three-dimensional map information to a user or the like, the client device determines that a decoding result to the sparse three-dimensional points is necessary as the attribute information, and requests the server to send the bitstream of three-dimensional map B including the geometry information and the attribute information in M LoDs (M<N) starting from an upper layer LoD0. Then, in response to the send request for the map information from the client device, the server sends the bitstream of encoded three-dimensional map A or B to the client device.

The client device receives the bitstream of three-dimensional map A or B sent from the server in accordance with the intended use of the client device, and decodes the received bitstream. In this way, the server changes a bitstream to be sent, in accordance with the intended use of the client device. With this, it is possible to reduce the processing load of the client device.

In the example shown in FIG. 170, the server stores three-dimensional map A and three-dimensional map B. The server generates three-dimensional map A by encoding the geometry information of the three-dimensional map using, for example, an octree structure, and encoding the attribute information of the three-dimensional map using N LoDs. In other words, NumLoD included in the bitstream of three-dimensional map A indicates N.

The server also generates three-dimensional map B by encoding the geometry information of the three-dimensional map using, for example, an octree structure, and encoding the attribute information of the three-dimensional map using M LoDs. In other words, NumLoD included in the bitstream of three-dimensional map B indicates M.

Client device A performs highly accurate estimation of the self-position. In this case, client device A determines that all the geometry information and all the attribute information are necessary, and requests the server to send three-dimensional map A including all the geometry information and the attribute information constructed from N LoDs. Client device A receives three-dimensional map A, and decodes all the geometry information and the attribute information constructed from N LoDs.

Client device B displays the three-dimensional map to a user. In this case, client device B determines that all the geometry information and the attribute information in M LoDs (M<N) are necessary, and requests the server to send three-dimensional map B including all the geometry information and the attribute information constructed from M LoDs. Client device B receives three-dimensional map B, and decodes all the geometry information and the attribute information constructed from M LoDs.

It is to be noted that in addition to three-dimensional map B, the server (the three-dimensional data encoding device) may generate three-dimensional map C in which attribute information in the remaining N-M LoDs is encoded, and send three-dimensional map C to client device B in response to the request from client device B. Moreover, client device B may obtain the decoding result of N LoDs using the bitstreams of three-dimensional maps B and C.

Hereinafter, an example of an application process will be described. FIG. 171 is a flowchart illustrating an example of the application process. When an application operation is started, a three-dimensional data demultiplexing device obtains an ISOBMFF file including point cloud data and a plurality of pieces of encoded data (S7301). For example, the three-dimensional data demultiplexing device may obtain the ISOBMFF file through communication, or may read the ISOBMFF file from the accumulated data.

Next, the three-dimensional data demultiplexing device analyzes the general configuration information in the ISOBMFF file, and specifies the data to be used for the application (S7302). For example, the three-dimensional data demultiplexing device obtains data that is used for processing, and does not obtain data that is not used for processing.

Next, the three-dimensional data demultiplexing device extracts one or more pieces of data to be used for the application, and analyzes the configuration information on the data (S7303).

When the type of the data is encoded data (encoded data in S7304), the three-dimensional data demultiplexing device converts the ISOBMFF to an encoded stream, and extracts a timestamp (S7305). Additionally, the three-dimensional data demultiplexing device refers to, for example, the flag indicating whether or not the synchronization between data is aligned to determine whether or not the synchronization between data is aligned, and may perform a synchronization process when not aligned.

Next, the three-dimensional data demultiplexing device decodes the data with a predetermined method according to the timestamp and the other instructions, and processes the decoded data (S7306).

On the other hand, when the type of the data is RAW data (RAW data in S7304), the three-dimensional data demultiplexing device extracts the data and timestamp (S7307). Additionally, the three-dimensional data demultiplexing device may refer to, for example, the flag indicating whether or not the synchronization between data is aligned to determine whether or not the synchronization between data is aligned, and may perform a synchronization process when not aligned. Next, the three-dimensional data demultiplexing device processes the data according to the timestamp and the other instructions (S7308).

For example, an example will be described in which the sensor signals obtained by a beam LiDAR, a FLASH LiDAR, and a camera are encoded and multiplexed with respective different encoding schemes. FIG. 172 is a diagram illustrating examples of the sensor ranges of a beam LiDAR, a FLASH LiDAR, and a camera. For example, the beam LiDAR detects all directions in the periphery of a vehicle (sensor), and the FLASH LiDAR and the camera detect the range in one direction (for example, the front) of the vehicle.

In the case of an application that integrally handles a LiDAR point cloud, the three-dimensional data demultiplexing device refers to the general configuration information, and extracts and decodes the encoded data of the beam LiDAR and the FLASH LiDAR. Additionally, the three-dimensional data demultiplexing device does not extract camera images.

According to the timestamps of the beam LiDAR and the FLASH LiDAR, the three-dimensional data demultiplexing device simultaneously processes the respective encoded data of the time of the same timestamp.

For example, the three-dimensional data demultiplexing device may present the processed data with a presentation device, may synthesize the point cloud data of the beam LiDAR and the FLASH LiDAR, or may perform a process such as rendering.

Additionally, in the case of an application that performs calibration between data, the three-dimensional data demultiplexing device may extract sensor geometry information, and use the sensor geometry information in the application.

For example, the three-dimensional data demultiplexing device may select whether to use beam LiDAR information or FLASH LiDAR information in the application, and may switch the process according to the selection result.

In this manner, since it is possible to adaptively change the obtaining of data and the encoding process according to the process of the application, the processing amount and the power consumption can be reduced.

Hereinafter, a use case in automated driving will be described. FIG. 173 is a diagram illustrating a configuration example of an automated driving system. This automated driving system includes cloud server 7350, and edge 7360 such as an in-vehicle device or a mobile device. Cloud server 7350 includes demultiplexer 7351, decoders 7352A, 7352B, and 7355, point cloud data synthesizer 7353, large data accumulator 7354, comparator 7356, and encoder 7357. Edge 7360 includes sensors 7361A and 7361B, point cloud data generators 7362A and 7362B, synchronizer 7363, encoders 7364A and 7364B, multiplexer 7365, update data accumulator 7366, demultiplexer 7367, decoder 7368, filter 7369, self-position estimator 7370, and driving controller 7371.

In this system, edge 7360 downloads large data, which is large point-cloud map data accumulated in cloud server 7350. Edge 7360 performs a self-position estimation process of edge 7360 (a vehicle or a terminal) by matching the large data with the sensor information obtained by edge 7360. Additionally, edge 7360 uploads the obtained sensor information to cloud server 7350, and updates the large data to the latest map data.

Additionally, in various applications that handle point cloud data in the system, point cloud data with different encoding methods are handled.

Cloud server 7350 encodes and multiplexes large data. Specifically, encoder 7357 performs encoding by using a third encoding method suitable for encoding a large point cloud. Additionally, encoder 7357 multiplexes encoded data. Large data accumulator 7354 accumulates the data encoded and multiplexed by encoder 7357.

Edge 7360 performs sensing. Specifically, point cloud data generator 7362A generates first point cloud data (geometry information (geometry) and attribute information) by using the sensing information obtained by sensor 7361A. Point cloud data generator 7362B generates second point cloud data (geometry information and attribute information) by using the sensing information obtained by sensor 7361B. The generated first point cloud data and second point cloud data are used for the self-position estimation or vehicle control of automated driving, or for map updating. In each process, a part of information of the first point cloud data and the second point cloud data may be used.

Edge 7360 performs the self-position estimation. Specifically, edge 7360 downloads large data from cloud server 7350. Demultiplexer 7367 obtains encoded data by demultiplexing the large data in a file format. Decoder 7368 obtains large data, which is large point-cloud map data, by decoding the obtained encoded data.

Self-position estimator 7370 estimates the self-position in the map of a vehicle by matching the obtained large data with the first point cloud data and the second point cloud data generated by point cloud data generators 7362A and 7362B. Additionally, driving controller 7371 uses the matching result or the self-position estimation result for driving control.

Note that self-position estimator 7370 and driving controller 7371 may extract specific information, such as geometry information, of the large data, and may perform processes by using the extracted information. Additionally, filter 7369 performs a process such as correction or decimation on the first point cloud data and the second point cloud data. Self-position estimator 7370 and driving controller 7371 may use the first point cloud data and second point cloud data on which the process has been performed. Additionally, self-position estimator 7370 and driving controller 7371 may use the sensor signals obtained by sensors 7361A and 7361B.

Synchronizer 7363 performs time synchronization and geometry correction between a plurality of sensor signals or the pieces of data of a plurality of pieces of point cloud data. Additionally, synchronizer 7363 may correct the geometry information on the sensor signal or point cloud data to match the large data, based on geometry correction information on the large data and sensor data generated by the self-position estimation process.

Note that synchronization and geometry correction may be performed not by edge 7360, but by cloud server 7350. In this case, edge 7360 may multiplex the synchronization information and the geometry information to transmit the synchronization information and the geometry information to cloud server 7350.

Edge 7360 encodes and multiplexes the sensor signal or point cloud data. Specifically, the sensor signal or point cloud data is encoded by using a first encoding method or a second encoding method suitable for encoding each signal. For example, encoder 7364A generates first encoded data by encoding first point cloud data by using the first encoding method. Encoder 7364B generates second encoded data by encoding second point cloud data by using the second encoding method.

Multiplexer 7365 generates a multiplexed signal by multiplexing the first encoded data, the second encoded data, the synchronization information, and the like. Update data accumulator 7366 accumulates the generated multiplexed signal. Additionally, update data accumulator 7366 uploads the multiplexed signal to cloud server 7350.

Cloud server 7350 synthesizes the point cloud data. Specifically, demultiplexer 7351 obtains the first encoded data and the second encoded data by demultiplexing the multiplexed signal uploaded to cloud server 7350. Decoder 7352A obtains the first point cloud data (or sensor signal) by decoding the first encoded data. Decoder 7352B obtains the second point cloud data (or sensor signal) by decoding the second encoded data.

Point cloud data synthesizer 7353 synthesizes the first point cloud data and the second point cloud data with a predetermined method. When the synchronization information and the geometry correction information are multiplexed in the multiplexed signal, point cloud data synthesizer 7353 may perform synthesis by using these pieces of information.

Decoder 7355 demultiplexes and decodes the large data accumulated in large data accumulator 7354. Comparator 7356 compares the point cloud data generated based on the sensor signal obtained by edge 7360 with the large data held by cloud server 7350, and determines the point cloud data that needs to be updated. Comparator 7356 updates the point cloud data that is determined to need to be updated of the large data to the point cloud data obtained from edge 7360.

Encoder 7357 encodes and multiplexes the updated large data, and accumulates the obtained data in large data accumulator 7354.

As described above, the signals to be handled may be different, and the signals to be multiplexed or encoding methods may be different, according to the usage or applications to be used. Even in such a case, flexible decoding and application processes are enabled by multiplexing data of various encoding schemes by using the present embodiment. Additionally, even in a case where the encoding schemes of signals are different, by conversion to an encoding scheme suitable for demultiplexing, decoding, data conversion, encoding, and multiplexing processing, it becomes possible to build various applications and systems, and to offer of flexible services.

Hereinafter, an example of decoding and application of divided data will be described. First, the information on divided data will be described. FIG. 174 is a diagram illustrating a configuration example of a bitstream. The general information of divided data indicates, for each divided data, the sensor ID (sensor_id) and data ID (data_id) of the divided data. Note that the data ID is also indicated in the header of each encoded data.

Note that, the general information of divided data illustrated in FIG. 174 includes, in addition to the sensor ID, at least one of the sensor information (Sensor), the version (Version) of the sensor, the maker name (Maker) of the sensor, the mount information (Mount Info.) of the sensor, and the position coordinates of the sensor (World Coordinate). Accordingly, the three-dimensional data decoding device can obtain the information on various sensors from the configuration information.

The general information of divided data may be stored in SPS, GPS, or APS, which is the metadata, or may be stored in SEI, which is the metadata not required for encoding. Additionally, at the time of multiplexing, the three-dimensional data encoding device stores the SEI in a file of ISOBMFF. The three-dimensional data decoding device can obtain desired divided data based on the metadata.

In FIG. 174, SPS is the metadata of the entire encoded data, GPS is the metadata of the geometry information, APS is the metadata for each attribute information, G is encoded data of the geometry information for each divided data, and A1, etc. are encoded data of the attribute information for each divided data.

Next, an application example of divided data will be described. An example of application will be described in which an arbitrary point cloud is selected, and the selected point cloud is presented. FIG. 175 is a flowchart of a point cloud selection process performed by this application. FIG. 176 to FIG. 178 are diagrams illustrating screen examples of the point cloud selection process.

As illustrated in FIG. 176, the three-dimensional data decoding device that performs the application includes, for example, a UI unit that displays an input UI (user interface) 8661 for selecting an arbitrary point cloud. Input UI 8661 includes presenter 8662 that presents the selected point cloud, and an operation unit (buttons 8663 and 8664) that receives operations by a user. After a point cloud is selected in UI 8661, the three-dimensional data decoding device obtains desired data from accumulator 8665.

First, based on an operation by the user on input UI 8661, the point cloud information that the user wants to display is selected (S8631). Specifically, by selecting button 8663, the point cloud based on sensor 1 is selected. By selecting button 8664, the point cloud based on sensor 2 is selected. Alternatively, by selecting both button 8663 and button 8664, the point cloud based on sensor 1 and the point cloud based on sensor 2 are selected. Note that it is an example of the selection method of point cloud, and it is not limited to this.

Next, the three-dimensional data decoding device analyzes the general information of divided data included in the multiplexed signal (bitstream) or encoded data, and specifies the data ID (data_id) of the divided data constituting the selected point cloud from the sensor ID (sensor_id) of the selected sensor (S8632). Next, the three-dimensional data decoding device extracts, from the multiplexed signal, the encoded data including the specified and desired data ID, and decodes the extracted encoded data to decode the point cloud based on the selected sensor (S8633). Note that the three-dimensional data decoding device does not decode the other encoded data.

Lastly, the three-dimensional data decoding device presents (for example, displays) the decoded point cloud (S8634). FIG. 177 illustrates an example in the case where button 8663 for sensor 1 is pressed, and the point cloud of sensor 1 is presented. FIG. 178 illustrates an example in the case where both button 8663 for sensor 1 and button 8664 for sensor 2 are pressed, and the point clouds of sensor 1 and sensor 2 are presented.

A three-dimensional data encoding device, a three-dimensional data decoding device, and the like according to the embodiments of the present disclosure have been described above, but the present disclosure is not limited to these embodiments.

Note that each of the processors included in the three-dimensional data encoding device, the three-dimensional data decoding device, and the like according to the above embodiments is typically implemented as a large-scale integrated (LSI) circuit, which is an integrated circuit (IC). These may take the form of individual chips, or may be partially or entirely packaged into a single chip.

Such IC is not limited to an LSI, and thus may be implemented as a dedicated circuit or a general-purpose processor. Alternatively, a field programmable gate array (FPGA) that allows for programming after the manufacture of an LSI, or a reconfigurable processor that allows for reconfiguration of the connection and the setting of circuit cells inside an LSI may be employed.

Moreover, in the above embodiments, the structural components may be implemented as dedicated hardware or may be realized by executing a software program suited to such structural components. Alternatively, the structural components may be implemented by a program executor such as a CPU or a processor reading out and executing the software program recorded in a recording medium such as a hard disk or a semiconductor memory.

The present disclosure may also be implemented as a three-dimensional data encoding method, a three-dimensional data decoding method, or the like executed by the three-dimensional data encoding device, the three-dimensional data decoding device, and the like.

Also, the divisions of the functional blocks shown in the block diagrams are mere examples, and thus a plurality of functional blocks may be implemented as a single functional block, or a single functional block may be divided into a plurality of functional blocks, or one or more functions may be moved to another functional block. Also, the functions of a plurality of functional blocks having similar functions may be processed by single hardware or software in a parallelized or time-divided manner.

Also, the processing order of executing the steps shown in the flowcharts is a mere illustration for specifically describing the present disclosure, and thus may be an order other than the shown order. Also, one or more of the steps may be executed simultaneously (in parallel) with another step.

A three-dimensional data encoding device, a three-dimensional data decoding device, and the like according to one or more aspects have been described above based on the embodiments, but the present disclosure is not limited to these embodiments. The one or more aspects may thus include forms achieved by making various modifications to the above embodiments that can be conceived by those skilled in the art, as well forms achieved by combining structural components in different embodiments, without materially departing from the spirit of the present disclosure.

INDUSTRIAL APPLICABILITY

The present disclosure is applicable to a three-dimensional data encoding device and a three-dimensional data decoding device.

What is claimed is:

1. A three-dimensional data encoding method, comprising:
encoding, for each of three-dimensional points included in point cloud data, geometry information and one or more items of attribute information to generate a bitstream, wherein
in the encoding, a normal vector of each of the three-dimensional points is encoded as an item of attribute information included in the one or more items of attribute information of the three-dimensional point,
the bitstream includes control information shared by the geometry information and the one or more items of attribute information, and
the control information includes at least one of:
information indicating that the item of attribute information included in the one or more items of attribute information indicates the normal vector; or
information indicating that the normal vector is data including three elements for each of the three-dimensional points.

2. The three-dimensional data encoding method according to claim 1, wherein
the encoding includes:
transforming the normal vector represented by a floating point to an integer; and
encoding the integer.

3. The three-dimensional data encoding method according to claim 1, wherein
the control information includes the information indicating that the item of attribute information included in the one or more items of attribute information indicates the normal vector.

4. The three-dimensional data encoding method according to claim 1, wherein
the control information is a sequence parameter set.

5. A three-dimensional data decoding method, comprising:
obtaining a bitstream, the bitstream being generated by encoding, for each of three-dimensional points included in point cloud data, geometry information and one or more items of attribute information, the bitstream including, for each of the three-dimensional points, a normal vector encoded as an item of attribute information included in the one or more items of attribute information of the three-dimensional point; and obtaining the normal vector by decoding the item of attribute information from the bitstream, wherein
the bitstream includes control information shared by the geometry information and the one or more items of attribute information, and
the control information includes at least one of:
information indicating that the item of attribute information included in the one or more items of attribute information indicates the normal vector; or
information indicating that the normal vector is data including three elements for each of the three-dimensional points.

6. The three-dimensional data decoding method according to claim 5, wherein
in the obtaining of the normal vector, the normal vector which is represented by an integer is obtained.

7. The three-dimensional data decoding method according to claim 5, wherein
the control information includes the information indicating that the item of attribute information included in the one or more items of attribute information indicates the normal vector.

8. The three-dimensional data decoding method according to claim 5, wherein
the control information is a sequence parameter set.

9. A three-dimensional data encoding device, comprising:
a processor; and
memory,
wherein using the memory, the processor:
encodes, for each of three-dimensional points included in point cloud data, geometry information and one or more items of attribute information to generate a bitstream, wherein
in the encoding, a normal vector of each of the three-dimensional points is encoded as an item of attribute information included in the one or more items of attribute information of the three-dimensional point,
the bitstream includes control information shared by the geometry information and the one or more items of attribute information, and
the control information includes at least one of:
information indicating that the item of attribute information included in the one or more items of attribute information indicates the normal vector; or
information indicating that the normal vector is data including three elements for each of the three-dimensional points.

10. A three-dimensional data decoding device, comprising:
a processor; and
memory,
wherein using the memory, the processor:
obtains a bitstream, the bitstream being generated by encoding, for each of three-dimensional points included in point cloud data, geometry information and one or more items of attribute information, the bitstream including, for each of the three-dimensional points, a normal vector encoded as an item of attribute information included in the one or more items of attribute information of the three-dimensional point; and
obtains the normal vector by decoding the item of attribute information from the bitstream, wherein
the bitstream includes control information shared by the geometry information and the one or more items of attribute information, and
the control information includes at least one of:

information indicating that the item of attribute information included in the one or more items of attribute information indicates the normal vector; or information indicating that the normal vector is data including three elements for each of the three-dimensional points.

\* \* \* \* \*